US007964961B2

(12) United States Patent
Lee et al.

(10) Patent No.: US 7,964,961 B2
(45) Date of Patent: Jun. 21, 2011

(54) CHIP PACKAGE

(75) Inventors: Jin-Yuan Lee, Hsin-Chu (TW); Hsin-Jung Lo, Taipei (TW)

(73) Assignee: Megica Corporation, Hsin-Chu (TW)

( * ) Notice: Subject to any disclaimer, the term of this patent is extended or adjusted under 35 U.S.C. 154(b) by 232 days.

(21) Appl. No.: 12/101,127

(22) Filed: Apr. 10, 2008

(65) Prior Publication Data

US 2008/0251940 A1 Oct. 16, 2008

Related U.S. Application Data

(60) Provisional application No. 60/911,512, filed on Apr. 12, 2007, provisional application No. 60/914,771, filed on Apr. 30, 2007.

(51) Int. Cl.
*H01L 23/485* (2006.01)

(52) U.S. Cl. . 257/737; 257/738; 257/777; 257/E23.141; 257/E23.021

(58) Field of Classification Search .......... 257/678–734, 257/787–796, E23.001–E23.194
See application file for complete search history.

(56) References Cited

U.S. PATENT DOCUMENTS

| | | | |
|---|---|---|---|
| 5,226,232 | A | 7/1993 | Boyd |
| 5,261,155 | A | 11/1993 | Angulas et al. |
| 5,534,465 | A | 7/1996 | Frye et al. |
| 5,631,499 | A | 5/1997 | Hosomi et al. |
| 5,883,435 | A | 3/1999 | Geffken et al. |
| 6,013,571 | A | 1/2000 | Morrell |
| 6,077,726 | A | 6/2000 | Mistry et al. |
| 6,144,100 | A | 11/2000 | Shen et al. |
| 6,177,731 | B1 | 1/2001 | Ishida et al. |
| 6,187,680 | B1 | 2/2001 | Costrini et al. |
| 6,229,711 | B1 | 5/2001 | Yoneda |
| 6,426,281 | B1 | 7/2002 | Lin et al. |
| 6,479,900 | B1 | 11/2002 | Shinogi et al. |
| 6,673,698 | B1 | 1/2004 | Lin et al. |
| 6,683,380 | B2 | 1/2004 | Efland et al. |

(Continued)

FOREIGN PATENT DOCUMENTS

| | | |
|---|---|---|
| EP | 1536469 | 6/2005 |

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — N Drew Richards
*Assistant Examiner* — Mamadou Diallo
(74) *Attorney, Agent, or Firm* — McDermott Will & Emery, LLP

(57) ABSTRACT

A chip package includes a semiconductor chip, a flexible circuit film and a substrate. The substrate has a circuit structure in the substrate. The flexible circuit film is connected to the circuit structure of the substrate through metal joints, an anisotropic conductive film or wireboning wires. The semiconductor chip has fine-pitched metal bumps having a thickness of between 5 and 50 micrometers, and preferably of between 10 and 25 micrometers, and the semiconductor chip is joined with the flexible circuit film by the fine-pitched metal bumps using a chip-on-film (COF) technology or tape-automated-bonding (TAB) technology. A pitch of the neighboring metal bumps is less than 35 micrometers, such as between 10 and 30 micrometers.

27 Claims, 69 Drawing Sheets

U.S. PATENT DOCUMENTS

| | | | |
|---|---|---|---|
| 6,707,159 B1 | 3/2004 | Kumamoto et al. | |
| 6,746,898 B2 | 6/2004 | Lin et al. | |
| 6,756,664 B2 | 6/2004 | Yang | |
| 6,762,122 B2 | 7/2004 | Mis et al. | |
| 6,791,178 B2 | 9/2004 | Yamaguchi et al. | |
| 6,800,941 B2 | 10/2004 | Lee et al. | |
| 6,853,076 B2 | 2/2005 | Datta et al. | |
| 6,940,169 B2 | 9/2005 | Jin et al. | |
| 7,045,899 B2 | 5/2006 | Yamane et al. | |
| 7,220,657 B2 | 5/2007 | Ihara et al. | |
| 7,413,929 B2 | 8/2008 | Lee et al. | |
| 7,511,376 B2 | 3/2009 | Lin et al. | |
| 7,569,422 B2 | 8/2009 | Lin | |
| 2001/0040290 A1 | 11/2001 | Sakurai et al. | |
| 2002/0037643 A1* | 3/2002 | Ishimaru | 438/642 |
| 2002/0043723 A1 | 4/2002 | Shimizu et al. | |
| 2003/0006062 A1 | 1/2003 | Stone et al. | |
| 2003/0218246 A1 | 11/2003 | Abe et al. | |
| 2004/0007779 A1 | 1/2004 | Arbuthnot et al. | |
| 2005/0093149 A1* | 5/2005 | Nakatani | 257/737 |
| 2008/0284037 A1 | 11/2008 | Andry et al. | |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection,"IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

CHIP PACKAGE

This application claims priority to U.S. provisional application No. 60/911,512, filed on Apr. 13, 2007, and to U.S. provisional application No. 60/914,771, filed on Apr. 30, 2007, which are herein incorporated by reference in their entirety.

BACKGROUND OF THE INVENTION

1. Field of the Invention

The invention relates to a chip package, and, more specifically, to a chip package having fine-pitched metal bumps connected to an external circuit through a flexible circuit film.

2. Brief Description of the Related Art

In the recent years, the development of advanced technology is on the cutting edge. As a result, high-technology electronics manufacturing industries launch more feature-packed and humanized electronic products. These new products that hit the showroom are lighter, thinner, and smaller in design. In the manufacturing of these electronic products, the key component has to be the integrated circuit (IC) chip inside any electronic product.

SUMMARY OF THE INVENTION

It is the objective of the invention to provide a chip package with a semiconductor chip having fine-pitched metal bumps connected to an external circuit through a flexible circuit film.

In order to reach the above objective, the present invention provides a chip package including a substrate, a flexible circuit film, a first tin-containing joint, a second tin-containing joint, a semiconductor chip, a first metal bump and a second metal bump. The substrate includes multiple insulating layers and multiple metal circuit layers between the insulating layers. The flexible circuit film is over a top surface of the substrate, and the flexible circuit film includes a first polymer layer over the top surface, a first metal trace on the first polymer layer, a second metal trace on the first polymer layer and a second polymer layer on the first and second metal traces. The first tin-containing joint is between the first metal trace and a first pad of the top surface, and the first metal trace is connected to the first pad through the first tin-containing joint. The second tin-containing joint is between the second metal trace and a second pad of the top surface, and the second metal trace is connected to the second pad through the second tin-containing joint. The semiconductor chip is over the flexible circuit film and directly over the top surface. The first metal bump is between the semiconductor chip and the first metal trace, and the second metal bump is between the semiconductor chip and the second metal trace, wherein a pitch between the first and second metal bumps is less than 35 micrometers, such as between 5 and 25 micrometers.

In order to reach the above objective, the present invention provides a chip package including a substrate, a flexible circuit film, an anisotropic conductive film (ACF), a semiconductor chip, a first metal bump and a second metal bump. The substrate includes a circuit structure in the substrate. The flexible circuit film is over a top surface of the substrate, and the flexible circuit film comprises a first polymer layer over the top surface, a first metal trace on the first polymer layer, a second metal trace on the first polymer layer and a second polymer layer on the first and second metal traces. The anisotropic conductive film is between the first metal trace and a first pad of the top surface, and between the second metal trace and a second pad of the top surface, wherein the first metal trace is connected to the first pad through multiple metal particles in the anisotropic conductive film, and the second metal trace is connected to the second pad through multiple metal particles in the anisotropic conductive film. The semiconductor chip is over the flexible circuit film and directly over the top surface. The first metal bump is between the semiconductor chip and the first metal trace, and the second metal bump is between the semiconductor chip and the second metal trace, wherein a pitch is between the first and second metal bumps is less than 35 micrometers, such as between 5 and 25 micrometers.

In order to reach the above objective, the present invention provides a chip package including a substrate, a flexible circuit film, a first wireboning wire, a second wireboning wire, a semiconductor chip, a first metal bump and a second metal bump. The substrate includes a circuit structure in the substrate. The flexible circuit film is over a top surface of the substrate, and the flexible circuit film includes a first polymer layer over the top surface, a first metal trace on the first polymer layer, a second metal trace on the first polymer layer and a second polymer layer on the first and second metal traces. The first wireboning wire is connected to a first pad of the top surface and to the first metal trace, and the second wireboning wire is connected to a second pad of the top surface and to the second metal trace. The semiconductor chip is over the flexible circuit film and directly over the top surface. The first metal bump is between the semiconductor chip and the first metal trace, and the second metal bump is between the semiconductor chip and the second metal trace, wherein a pitch between the first and second metal bumps is less than 35 micrometers, such as between 5 and 25 micrometers.

To enable the objectives, technical contents, characteristics and accomplishments of the present invention, the embodiments of the present invention are to be described in detail in cooperation with the attached drawings below.

BRIEF DESCRIPTION OF THE DRAWINGS

FIGS. 8I and 8J are perspective views showing two chip packages each including a rigid substrate, a flexible circuit film mounted on the rigid substrate, a semiconductor chip joined with the flexible circuit film and an electronic device joined with the flexible circuit film.

FIGS. 8K-8T are cross-sectional views showing various chip packages each including a rigid substrate, a flexible circuit film mounted on the rigid substrate, a semiconductor chip joined with the flexible circuit film and an electronic device joined with the flexible circuit film.

DETAILED DESCRIPTION OF THE INVENTION

Figure 1:
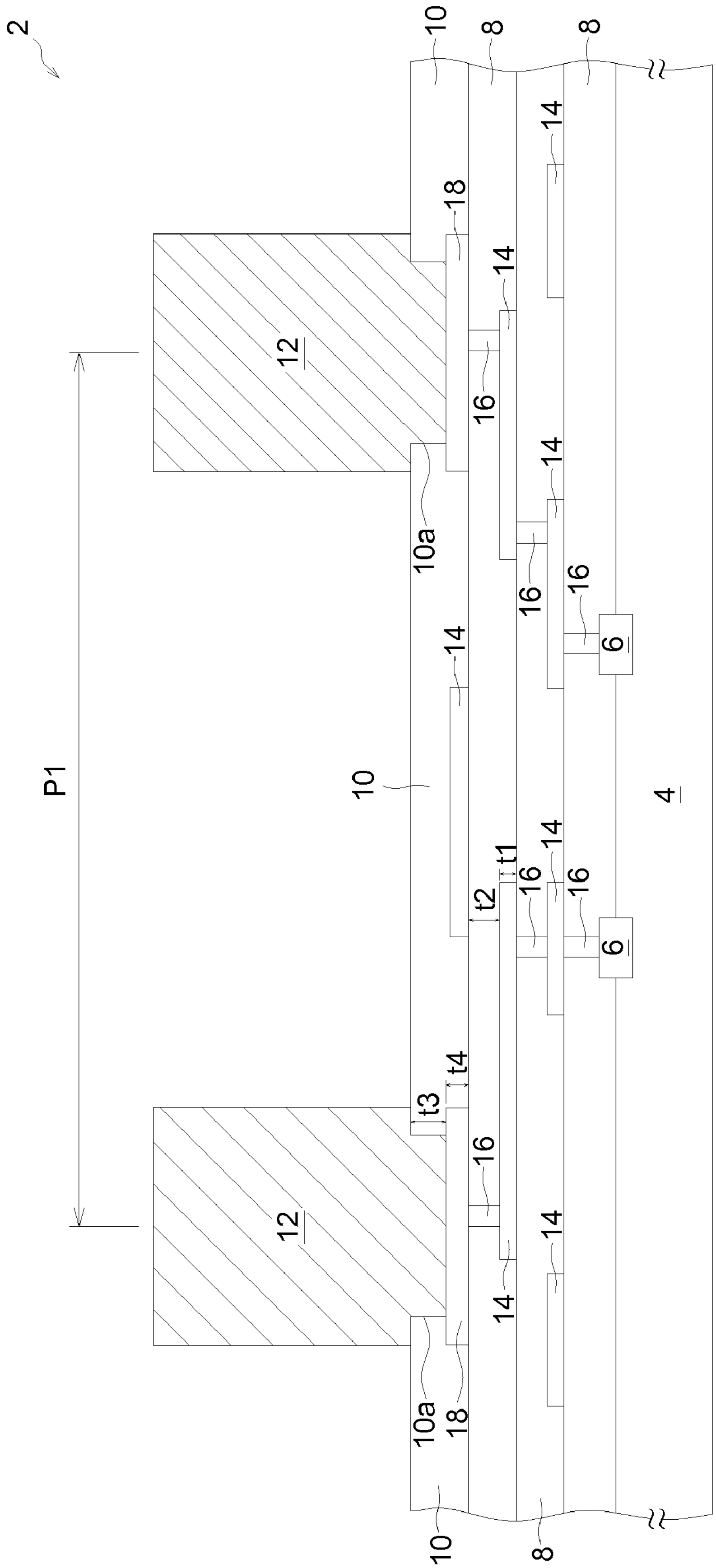
FIGS. 1 and 2 are cross-sectional views schematically showing semiconductor chips according to the present invention.

Referring to FIG. 1, a semiconductor chip 2 includes a semiconductor substrate 4, multiple semiconductor devices 6, a metallization structure, multiple dielectric layers 8, a passivation layer 10 and multiple metal bumps 12. The semiconductor substrate 4 may be a silicon substrate, a GaAs substrate or a SiGe substrate.

The semiconductor devices 6 are formed in or over the semiconductor substrate 4. The semiconductor devices 6 may comprise a memory cell, a logic circuit, a passive device, such as resistor, capacitor, inductor or filter, or an active device, such as p-channel MOS device, n-channel MOS device, CMOS (Complementary Metal Oxide Semiconductor) device, BJT (Bipolar Junction Transistor) device or BiCMOS (Bipolar CMOS) device.

The metallization structure is formed over the semiconductor substrate 4, connected to the semiconductor devices 6. The metallization structure comprises multiple patterned metal layers 14 having a thickness t1 of less than 3 micrometers (such as between 0.2 and 2 μm) and multiple metal plugs 16. For example, the patterned metal layers 14 and the metal plugs 16 are principally made of copper, wherein each of the patterned metal layers 14 has a copper-containing layer having a thickness of less than 3 micrometers (such as between 0.2 and 2 μm). Alternatively, the patterned metal layers 14 are principally made of aluminum or aluminum-alloy, and the metal plugs 16 are principally made of tungsten, wherein each of the patterned metal layers 14 has an aluminum-containing layer having a thickness of less than 3 micrometers (such as between 0.2 and 2 μm). The patterned metal layers 14 may include multiple metal lines each having a copper layer and an adhesion/barrier layer on the bottom surface and sidewalls of the copper layer, wherein the adhesion/barrier layer may be a tantalum-containing layer, such as tantalum layer or tantalum nitride layer. The patterned metal layers 14 can be formed by a damascene process including sputtering an adhesion/barrier layer on the bottom of an opening in one of the dielectric layer 8, on the sidewall of the opening and on one of the dielectric layer 8, sputtering a copper seed layer on the adhesion/barrier layer, electroplating a copper bulk layer on the copper seed layer, then removing the copper bulk layer, the copper seed layer and the adhesion/barrier layer outside the opening using a chemical mechanical polishing (CMP) process.

The dielectric layers 8 are located over the semiconductor substrate 4 and interposed respectively between the neighboring patterned metal layers 14, and the neighboring patterned metal layers 14 are interconnected through the metal plugs 16 inside the dielectric layer 8. The dielectric layers 8 are commonly formed by a chemical vapor deposition (CVD) process. The material of the dielectric layers 8 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, silicon carbon nitride (such as SiCN), oxygen and silicon, SOG (Spin-On Glass), BPSG (borophosphosilicate glass), a polyarylene ether, polybenzoxazole (PBO), or a material having a low dielectric constant (K) of between 1.5 and 3, for example. The dielectric layer 8 between the neighboring patterned metal layers 14 has a thickness t2 of less than 3 micrometers, such as between 0.3 and 3 μm or between 0.3 and 2.5 μm.

The passivation layer 10 is formed over the semiconductor devices 6, over the metallization structure (including the metal layers 14 and the metal plugs 16) and over the dielectric layers 8. The passivation layer 10 can protect the semiconductor devices 6 and the metallization structure from being damaged by moisture and foreign ion contamination. In other words, mobile ions (such as sodium ion), transition metals (such as gold, silver and copper) and impurities can be prevented from penetrating through the passivation layer 10 to the semiconductor devices 6, such as transistors, polysilicon resistor elements and polysilicon-polysilicon capacitor elements, and to the metallization structure.

The passivation layer 10 is commonly made of silicon oxide (such as $SiO_2$), PSG (phosphosilicate glass), silicon oxynitride, silicon nitride (such as $Si_3N_4$) or silicon carbon nitride (such as SiCN). The passivation layer 10 on pads 18 of the metallization structure and on the topmost metal layers 14 of the metallization structure typically has a thickness t3 of more than 0.3 μm, such as between 0.3 and 2 μm or between 0.8 and 1.5 μm. In a preferred case, the passivation layer 10 includes a topmost silicon nitride layer of the semiconductor chip 2, wherein the topmost silicon nitride layer in the passivation layer 10 has a thickness of more than 0.2 μm, such as between 0.3 and 1.2 μm, wherein the passivation layer has first and second portions, and each of the metal bumps 12 shown in FIG. 1 has a metal portion between the first and second portions of the passivation layer 10 and on the pad 18. Fifteen methods for depositing the passivation layer 10 are described as below.

In a first method, the passivation layer 10 is formed by depositing a silicon oxide layer with a thickness of between 0.2 and 1.2 μm using a CVD method and then depositing a silicon nitride layer with a thickness of 0.2 and 1.2 μm on the silicon oxide layer using a CVD method.

In a second method, the passivation layer 10 is formed by depositing a silicon oxide layer with a thickness of between 0.2 and 1.2 μm using a CVD method, next depositing a silicon oxynitride layer with a thickness of between 0.05 and 0.15 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 10 is formed by depositing a silicon oxynitride layer with a thickness of between 0.05 and 0.15 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 10 is formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 10 is formed by depositing a silicon oxide layer with a thickness of between 0.5 and 2 μm using a High Density Plasma CVD (HDP-CVD) method and then depositing a silicon nitride layer with a thickness of 0.2 and 1.2 μm on the silicon oxide layer using a CVD method.

In a sixth method, the passivation layer 10 is formed by depositing an Undoped Silicate Glass (USG) layer with a thickness of between 0.2 and 3 μm, next depositing an insulating layer of TEOS, PSG or BPSG (borophosphosilicate glass) with a thickness of between 0.5 and 3 μm on the USG layer, and then depositing a silicon nitride layer with a thickness of 0.2 and 1.2 μm on the insulating layer using a CVD method.

In a seventh method, the passivation layer 10 is formed by optionally depositing a first silicon oxynitride layer with a thickness of between 0.05 and 0.15 μm using a CVD method, next depositing a silicon oxide layer with a thickness of between 0.2 and 1.2 μm on the first silicon oxynitride layer using a CVD method, next optionally depositing a second silicon oxynitride layer with a thickness of between 0.05 and 0.15 μm on the silicon oxide layer using a CVD method, next depositing a silicon nitride layer with a thickness of between 0.2 and 1.2 μm on the second silicon oxynitride layer or on the silicon oxide using a CVD method, next optionally depositing a third silicon oxynitride layer with a thickness of between 0.05 and 0.15 μm on the silicon nitride layer using a CVD method, and then depositing a silicon oxide layer with a thickness of between 0.2 and 1.2 μm on the third silicon oxynitride layer or on the silicon nitride layer using a CVD method.

In a eighth method, the passivation layer 10 is formed by depositing a first silicon oxide layer with a thickness of between 0.2 and 1.2 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 1.2 μm on the second silicon oxide layer using a CVD method, next depositing a silicon nitride layer with a thickness of between 0.2 and 1.2 μm on the third silicon oxide layer using a CVD method, and then depositing a fourth silicon oxide layer with a thickness of between 0.2 and 1.2 μm on the silicon nitride layer using a CVD method.

In a ninth method, the passivation layer 10 is formed by depositing a first silicon oxide layer with a thickness of between 0.5 and 2 μm using a HDP-CVD method, next depositing a silicon nitride layer with a thickness of between 0.2 and 1.2 μm on the first silicon oxide layer using a CVD method, and then depositing a second silicon oxide layer with a thickness of between 0.5 and 2 μm on the silicon nitride using a HDP-CVD method.

In a tenth method, the passivation layer 10 is formed by depositing a first silicon nitride layer with a thickness of between 0.2 and 1.2 μm using a CVD method, next depositing a silicon oxide layer with a thickness of between 0.2 and 1.2 μm on the first silicon nitride layer using a CVD method, and then depositing a second silicon nitride layer with a thickness of between 0.2 and 1.2 μm on the silicon oxide layer using a CVD method.

In a eleventh method, the passivation layer 10 is formed by depositing a single layer of silicon nitride with a thickness of between 0.2 and 1.5 μm, and preferably of between 0.3 and 1.2 μm, using a CVD method, by depositing a single layer of silicon oxynitride with a thickness of between 0.2 and 1.5 μm, and preferably of between 0.3 and 1.2 μm, using a CVD method, or by depositing a single layer of silicon carbon nitride with a thickness of between 0.2 and 1.5 μm, and preferably of between 0.3 and 1.2 μm, using a CVD method.

In a twelfth method, the passivation layer 10 is formed by depositing a silicon oxide layer with a thickness of between 0.2 and 1.2 μm using a CVD method and then depositing a silicon carbon nitride layer with a thickness of 0.2 and 1.2 μm on the silicon oxide layer using a CVD method.

In a thirteenth method, the passivation layer 10 is formed by depositing a first silicon carbon nitride layer with a thickness of between 0.2 and 1.2 μm using a CVD method, next depositing a silicon oxide layer with a thickness of between 0.2 and 1.2 μm on the first silicon carbon nitride layer using a CVD method, and then depositing a second silicon carbon nitride layer with a thickness of 0.2 and 1.2 μm on the silicon oxide layer using a CVD method.

In a fourteenth method, the passivation layer 10 is formed by depositing a silicon carbon nitride layer with a thickness of between 0.2 and 1.2 μm using a CVD method, next depositing a silicon oxide layer with a thickness of between 0.2 and 1.2 μm on the silicon carbon nitride layer using a CVD method, and then depositing a silicon nitride layer with a thickness of 0.2 and 1.2 μm on the silicon oxide layer using a CVD method.

In a fifteenth method, the passivation layer 10 is formed by depositing a silicon nitride layer with a thickness of between 0.2 and 1.2 μm using a CVD method, next depositing a silicon oxide layer with a thickness of between 0.2 and 1.2 μm on the silicon nitride layer using a CVD method, and then depositing a silicon carbon nitride layer with a thickness of 0.2 and 1.2 μm on the silicon oxide layer using a CVD method.

Openings 10*a* in the passivation layer 10 expose the pads 18 of the metallization structure used to input or output signals or to be connected to a power source or a ground reference. The neighboring pads 18 are separated from each other by an insulating material. The pads 18 are provided by a topmost metal layer under the passivation layer 10. Each of the pads 18 has a thickness t4 of between 0.5 and 3 μm, and the pads 18 can be connected to the semiconductor devices 6 through the metal layers 14 and the metal plugs 16. The pads 18 may be composed of a sputtered aluminum layer or a sputtered aluminum-copper-alloy layer with a thickness of between 0.5 and 3 μm. Alternatively, the pads 18 may include a copper layer with a thickness of between 0.5 and 3 μm, and a barrier layer, such as tantalum or tantalum nitride, on a bottom surface and sidewalls of the copper layer, wherein the copper layer may include electroplated copper.

Therefore, the pads 18 can be aluminum pads, principally made of sputtered aluminum with a thickness of between 0.5 and 3 μm. Alternatively, the pads 18 can be copper pads, principally made of electroplated copper with a thickness of between 0.5 and 3 μm.

The openings 10*a* may have a transverse dimension, from a top view, of between 0.5 and 20 μm or between 20 and 200 μm. The shape of the openings 10*a* from a top view may be a circle, and the diameter of the circle-shaped openings 10*a* may be between 0.5 and 20 μm or between 20 and 200 μm. Alternatively, the shape of the openings 10*a* from a top view may be a square, and the width of the square-shaped openings 10*a* may be between 0.5 and 20 μm or between 20 and 200 μm. Alternatively, the shape of the openings 10*a* from a top view may be a polygon, such as hexagon or octagon, and the polygon-shaped openings 10*a* may have a width of between 0.5 and 20 μm or between 20 and 200 μm. Alternatively, the shape of the openings 10*a* from a top view may be a rectangle, and the rectangle-shaped openings 10*a* may have a shorter width of between 0.5 and 20 μm or between 20 and 200 μm.

Metal caps (not shown) having a thickness of between 0.4 and 5 μm, and preferably of between 0.4 and 2 μm, can be optionally formed on the pads 18 exposed by the openings 10*a* in the passivation layer 10 to prevent the pads 18 from being oxidized or contaminated. The material of the metal caps may include aluminum, an aluminum-copper alloy or an Al—Si—Cu alloy. For example, when the pads 18 are copper pads, the metal caps including aluminum are used to protect the copper pads 18 from being oxidized. The metal caps may comprise a barrier layer having a thickness of between 0.01 and 0.5 μm on the pads 18. The barrier layer may be made of titanium, titanium nitride, titanium-tungsten alloy, tantalum, tantalum nitride, chromium or nickel.

For example, the metal caps may include a tantalum-containing layer, such as tantalum layer or tantalum-nitride layer, having a thickness of between 0.01 and 0.5 μm on the pads 18, principally made of electroplated copper, exposed by the opening 10*a*, and an aluminum-containing layer, such as aluminum layer or aluminum-copper-alloy layer, having a thickness of between 0.4 and 3 μm on the tantalum-containing layer.

The metal bumps 12 can be formed, respectively, on the pads 18, such as aluminum pads or copper pads, exposed by the openings 10*a*, and a pitch P1 between the neighboring metal bumps 12 is greater than 5 micrometers or less than 35 micrometers, such as between 15 and 35 micrometers, between 10 and 30 micrometers or between 5 and 20 micrometers. The metal bumps 12 can be formed of an adhesion/barrier layer having a thickness of between 0.03 and 0.7 μm, and preferably of between 0.25 and 0.35 μm, on the pads 18 exposed by the openings 10*a* and a metal layer having a thickness of between 5 and 50 micrometers, and preferably of between 10 and 25 micrometers, on the adhesion/barrier layer. The adhesion/barrier layer may be titanium, a titanium-tungsten alloy, titanium nitride, chromium, tantalum, tantalum nitride or a composite of the above-mentioned materials, and the adhesion/barrier layer can be formed by a physical vapor deposition (PVD) process, such as a sputtering process or an evaporation process. The metal layer may be gold, copper, silver, nickel, palladium, tin or a composite of the above-mentioned materials, and the metal layer may be formed by a process including a sputtering process, an electroplating process or an electroless plating process. Below, the process of forming the metal bumps 12 is exemplified with the case of forming the metal bumps 12 on the pads 18, such as aluminum pads or copper pads, exposed by the openings 10*a*. Alternatively, the metal bumps 12 can be formed on the metal caps, such as aluminum caps, wherein the metal caps are formed on the pads 18, such as copper pads, exposed by the openings 10*a*.

FIGS. 1*a*-1*e* are schematically cross-sectional figures showing a process of forming the metal bumps 12 on a semiconductor wafer 20. The above-mentioned semiconductor chip 2 is cut from the semiconductor wafer 20. Before cutting the semiconductor wafer 20, the metal bumps 12 are formed on the semiconductor wafer 20.

Figure 1A:
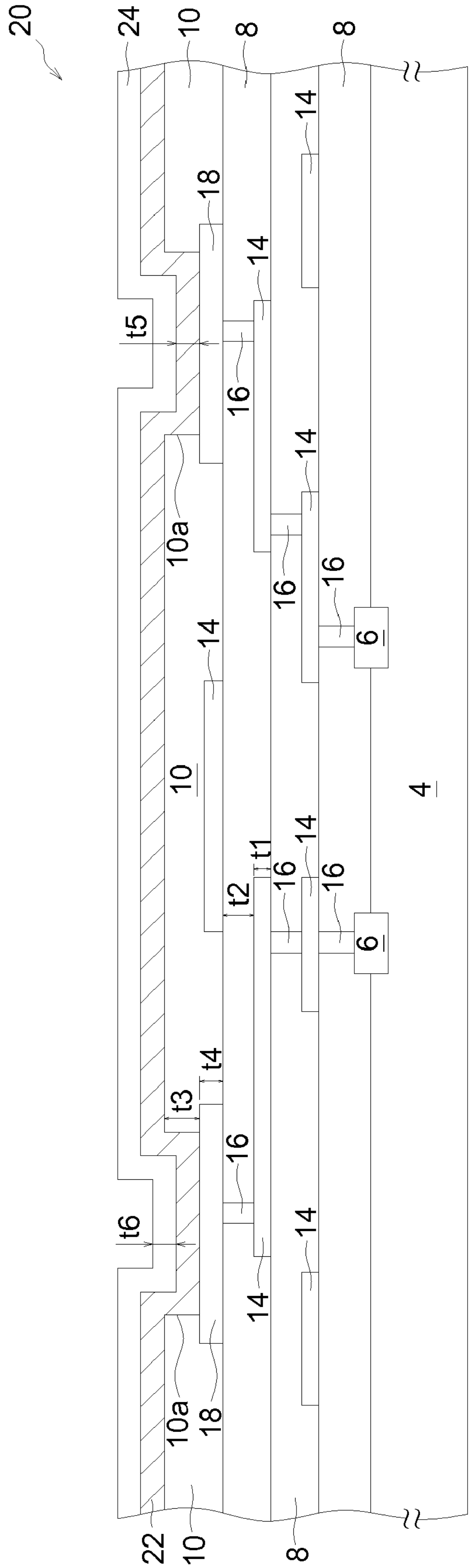
FIGS. 1*a*-1*e* are cross-sectional views showing a process for forming a semiconductor chip with metal bumps according to the present invention.

Referring to FIG. 1*a*, an adhesion/barrier layer 22 having a thickness t5 of between 0.01 and 0.7 μm, and preferably of between 0.03 and 0.7 μm, can be formed on the passivation layer 10 and on the pads 18, such as aluminum pads or copper pads, exposed by the openings 10*a*. The adhesion/barrier layer 22 can be formed by a physical vapor deposition (PVD) process, such as a sputtering process or an evaporation process. The material of the adhesion/barrier layer 22 may be titanium, a titanium-tungsten alloy, titanium nitride, chromium, tantalum, tantalum nitride or a composite of the above-mentioned materials. In a case, the adhesion/barrier layer 22 can be formed by sputtering a titanium-tungsten-alloy layer with a thickness of between 0.03 and 0.7 μm, and preferably of between 0.15 and 0.4 μm, on the passivation layer 10 and on the pads 18, such as aluminum pads or copper pads, exposed by the openings 10*a*. In another case, the adhesion/barrier layer 22 can be formed by sputtering a titanium layer with a thickness of between 0.01 and 0.7 μm, and preferably of between 0.01 and 0.15 μm, on the passivation layer 10 and on the pads 18, such as aluminum pads or copper pads, exposed by the openings 10*a*. In another case, the adhesion/barrier layer 22 can be formed by sputtering a titanium-nitride layer with a thickness of between 0.01 and 0.1 μm, and preferably of between 0.01 and 0.02 μm, on the passivation layer 10 and on the pads 18, such as aluminum pads or copper pads, exposed by the openings 10*a*. In another case, the adhesion/barrier layer 22 can be formed by sputtering a titanium layer with a thickness of between 0.01 and 0.15 μm on the passivation layer 10 and on the pads 18, such as aluminum pads or copper pads, exposed by the openings 10*a*, and then sputtering a titanium-tungsten-alloy layer with a thickness of between 0.1 and 0.35 μm on the titanium layer. The adhesion/barrier layer 22 is used to prevent the occurrence of interdiffusion between metal layers and to provide good adhesion between the metal layers.

Next, a seed layer 24 having a thickness t6 of between 0.03 and 1 μm, and preferably of between 0.05 and 0.2 μm, can be formed on the adhesion/barrier layer 22. The seed layer 24 can be formed by a physical vapor deposition (PVD) process, such as a sputtering process or an evaporation process. The seed layer 24 is beneficial to electroplating a metal layer thereon.

For example, when the adhesion/barrier layer 22 is formed by sputtering a titanium-containing layer, the seed layer 24 can be formed by sputtering a gold layer with a thickness of between 0.03 and 1 μm, and preferably of between 0.05 and 0.2 μm, on the titanium-containing layer. When the adhesion/barrier layer 22 is formed by sputtering a titanium-containing layer, the seed layer 24 can be formed by sputtering a copper layer with a thickness of between 0.03 and 1 μm, and preferably of between 0.1 and 0.5 μm, on the titanium-containing layer. The above-mentioned titanium-containing layer can be a single titanium-tungsten-alloy layer having a thickness of between 0.03 and 0.7 μm, and preferably of between 0.15 and 0.4 μm, a single titanium layer having a thickness of between 0.01 and 0.7 μm, and preferably of between 0.01 and 0.15 μm, a single titanium-nitride layer having a thickness of between 0.01 and 0.1 μm, and preferably of between 0.01 and 0.02 μm, or a composite layer comprising a titanium layer having a thickness of between 0.01 and 0.15 μm, and a titanium-tungsten-alloy layer, having a thickness of between 0.1 and 0.35 μm, on the titanium layer.

Figure 1B:
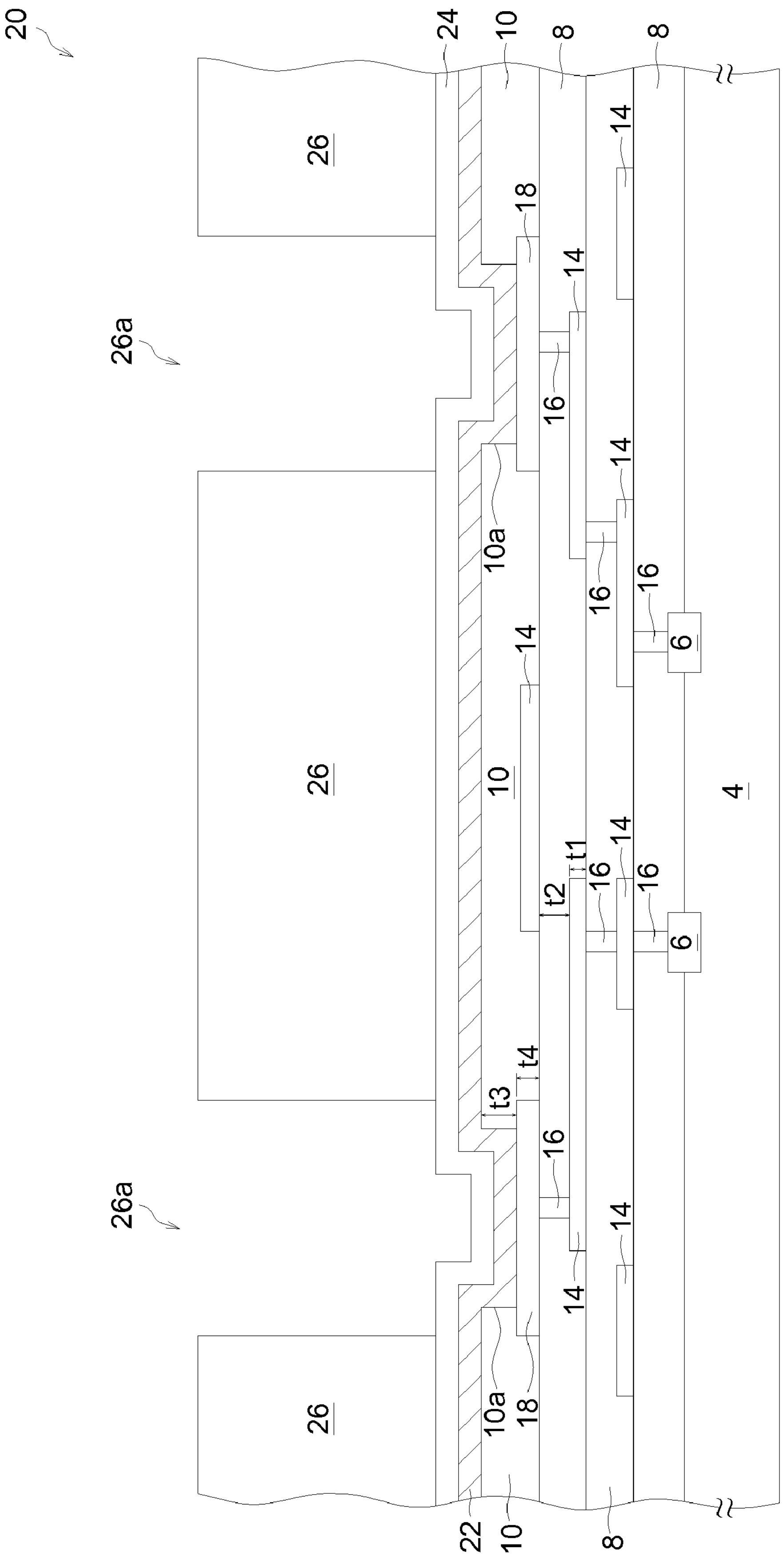

Referring to FIG. 1*b*, a photoresist layer 26, such as positive-type photoresist layer or negative-type photoresist layer, having a thickness of between 5 and 50 micrometers, and preferably of between 10 and 25 micrometers, is spin-on coated on the seed layer 24. Next, the photoresist layer 26 is patterned with the processes of exposure and development to form openings 26*a* in the photoresist layer 26 exposing the seed layer 24. A 1× stepper or 1× contact aligner can be used to expose the photoresist layer 26 during the process of exposure.

For example, the photoresist layer 26 can be formed by spin-on coating a positive-type photosensitive polymer layer having a thickness of between 5 and 50 μm, and preferably of between 15 and 20 μm, on the seed layer 24, then exposing the photosensitive polymer layer using a 1× stepper or contact aligner with at least two of G-line, H-line and I-line, wherein G-line has a wavelength ranging from 434 to 438 nm, H-line has a wavelength ranging from 403 to 407 nm, and I-line has a wavelength ranging from 363 to 367 nm, then developing the exposed polymer layer by spraying and puddling a developer on a wafer or by immersing a wafer into a developer, and then cleaning the wafer using deionized wafer and drying the wafer by sprining the wafer. After development, a scum removal process of removing the residual polymeric material or other contaminants from the seed layer 24 may be conducted by using an $O_2$ plasma or a plasma containing fluorine of below 200 PPM and oxygen. By these processes, the photoresist layer 26 can be patterned with the openings 26*a* in the photoresist layer 26 exposing the seed layer 24.

Figure 1C:
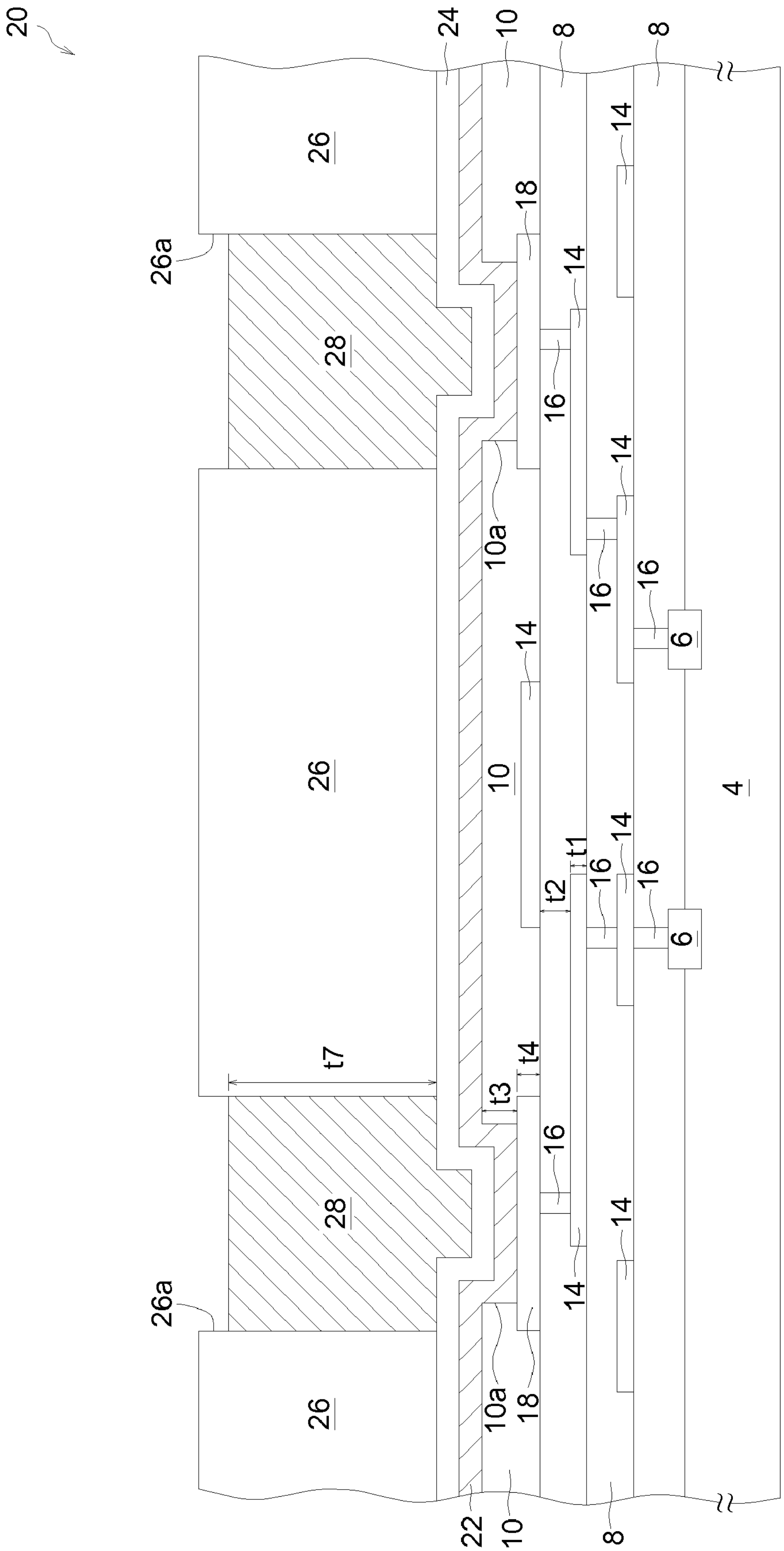

Referring to FIG. 1*c*, a metal layer 28 having a thickness t7 of between 5 and 50 micrometers, and preferably of between 10 and 25 micrometers, can be electroplated and/or electroless plated on the seed layer 24 exposed by the openings 26*a*. The material of the metal layer 28 may be gold, copper, nickel, silver, tin, palladium or a composite of the above-mentioned materials.

For example, the metal layer 28 may be formed by electroplating a gold layer with a thickness of between 5 and 50 μm, and preferably of between 10 and 25 micrometers, on the seed layer 24, made of gold, exposed by the opening 26*a* with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide. Alternatively, the metal layer 28 may be formed by electroplating a copper layer having a thickness of between 0.5 and 45 μm, and preferably of between 5 and 35 micrometers, on the seed layer 24, made of copper, exposed by the opening 26*a*, then electroplating a nickel layer having a thickness of between 0.5 and 5 μm, and preferably of between 1 and 3 micrometers, on the copper layer in the opening 26*a*, and then electroplating a gold layer having a thickness of between 0.5 and 5 μm, and preferably of between 1 and 3 micrometers, on the nickel layer in the opening 26*a* with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide. Alternatively, the metal layer 28 may be formed by electroplating a copper layer having a thickness of between 0.5 and 45 μm, and preferably of between 5 and 35 micrometers, on the seed layer 24, made of copper, exposed by the opening 26*a*, and then electroplating a gold layer having a thickness of between 0.5 and 5 μm, and preferably of between 1 and 3 micrometers, on the copper layer in the opening 26*a* with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide. Alternatively, the metal layer 28 may be formed by electroplating a nickel layer having a thickness of between 0.5 and 45 μm, and preferably of between 5 and 35 micrometers, on the seed layer 24, made of copper, exposed by the opening 26*a*, and then electroplating a gold layer having a thickness of between 0.5 and 5 μm, and preferably of between 1 and 3 micrometers, on the nickel layer in the opening 26*a* with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide.

Figure 1D:
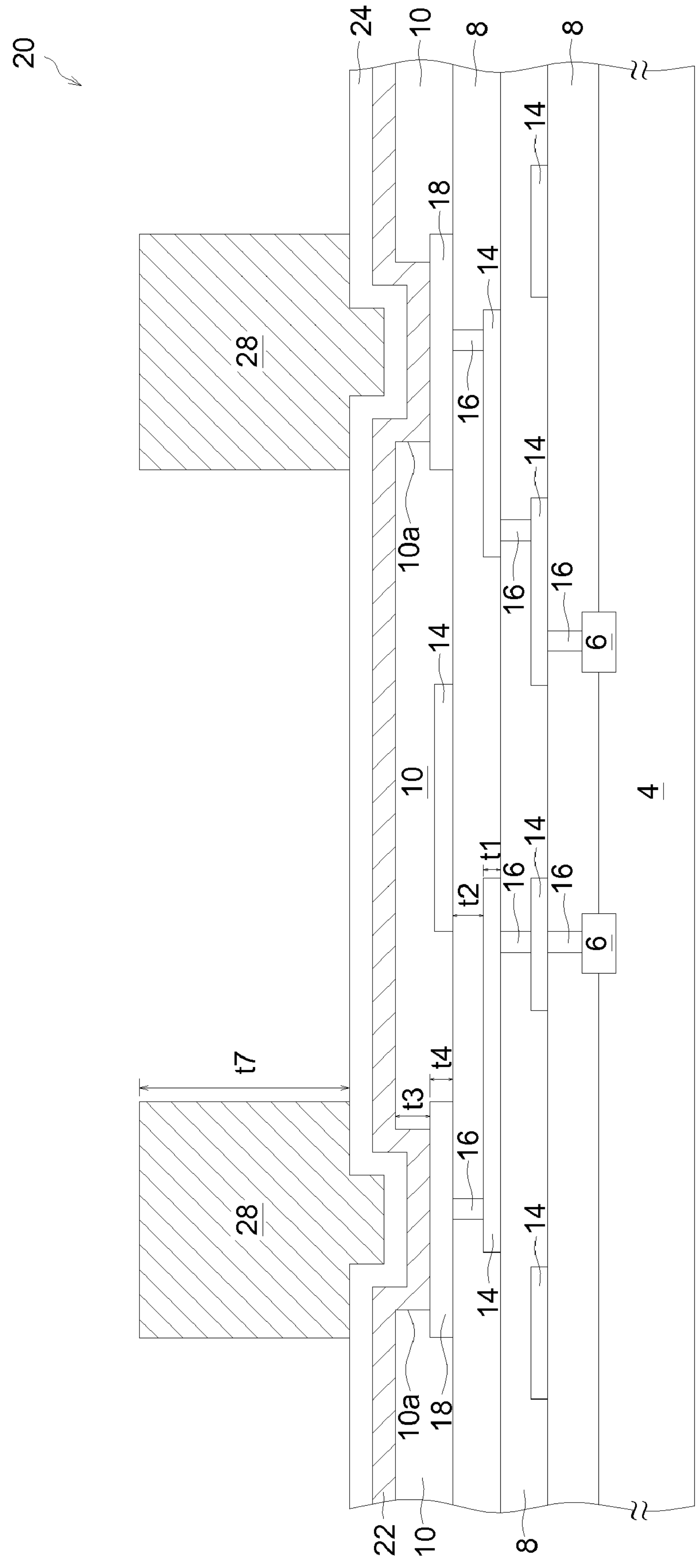

Referring to FIG. 1*d*, after the metal layer 28 is formed, most of the photoresist layer 26 can be removed using an organic solution with amide or a solution containing $H_2SO_4$ and $H_2O_2$. However, some residuals from the photoresist layer 26 could remain on the metal layer 28 and on the seed layer 24. Thereafter, the residuals can be removed from the metal layer 28 and from the seed layer 24 with a plasma, such as $O_2$ plasma or plasma containing fluorine of below 200 PPM and oxygen.

Figure 1E:
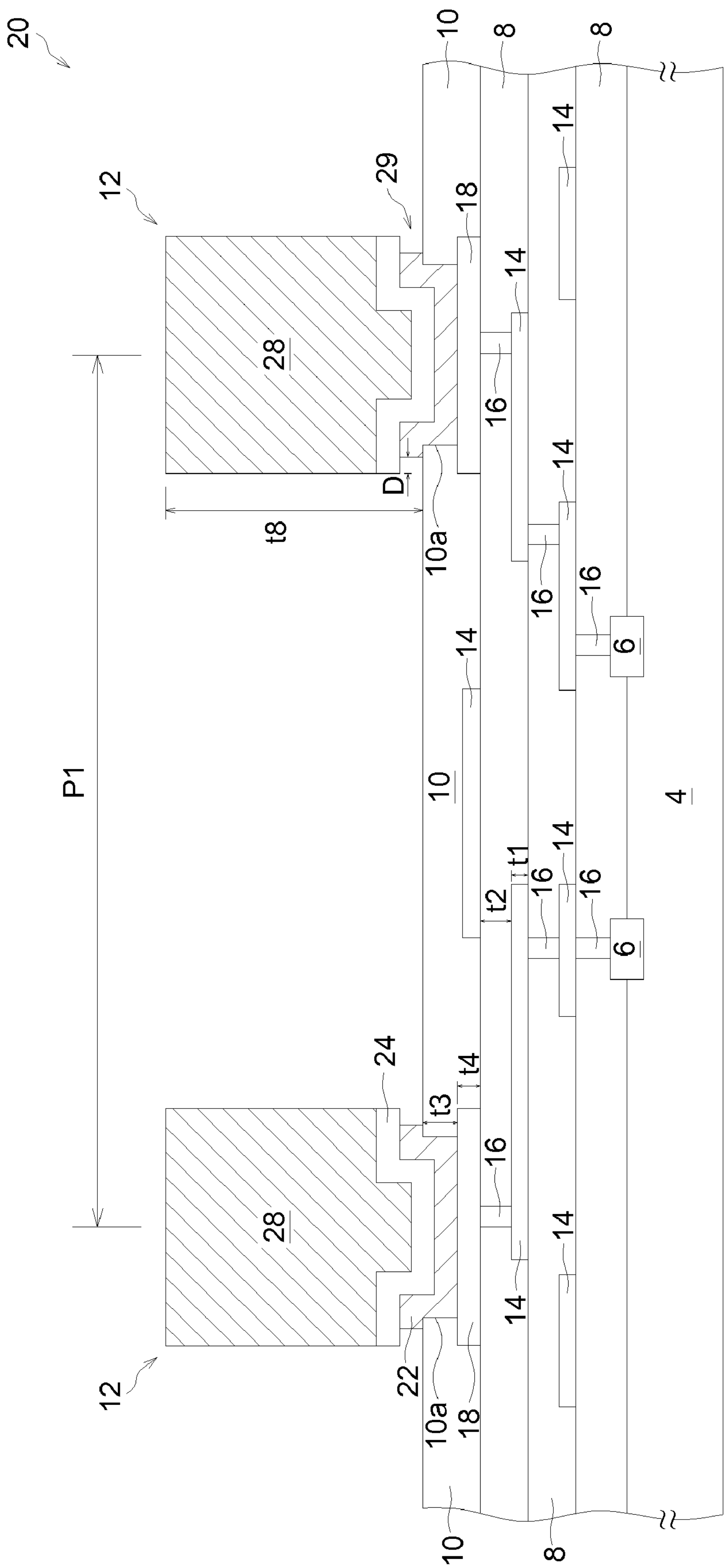

Referring to FIG. 1*e*, the seed layer 24 and the adhesion/barrier layer 22 not under the metal layer 28 are subsequently removed with a wet etching method or a dry etching method. The dry etching method may be an Ar sputtering etching process or a reactive ion etching (RIE) process. As to the wet etching method, when the seed layer 24 is a gold layer, it can be etched with an iodine-containing solution, such as solution containing potassium iodide; when the seed layer 24 a copper layer, it can be etched with a solution containing $NH_4OH$ or with a solution containing $H_2SO_4$; when the adhesion/barrier layer 22 is a titanium-tungsten-alloy layer, it can be etched with a solution containing hydrogen peroxide or with a solution containing $NH_4OH$ and hydrogen peroxide; when the adhesion/barrier layer 22 is a titanium layer, it can be etched with a solution containing hydrogen fluoride or with a solution containing $NH_4OH$ and hydrogen peroxide; when the adhesion/barrier layer 22 is a chromium layer, it can be etched with a solution containing potassium ferricyanide.

Thereby, in the present invention, the metal bumps 12 can be formed, respectively, on the pads 18, such as aluminum pads or copper pads, exposed by the openings 10*a*, and the pitch P1 between the neighboring metal bumps 12 is greater than 5 micrometers or less than 35 micrometers, such as between 15 and 35 micrometers, between 10 and 30 micrometers or between 5 and 20 micrometers. The metal bumps 12 can be formed of the adhesion/barrier layer 22 on the pads 18 and a bump metal layer (including the seed layer 24 and the metal layer 28 on the seed layer 24), having a thickness of between 5 and 30 micrometers, and preferably of between 10 and 25 micrometers, on the adhesion/barrier layer 22.

In a case, the metal bumps 12 may include a titanium-containing layer on the pads 18 exposed by the openings 10*a*, and a gold layer having a thickness of between 5 and 50 micrometers, and preferably of between 10 and 25 micrometers, on the titanium-containing layer. In another case, the metal bumps 12 may include a titanium-containing layer on the pads 18 exposed by the openings 10*a*, a copper layer having a thickness of between 0.5 and 45 micrometers, and preferably of between 5 and 35 micrometers, on the titanium-containing layer, a nickel layer having a thickness of between 0.5 and 5 micrometers, and preferably of between 1 and 3 micrometers, on the copper layer, and a gold layer having a thickness of between 0.5 and 5 micrometers, and preferably of between 1 and 3 micrometers, on the nickel layer. In another case, the metal bumps 12 may include a titanium-containing layer on the pads 18 exposed by the openings 10*a*, a copper layer having a thickness of between 0.5 and 45 micrometers, and preferably of between 5 and 35 micrometers, on the titanium-containing layer, and a gold layer having a thickness of between 0.5 and 5 micrometers, and preferably of between 1 and 3 micrometers, on the copper layer. In another case, the metal bumps 12 may include a titanium-containing layer on the pads 18 exposed by the openings 10*a*, a copper layer, formed by a sputtering process, having a thickness of between 0.03 and 1 μm, and preferably of between 0.1 and 0.5 μm, on the titanium-containing layer, a nickel layer, formed by an electroplating process, having a thickness of between 0.5 and 45 micrometers, and preferably of between 5 and 35 micrometers, on the copper layer, and a gold layer, formed by an electroplating process, having a thickness of between 0.5 and 5 micrometers, and preferably of between 1 and 3 micrometers, on the nickel layer. The above-mentioned titanium-containing layer can be a single titanium-tungsten-alloy layer having a thickness of between 0.03 and 0.7 μm, and preferably of between 0.15 and 0.4 μm, a single titanium layer having a thickness of between 0.01 and 0.7 μm, and preferably of between 0.01 and 0.15 μm, a single titanium-nitride layer having a thickness of between 0.01 and 0.1 μm, and preferably of between 0.01 and 0.02 μm, or a composite layer comprising a titanium layer having a thickness of between 0.01 and 0.15 μm on the pads 18 exposed by the openings 10*a*, and a titanium-tungsten-alloy layer having a thickness of between 0.1 and 0.35 μm on the titanium layer.

Multiple undercuts 29 may be formed under the seed layer 24 and under the metal layer 28 when the adhesion/barrier layer 22 not under the metal layer 28 is removed using a wet etching method. The adhesion/barrier layer 22 under the metal layer 28 has a first sidewall recessed from a second sidewall of the seed layer 24, wherein a distance D between the first sidewall and the second sidewall is between 0.3 and 2 micrometers.

However, the undercuts 29 could result in the dramatical drop of the contact area between the metal bump 12, especially fine pitch metal bump, and the passivation layer 10. For avoiding the undesired undercuts 29, the adhesion/barrier layer 22 not under the metal layer 28 can be alternatively removed using the above-mentioned dry etching method.

After the metal bumps 12 are formed, the semiconductor wafer 20 can be cut into the semiconductor chips 2 by a mechanical cutting process. The fine-pitched metal bumps 12 are formed on the pads 18, of each semiconductor chips 2, exposed by the openings 10*a*.

Figure 2:
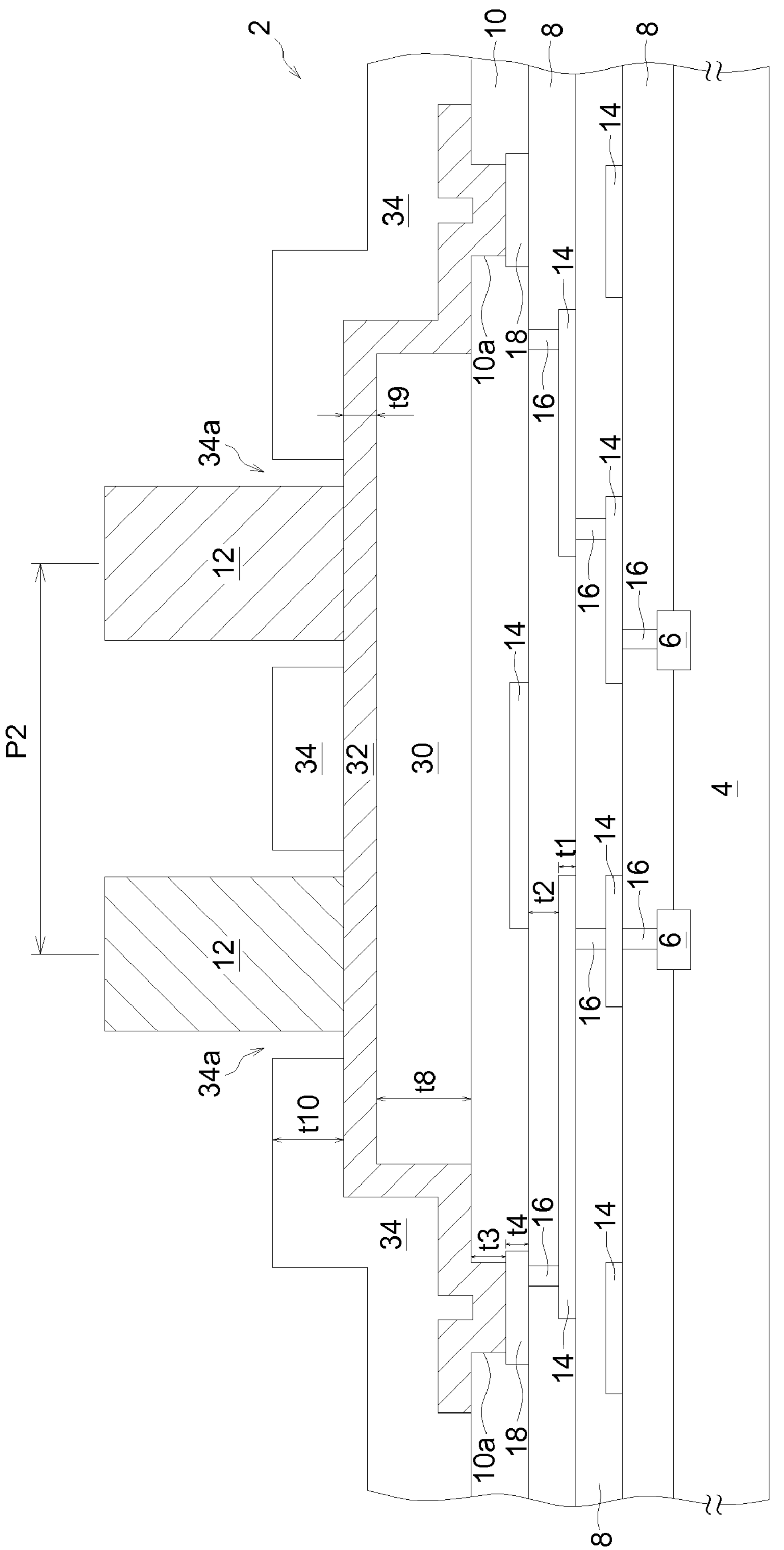

Referring to FIG. 2, alternatively, the semiconductor chip 2 cut from the semiconductor wafer includes the semiconductor substrate 4, the semiconductor devices 6, the metallization structure (including the patterned metal layers 14 and the metal plugs 16), the dielectric layers 8, the passivation layer 10, a polymer layer 30, multiple metal traces 32, the metal bumps 12 and a polymer layer 34. The specification of the semiconductor substrate 4, the semiconductor devices 6, the metallization structure (including the patterned metal layers 14 and the metal plugs 16), the dielectric layers 8 and the passivation layer 10 shown in FIG. 2 can be referred to as the specification of the semiconductor substrate 4, the semiconductor devices 6, the metallization structure (including the patterned metal layers 14 and the metal plugs 16), the dielectric layers 8 and the passivation layer 10 illustrated in FIG. 1. The process, of forming the metallization structure (including the patterned metal layers 14 and the metal plugs 16), the dielectric layers 8 and the passivation layer 10, as shown in FIG. 2 can be referred to as the process, of forming the metallization structure (including the patterned metal layers 14 and the metal plugs 16), the dielectric layers 8 and the passivation layer 10, as illustrated in FIG. 1.

The polymer layer 30 having a thickness t8 of between 3 and 25 μm can be formed on the passivation layer 10 by a process including a spin-on coating process, a lamination process or a screen-printing process. The material of the polymer layer 30 may include benzocyclobutane (BCB), polyimide (PI), polybenzoxazole (PBO) or epoxy resin.

For example, the polymer layer 30 can be formed by spin-on coating a negative-type photosensitive polyimide layer having a thickness of between 6 and 50 μm on the passivation layer 10 and on the pads 18 exposed by the openings 10*a*, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form a patterned polyimide layer on the passivation layer 10, then curing or heating the patterned polyimide layer at a peak temperature of between 180 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the upper surface of the pads 18 with an $O_2$ plasma or a plasma containing fluorine of below 200 PPM and oxygen, such that the polymer layer 30 can be formed on the passivation layer 10. For example, the patterned polyimide layer can be cured or heated at a temperature between 180 and 250° C. for a time of between 20 and 150 minutes in a nitrogen ambient or in an oxygen-free ambient. Alternatively, the patterned polyimide layer can be cured or heated at a temperature between 250 and 290° C. for a time of between 20 and 150 minutes in a nitrogen ambient or in an oxygen-free ambient. Alternatively, the patterned polyimide layer can be cured or heated at a temperature between 290 and 400° C. for a time of between 20 and 150 minutes in a nitrogen ambient or in an oxygen-free ambient. Alternatively, the patterned polyimide layer can be cured or heated at a temperature between 250 and 400° C. for a time of between 20 and 150 minutes in a nitrogen ambient or in an oxygen-free ambient.

Alternatively, the polymer layer 30 can be formed by spin-on coating a positive-type photosensitive polybenzoxazole layer having a thickness of between 3 and 25 μm on the passivation layer 10 and on the pads 18 exposed by the openings 10*a*, then baking the spin-on coated polybenzoxazole layer, then exposing the baked polybenzoxazole layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polybenzoxazole layer, then developing the exposed polybenzoxazole layer to form a patterned polybenzoxazole layer on the passivation layer 10, then curing or heating the patterned polybenzoxazole layer at a peak temperature of between 150 and 250° C., and preferably of between 180 and 250° C., for a time of between 5 and 180 minutes, and preferably of between 30 and 120 minutes, in a nitrogen ambient or in an oxygen-free ambient, the cured polybenzoxazole layer having a thickness of between 3 and 25 μm, and then removing the residual polymeric material or other contaminants from the upper surface of the pads 18 with an $O_2$ plasma or a plasma containing fluorine of below 200 PPM and oxygen, such that the polymer layer 30 can be formed on the passivation layer 10. Alternatively, the patterned polybenzoxazole layer can be cured or heated at a temperature between 200 and 400° C., and preferably of between 250 and 350° C., for a time of between 5 and 180 minutes, and preferably of between 30 and 120 minutes, in a nitrogen ambient or in an oxygen-free ambient.

Each of the metal traces 32 having a thickness t9 of between 1 and 30 micrometers, and preferably of between 5 and 20 micrometers, can be formed on the passivation layer 10, on the polymer layer 30 and on the pads 18 exposed by the openings 10*a*, wherein the metal trace 32 may connect one of the pads 18 to another one of the pads 18. The metal traces 32 may include titanium, a titanium-tungsten alloy, titanium nitride, chromium, tantalum, tantalum nitride, gold, copper, nickel or a composite of the above-mentioned materials, and the metal traces 32 may be formed by a process including a sputtering process, an electroplating process or an electroless plating process.

In a case, the metal traces 32 may include a titanium-containing layer on the pads 18 exposed by the openings 10*a*, on the passivation layer 10 and on the polymer layer 30, and a gold layer having a thickness of between 1 and 30 micrometers, and preferably of between 5 and 20 micrometers, on the titanium-containing layer. In another case, the metal traces 32 may include a titanium-containing layer on the pads 18 exposed by the openings 10*a*, on the passivation layer 10 and on the polymer layer 30, and a copper layer having a thickness of between 1 and 30 micrometers, and preferably of between 5 and 20 micrometers, on the titanium-containing layer. In another case, the metal traces 32 may include a titanium-containing layer on the pads 18 exposed by the openings 10*a*, on the passivation layer 10 and on the polymer layer 30, and a nickel layer having a thickness of between 1 and 30 micrometers, and preferably of between 5 and 20 micrometers, on the titanium-containing layer. In another case, the metal traces 32 may include a titanium-containing layer on the pads 18 exposed by the openings 10*a*, on the passivation layer 10 and on the polymer layer 30, a copper layer having a thickness of between 1 and 25 micrometers, and preferably of between 3 and 15 micrometers, on the titanium-tungsten-alloy layer, a nickel layer having a thickness of between 0.5 and 2.5 micrometers, and preferably of between 1 and 2.5 micrometers, on the copper layer, and a gold layer having a thickness of between 0.5 and 2.5 micrometers, and preferably of between 1 and 2.5 micrometers, on the nickel layer. In another case, the metal traces 32 may include a titanium-containing layer on the pads 18 exposed by the openings 10*a*, on the passivation layer 10 and on the polymer layer 30, a copper layer having a thickness of between 1 and 25 μm, and preferably of between 3 and 15 micrometers, on the titanium-containing layer, and a gold layer having a thickness of between 0.5 and 5 micrometers, and preferably of between 2 and 5 micrometers, on the copper layer. In another case, the metal traces 32 may include a titanium-containing layer on the pads 18 exposed by the openings 10*a*, on the passivation layer 10 and on the polymer layer 30, a copper layer, formed by a sputtering process, having a thickness of between 0.03 and 1 μm, and preferably of between 0.1 and 0.5 μm, on the titanium-containing layer, a nickel layer, formed by an electroplating process, having a thickness of between 0.5 and 25 micrometers, and preferably of between 3 and 15 micrometers, on the sputtered copper layer, and a gold layer, formed by an electroplating process, having a thickness of between 0.5 and 5 micrometers, and preferably of between 2 and 5 micrometers, on the nickel layer. In another case, the metal traces 32 may include a titanium-containing layer on the pads 18 exposed by the openings 10*a*, on the passivation layer 10 and on the polymer layer 30, a copper layer, formed by a sputtering process, having a thickness of between 0.03 and 1 μm, and preferably of between 0.1 and 0.5 μm, on the titanium-containing layer, and a nickel layer, formed by an electroplating process, having a thickness of between 0.5 and 25 micrometers, and preferably of between 3 and 15 micrometers, on the sputtered copper layer. The above-mentioned titanium-containing layer can be a single titanium-tungsten-alloy layer having a thickness of between 0.03 and 0.7 μm, and preferably of between 0.15 and 0.4 μm, a single titanium layer having a thickness of between 0.01 and 0.7 μm, and preferably of between 0.01 and 0.15 μm, a single titanium-nitride layer having a thickness of between 0.01 and 0.1 μm, and preferably of between 0.01 and 0.02 μm, or a composite layer comprising a titanium layer having a thickness of between 0.01 and 0.15 μm, and a titanium-tungsten-alloy layer, having a thickness of between 0.1 and 0.35 μm, on the titanium layer.

The polymer layer 34 having a thickness t10 of between 1 and 25 μm can be formed on the passivation layer 10, on the metal traces 32 and on the polymer layer 30 by a process including a spin-on coating process, a lamination process or a screen-printing process. The polymer layer 34 uncovers the metal bumps 12 on the metal traces 32, with openings 34*a* in the polymer layer 34 being over the metal traces 32 having the metal bumps 12 formed thereon. The material of the polymer layer 34 may include benzocyclobutane (BCB), polyimide (PI), polybenzoxazole (PBO) or epoxy resin.

For example, the polymer layer 34 can be formed by spin-on coating a negative-type photosensitive polyimide layer having a thickness of between 2 and 50 μm on the passivation layer 10, on the metal traces 32, on the metal bumps 12 and on the polymer layer 30, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to uncover the metal bumps 12, then curing or heating the developed polyimide layer at a peak temperature of between 180 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the upper surface of the metal bumps 12 and from the upper surface of the metal traces 32 with an $O_2$ plasma or a plasma containing fluorine of below 200 PPM and oxygen, such that the polymer layer 34 can be formed on the passivation layer 10, on the metal traces 32 and on the polymer layer 30, uncovering the metal bumps 12. For example, the developed polyimide layer can be cured or heated at a temperature between 180 and 250° C. for a time of between 20 and 150 minutes in a nitrogen ambient or in an oxygen-free ambient. Alternatively, the developed polyimide layer can be cured or heated at a temperature between 250 and 290° C. for a time of between 20 and 150 minutes in a nitrogen ambient or in an oxygen-free ambient. Alternatively, the developed polyimide layer can be cured or heated at a temperature between 290 and 400° C. for a time of between 20 and 150 minutes in a nitrogen ambient or in an oxygen-free ambient. Alternatively, the developed polyimide layer can be cured or heated at a temperature between 250 and 400° C. for a time of between 20 and 150 minutes in a nitrogen ambient or in an oxygen-free ambient.

Alternatively, the polymer layer 34 can be formed by spin-on coating a positive-type photosensitive polybenzoxazole layer having a thickness of between 3 and 25 μm on the passivation layer 10, on the metal traces 32 and on the polymer layer 30, then baking the spin-on coated polybenzoxazole layer, then exposing the baked polybenzoxazole layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polybenzoxazole layer, then developing the exposed polybenzoxazole layer to uncover the metal bumps 12, then curing or heating the developed polybenzoxazole layer at a peak temperature of between 200 and 400° C., and preferably of between 250 and 350° C., for a time of between 5 and 180 minutes, and preferably of between 30 and 120 minutes, in a nitrogen ambient or in an oxygen-free ambient, the cured polybenzoxazole layer having a thickness of between 3 and 25 μm, and then removing the residual polymeric material or other contaminants from the upper surface of the metal bumps 12 and from the upper surface of the metal traces 32 with an $O_2$ plasma or a plasma containing fluorine of below 200 PPM and oxygen, such that the polymer layer 34 can be formed on the passivation layer 10, on the metal traces 32 and on the polymer layer 30, uncovering the metal bumps 12.

The metal bumps 12 are on the metal traces 32 exposed by the openings 34*a*, and the pitch P2 between the neighboring metal bumps 12 is greater than 5 micrometers or less than 35 micrometers, such as between 15 and 35 micrometers, between 10 and 30 micrometers or between 5 and 20 micrometers. The metal bumps 12 may include titanium, a titanium-tungsten alloy, titanium nitride, chromium, tantalum, tantalum nitride, gold, copper, silver, nickel, palladium, tin or a composite of the above-mentioned materials, and the metal bumps 12 may be formed by a process including a sputtering process, an electroplating process or an electroless plating process.

For example, the specification of the metal bumps 12 shown in FIG. 2 can be referred to as the specification of the metal bumps 12 illustrated in FIG. 1 and FIGS. 1*a*-1*e*. Alternatively, the metal bumps 12 can be formed by electroplating a gold layer with a thickness of between 5 and 50 micrometers, and preferably of between 10 and 25 micrometers, directly on the gold layer of the metal traces 32, directly on the copper layer of the metal traces 32 or directly on the nickel layer of metal traces 32. Alternatively, the metal bumps 12 can be formed by electroplating a copper layer with a thickness of between 5 and 50 micrometers, and preferably of between 10 and 25 micrometers, directly on the gold layer of the metal traces 32, directly on the copper layer of the metal traces 32 or directly on the nickel layer of metal traces 32. Alternatively, the metal bumps 12 can be formed by electroplating a copper layer with a thickness of between 0.5 and 45 micrometers, and preferably of between 5 and 35 micrometers, directly on the gold layer of the metal traces 32, directly on the copper layer of the metal traces 32 or directly on the nickel layer of metal traces 32, and then electroplating a gold layer with a thickness of between 0.5 and 5 micrometers, and preferably of between 1 and 3 micrometers, on the electroplated copper layer. Alternatively, the metal bumps 12 can be formed by electroplating a copper layer with a thickness of between 0.5 and 45 micrometers, and preferably of between 5 and 35 micrometers, directly on the gold layer of the metal traces 32, directly on the copper layer of the metal traces 32 or directly on the nickel layer of metal traces 32, then electroplating a nickel layer with a thickness of between 0.5 and 5 micrometers, and preferably of between 1 and 3 micrometers, on the electroplated copper layer, and then electroplating a gold layer with a thickness of between 0.5 and 5 micrometers, and preferably of between 1 and 3 micrometers, on the electroplated nickel layer.

The above-mentioned metal bumps 12 of the semiconductor chip 2 can be joined with any one of various flexible circuit films 36, 38, 40, 42, 44, 46 and 48 as illustrated in the following embodiments.

Embodiment 1

Figure 3A:
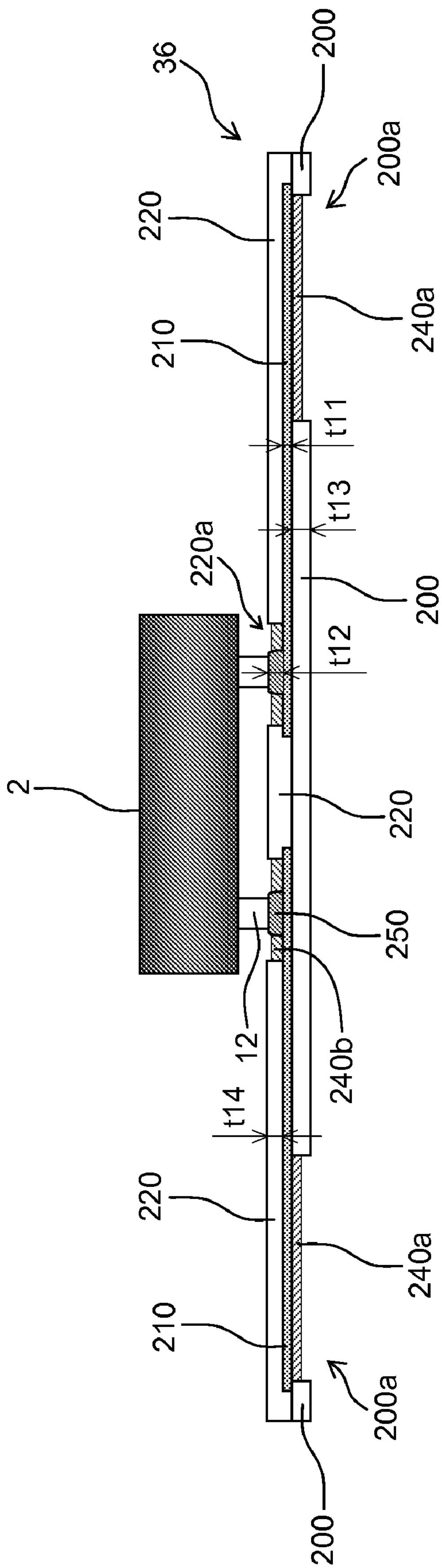
FIGS. 3A-3K are cross-sectional views showing a process for bonding a semiconductor chip with a flexible circuit film using a chip-on-film (COF) technology and joining the flexible circuit film with a rigid substrate according to one embodiment of the present invention.

FIG. 3A is a schematically cross-sectional figure showing a chip-on-film (COF) package. A flexible circuit film 36 includes a polymer layer 200, a polymer layer 220 and multiple copper traces 210 between the polymer layers 200 and 220, wherein openings 200*a* in the polymer layer 200 expose first contact points of the copper traces 210 and openings 220*a* in the polymer layer 220 expose second contact points of the copper traces 210. Each of the copper traces 210 has a thickness t11 of between 3 and 30 micrometers, of between 5 and 20 micrometers or of between 4 and 10 micrometers. Alternatively, the copper traces 210 can be replaced by gold traces having a thickness of between 3 and 30 μm, of between 5 and 20 micrometers or of between 4 and 10 micrometers. Alternatively, the copper traces 210 can be replaced by silver traces having a thickness of between 3 and 30 μm, of between 5 and 20 micrometers or of between 4 and 10 micrometers.

The polymer layer 200 has a thickness t13 of between 10 and 100 micrometers, of between 15 and 30 micrometers or of between 20 and 80 micrometers, and the material of the polymer layer 200 may be polybenzoxazole, expoxy, polyester or polyimide. The polymer layer 220 has a thickness t14 of between 5 and 30 micrometers, and preferably of between 5 and 15 micrometers, and the material of the polymer layer 220 may be polybenzoxazole, expoxy, polyester or polyimide.

The flexible circuit film 36 further comprises a wetting layer 240*a* on the first contact points of the copper traces 210 exposed by the openings 200*a*, and a wetting layer 240*b* on the second contact points of the copper traces 210 exposed by the openings 220*a* to be joined with the metal bumps 12 preformed on the metal pads 18 or on the metal traces 32 of the semiconductor chip 2 shown in FIG. 1 or 2.

The metal bumps 12 of the semiconductor chip 2 are bonded with the copper traces 210 of the flexible circuit film 36 exposed by the openings 220*a* through an interface bonding layer 250. Two methods for bonding the metal bumps 12 of the semiconductor chip 2 with the copper traces 210 of the flexible circuit film 36 are described as shown in FIG. 3B and FIG. 3C.

Figure 3B:
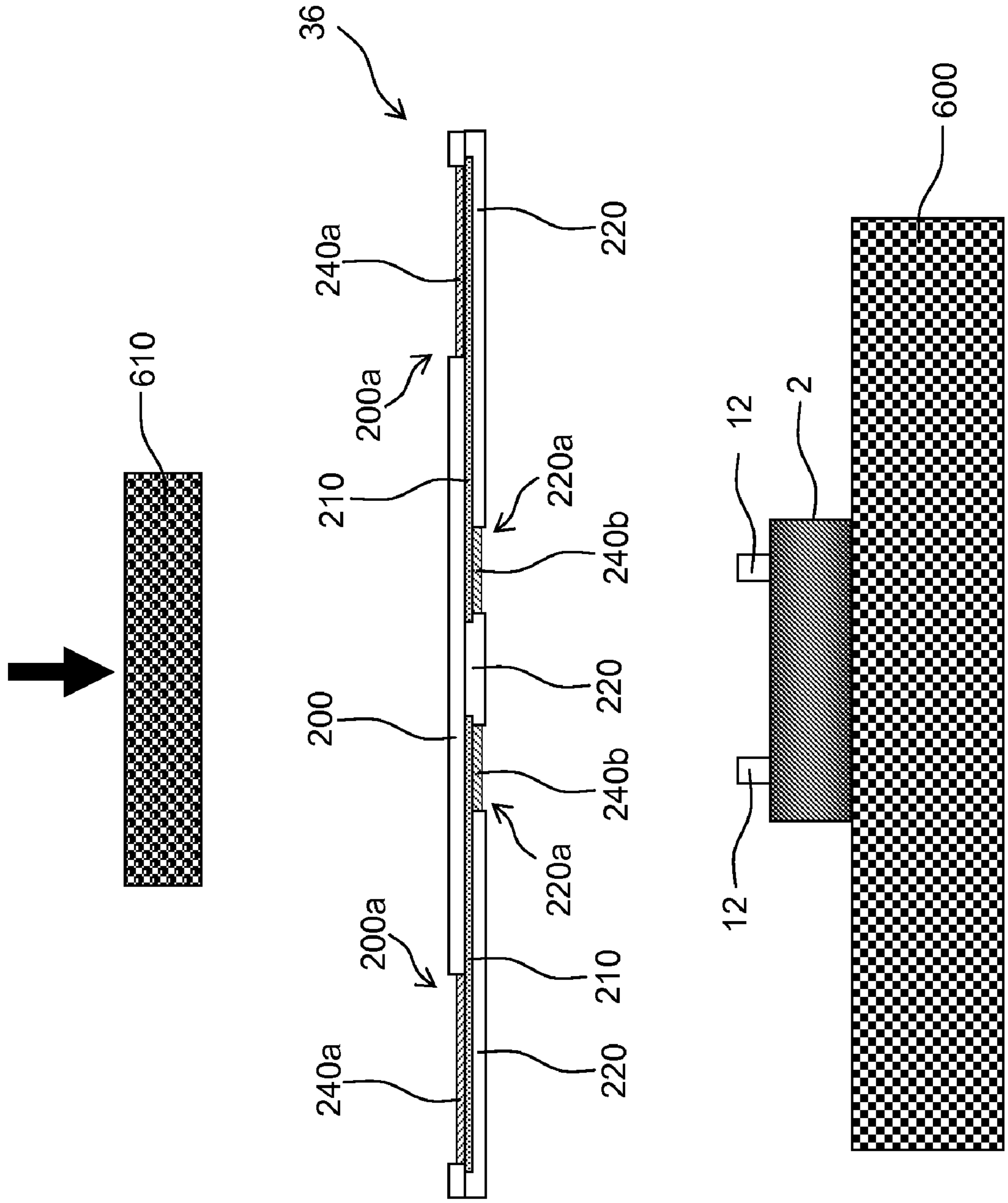
Figure 3C:
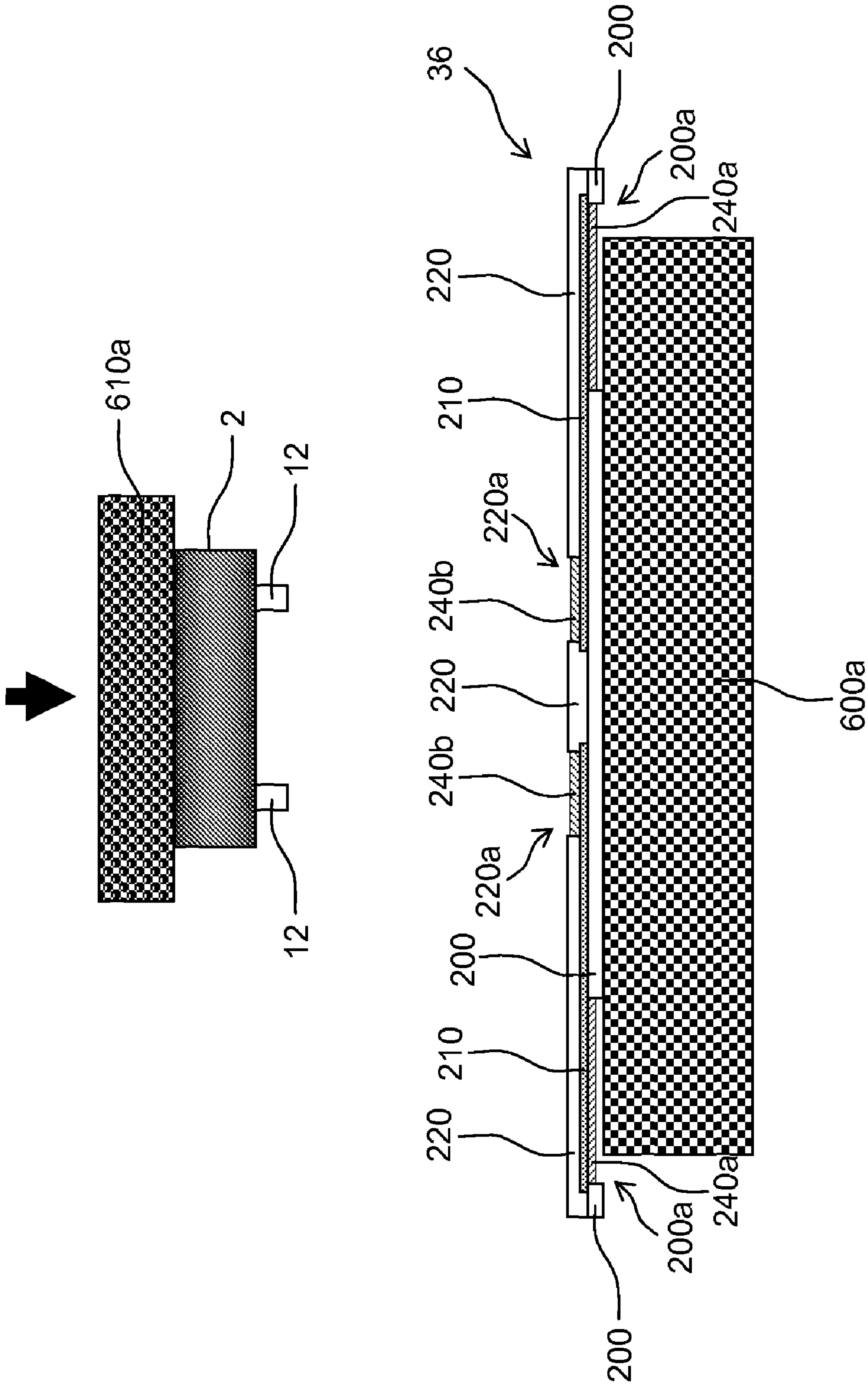

Referring to FIGS. 3B and 3C, the flexible circuit film 36 can be connected to the semiconductor chip 2. The flexible circuit film 36 has the wetting layer 240*a* to be joined with a substrate 300 shown in FIG. 3E, and the wetting layer 240*b* to be joined with the metal bumps 12 preformed on the metal pads 18 or on the metal traces 32 of the semiconductor chip 2 shown in FIG. 1 or 2. The wetting layer 240*a* having a thickness of between 0.05 and 5 micrometers, and preferably of between 0.1 and 1 micrometer, may be gold, copper, nickel, silver, palladium, tin or a composite of the above-mentioned materials. For example, the wetting layer 240*a* may be a tin-containing layer, such as pure tin, a tin-silver alloy, a tin-silver-copper alloy or a tin-lead alloy, having a thickness of between 0.05 and 5 micrometers, and preferably of between 0.1 and 1 micrometer, directly on the first contact points of the copper traces 210. Alternatively, the wetting layer 240*a* may be a gold layer having a thickness of between 0.05 and 5 micrometers, and preferably of between 0.1 and 1 micrometer, directly on the first contact points of the copper traces 210; optionally, a nickel layer having a thickness between 0.05 and 1 micrometer may be between the copper traces 210 and the gold layer. The wetting layer 240*b* having a thickness of between 0.05 and 2 micrometers, and preferably of between 0.1 and 1 micrometer, may be gold, copper, nickel, silver, palladium, tin or a composite of the above-mentioned materials. For example, the wetting layer 240*b* may be a tin-containing layer, such as pure tin, a tin-silver alloy, a tin-silver-copper alloy or a tin-lead alloy, having a thickness of between 0.05 and 2 micrometers, and preferably of between 0.1 and 1 micrometer, directly on the second contact points of the copper traces 210. Alternatively, the wetting layer 240*b* may be a gold layer having a thickness of between 0.05 and 2 micrometers, and preferably of between 0.1 and 1 micrometer, directly on the second contact points of the copper traces 210; optionally, a nickel layer having a thickness between 0.05 and 1 micrometer may be between the copper traces 210 and the gold layer.

In a first case, referring to FIG. 3B, the metal bumps 12 have the above-mentioned gold layer, at the tips of the metal bumps 12, capable of being used to be joined with the wetting layer 240*b* of pure tin or an above-mentioned tin alloy using gang bonding, which process is described as below. First, the semiconductor chip 2 is held by vacuum adsorption on a stage 600 kept at a temperature of between 250 and 500° C., and preferably of between 350 and 450° C. Next, the flexible circuit film 36 is thermally pressed on the metal bumps 12 of the semiconductor chip 2 at a force of between 20 and 150N, and preferably of between 50 and 90N, for a time of between 0.1 and 10 seconds, and preferably of between 0.5 and 3 seconds, by a tool head 610 kept at a temperature of between 150 and 450° C., and preferably of between 250 and 400° C., optionally applying ultrasonic waves to the metal bumps 12 and to the wetting layer 240*b* of the flexible circuit film 36, to join the wetting layer 240*b* with the metal bumps 12. Referring to FIGS. 3A and 3B, in the step of joining the wetting layer 240*b* with the metal bumps 12, the interface bonding layer 250, such as a metal alloy, may be formed between the metal bumps 12 and the copper traces 210. The interface bonding layer 250 has a thickness t12 of between 0.2 and 10 micrometers, and preferably of between 0.4 and 5 micrometers. When the wetting layer 240*b* before bonded with the gold layer of the metal bumps 12 is pure tin, the interface bonding layer 250 is a tin-gold alloy having a thickness of between 0.2 and 10 micrometers or of between 0.4 and 5 micrometers, wherein an atomic ratio of tin to gold in the tin-gold alloy is between 0.2 and 0.3. When the wetting layer 240*b* before bonded with the gold layer of the metal bumps 12 is a tin-silver-copper alloy, the interface bonding layer 250 is a tin-silver-gold-copper alloy having a thickness of between 0.2 and 10 micrometers or of between 0.4 and 5 micrometers. When the wetting layer 240*b* before bonded with the gold layer of the metal bumps 12 is a tin-silver alloy, the interface bonding layer 250 is a tin-silver-gold alloy having a thickness of between 0.2 and 10 micrometers or of between 0.4 and 5 micrometers. When the wetting layer 240*b* before bonded with the gold layer of the metal bumps 12 is a tin-lead alloy, the interface bonding layer 250 is a tin-lead-gold alloy having a thickness of between 0.2 and 10 micrometers or of between 0.4 and 5 micrometers. Next, the tool head 610 is removed from the flexible circuit film 36. Next, the semiconductor chip 2 bonded with the flexible circuit film 36 is removed from the stage 600.

The metal bumps 12 bonded with the copper traces 210 of the flexible circuit film 36 have a thickness of between 5 and 50 micrometers, and preferably of between 10 and 25 micrometers. For example, the metal bumps 12 between the semiconductor chip 2 and the interface bonding layer 250 may include a titanium-containing layer on the pads 18 exposed by the openings 10*a*, and a gold layer having a thickness of between 5 and 50 micrometers, and preferably of between 10 and 25 micrometers, on the titanium-containing layer and between the titanium-containing layer and the interface bonding layer 250. Alternatively, the metal bumps 12 between the semiconductor chip 2 and the interface bonding layer 250 may include a titanium-containing layer on the pads 18 exposed by the openings 10*a*, and a copper layer having a thickness of between 5 and 50 micrometers, and preferably of between 10 and 25 micrometers, on the titanium-containing layer and between the titanium-containing layer and the interface bonding layer 250. Alternatively, the metal bumps 12 between the semiconductor chip 2 and the interface bonding layer 250 may include a titanium-containing layer on the pads 18 exposed by the openings 10*a*, a copper layer having a thickness of between 0.5 and 45 micrometers, and preferably of between 5 and 35 micrometers, on the titanium-containing layer and between the titanium-containing layer and the interface bonding layer 250, a nickel layer having a thickness of between 0.5 and 5 micrometers, and preferably of between 1 and 3 micrometers, on the copper layer and between the copper layer and the interface bonding layer 250, and a gold layer having a thickness of between 0.5 and 5 micrometers, and preferably of between 1 and 3 micrometers, on the nickel layer and between the nickel layer and the interface bonding layer 250. Alternatively, the metal bumps 12 between the semiconductor chip 2 and the interface bonding layer 250 may include a titanium-containing layer on the pads 18 exposed by the openings 10*a*, a copper layer having a thickness of between 0.5 and 45 micrometers, and preferably of between 5 and 35 micrometers, on the titanium-containing layer and between the titanium-containing layer and the interface bonding layer 250, and a nickel layer having a thickness of between 0.5 and 5 micrometers, and preferably of between 1 and 3 micrometers, on the copper layer and between the copper layer and the interface bonding layer 250. Alternatively, the metal bumps 12 between the semiconductor chip 2 and the interface bonding layer 250 may include a titanium-containing layer on the pads 18 exposed by the openings 10*a*, a copper layer having a thickness of between 0.5 and 45 micrometers, and preferably of between 5 and 35 micrometers, on the titanium-containing layer and between the titanium-containing layer and the interface bonding layer 250, and a gold layer having a thickness of between 0.5 and 5 micrometers, and preferably of between 1 and 3 micrometers, on the copper layer and between the copper layer and the interface bonding layer 250. Alternatively, the metal bumps 12 between the semiconductor chip 2 and the interface bonding layer 250 may include a titanium-containing layer on the pads 18 exposed by the openings 10*a*, a copper layer, formed by a sputtering process, having a thickness of between 0.03 and 1 μm, and preferably of between 0.1 and 0.5 μm, on the titanium-containing layer and between the titanium-containing layer and the interface bonding layer 250, a nickel layer, formed by an electroplating process, having a thickness of between 0.5 and 45 micrometers, and preferably of between 5 and 35 micrometers, on the sputtered copper layer and between the sputtered copper layer and the interface bonding layer 250, and a gold layer, formed by an electroplating process, having a thickness of between 0.5 and 5 micrometers, and preferably of between 1 and 3 micrometers, on the nickel layer and between the nickel layer and the interface bonding layer 250. Alternatively, the metal bumps 12 between the semiconductor chip 2 and the interface bonding layer 250 may include a titanium-containing layer on the pads 18 exposed by the openings 10*a*, a copper layer, formed by a sputtering process, having a thickness of between 0.03 and 1 μm, and preferably of between 0.1 and 0.5 μm, on the titanium-containing layer and between the titanium-containing layer and the interface bonding layer 250, and a nickel layer, formed by an electroplating process, having a thickness of between 0.5 and 45 micrometers, and preferably of between 5 and 35 micrometers, on the sputtered copper layer and between the sputtered copper layer and the interface bonding layer 250. The above-mentioned titanium-containing layer can be a single titanium-tungsten-alloy layer having a thickness of between 0.03 and 0.7 μm, and preferably of between 0.15 and 0.4 μm, a single titanium layer having a thickness of between 0.01 and 0.7 μm, and preferably of between 0.01 and 0.15 μm, a single titanium-nitride layer having a thickness of between 0.01 and 0.1 μm, and preferably of between 0.01 and 0.02 μm, or a composite layer comprising a titanium layer having a thickness of between 0.01 and 0.15 μm, and a titanium-tungsten-alloy layer, having a thickness of between 0.1 and 0.35 μm, on the titanium layer.

In a second case, referring to FIG. 3B, the metal bumps 12 have the above-mentioned gold layer, at the tips of the metal bumps 12, capable of being used to be joined with a gold layer of the wetting layer 240*b* using gang bonding, which process is described as below. First, the semiconductor chip 2 is held by vacuum adsorption on the stage 600 kept at a temperature of between 250 and 500° C., and preferably of between 350 and 450° C. Next, the flexible circuit film 36 is thermally pressed on the metal bumps 12 of the semiconductor chip 2 at a force of between 20 and 150N, and preferably of between 70 and 120N, for a time of between 0.1 and 10 seconds, and preferably of between 0.5 and 3 seconds, by the tool head 610 kept at a temperature of between 150 and 450° C., and preferably of between 250 and 400° C., optionally applying ultrasonic waves to the metal bumps 12 and to the wetting layer 240*b* of the flexible circuit film 36, to join the gold layer of the wetting layer 240*b* with the above-mentioned gold layer of the metal bumps 12. Next, the tool head 610 is removed from the flexible circuit film 36. Next, the semiconductor chip 2 bonded with the flexible circuit film 36 is removed from the stage 600.

Thereby, the pads 18 of the semiconductor chip 2 can be connected to the copper traces 210 of the flexible circuit film 36 through gold joints formed by joining the gold layer of the wetting layer 240*b* with the above-mentioned gold layer of the metal bumps 12. For example, the metal bumps 12 between the semiconductor chip 2 and the copper traces 210 may include a titanium-containing layer on the pads 18 exposed by the openings 10*a*, and a gold joint having a thickness of between 5 and 50 micrometers, and preferably of between 10 and 25 micrometers on the titanium-containing layer and between the titanium-containing layer and the copper traces 210. Alternatively, the metal bumps 12 between the semiconductor chip 2 and the copper traces 210 may include a titanium-containing layer on the pads 18 exposed by the openings 10*a*, a copper layer having a thickness of between 0.5 and 45 micrometers, and preferably of between 5 and 35 micrometers, on the titanium-containing layer and between the titanium-containing layer and the copper traces 210, a nickel layer having a thickness of between 0.5 and 5 micrometers, and preferably of between 1 and 3 micrometers, on the copper layer and between the copper layer and the copper traces 210, and a gold joint having a thickness of between 0.5 and 5 micrometers, and preferably of between 1 and 3 micrometers, on the nickel layer and between the nickel layer and the copper traces 210. Alternatively, the metal bumps 12 between the semiconductor chip 2 and the copper traces 210 may include a titanium-containing layer on the pads 18 exposed by the openings 10*a*, a copper layer having a thickness of between 0.5 and 45 micrometers, and preferably of between 5 and 35 μm, on the titanium-containing layer and between the titanium-containing layer and the copper traces 210, and a gold joint having a thickness of between 0.5 and 5 micrometers, and preferably of between 1 and 3 micrometers, on the copper layer and between the copper layer and the copper traces 210. Alternatively, the metal bumps 12 between the semiconductor chip 2 and the copper traces 210 may include a titanium-containing layer on the pads 18 exposed by the openings 10*a*, a copper layer, formed by a sputtering process, having a thickness of between 0.03 and 1 μm, and preferably of between 0.1 and 0.5 μm, on the titanium-containing layer and between the titanium-containing layer and the copper traces 210, a nickel layer, formed by an electroplating process, having a thickness of between 0.5 and 45 micrometers, and preferably of between 5 and 35 micrometers, on the sputtered copper layer and between the sputtered copper layer and the copper traces 210, and a gold joint having a thickness of between 0.5 and 5 micrometers, and preferably of between 1 and 3 micrometers, on the nickel layer and between the nickel layer and the copper traces 210. The above-mentioned titanium-containing layer can be a single titanium-tungsten-alloy layer having a thickness of between 0.03 and 0.7 μm, and preferably of between 0.15 and 0.4 μm, a single titanium layer having a thickness of between 0.01 and 0.7 μm, and preferably of between 0.01 and 0.15 μm, a single titanium-nitride layer having a thickness of between 0.01 and 0.1 μm, and preferably of between 0.01 and 0.02 μm, or a composite layer comprising a titanium layer having a thickness of between 0.01 and 0.15 μm, and a titanium-tungsten-alloy layer, having a thickness of between 0.1 and 0.35 μm, on the titanium layer.

In a first case, referring to FIG. 3C, the metal bumps 12 have the above-mentioned gold layer, at the tips of the metal bumps 12, capable of being used to be joined with the wetting layer 240*b* of pure tin or an above-mentioned tin alloy using flip-chip bonding, which process is described as below. First, the flexible circuit film 36 is placed on a stage 600*a* kept at a temperature of between 150 and 450° C., and preferably of between 250 and 400° C., and the semiconductor chip 2 is held by vacuum adsorption on a tool head 610*a* kept at a temperature of between 250 and 500° C., of between 350 and 450° C. or of between 100 and 500° C. Next, the semiconductor chip 2 is thermally pressed on the wetting layer 240*b* of the flexible circuit film 36 at a force of between 20 and 150N, and preferably of between 50 and 90N, for a time of between 0.1 and 10 seconds, and preferably of between 0.5 and 3 seconds, by the tool head 610*a* kept at a temperature of between 250 and 500° C., of between 350 and 450° C. or of between 100 and 500° C., optionally applying ultrasonic waves to the metal bumps 12 and to the wetting layer 240*b* of the flexible circuit film 36, to join the metal bumps 12 with the wetting layer 240*b*. Referring to FIGS. 3A and 3C, in the step of joining the metal bumps 12 with the wetting layer 240*b*, the interface bonding layer 250, such as a metal alloy, may be formed between the metal bumps 12 and the copper traces 210. The specification of the interface bonding layer 250 formed in the process as illustrated in the first case shown in FIG. 3C can be referred to as the specification of the interface bonding layer 250 formed in the process as illustrated in the first case shown in FIGS. 3A and 3B. Next, the tool head 610*a* is removed from the semiconductor chip 2. Next, the flexible circuit film 36 bonded with the semiconductor chip 2 is removed from the stage 600*a*. The specification of the metal bumps 12, between the semiconductor chip 2 and the interface bonding layer 250, formed in the process as illustrated in the first case shown in FIG. 3C can be referred to as the specification of the metal bumps 12, between the semiconductor chip 2 and the interface bonding layer 250, formed in the process as illustrated in the first case shown in FIGS. 3A and 3B.

In a second case, referring to FIG. 3C, the metal bumps 12 have the above-mentioned gold layer, at the tips of the metal bumps 12, capable of being used to be joined with a gold layer of the wetting layer 240*b* using flip-chip bonding, which process is described as below. First, the flexible circuit film 36 is placed on the stage 600*a* kept at a temperature of between 150 and 450° C., and preferably of between 250 and 400° C., and the semiconductor chip 2 is held by vacuum adsorption on the tool head 610*a* kept at a temperature of between 250 and 500° C., of between 350 and 450° C. or of between 100 and 500° C. Next, the semiconductor chip 2 is thermally pressed on the wetting layer 240*b* of the flexible circuit film 36 at a force of between 20 and 150N, and preferably of between 70 and 120N, for a time of between 0.1 and 10 seconds, and preferably of between 0.5 and 3 seconds, by the tool head 610*a* kept at a temperature of between 250 and 500° C., of between 350 and 450° C. or of between 100 and 500° C., optionally applying ultrasonic waves to the metal bumps 12 and to the wetting layer 240*b* of the flexible circuit film 36, to join the above-mentioned gold layer of the metal bumps 12 with the gold layer of the wetting layer 240*b*. Next, the tool head 610*a* is removed from the semiconductor chip 2. Next, the flexible circuit film 36 bonded with the semiconductor chip 2 is removed from the stage 600*a*. Thereby, the pads 18 of the semiconductor chip 2 can be connected to the copper traces 210 of the flexible circuit film 36 through gold joints formed by joining the above-mentioned gold layer of the metal bumps 12 with the gold layer of the wetting layer 240*b*. The specification of the metal bumps 12, between the semiconductor chip 2 and the flexible circuit film 36, formed in the process as illustrated in the second case shown in FIG. 3C can be referred to as the specification of the metal bumps 12, between the semiconductor chip 2 and the copper traces 210, formed in the process as illustrated in the second case shown in FIG. 3B.

Figure 3D:
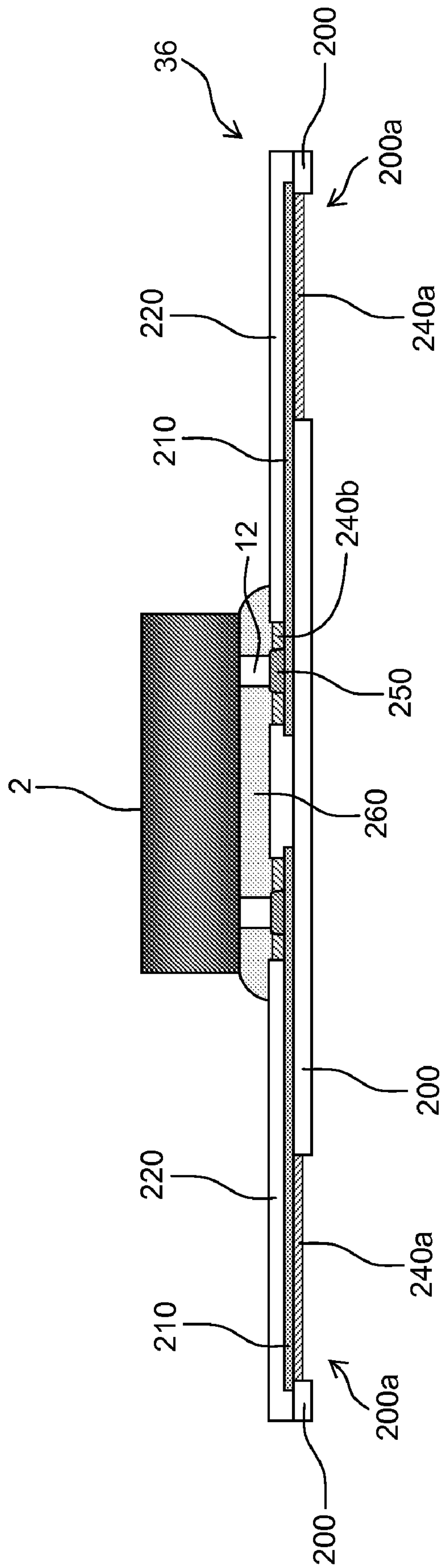

Referring to FIG. 3D, a polymer layer 260 is filled into the gap between the semiconductor chip 2 and the flexible circuit film 36, enclosing the metal bumps 12, by dispensing a polymer on the flexible circuit film 36 close to the semiconductor chip 2, with the polymer flowing into the gap between the semiconductor chip 2 and the flexible circuit film 36, and then curing the flowing polymer at a temperature of between 100 and 250° C. The material of the polymer layer 260 may be expoxy, polyester, polybenzoxazole or polyimide.

Figure 3E:
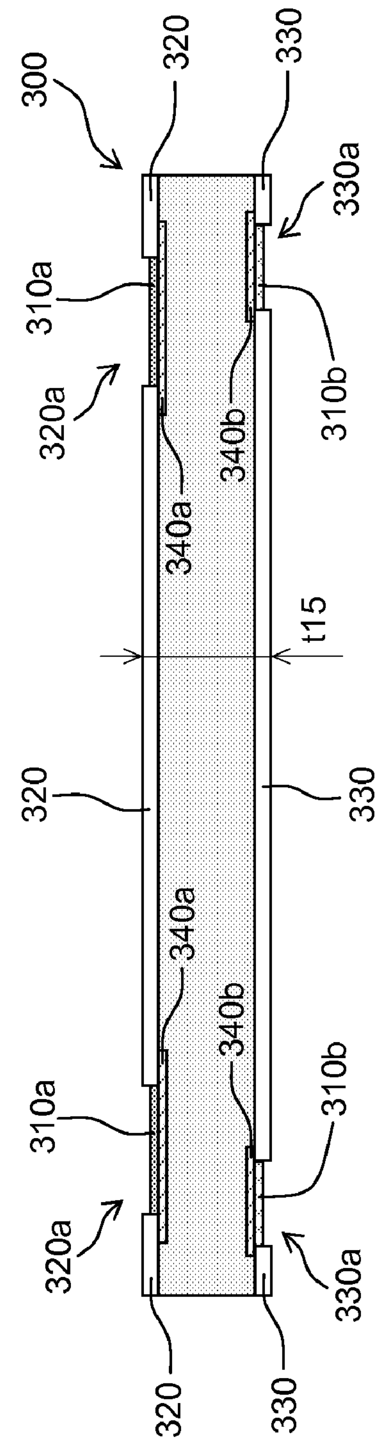

Referring to FIG. 3E, a substrate 300 comprises a circuit structure in the substrate 300, an insulating layer 320, an insulating layer 330, metal pads 310*a* and metal pads 310*b*. The circuit structure comprises copper traces (including 340*a* and 340*b*) each having a thickness between 5 and 30 micrometers. Openings 320*a* in the insulating layer 320 expose the topmost copper traces 340*a* and openings 330*a* in the insulating layer 330 expose the bottommost copper traces 340*b*. The metal pads 310*a* are on the topmost copper traces 340*a* exposed by the openings 320*a*, and the metal pads 310*b* are on the bottommost copper traces 340*b* exposed by the openings 330*a*. The metal pads 310*a* are connected to the metal pads 310*b* through the copper traces (comprising the copper traces 340*a* and 340*b*) in the substrate 300.

Each of the insulating layers 320 and 330 has a thickness of between 5 and 40 micrometers, of between 5 and 10 micrometers or of between 10 and 20 micrometers, and may comprise epoxy, polyester, polybenzoxazole or polyimide. Each of the metal pads 310*a* and 310*b* has a thickness of between 0.1 and 3 micrometers, and may be gold, copper, silver, nickel, tin, palladium or a composite of the above-mentioned materials. For example, the metal pads 310*a* can be formed by electroless plating a nickel layer having a thickness of between 0.05 and 1 μm on the topmost copper traces 340*a* exposed by the openings 320*a*, and electroless plating a gold layer having a thickness of between 0.05 and 2 micrometers, and preferably of between 0.05 and 0.3 micrometers, on the nickel layer in the openings 320*a*. Alternatively, the metal pads 310*a* can be formed by electroless plating a nickel layer having a thickness of between 0.05 and 1 μm on the topmost copper traces 340*a* exposed by the openings 320*a*, and electroless plating a tin layer having a thickness of between 0.05 and 2 micrometers, and preferably of between 0.05 and 0.3 micrometers, on the nickel layer in the openings 320*a*. Alternatively, the metal pads 310*a* can be formed by electroless plating a gold layer having a thickness of between 0.05 and 2 micrometers, and preferably of between 0.05 and 0.3 micrometers, on the topmost copper traces 340*a* exposed by the openings 320*a*. For example, the metal pads 310*b* can be formed by electroless plating a nickel layer having a thickness of between 0.05 and 1 μm on the bottommost copper traces 340*b* exposed by the openings 330*a*, and electroless plating a gold layer having a thickness of between 0.05 and 2 micrometers, and preferably of between 0.05 and 0.3 micrometers, on the nickel layer in the openings 330*a*. Alternatively, the metal pads 310*b* can be formed by electroless plating a nickel layer having a thickness of between 0.05 and 1 μm on the bottommost copper traces 340*b* exposed by the openings 330*a*, and electroless plating a tin layer having a thickness of between 0.05 and 2 micrometers, and preferably of between 0.05 and 0.3 micrometers, on the nickel layer in the openings 330*a*. Alternatively, the metal pads 310*b* can be formed by electroless plating a gold layer having a thickness of between 0.05 and 2 micrometers, and preferably of between 0.05 and 0.3 micrometers, on the bottommost copper traces 340*b* exposed by the openings 330*a*.

In a case, the substrate 300 may comprise a core layer, such as a glass fiber reinforced epoxy with a thickness of between 200 and 2,000 μm, multiple copper circuit layers respectively over and under the core layer, and multiple polymer layers between the neighboring copper circuit layers. The copper circuit layers provide the circuit structure in the substrate 300. The metal pads 310*a* and 310*b* are respectively on the copper traces 340*a* of the topmost copper circuit layer and on the copper traces 340*b* of the bottommost copper circuit layer.

In another case, the substrate 300 may comprise multiple copper circuit layers and multiple ceramic layers between the neighboring copper circuit layers. The copper circuit layers provide the circuit structure in the substrate 300. The metal pads 310*a* and 310*b* are respectively on the copper traces 340*a* of the topmost copper circuit layer and on the copper traces 340*b* of the bottommost copper circuit layer.

The substrate 300 may be a ball grid array (BGA) substrate with a thickness t15 of between 200 and 2,000 μm. Alternatively, the substrate 300 may be a glass fiber reinforced epoxy based substrate with a thickness t15 of between 200 and 2,000 μm. Alternatively, the substrate 300 may be a silicon substrate with a thickness t5 of between 200 and 2,000 μm. Alternatively, the substrate 300 may be a ceramic substrate with a thickness t15 of between 200 and 2,000 μm. Alternatively, the substrate 300 may be an organic substrate with a thickness t15 of between 200 and 2,000 μm.

Figure 3F:
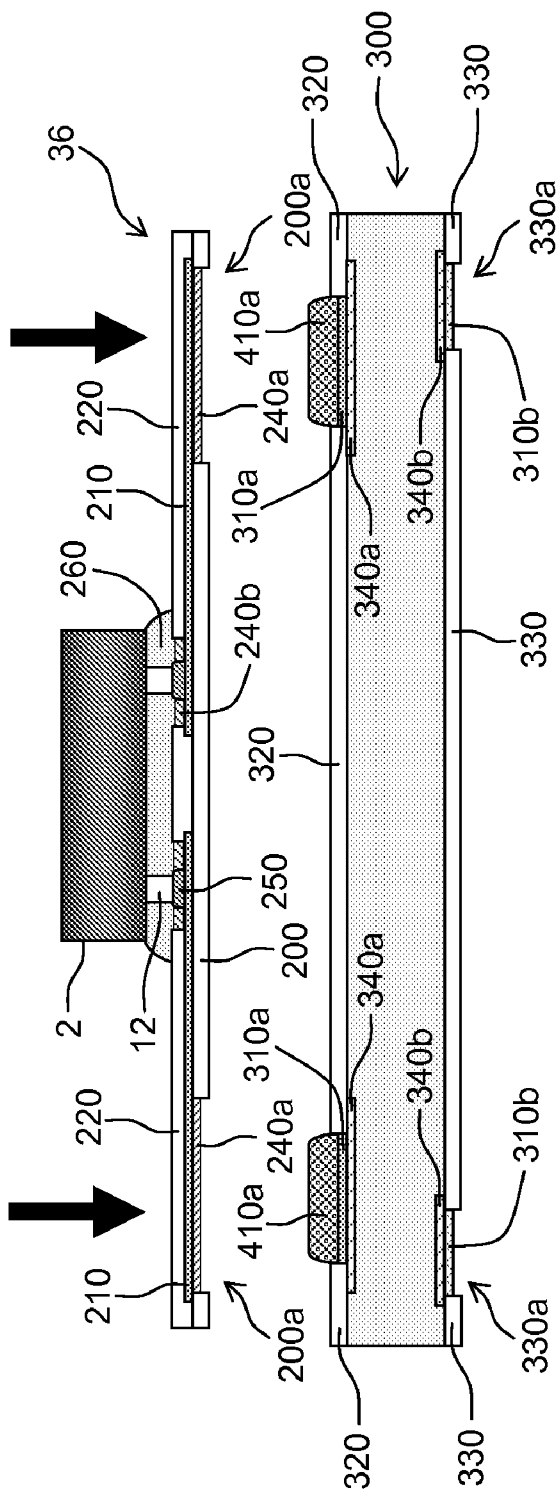

Referring to FIG. 3F, metal joints 410*a*, such as tin-containing joints, are formed on the metal pads 310*a* by screen printing a solder paste containing flux and solder, such as pure tin, a tin-silver alloy, a tin-silver-copper alloy or a tin-lead alloy, on the metal pads 310*a* and then reflowing the solder paste. The metal joints 410*a* may be formed of pure tin, a tin-silver alloy, a tin-silver-copper alloy or a tin-lead alloy. Two methods of bonding the flexible circuit film 36 with the substrate 300 are described as follow.

In a first case, referring to FIGS. 3F and 3G, when the metal joints 410*a* are tin-containing joints, the metal joints 410*a* can be used to be joined with the wetting layer 240*a* of pure tin or an above-mentioned tin alloy using a heat press process, which method is described as below. First, the substrate 300 is placed on a stage kept at a temperature of between 150 and 350° C., and preferably of between 200 and 300° C. Next, the flexible circuit film 36 is thermally pressed on the metal joints 410*a* on the metal pads 310*a* of the substrate 300 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*a* with the metal joints 410*a*. In the step of joining the wetting layer 240*a* with the metal joints 410*a*, metal joints 410*b* can be formed between the first contact points of the copper traces 210 and the topmost copper traces 340*a* of the substrate 300. The metal joints 410*b* can be tin-containing joints having a thickness t16 of between 20 and 150 micrometers or of between 15 and 50 micrometers, wherein the tin-containing joints may include pure tin, a tin-silver alloy, a tin-silver-copper alloy or a tin-lead alloy. The tin-containing joints may include a tin-gold alloy, a tin-silver-gold alloy, a tin-silver-gold-copper alloy or a tin-lead-gold alloy at the bottom side of the tin-containing joints due to the reaction between tin in the metal joints 410*a* and gold at the top of the metal pads 310*a*. Next, the tool head is removed from the flexible circuit film 36. Next, the substrate 300 bonded with the flexible circuit film 36 is removed from the stage.

In a second case, referring to FIGS. 3F and 3G, when the metal joints 410*a* are tin-containing joints, the metal joints 410*a* can be used to be joined with a gold layer of the wetting layer 240*a* using a heat press process, which method is described as below. First, the substrate 300 is placed on a stage kept at a temperature of between 150 and 350° C., and preferably of between 200 and 300° C. Next, the flexible circuit film 36 is thermally pressed on the metal joints 410*a* on the metal pads 310*a* of the substrate 300 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*a* with the metal joints 410*a*. In the step of joining the wetting layer 240*a* with the metal joints 410*a*, the metal joints 410*b* can be formed between the first contact points of the copper traces 210 and the topmost copper traces 340*a* of the substrate 300. The metal joints 410*b* can be tin-containing joints having a thickness t16 of between 20 and 150 micrometers or of between 15 and 50 micrometers. The tin-containing joints may include a tin-silver-gold-copper alloy, a tin-silver-gold alloy or a tin-gold alloy at the top side of the tin-containing joints due to the reaction between tin in the metal joints 410*a* and gold at the top of the wetting layer 240*a*. The tin-containing joints may include a tin-gold alloy, a tin-silver-gold alloy or a tin-silver-gold-copper alloy at the bottom side of the tin-containing joints due to the reaction between tin in the metal joints 410*a* and gold at the top of the metal pads 310*a*. Next, the tool head is removed from the flexible circuit film 36. Next, the substrate 300 bonded with the flexible circuit film 36 is removed from the stage.

Figure 3G:
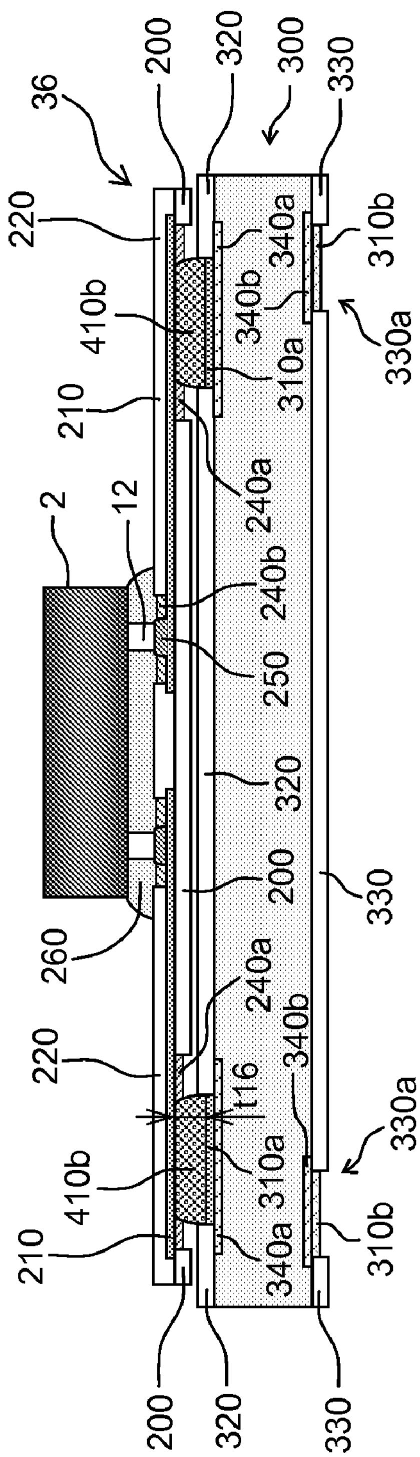
Figure 3H:
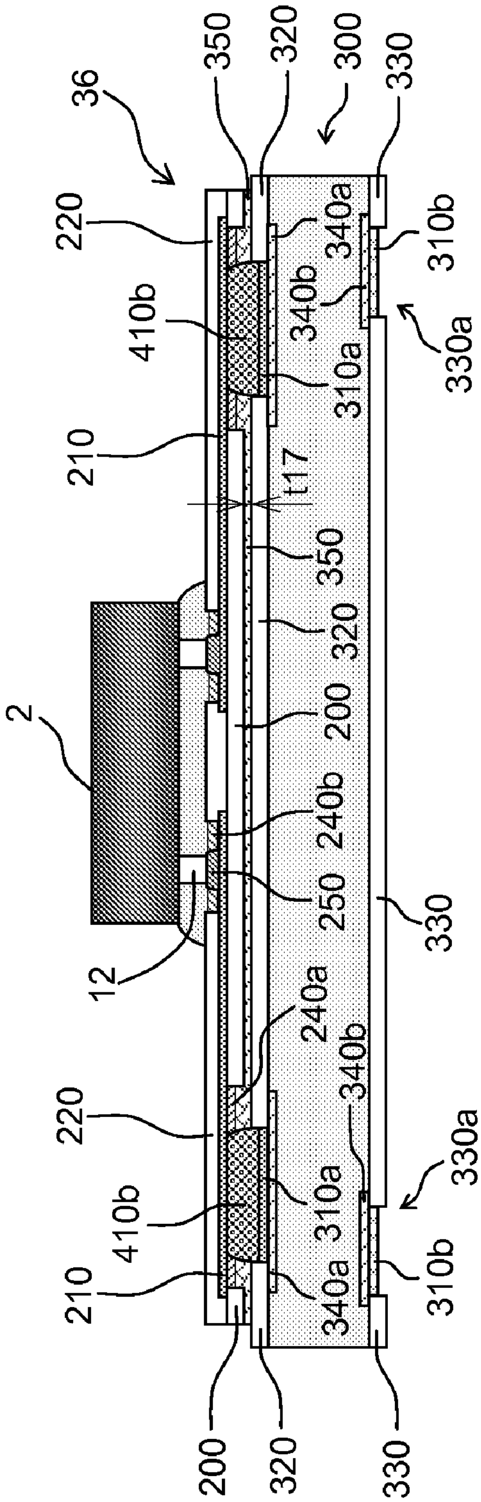

Referring to FIG. 3H, after the flexible circuit film 36 is bonded with the substrate 300, a polymer layer 350 can be filled into the gap between the flexible circuit film 36 and the substrate 300, enclosing the metal joints 410*b*, by dispensing a polymer on the substrate 300 close to the flexible circuit film 36, with the polymer flowing into the gap between the flexible circuit film 36 and the substrate 300, and then curing the flowing polymer at a temperature of between 100 and 250° C. The material of the polymer layer 350 may be expoxy, polyester or polyimide, and the polymer layer 350 has a thickness t17 of between 1 and 30 micrometers.

Figure 3I:
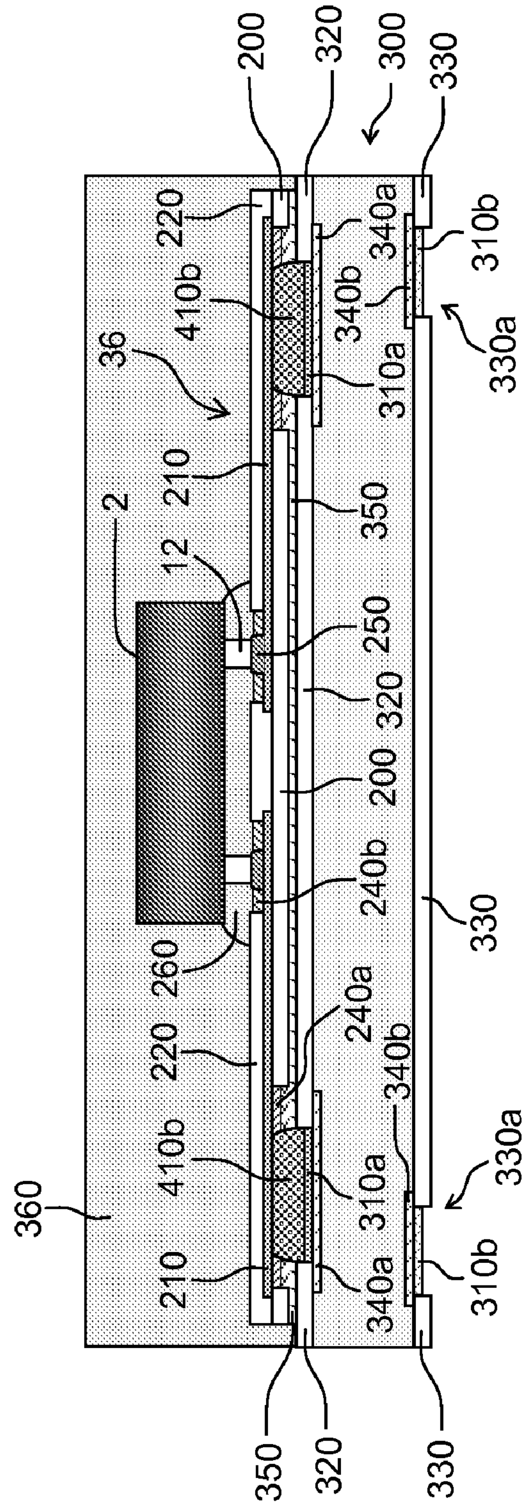

Referring to FIG. 3I, a polymer compound 360 is formed on the semiconductor chip 2, on the flexible circuit film 36 and on a peripheral region of the substrate 300 by molding an epoxy-based polymer with carbon fillers therein on the semiconductor chip 2, on the flexible circuit film 36 and on the peripheral region of the substrate 300 at a temperature of between 130 and 250° C. Alternatively, the polymer compound 360 can be polyimide, polybenzoxazole (PBO) or polyester. Preferably, the polymer compound 360 has a value of Young's modulus less than 0.5 GPa.

Figure 3J:
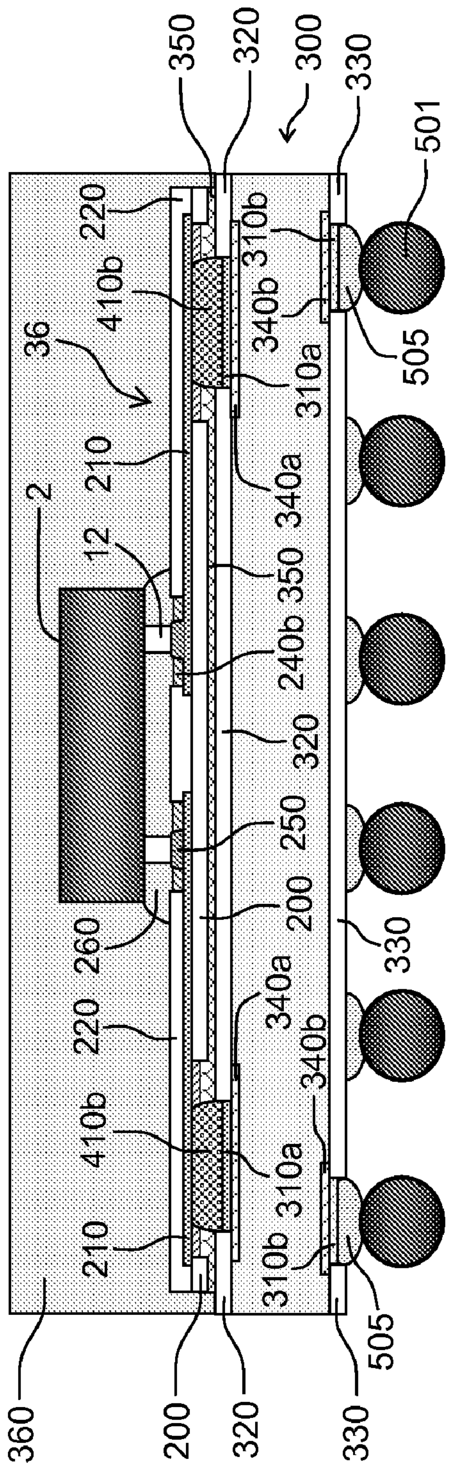
Figure 3K:
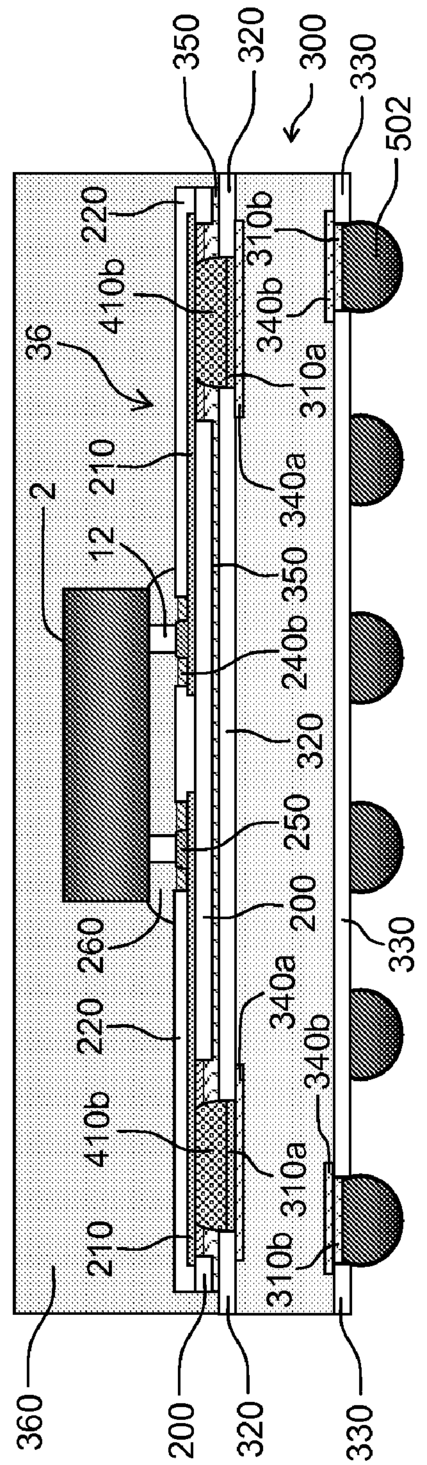

Referring to FIGS. 3J and 3K, solder balls 501 shown in FIG. 3J may be being placed, in a ball-grid-array arrangement, on a flux or solder paste 505 preformed on the metal pads 310*b* of the substrate 300 using a ball placement process to form solder balls 502 shown in FIG. 3K on the substrate 300. The solder balls 502 can be formed by printing the flux or solder paste 505 on the metal pads 310*b*, next placing the solder balls 501, such as pure tin, a tin-silver alloy, a tin-lead alloy or a tin-silver-copper alloy, having a diameter of between 0.25 and 1.2 millimeters on the flux or solder paste 505, next reflowing the solder balls 501 at a peak temperature of between 230 and 270° C., and then cleaning the remaining flux from the substrate 300. The solder balls 502 have a diameter of between 0.2 and 1.2 millimeters, and the solder balls 502 may include pure tin, a tin-silver alloy, a tin-silver-copper alloy or a tin-lead alloy.

For example, during the step of reflowing the solder balls 501, when the metal pads 310*b* have a bottommost metal layer of gold, the gold layer of the metal pads 310*b* is solved in the solder balls 502. Preferably, the metal pads 310*b* have a nickel layer between the gold layer and the copper traces 340*b*. The nickel layer serves as a barrier layer preventing copper in the copper traces 340*b* from being solved in the solder balls 502 after the solder balls 502 are formed on the substrate 300. In the case of gold serving as a bottommost metal layer of the metal pads 310*b*, the solder balls 502, after being joined with the substrate 300, may include a portion, of a tin-silver-gold-copper alloy, a tin-silver-gold alloy, a tin-gold alloy or a tin-lead-gold alloy, on the nickel layer of the metal pads 310*b* and under the copper traces 340*b* of the substrate 300 due to the reaction between gold in the metal pads 310*b* and tin in the solder balls 501 during reflowing the solder balls 501.

After the solder balls 502 are formed on the substrate 300, the substrate 300 and the polymer compound 360 can be optionally cut into multiple units.

Figure 3L:
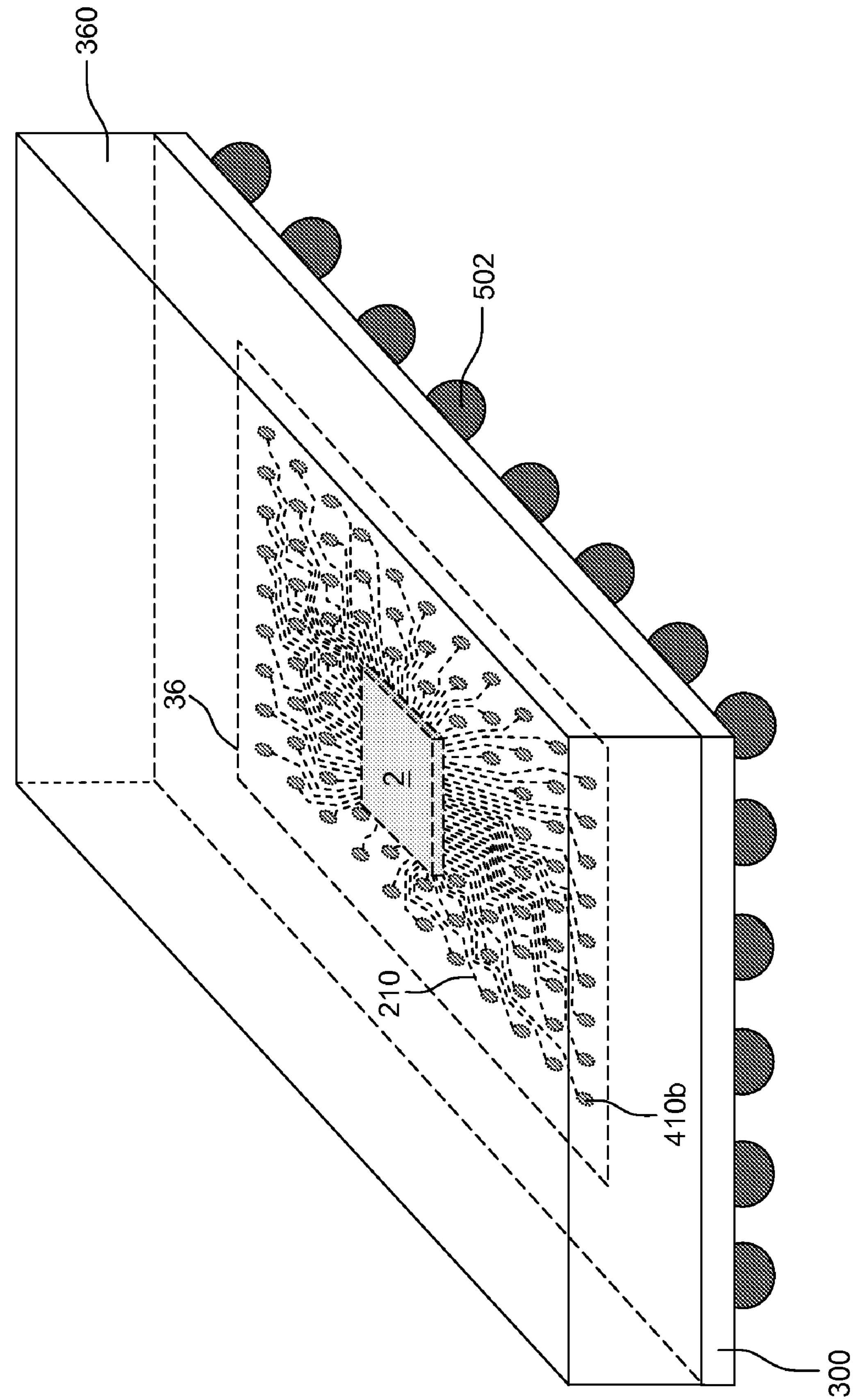
FIGS. 3L and 3M are perspective views showing two chip packages each including a rigid substrate, a flexible circuit film mounted on the rigid substrate and a semiconductor chip joined with the flexible circuit film.

FIG. 3L is a perspective view showing FIG. 3K. The fine-pitched metal bumps 12 of the semiconductor chip 2 can be fanned out through the copper traces 210 of the flexible circuit film 36 by bonding the semiconductor chip 2 with the flexible circuit film 36. The flexible circuit film 36 is also bonded with the substrate 300 to connect the fine-pitched metal bumps 12 of the semiconductor chip 2 with the circuit structure of the substrate 300. Thereby, the semiconductor chip 2 has the fine-pitched metal bumps 12 connected to an external circuit, such as a printed circuit board (PCB) comprising a glass fiber as a core, through the copper traces 210 of the flexible circuit film 36 and the circuit structure of the substrate 300.

Figure 3M:
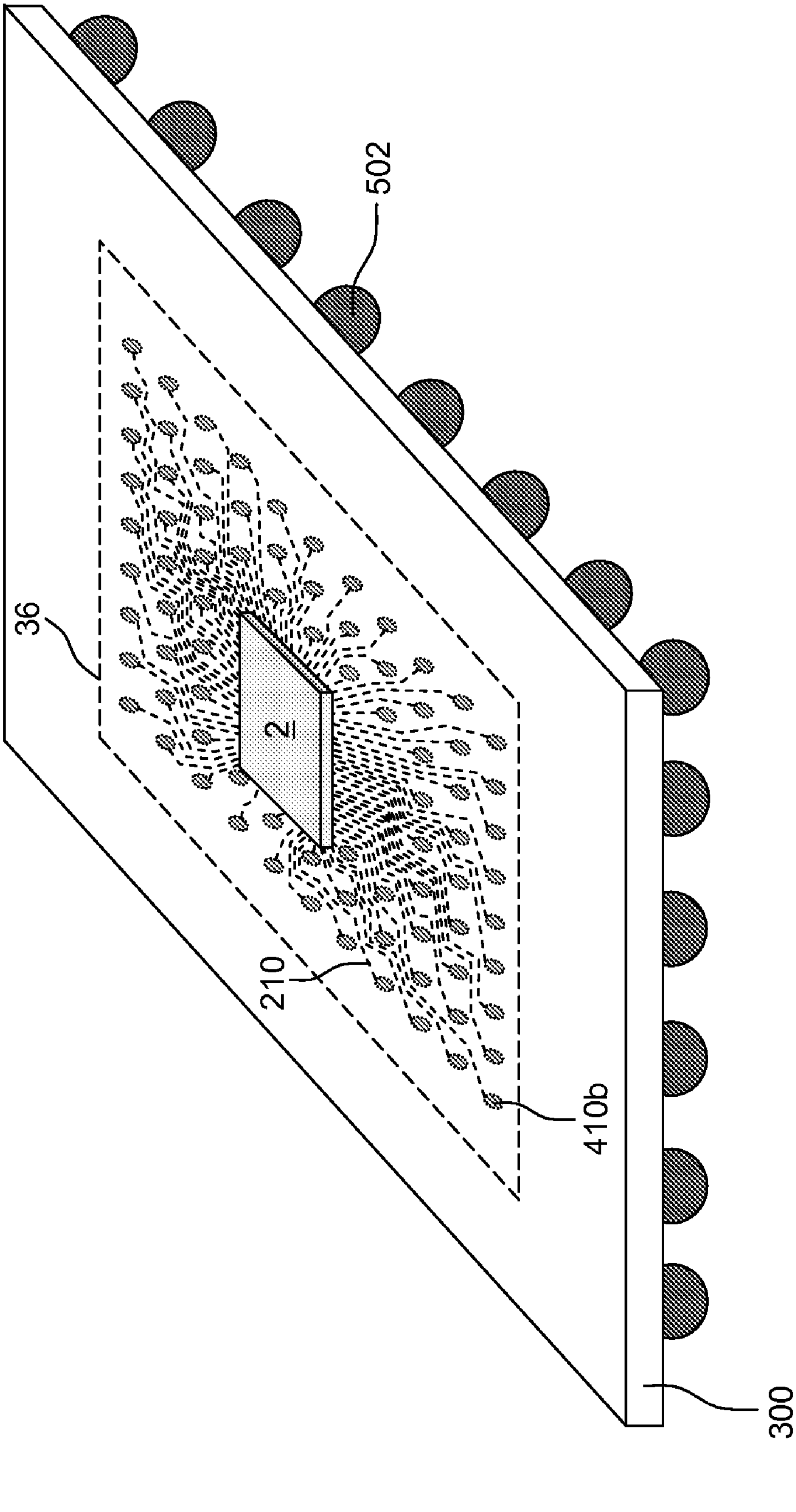
Figure 3N:
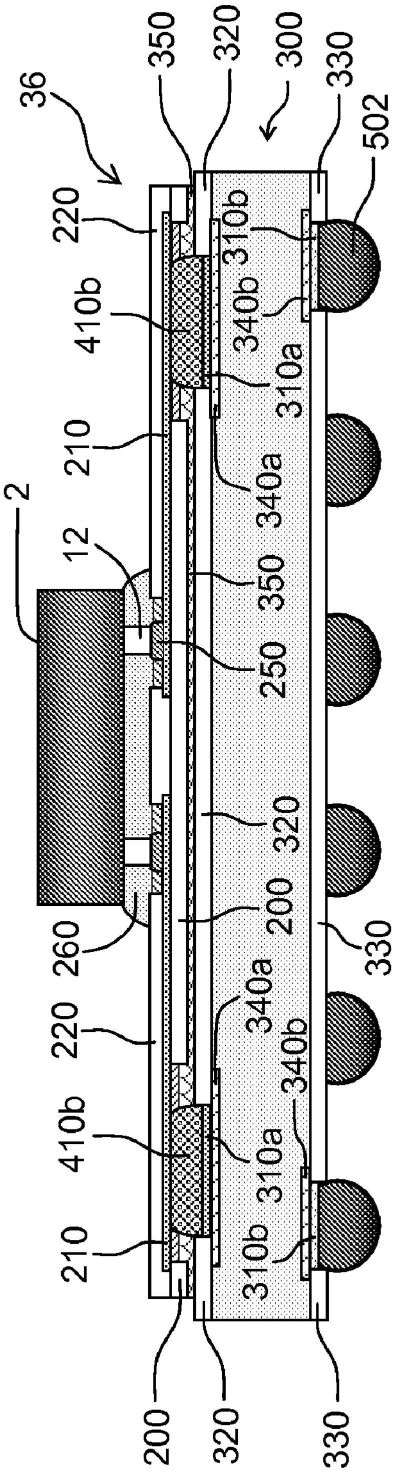
FIGS. 3N-3Q are cross-sectional views showing various chip packages each including a rigid substrate, a flexible circuit film mounted on the rigid substrate and a semiconductor chip joined with the flexible circuit film.
Figure 3O:
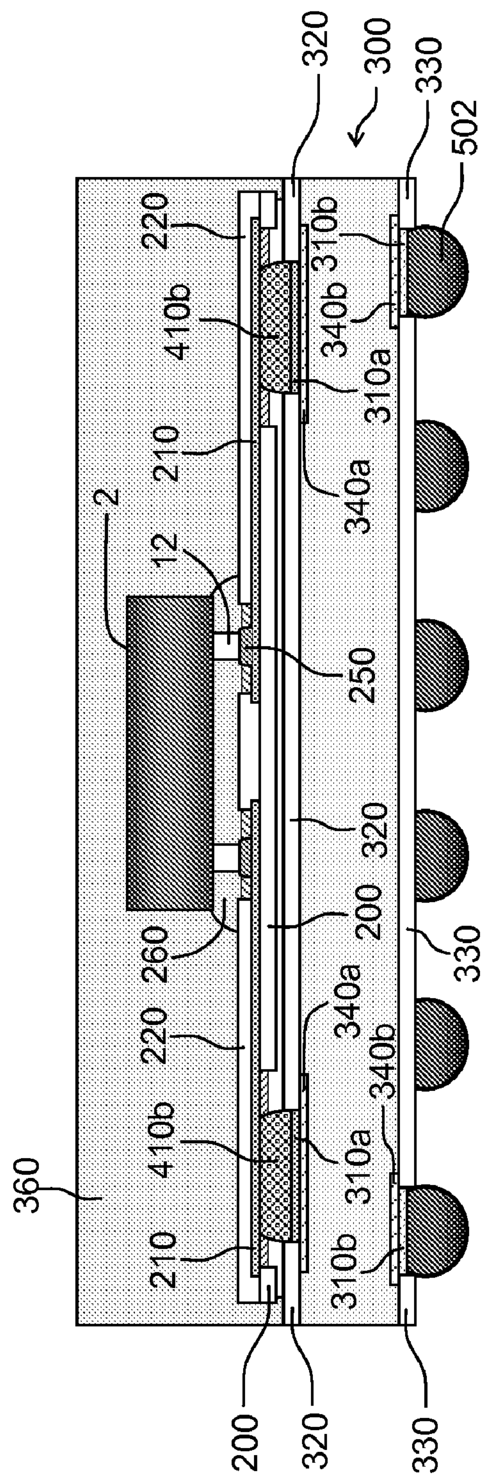
Figure 3P:
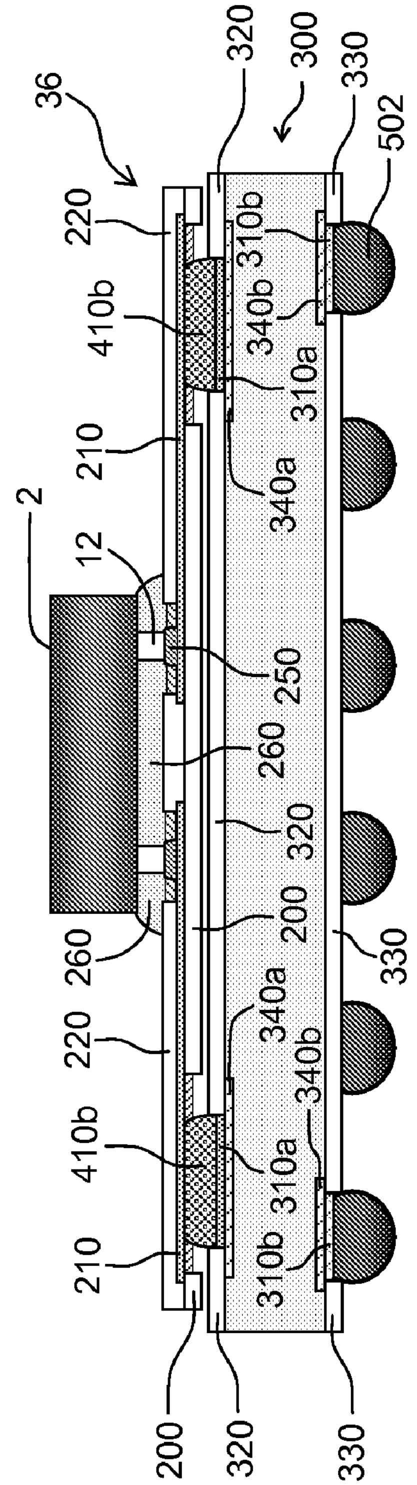

Alternatively, referring to FIGS. 3M and 3N, the step of forming the polymer compound 360, as shown in FIG. 3I, can be omitted, that is, the semiconductor chip 2 and the flexible circuit film 36 are uncovered by any polymer compound. Alternatively, referring to FIG. 30, the step of forming the polymer layer 350, as shown in FIG. 3H, can be omitted. Alternatively, referring to FIG. 3P, the steps of forming the polymer layer 350, as shown in FIG. 3H, and of forming the polymer compound 360, as shown in FIG. 3I, can be omitted, that is, the semiconductor chip 2 and the flexible circuit film 36 are uncovered by any polymer compound.

Alternatively, the solder balls 502 can be omitted, as shown in FIG. 3I. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer compound 360 and the solder balls 502 can be omitted, as shown in FIG. 3H. The semiconductor chip 2 and the flexible circuit film 36 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 3Q:
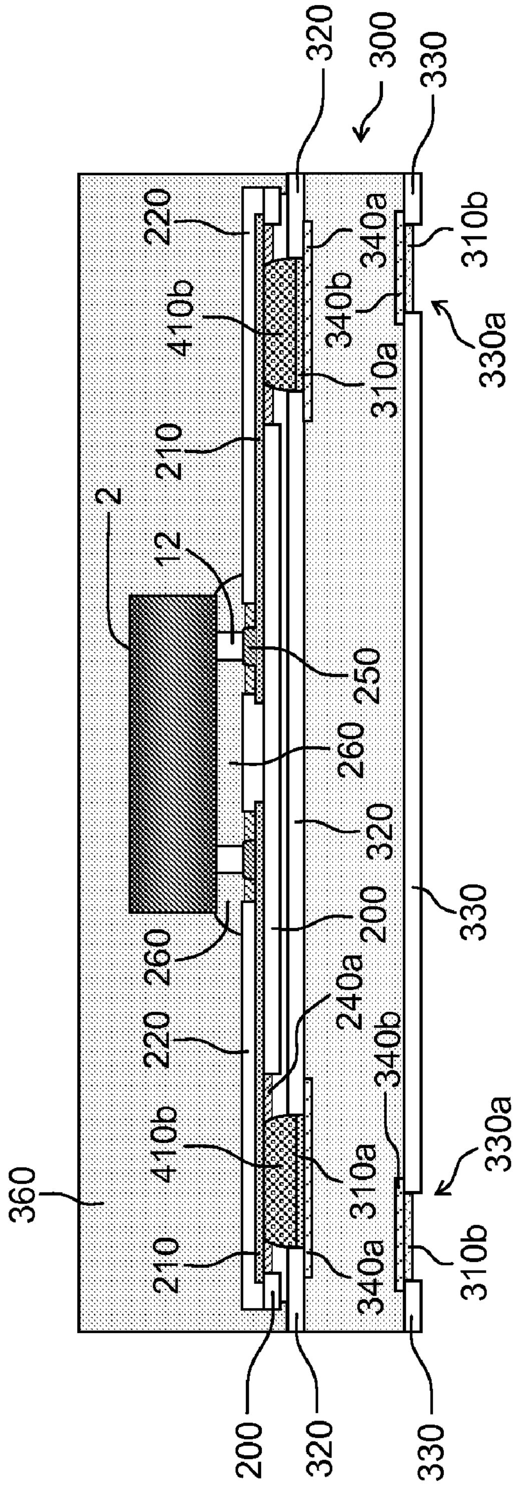

Alternatively, the polymer layer 350 and the solder balls 502 can be omitted, as shown in FIG. 3Q. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350, the polymer compound 360 and the solder balls 502 can be omitted, as shown in FIG. 3G. The semiconductor chip 2 and the flexible circuit film 36 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 3R:
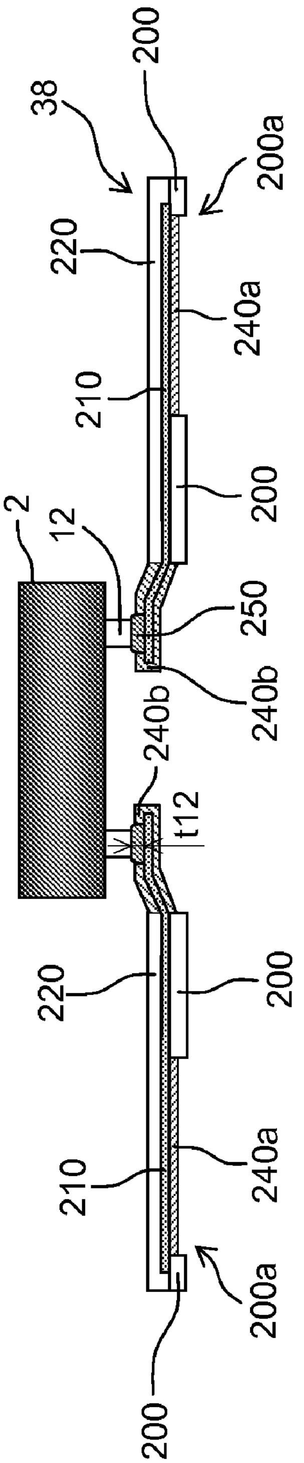
FIGS. 3R-3X are cross-sectional views showing a process for bonding a semiconductor chip with a flexible circuit film using a tape-automated-bonding (TAB) technology and joining the flexible circuit film with a rigid substrate according to another embodiment of the present invention.

FIG. 3R is a schematically cross-sectional figure showing a chip package including the semiconductor chip 2 joined with a flexible circuit substrate 38 using a tape-automated-bonding (TAB) technology. The above-mentioned flexible circuit film 36 can be replaced by the flexible circuit film 38. The flexible circuit film 38 includes the polymer layer 200, the polymer layer 220, the wetting layer 240*a*, the wetting layer 240*b* and the copper traces 210 between the polymer layers 200 and 220, wherein the openings 200*a* in the polymer layer 200 expose contact points of the copper traces 210, and the polymer layers 200 and 220 uncover top and bottom sides of the copper traces 210 at the center portion of the flexible circuit film 38. The wetting layer 240*a* is on the contact points of the copper traces 210 exposed by the openings 200*a* in the polymer layer 200, and the wetting layer 240*b* is on the copper traces 210 at the center portion of the flexible circuit film 38. The specification of the polymer layer 200, the polymer layer 220 and the copper traces 210 shown in FIG. 3R can be referred to as the specification of the polymer layer 200, the polymer layer 220 and the copper traces 210 illustrated in FIG. 3A. The specification of the wetting layer 240*a* shown in FIG. 3R can be referred to as the specification of the wetting layer 240*a* illustrated in FIGS. 3B and 3C. Alternatively, the copper traces 210 can be replaced by gold traces having a thickness of between 3 and 30 μm, of between 5 and 20 micrometers or of between 4 and 10 micrometers. Alternatively, the copper traces 210 can be replaced by silver traces having a thickness of between 3 and 30 μm, of between 5 and 20 micrometers or of between 4 and 10 micrometers.

The metal bumps 12 of the semiconductor chip 2 are bonded with the copper traces 210 at the center portion of the flexible circuit film 38 through the interface bonding layer 250. A method for bonding the metal bumps 12 of the semiconductor chip 2 with the copper traces 210 at the center portion of the flexible circuit film 38 is described as shown in FIG. 3S.

Figure 3S:
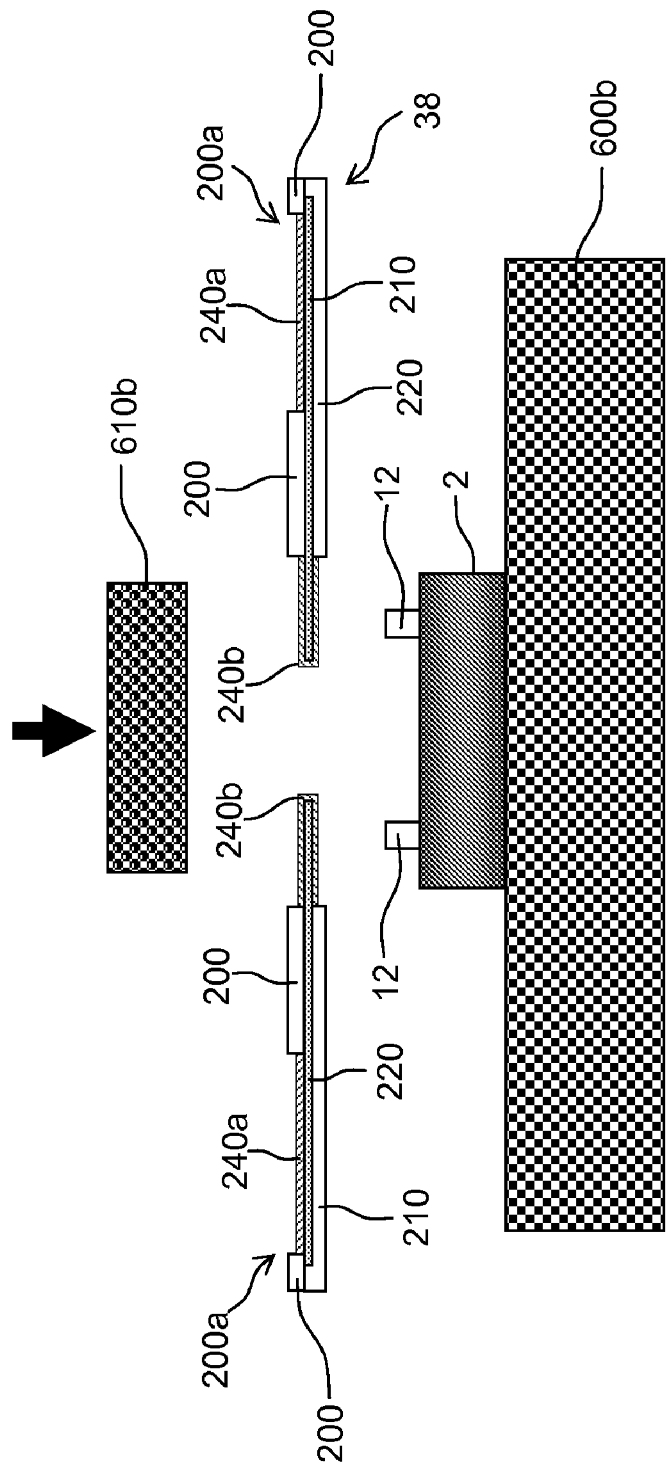

Referring to FIG. 3S, the flexible circuit film 38 can be connected to the semiconductor chip 2. The flexible circuit film 38 has the wetting layer 240*a* to be joined with the substrate 300 shown in FIG. 3E, and the wetting layer 240*b* to be joined with the metal bumps 12 on the semiconductor chip 2. The wetting layer 240*b* is formed on the top and bottom sides of the copper traces 210, uncovered by the polymer layers 200 and 220, at the center portion of the flexible circuit film 38, and the wetting layer 240*b* having a thickness of between 0.05 and 2 micrometers, and preferably of between 0.1 and 1 micrometer, may be gold, copper, nickel, silver, palladium, tin or a composite of the above-mentioned materials. For example, the wetting layer 240*b* may be a tin-containing layer, such as pure tin, a tin-silver alloy, a tin-lead alloy or a tin-silver-copper alloy, having a thickness of between 0.05 and 2 micrometers, and preferably of between 0.1 and 1 micrometer, on the top and bottom sides of the copper traces 210, uncovered by the polymer layers 200 and 220, at the center portion of the flexible circuit film 38. Alternatively, the wetting layer 240*b* may be a gold layer having a thickness of between 0.05 and 2 micrometers, and preferably of between 0.1 and 1 micrometer, on the top and bottom sides of the copper traces 210, uncovered by the polymer layers 200 and 220, at the center portion of the flexible circuit film 38.

In a first case, referring to FIG. 3S, the metal bumps 12 have the above-mentioned gold layer, at the tips of the metal bumps 12, capable of being used to be joined with the wetting layer 240*b* of pure tin or an above-mentioned tin alloy, which method is described as below. First, the semiconductor chip 2 is held by vacuum adsorption on a stage 600*b* kept at a temperature of between 250 and 500° C., and preferably of between 350 and 450° C. Next, the flexible circuit film 38 is thermally pressed on the metal bumps 12 of the semiconductor chip 2 at a force of between 20 and 150N, and preferably of between 50 and 90N, for a time of between 0.1 and 10 seconds, and preferably of between 0.5 and 3 seconds, by a tool head 610*b* kept at a temperature of between 150 and 450° C., and preferably of between 250 and 400° C., optionally applying ultrasonic waves to the metal bumps 12 and to the wetting layer 240*b* of the flexible circuit film 38, to join the wetting layer 240*b* with the metal bumps 12. Referring to FIGS. 3R and 3S, in the step of joining the wetting layer 240*b* with the metal bumps 12, the interface bonding layer 250, such as a metal alloy, may be formed between the metal bumps 12 and the copper traces 210. The interface bonding layer 250 has a thickness t12 of between 0.2 and 10 micrometers, and preferably of between 0.4 and 5 micrometers. When the wetting layer 240*b* before bonded with the gold layer of the metal bumps 12 is pure tin, the interface bonding layer 250 is a tin-gold alloy having a thickness of between 0.2 and 10 micrometers or of between 0.4 and 5 micrometers, wherein an atomic ratio of tin to gold in the tin-gold alloy is between 0.2 and 0.3. When the wetting layer 240*b* before bonded with the gold layer of the metal bumps 12 is a tin-silver alloy, the interface bonding layer 250 is a tin-silver-gold alloy having a thickness of between 0.2 and 10 micrometers or of between 0.4 and 5 micrometers. When the wetting layer 240*b* before bonded with the gold layer of the metal bumps 12 is a tin-silver-copper alloy, the interface bonding layer 250 is a tin-silver-gold-copper alloy having a thickness of between 0.2 and 10 micrometers or of between 0.4 and 5 micrometers. Next, the tool head 610*b* is removed from the flexible circuit film 38. Next, the semiconductor chip 2 bonded with the flexible circuit film 38 is removed from the stage 600*b*. The metal bumps 12 bonded with the copper traces 210 of the flexible circuit film 38 have a thickness of between 5 and 50 micrometers, and preferably of between 10 and 25 micrometers, and the specification of the metal bumps 12, between the semiconductor chip 2 and the interface bonding layer 250, formed in the process as illustrated in the first case shown in FIGS. 3R and 3S can be referred to as the specification of the metal bumps 12, between the semiconductor chip 2 and the interface bonding layer 250, formed in the process as illustrated in the first case shown in FIGS. 3A and 3B.

In a second case, referring to FIG. 3S, the metal bumps 12 have the above-mentioned gold layer, at the tips of the metal bumps 12, capable of being used to be joined with a gold layer of the wetting layer 240*b*, which method is described as below. First, the semiconductor chip 2 is held by vacuum adsorption on the stage 600*b* kept at a temperature of between 250 and 500° C., and preferably of between 350 and 450° C. Next, the flexible circuit film 38 is thermally pressed on the metal bumps 12 of the semiconductor chip 2 at a force of between 20 and 150N, and preferably of between 70 and 120N, for a time of between 0.1 and 10 seconds, and preferably of between 0.5 and 3 seconds, by the tool head 610*b* kept at a temperature of between 150 and 450° C., and preferably of between 250 and 400° C., optionally applying ultrasonic waves to the metal bumps 12 and to the wetting layer 240*b* of the flexible circuit film 38, to join the gold layer of the wetting layer 240*b* with the above-mentioned gold layer of the metal bumps 12. Next, the tool head 610*b* is removed from the flexible circuit film 38. Next, the semiconductor chip 2 bonded with the flexible circuit film 38 is removed from the stage 600*b*. Thereby, the pads 18 of the semiconductor chip 2 can be connected to the copper traces 210 of the flexible circuit film 38 through gold joints formed by joining the gold layer of the wetting layer 240*b* with the above-mentioned gold layer of the metal bumps 12. The metal bumps 12 bonded with the copper traces 210 of the flexible circuit film 38 have a thickness of between 5 and 50 micrometers, and preferably of between 10 and 25 micrometers. The specification of the metal bumps 12, between the semiconductor chip 2 and the copper traces 210, formed in the process as illustrated in the second case shown in FIG. 3S can be referred to as the specification of the metal bumps 12, between the semiconductor chip 2 and the copper traces 210, formed in the process as illustrated in the second case shown in FIG. 3B.

Figure 3T:
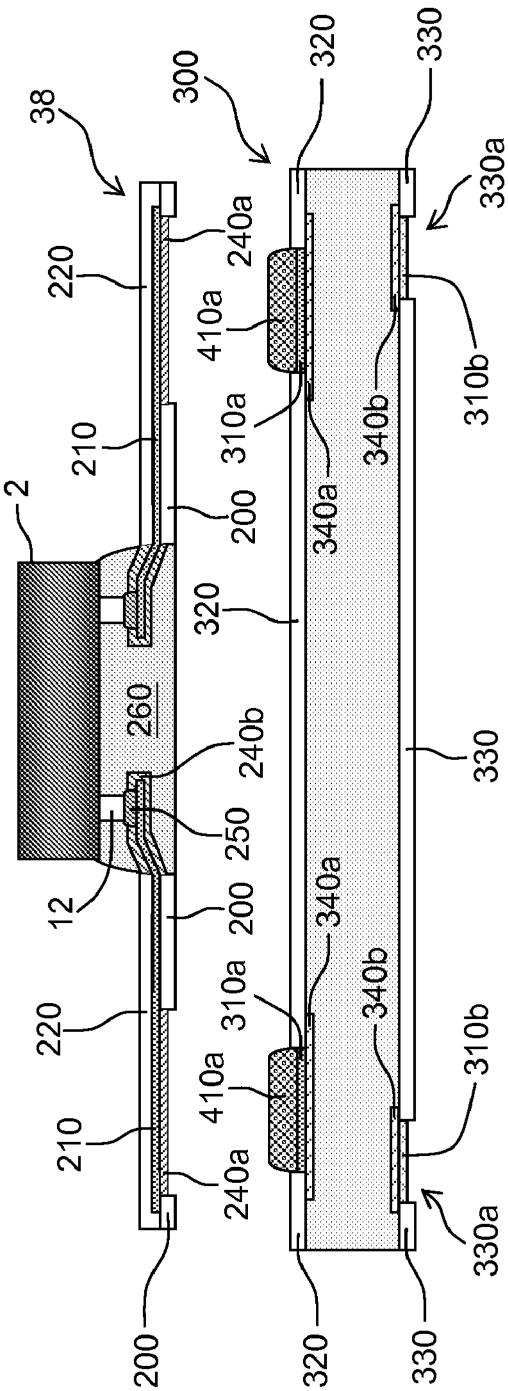

Referring to FIG. 3T, the polymer layer 260 can be formed by dispensing a polymer on the semiconductor chip 2 with the polymer enclosing the metal bumps 12 and the copper traces 210 at the center portion of the flexible circuit film 38, and then curing the polymer at a temperature of between 100 and 250° C. The material of the polymer layer 260 may be expoxy, polyester or polyimide.

The metal joints 410*a*, such as tin-containing joints, are formed on the metal pads 310*a* of the substrate 300 shown in FIG. 3E by screen printing a solder paste containing flux and solder, such as pure tin, a tin-silver alloy, a tin-silver-copper alloy or a tin-lead alloy, on the metal pads 310*a* and then reflowing the solder paste. The metal joints 410*a* may be formed of pure tin, a tin-silver alloy, a tin-silver-copper alloy or a tin-lead alloy. The specification of the substrate 300 shown in FIG. 3T can be referred to as the specification of the substrate 300 illustrated in FIG. 3E. Two methods of bonding the flexible circuit film 38 with the substrate 300 are described as follow.

In a first case, referring to FIGS. 3T and 3U, when the metal joints 410*a* are tin-containing joints, the metal joints 410*a* can be used to be joined with the wetting layer 240*a* of pure tin or an above-mentioned tin alloy using a heat press process, which method which process is described as below. First, the substrate 300 is placed on a stage kept at a temperature of between 150 and 350° C., and preferably of between 200 and 300° C. Next, the flexible circuit film 38 is thermally pressed on the metal joints 410*a* on the metal pads 310*a* of the substrate 300 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*a* with the metal joints 410*a*. In the step of joining the wetting layer 240*a* with the metal joints 410*a*, the metal joints 410*b* can be formed between the contact points of the copper traces 210 and the topmost copper traces 340*a* of the substrate 300. Next, the tool head is removed from the flexible circuit film 38. Next, the substrate 300 bonded with the flexible circuit film 38 is removed from the stage. The specification of the metal joints 410*b*, between the contact points of the copper traces 210 and the topmost copper traces 340*a* of the substrate 300, formed in the process as illustrated in the first case shown in FIGS. 3T and 3U can be referred to as the specification of the metal joints 410*b*, between the first contact points of the copper traces 210 and the topmost copper traces 340*a* of the substrate 300, formed in the process as illustrated in the first case shown in FIGS. 3F and 3G.

In a second case, referring to FIGS. 3T and 3U, when the metal joints 410*a* are tin-containing joints, the metal joints 410*a* can be used to be joined with a gold layer of the wetting layer 240*a* using a heat press process, which method is described as below. First, the substrate 300 is placed on a stage kept at a temperature of between 150 and 350° C., and preferably of between 200 and 300° C. Next, the flexible circuit film 38 is thermally pressed on the metal joints 410*a* on the metal pads 310*a* of the substrate 300 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*a* with the metal joints 410*a*. In the step of joining the wetting layer 240*a* with the metal joints 410*a*, the metal joints 410*b* can be formed between the contact points of the copper traces 210 and the topmost copper traces 340*a* of the substrate 300. Next, the tool head is removed from the flexible circuit film 38. Next, the substrate 300 is removed from the stage. The specification of the metal joints 410*b*, between the contact points of the copper traces 210 and the topmost copper traces 340*a* of the substrate 300, formed in the process as illustrated in the second case shown in FIGS. 3T and 3U can be referred to as the specification of the metal joints 410*b*, between the first contact points of the copper traces 210 and the topmost copper traces 340*a* of the substrate 300, formed in the process as illustrated in the second case shown in FIGS. 3F and 3G.

Figure 3U:
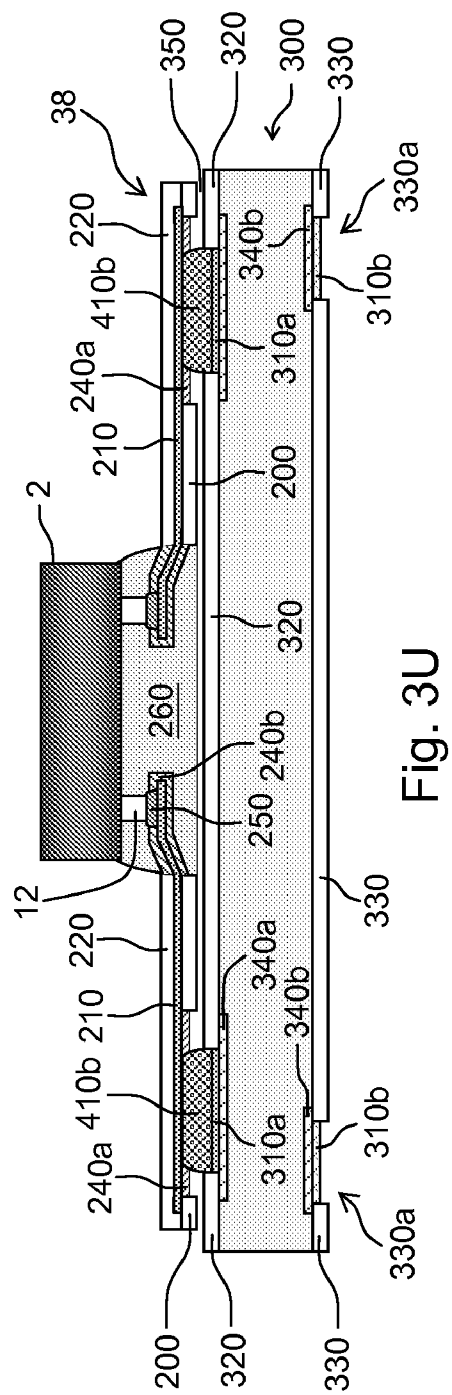
Figure 3V:
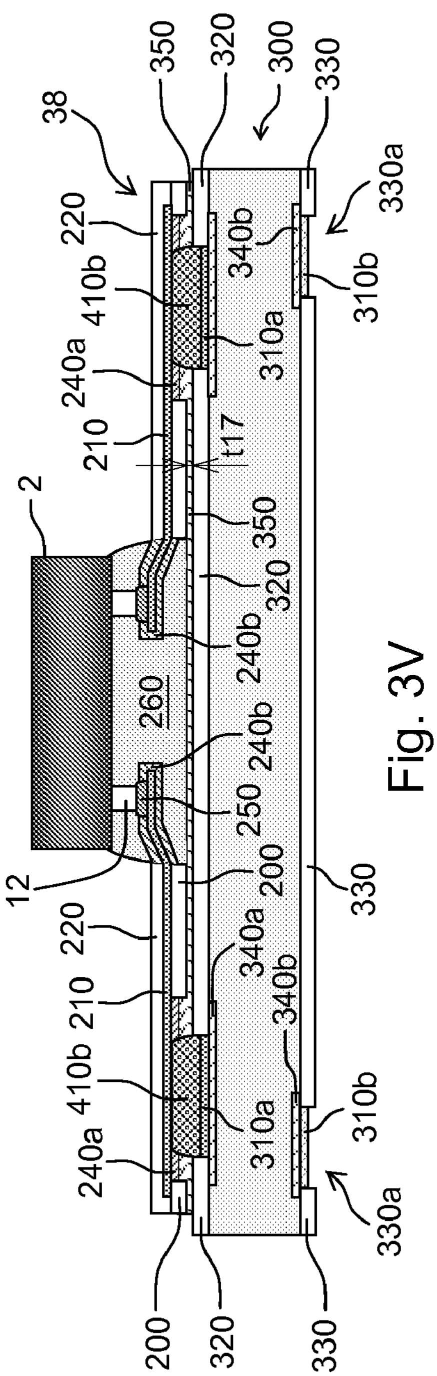

Referring to FIG. 3V, after the flexible circuit film 38 is bonded with the substrate 300, the polymer layer 350 can be optionally filled into the gap between the flexible circuit film 38 and the substrate 300, enclosing the metal joints 410*b*, by dispensing a polymer on the substrate 300 close to the flexible circuit film 38, with the polymer flowing into the gap between the flexible circuit film 38 and the substrate 300, and then curing the flowing polymer at a temperature of between 100 and 250° C. The material of the polymer layer 350 may be expoxy, polyester or polyimide, and the polymer layer 350 has a thickness t17 of between 1 and 30 micrometers.

Figure 3W:
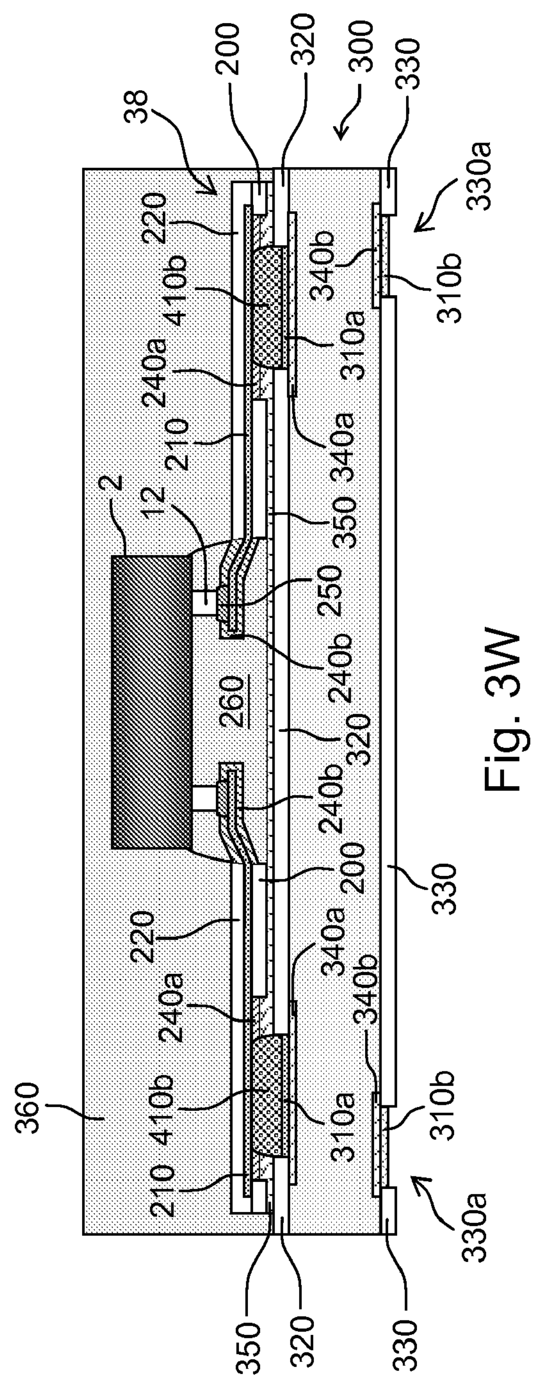

Referring to FIG. 3W, the polymer compound 360 can be optionally formed on the semiconductor chip 2, on the flexible circuit film 38 and on the substrate 300 by molding an epoxy-based polymer with carbon fillers therein on the semiconductor chip 2, on the flexible circuit film 38 and the peripheral region of the substrate 300 at a temperature of between 130 and 250° C. Alternatively, the polymer compound 360 can be polyimide or polyester. Preferably, the polymer compound 360 has a value of Young's modulus less than 0.5 GPa.

Figure 3X:
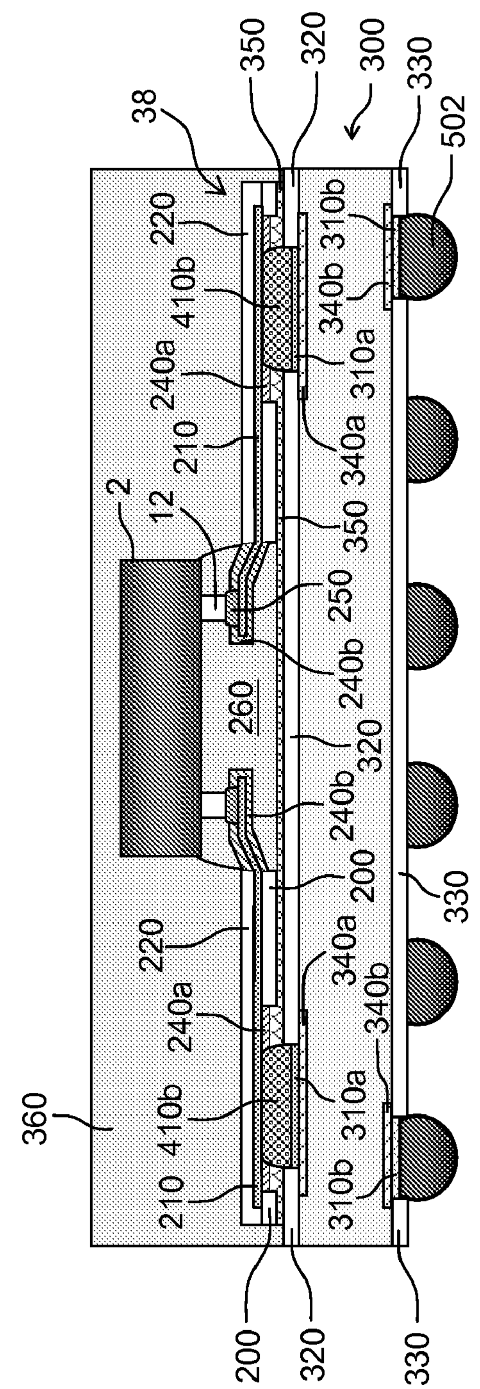

Referring to FIG. 3X, after the polymer compound 360 is formed, the solder balls 502 may be formed, in a ball-grid-array arrangement, on the metal pads 310*b* of the substrate 300 using a ball placement process. The process, of forming the solder balls 502 on the metal pads 310*b* of the substrate 300, as shown in FIG. 3X can be referred to as the process, of forming the solder balls 502 on the metal pads 310*b* of the substrate 300, as illustrated in FIGS. 3J and 3K. The specification of the solder balls 502 shown in FIG. 3X can be referred to as the specification of the solder balls 502 illustrated in FIGS. 3J and 3K. Optionally, the substrate 300 can be sawed after the solder balls 502 are formed on the metal pads 310*b* of the substrate 300.

Thereby, the fine-pitched metal bumps 12 of the semiconductor chip 2 can be fanned out through the copper traces 210 of the flexible circuit film 38 by bonding the semiconductor chip 2 with the flexible circuit film 38. The flexible circuit film 38 is also bonded with the substrate 300 to connect the fine-pitched metal bumps 12 of the semiconductor chip 2 with the circuit structure of the substrate 300. The semiconductor chip 2 has the fine-pitched metal bumps 12 connected to an external circuit, such as a printed circuit board (PCB) comprising a glass fiber as a core, through the copper traces 210 of the flexible circuit film 38 and the circuit structure of the substrate 300.

Alternatively, the step of forming the polymer compound 360, as shown in FIG. 3W, can be omitted, that is, the semiconductor chip 2 and the flexible circuit film 38 are uncovered by any polymer compound. Alternatively, the step of forming the polymer layer 350, as shown in FIG. 3V, can be omitted. Alternatively, the steps of forming the polymer layer 350, as shown in FIG. 3V, and of forming the polymer compound 360, as shown in FIG. 3W, can be omitted, that is, the semiconductor chip 2 and the flexible circuit film 38 are uncovered by any polymer compound.

Alternatively, the solder balls 502 can be omitted, as shown in FIG. 3W. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer compound 360 and the solder balls 502 can be omitted, as shown in FIG. 3V. The semiconductor chip 2 and the flexible circuit film 38 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 3Y:
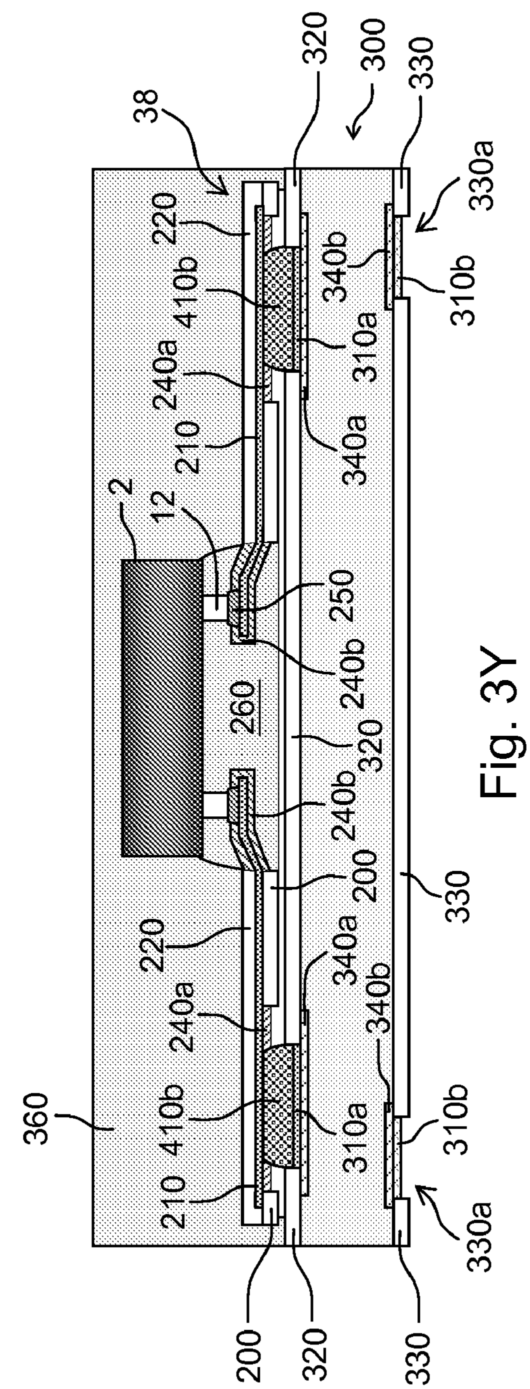
FIG. 3Y is a cross-sectional view showing a chip package including a rigid substrate, a flexible circuit film mounted on the rigid substrate and a semiconductor chip joined with the flexible circuit film.

Alternatively, the polymer layer 350 and the solder balls 502 can be omitted, as shown in FIG. 3Y. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350, the polymer compound 360 and the solder balls 502 can be omitted, as shown in FIG. 3U. The semiconductor chip 2 and the flexible circuit film 38 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Embodiment 2

Figure 4A:
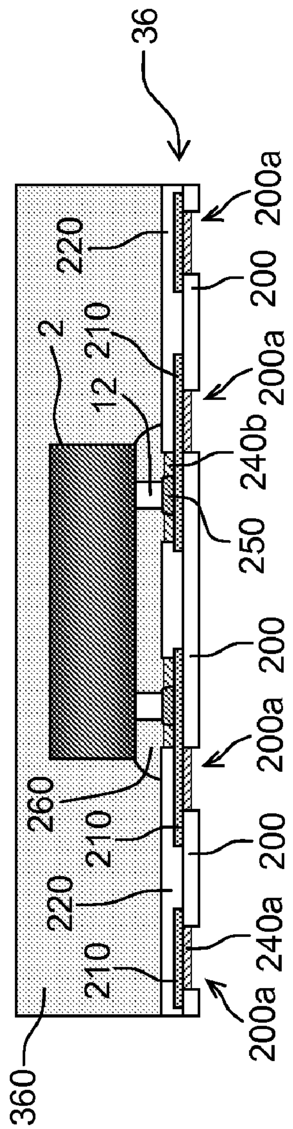
FIGS. 4A-4C are cross-sectional views showing a process for bonding a semiconductor chip with a flexible circuit film using a chip-on-film (COF) technology and bonding solder balls with the flexible circuit film according to another embodiment of the present invention.

Referring to FIG. 4A, after the step shown in FIG. 3D, a polymer compound 360 is formed on the semiconductor chip 2 and on the flexible circuit film 36 by molding an epoxy-based polymer with carbon fillers therein on the semiconductor chip 2 and on the flexible circuit film 36 at a temperature of between 130 and 250° C. Alternatively, the polymer compound 360 can be polyimide or polyester. Preferably, the polymer compound 360 has a value of Young's modulus less than 0.5 GPa.

Figure 4B:
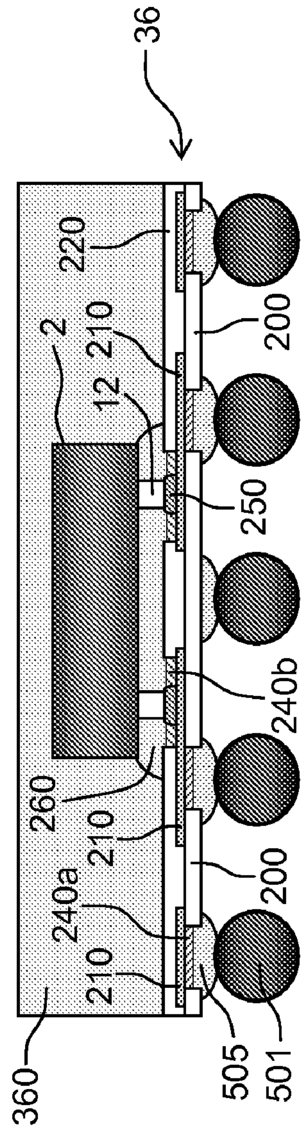
Figure 4C:
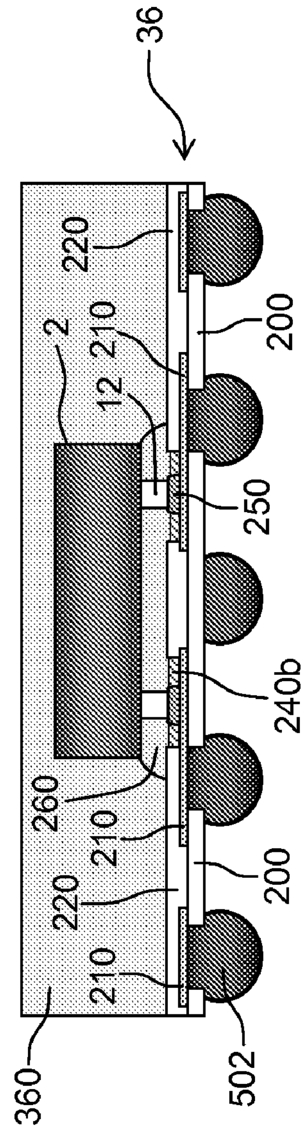

Referring to FIGS. 4B and 4C, after the polymer compound 360 is formed, solder balls 501 shown in FIG. 4B are placed, in a ball-grid-array arrangement, on a flux or solder paste 505 preformed on the wetting layer 240*a* of the flexible circuit film 36 using a ball placement process to form solder balls 502 shown in FIG. 4C on the flexible circuit film 36. The solder balls 502 can be formed by printing the flux or solder paste 505 on the wetting layer 240*a*, next placing the solder balls 501, such as pure tin, a tin-silver alloy, a tin-lead alloy or a tin-silver-copper alloy, having a diameter of between 0.25 and 1.2 millimeters on the flux or solder paste 505, next reflowing the solder balls 501 at a peak temperature of between 230 and 270° C., and then cleaning the remaining flux from the flexible circuit film 36. The solder balls 502 have a diameter of between 0.2 and 1.2 millimeters, and the solder balls 502 may include pure tin, a tin-silver alloy, a tin-silver-copper alloy or a tin-lead alloy.

For example, during the step of reflowing the solder balls 501, when the wetting layer 240*a* is a tin-containing layer, such as pure tin, a tin-silver alloy, a tin-silver-copper alloy or a tin-lead alloy, the tin-containing layer is solved in the solder balls 502.

Alternatively, during the step of reflowing the solder balls 501, when the wetting layer 240*a* is a gold layer, the gold layer is solved in the solder balls 502. The solder balls 502, after being joined with the flexible circuit film 36, include a portion, of a tin-silver-gold-copper alloy, a tin-silver-gold alloy, a tin-gold alloy or a tin-lead-gold alloy, on the copper traces 210 of the flexible circuit film 36 due to the reaction between gold in the wetting layer 240*a* and tin in the solder balls 501 during reflowing the solder balls 501.

After the solder balls 502 are formed on the flexible circuit film 36, the flexible circuit film 36 and the polymer compound 360 can be cut into multiple units.

Figure 4D:
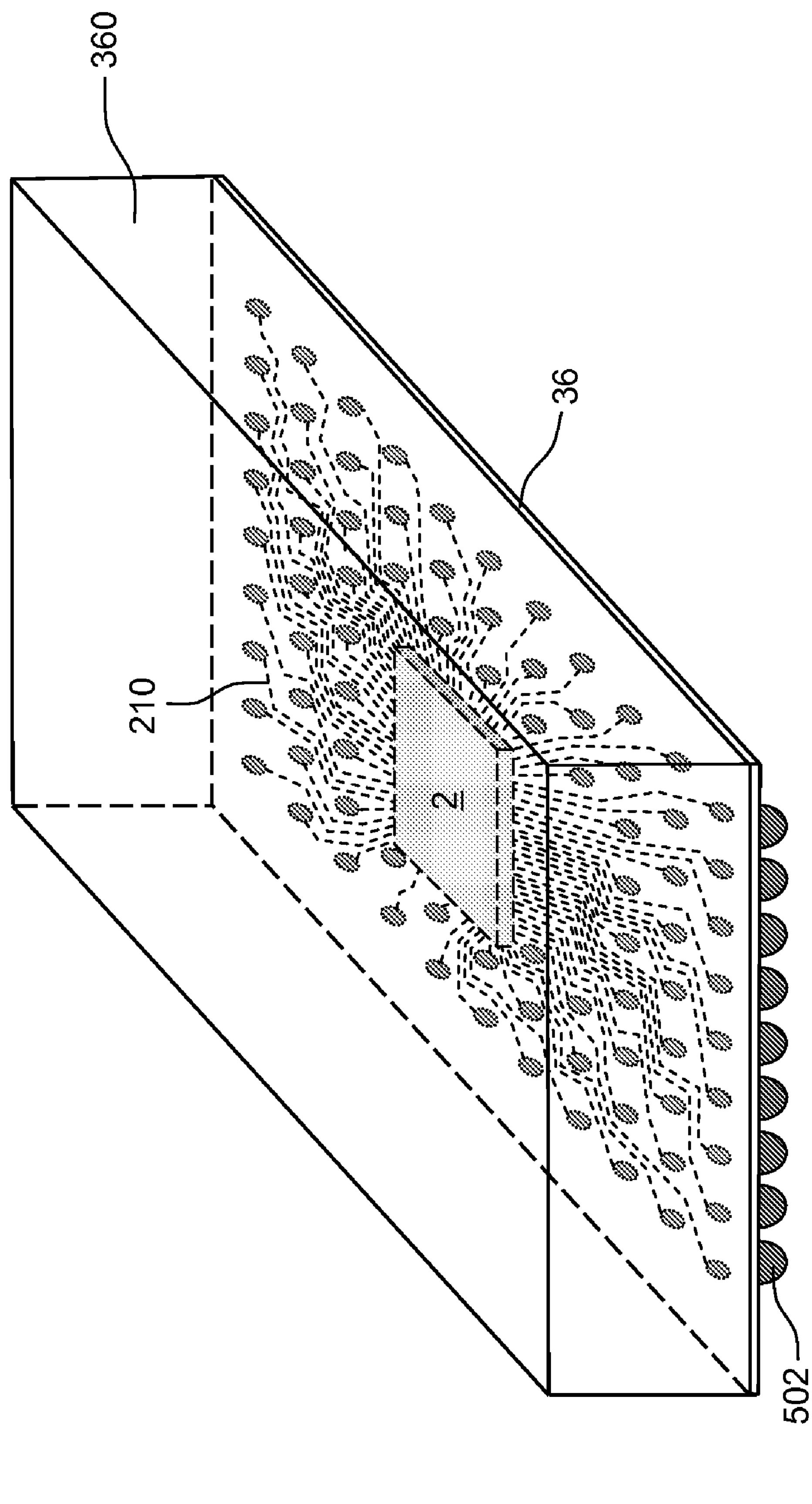
FIG. 4D is a perspective view showing a chip package including a flexible circuit film bonded with solder balls and a semiconductor chip joined with the flexible circuit film.

FIG. 4D is a perspective view showing FIG. 4C. The fine-pitched metal bumps 12 of the semiconductor chip 2 can be fanned out through the copper traces 210 of the flexible circuit film 36 by bonding the semiconductor chip 2 with the flexible circuit film 36. Thereby, the semiconductor chip 2 has the fine-pitched metal bumps 12 connected to an external circuit, such as a printed circuit board (PCB) comprising a glass fiber as a core, through the copper traces 210 of the flexible circuit film 36 and the solder balls 502.

Figure 5A:
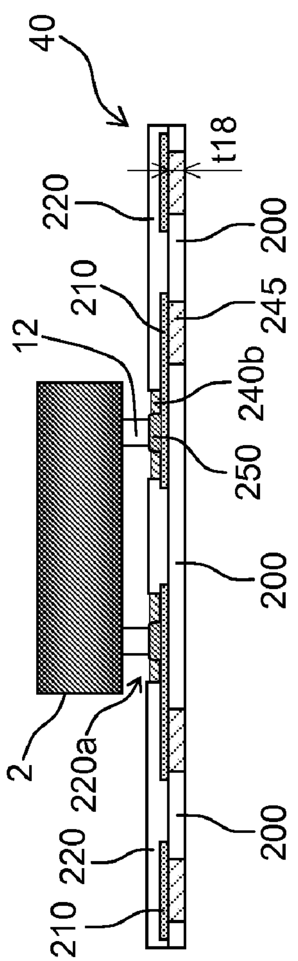
FIGS. 5A-5E are cross-sectional views showing a process for bonding a semiconductor chip with a flexible circuit film using a chip-on-film (COF) technology and bonding solder balls with the flexible circuit film according to another embodiment of the present invention.

FIG. 5A is a schematically cross-sectional figure showing a chip-on-film package. The above-mentioned flexible circuit film 36 can be replaced by a flexible circuit film 40. The flexible circuit film 40 includes the polymer layer 200, the polymer layer 220, the wetting layer 240*b*, metal pads 245 and the copper traces 210 between the polymer layers 200 and 220. The metal pads 245 are formed on first contact points of the copper traces 210 exposed by openings in the polymer layer 200, and the openings are filled up with the metal pads 245. The wetting layer 240*b* are formed on second contact points of the copper traces 210 exposed by the openings 220*a* in the polymer layer 220. The specification of the polymer layer 200, the polymer layer 220 and the copper traces 210 shown in FIG. 5A can be referred to as the specification of the polymer layer 200, the polymer layer 220 and the copper traces 210 illustrated in FIG. 3A. The specification of the wetting layer 240*b* shown in FIG. 5A can be referred to as the specification of the wetting layer 240*b* illustrated in FIGS. 3B and 3C. The specification of the interface bonding layer 250 shown in FIG. 5A can be referred to as the specification of the interface bonding layer 250 formed in the process as illustrated in the first case shown in FIGS. 3A and 3B. Alternatively, the copper traces 210 can be replaced by gold traces having a thickness of between 3 and 30 μm, of between 5 and 20 micrometers or of between 4 and 10 micrometers. Alternatively, the copper traces 210 can be replaced by silver traces having a thickness of between 3 and 30 μm, of between 5 and 20 micrometers or of between 4 and 10 micrometers.

The material of the metal pads 245 may be gold, copper, nickel, silver, tin, palladium or a composite of the above-mentioned materials, and the metal pads 245 have a thickness t18 of between 4 and 10 micrometers, of between 15 and 30 micrometers or of between 10 and 100 micrometers. In a case, the metal pads 245 may be formed by electroplating or electroless plating a gold layer with a thickness of between 4 and 10 micrometers, of between 15 and 30 micrometers or of between 10 and 100 micrometers on the first contact points of the copper traces 210 exposed by the openings in the polymer layer 200, and the openings in the polymer layer 200 are filled up with the gold layer. In another case, the metal pads 245 may be formed by electroplating or electroless plating a tin-containing layer, such as pure tin, a tin-silver alloy, a tin-silver-copper alloy or a tin-lead alloy, with a thickness of between 4 and 10 micrometers, of between 15 and 30 micrometers or of between 10 and 100 micrometers on the first contact points of the copper traces 210 exposed by the openings in the polymer layer 200, and the openings are filled up with the tin-containing layer. In another case, the metal pads 245 may be formed by electroplating or electroless plating a copper layer with a thickness of between 4 and 10 micrometers, of between 15 and 30 micrometers or of between 10 and 100 micrometers on the first contact points of the copper traces 210 exposed by the openings in the polymer layer 200, and the openings are filled up with the copper layer. In another case, the metal pads 245 may be formed by electroplating a nickel layer with a thickness of between 0.5 and 5 micrometers, and preferably of between 1 and 3 micrometers, on the first contact points of the copper traces 210 exposed by the openings in the polymer layer 200, and then electroplating a gold layer with a thickness of between 0.05 and 2 micrometers, and preferably of between 0.05 and 0.5 micrometers, on the nickel layer in the openings in the polymer layer 200, wherein the openings in the polymer layer 200 are filled up with the nickel layer and the gold layer. In another case, the metal pads 245 may be formed by electroless plating a nickel layer with a thickness of between 0.5 and 5 micrometers, and preferably of between 1 and 3 micrometers, on the first contact points of the copper traces 210 exposed by the openings in the polymer layer 200, and then electroless plating a gold layer with a thickness of between 0.05 and 2 micrometers, and preferably of between 0.05 and 0.5 micrometers, on the nickel layer in the openings in the polymer layer 200, wherein the openings in the polymer layer 200 are filled up with the nickel layer and the gold layer. In another case, the metal pads 245 may be formed by electroplating a nickel layer with a thickness of between 0.5 and 5 micrometers, and preferably of between 1 and 3 micrometers, on the first contact points of the copper traces 210 exposed by the openings in the polymer layer 200, and then electroplating a tin-containing layer, such as pure tin, a tin-silver alloy, a tin-silver-copper alloy or a tin-lead alloy, with a thickness of between 0.05 and 2 micrometers, and preferably of between 0.05 and 0.5 micrometers, on the nickel layer in the openings in the polymer layer 200, wherein the openings in the polymer layer 200 are filled up with the nickel layer and the tin-containing layer. In another case, the metal pads 245 may be formed by electroless plating a nickel layer with a thickness of between 0.5 and 5 micrometers, and preferably of between 1 and 3 micrometers, on the first contact points of the copper traces 210 exposed by the openings in the polymer layer 200, and then electroless plating a tin-containing layer, such as pure tin, a tin-silver alloy, a tin-silver-copper alloy or a tin-lead alloy, with a thickness of between 0.05 and 2 micrometers, and preferably of between 0.05 and 0.5 micrometers, on the nickel layer in the openings in the polymer layer 200, wherein the openings in the polymer layer 200 are filled up with the nickel layer and the tin-containing layer.

The metal bumps 12 of the semiconductor chip 2 are bonded with the copper traces 210, exposed by the openings 220*a*, of the flexible circuit film 40 through the interface bonding layer 250. The methods, of bonding the metal bumps 12 of the semiconductor chip 2 with the copper traces 210 of the flexible circuit film 40, as shown in FIG. 5A can be referred to as the methods, of bonding the metal bumps 12 of the semiconductor chip 2 with the copper traces 210 of the flexible circuit film 36, as illustrated in the first and second cases shown in FIGS. 3B and 3C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 5A can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 5A can be referred to as the specification of the metal bumps 12, between the semiconductor chip 2 and the copper traces 210, formed in the process as illustrated in the second case shown in FIG. 3B.

Figure 5B:
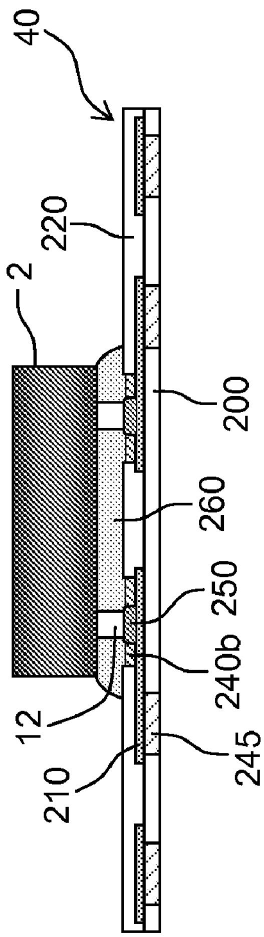

Referring to FIG. 5B, after the semiconductor chip 2 is bonded with the flexible circuit film 40, the polymer layer 260 is filled into the gap between the semiconductor chip 2 and the flexible circuit film 40, enclosing the metal bumps 12, by dispensing a polymer on the flexible circuit film 40 close to the semiconductor chip 2, with the polymer flowing into the gap between the semiconductor chip 2 and the flexible circuit film 40, and then curing the flowing polymer at a temperature of between 100 and 250° C. The material of the polymer layer 260 may be expoxy, polyester, polybenzoxazole or polyimide.

Figure 5C:
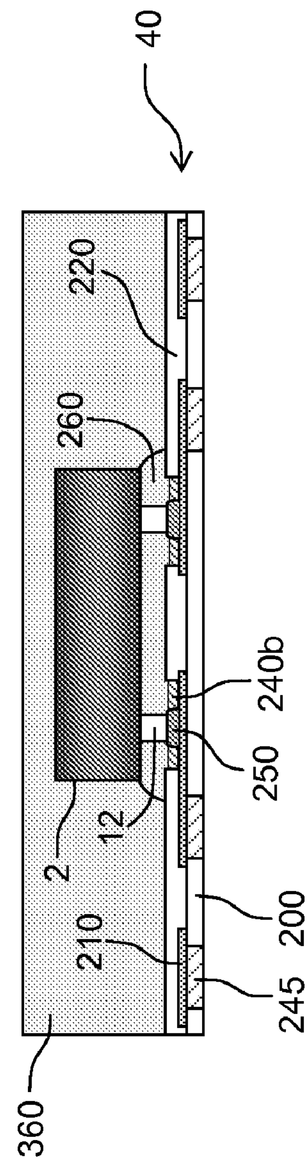

Referring to FIG. 5C, after the polymer layer 260 is formed, the polymer compound 360 is formed on the semiconductor chip 2 and on the flexible circuit film 40 by molding an epoxy-based polymer with carbon fillers therein on the semiconductor chip 2 and on the flexible circuit film 40 at a temperature of between 130 and 250° C. Alternatively, the polymer compound 360 can be polyimide or polyester. Preferably, the polymer compound 360 has a value of Young's modulus less than 0.5 GPa.

Figure 5D:
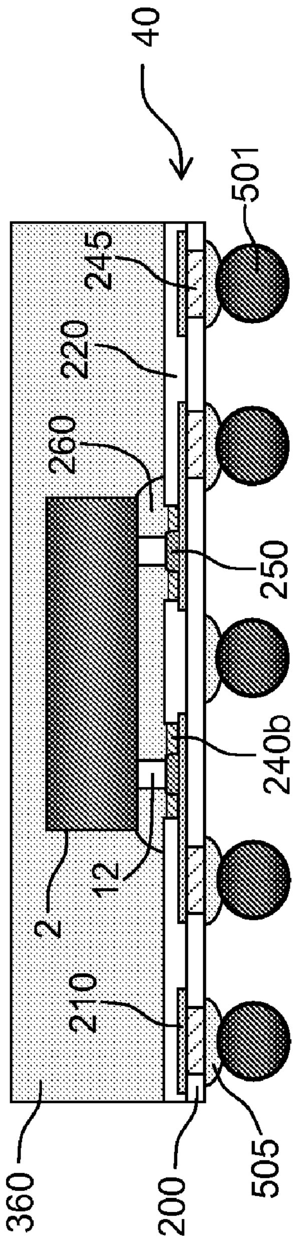
Figure 5E:
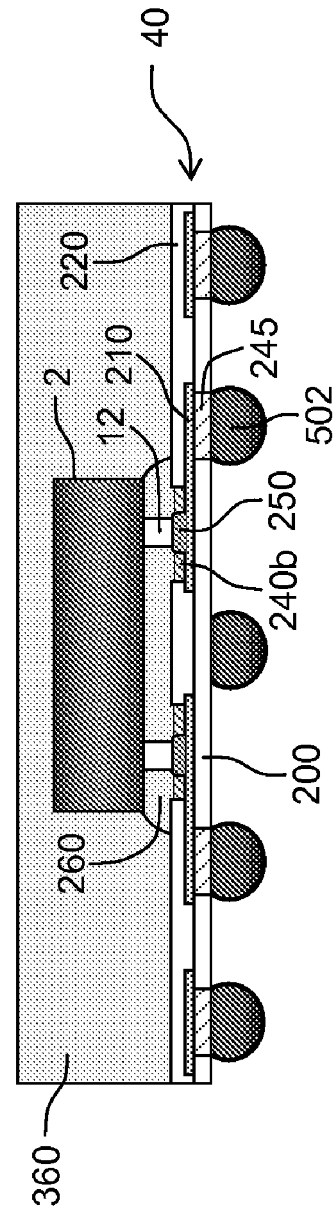

Referring to FIGS. 5D and 5E, after the polymer compound 360 is formed, the solder balls 501 shown in FIG. 5D are placed, in a ball-grid-array arrangement, on the flux or solder paste 505 preformed on the metal pads 245 of the flexible circuit film 40 using a ball placement process to form the solder balls 502 shown in FIG. 5E on the flexible circuit film 40. The solder balls 502 can be formed by printing the flux or solder paste 505 on the metal pads 245, next placing the solder balls 501, such as pure tin, a tin-silver alloy, a tin-silver-copper alloy or a tin-lead alloy, having a diameter of between 0.25 and 1.2 millimeters on the flux or solder paste 505, next reflowing the solder balls 501 at a peak temperature of between 230 and 270° C., and then cleaning the remaining flux from the flexible circuit film 40. The solder balls 502 have a diameter of between 0.2 and 1.2 millimeters, and the solder balls 502 may include pure tin, a tin-silver alloy, a tin-silver-copper alloy or a tin-lead alloy.

For example, during the step of reflowing the solder balls 501, when the metal pads 245 have a bottommost metal layer of gold, the gold layer of the metal pads 245 is solved in the solder balls 502. Preferably, the metal pads 245 have a nickel layer between the gold layer and the copper traces 210. The nickel layer serves as a barrier layer preventing copper in the copper traces 210 from being solved in the solder balls 502 after the solder balls 502 are formed on the flexible circuit film 40. In the case of gold serving as a bottommost metal layer of the metal pads 245, the solder balls 502, after being joined with the flexible circuit film 40, may include a portion, of a tin-gold alloy, a tin-silver-gold-copper alloy, a tin-silver-gold alloy or a tin-lead-gold alloy, on the nickel layer of the metal pads 245 and under the first contact points of the copper traces 210 due to the reaction between gold in the metal pads 245 and tin in the solder balls 501 during reflowing the solder balls 501.

Alternatively, during the step of reflowing the solder balls 501, when the metal pads 245 have a bottommost metal layer of copper, all or a part of the copper layer of the metal pads 245 may be solved in the solder balls 502. In the case of copper serving as a bottommost metal layer of the metal pads 245, the solder balls 502, after being joined with the flexible circuit film 40, may include a portion, of a tin-silver-copper alloy, a tin-lead-copper alloy or a tin-copper alloy, under the first contact points of the copper traces 210 due to the reaction between copper in the metal pads 245 and tin in the solder balls 501 during reflowing the solder balls 501.

After the solder balls 502 are formed on the flexible circuit film 40, the flexible circuit film 40 and the polymer compound 360 can be cut into multiple units.

Alternatively, the solder balls 502 can be omitted, as shown in FIG. 5C. The flexible circuit film 40 is sawed into multiple units. After sawing the flexible circuit film 40, the metal pads 245 of the flexible circuit film 40 can be joined with a solder, containing pure tin, a tin-silver alloy, a tin-lead alloy or a tin-silver-copper alloy, preformed on an external circuit or can contact with contact points of a socket.

Thereby, the fine-pitched metal bumps 12 of the semiconductor chip 2 can be fanned out through the copper traces 210 of the flexible circuit film 40 by bonding the semiconductor chip 2 with the flexible circuit film 40. The semiconductor chip 2 has the fine-pitched metal bumps 12 connected to an external circuit, such as a printed circuit board (PCB) comprising a glass fiber as a core, through the copper traces 210 of the flexible circuit film 40.

Embodiment 3

Figure 6A:
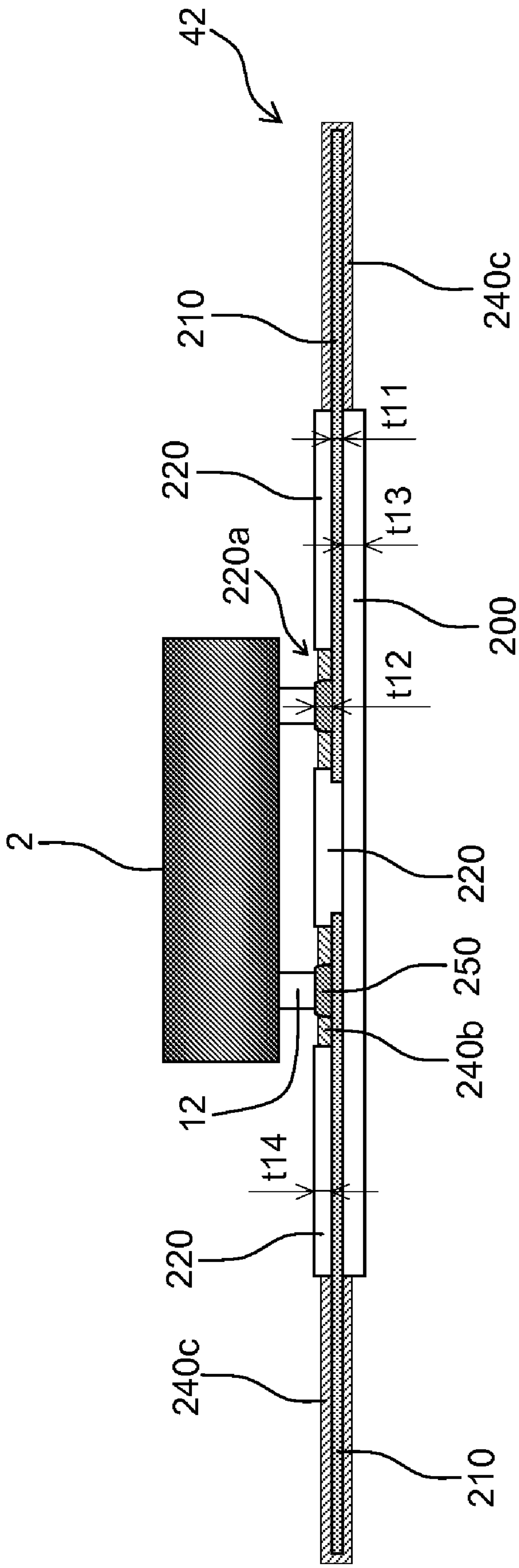
FIGS. 6A-6G are cross-sectional views showing a process for bonding a semiconductor chip with a flexible circuit film using a chip-on-film (COF) technology and joining the flexible circuit film with a rigid substrate according to another embodiment of the present invention.

FIG. 6A is a schematically cross-sectional figure showing a chip-on-film package. A flexible circuit film 42 includes a polymer layer 200, a polymer layer 220, a wetting layer 240*b*, a wetting layer 240*c* and copper traces 210 between the polymer layers 200 and 220, wherein the polymer layers 200 and 220 uncover top and bottom sides of the copper traces 210 at the outer portion of the flexible circuit film 42. The wetting layer 240*b* is on contact points, exposed by openings 220*a*, of the copper traces 210 in the polymer layer 220. The wetting layer 240*c* is on the copper traces 210 at the outer portion of the flexible circuit film 42. The specification of the polymer layer 200, the polymer layer 220 and the copper traces 210 shown in FIG. 6A can be referred to as the specification of the polymer layer 200, the polymer layer 220 and the copper traces 210 illustrated in FIG. 3A. The specification of the wetting layer 240*b* shown in FIG. 6A can be referred to as the specification of the wetting layer 240*b* illustrated in FIGS. 3B and 3C. Alternatively, the copper traces 210 can be replaced by gold traces having a thickness of between 3 and 30 μm, of between 5 and 20 micrometers or of between 4 and 10 micrometers. Alternatively, the copper traces 210 can be replaced by silver traces having a thickness of between 3 and 30 μm, of between 5 and 20 micrometers or of between 4 and 10 micrometers.

The wetting layer 240*c* having a thickness of between 0.05 and 2 micrometers, and preferably of between 0.1 and 1 micrometer, may be gold, copper, nickel, silver, tin or a composite of the above-mentioned materials. For example, the wetting layer 240*c* may be a tin-containing layer, such as pure tin, a tin-silver alloy, a tin-lead alloy or a tin-silver-copper alloy, having a thickness of between 0.05 and 2 micrometers, and preferably of between 0.1 and 1 micrometer, on the copper traces 210 at the outer portion of the flexible circuit film 42. Alternatively, the wetting layer 240*c* may be a gold layer having a thickness of between 0.05 and 2 micrometers, and preferably of between 0.1 and 1 micrometer, on the copper traces 210 at the outer portion of the flexible circuit film 42.

The metal bumps 12 of the semiconductor chip 2 are bonded with the copper traces 210, exposed by the openings 220*a*, of the flexible circuit film 42 through an interface bonding layer 250. The specification of the interface bonding layer 250 shown in FIG. 6A can be referred to as the specification of the interface bonding layer 250 formed in the process as illustrated in the first case shown in FIGS. 3A and 3B. The methods, of bonding the metal bumps 12 of the semiconductor chip 2 with the copper traces 210 of the flexible circuit film 42, as shown in FIG. 6A can be referred to as the methods, of bonding the metal bumps 12 of the semiconductor chip 2 with the copper traces 210 of the flexible circuit film 36, as illustrated in the first and second cases shown in FIGS. 3B and 3C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 6A can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 6A can be referred to as the specification of the metal bumps 12, between the semiconductor chip 2 and the copper traces 210, formed in the process as illustrated in the second case shown in FIG. 3B.

Figure 6B:
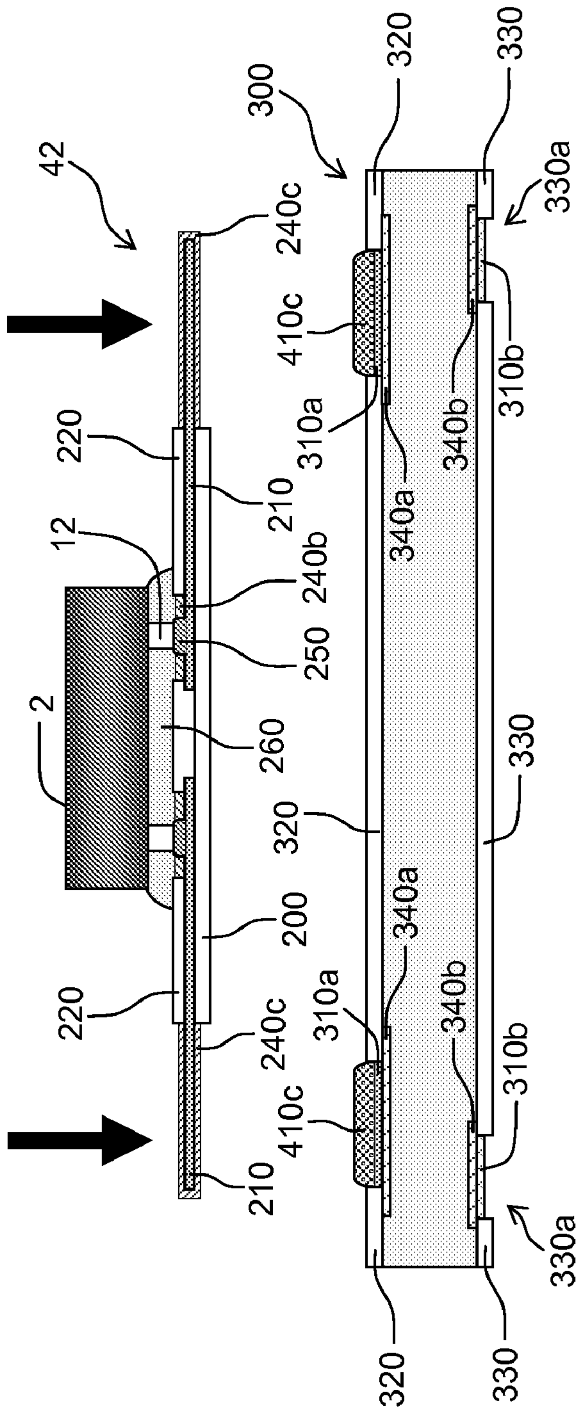

Referring to FIG. 6B, a polymer layer 260 is filled into the gap between the semiconductor chip 2 and the flexible circuit film 42, enclosing the metal bumps 12, by dispensing a polymer on the flexible circuit film 42 close to the semiconductor chip 2, with the polymer flowing into the gap between the semiconductor chip 2 and the flexible circuit film 42, and then curing the flowing polymer at a temperature of between 100 and 250° C. The material of the polymer layer 260 may be expoxy, polyester, polybenzoxazole or polyimide.

Metal joints 410*c*, such as tin-containing joints, are formed on the metal pads 310*a* of the substrate 300 shown in FIG. 3E by screen printing a solder paste containing flux and solder, such as pure tin, a tin-silver alloy, a tin-silver-copper alloy or a tin-lead alloy, on the metal pads 310*a* and then reflowing the solder paste. The metal joints 410*a* may be formed of pure tin, a tin-silver alloy, a tin-silver-copper alloy or a tin-lead alloy. The specification of the substrate 300 shown in FIG. 6B can be referred to as the specification of the substrate 300 illustrated in FIGS. 3E. Two methods of bonding the flexible circuit film 42 with the substrate 300 are described as follow.

In a first case, referring to FIGS. 6B and 6C, when the metal joints 410*c* are tin-containing joints, the metal joints 410*c* can be used to be joined with the wetting layer 240*c* of pure tin or an above-mentioned tin alloy using a heat press process, which method is described as below. First, the substrate 300 is placed on a stage kept at a temperature of between 150 and 350° C., and preferably of between 200 and 300° C. Next, the flexible circuit film 42 is thermally pressed on the metal joints 410*c* on the metal pads 310*a* of the substrate 300 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*c* with the metal joints 410*c*. In the step of joining the wetting layer 240*c* with the metal joints 410*c*, metal joints 410*d* can be formed between the topmost copper traces 340*a* of the substrate 300 and the copper traces 210 at the outer portion of the flexible circuit film 42. The metal joints 410*d* can be tin-containing joints having a thickness t19 of between 0.5 and 100 micrometers, and preferably of between 1 and 10 micrometers, wherein the tin-containing joints may include pure tin, a tin-silver alloy, a tin-lead alloy or a tin-silver-copper alloy. The tin-containing joints may include a tin-gold alloy, a tin-silver-gold alloy, a tin-silver-gold-copper alloy or a tin-lead-gold alloy at the bottom side of the tin-containing joints due to the reaction between tin in the metal joints 410*c* and gold at the top of the metal pads 310*a*. Preferably, the metal pads 310*a* have a nickel layer between the metal joints 410*d* and the copper traces 340*a*. The nickel layer serves as a barrier layer preventing copper in the copper traces 340*a* from being solved in the metal joints 410*d* after the metal joints 410*d* are formed between the flexible circuit film 42 and the substrate 300. Next, the tool head is removed from the flexible circuit film 42. Next, the substrate 300 bonded with flexible circuit film 42 is removed from the stage.

In a second case, referring to FIGS. 6B and 6C, when the metal joints 410*c* are tin-containing joints, the metal joints 410*c* can be used to be joined with a gold layer of the wetting layer 240*c* using a heat press process, which method is described as below. First, the substrate 300 is placed on a stage kept at a temperature of between 150 and 350° C., and preferably of between 200 and 300° C. Next, the flexible circuit film 42 is thermally pressed on the metal joints 410*c* on the metal pads 310*a* of the substrate 300 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*c* with the metal joints 410*c*. In the step of joining the wetting layer 240*c* with the metal joints 410*c*, the metal joints 410*d* can be formed between the topmost copper traces 340*a* of the substrate 300 and the copper traces 210 at the outer portion of the flexible circuit film 42. The metal joints 410*d* can be tin-containing joints having a thickness t19 of between 0.5 and 100 micrometers, and preferably of between 1 and 10 micrometers. The tin-containing joints may include a tin-silver-gold-copper alloy, a tin-silver-gold alloy, a tin-gold alloy or a tin-lead-gold alloy at the top side of the tin-containing joints due to the reaction between tin in the metal joints 410*c* and gold at the top of the wetting layer 240*c*. The tin-containing joints may include a tin-gold alloy, a tin-silver-gold alloy, a tin-silver-gold-copper alloy or a tin-lead-gold alloy at the bottom side of the tin-containing joints due to the reaction between tin in the metal joints 410*c* and gold at the top of the metal pads 310*a*. Preferably, the metal pads 310*a* have a nickel layer between the metal joints 410*d* and the copper traces 340*a*. The nickel layer serves as a barrier layer preventing copper in the copper traces 340*a* from being solved in the metal joints 410*d* after the metal joints 410*d* are formed between the flexible circuit film 42 and the substrate 300. Next, the tool head is removed from the flexible circuit film 42. Next, the substrate 300 bonded with the flexible circuit film 42 is removed from the stage.

Figure 6C:
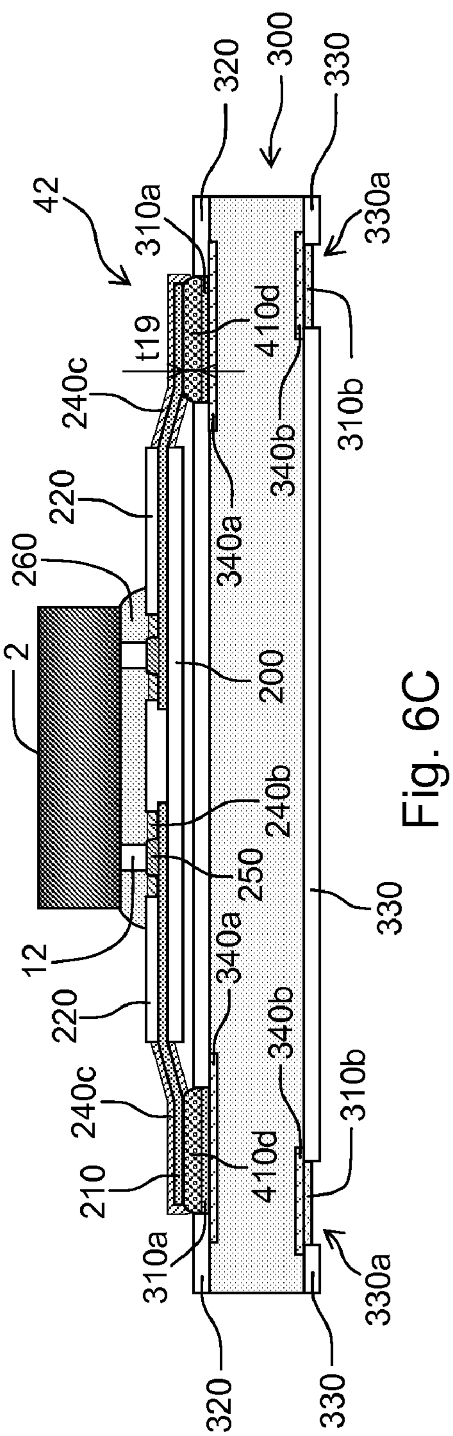

Referring to FIG. 6C, there is no opening in the polymer layer 200 exposing the copper traces 210 to lead the copper traces 210 to be connected to the substrate 300. Alternatively, the metal joints 410*d* can be replaced by an anisotropic conductive film (ACF). The anisotropic conductive film can be preformed on the metal pads 310*a* of the substrate 300 shown in FIG. 3E, and then the wetting layer 240*c* on the copper traces 210 at the outer portion of the flexible circuit film 42 can be pressed on the anisotropic conductive film, such that metal particles in the anisotropic conductive film connects the wetting layer 240*c* of the flexible circuit film 42 to the metal pads 310*a* of the substrate 300.

Figure 6D:
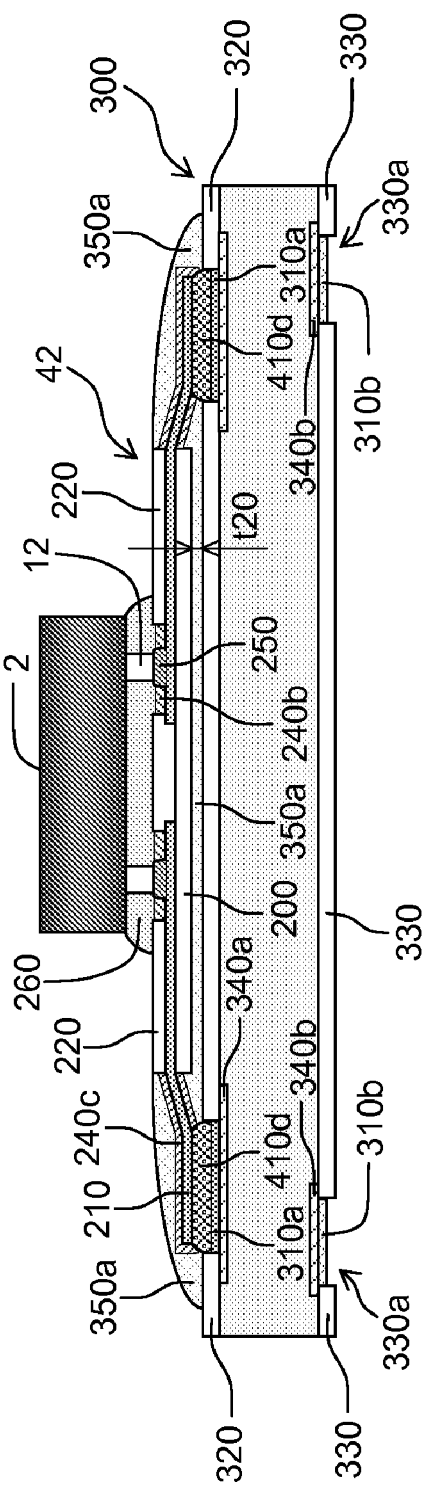

Referring to FIG. 6D, after the flexible circuit film 42 is bonded with the substrate 300, a polymer layer 350*a* can be filled into the gap between the flexible circuit film 42 and the substrate 300, enclosing the metal joints 410*d* and the wetting layer 240*c*, by dispensing a polymer on the substrate 300 close to the flexible circuit film 42, with the polymer flowing into the gap between the flexible circuit film 42 and the substrate 300, and then curing the flowing polymer at a temperature of between 100 and 250° C. The material of the polymer layer 350*a* may be expoxy, polyester or polyimide, and the polymer layer 350*a* between the flexible circuit film 42 and the substrate 300 has a thickness t20 of between 1 and 30 micrometers.

Figure 6E:
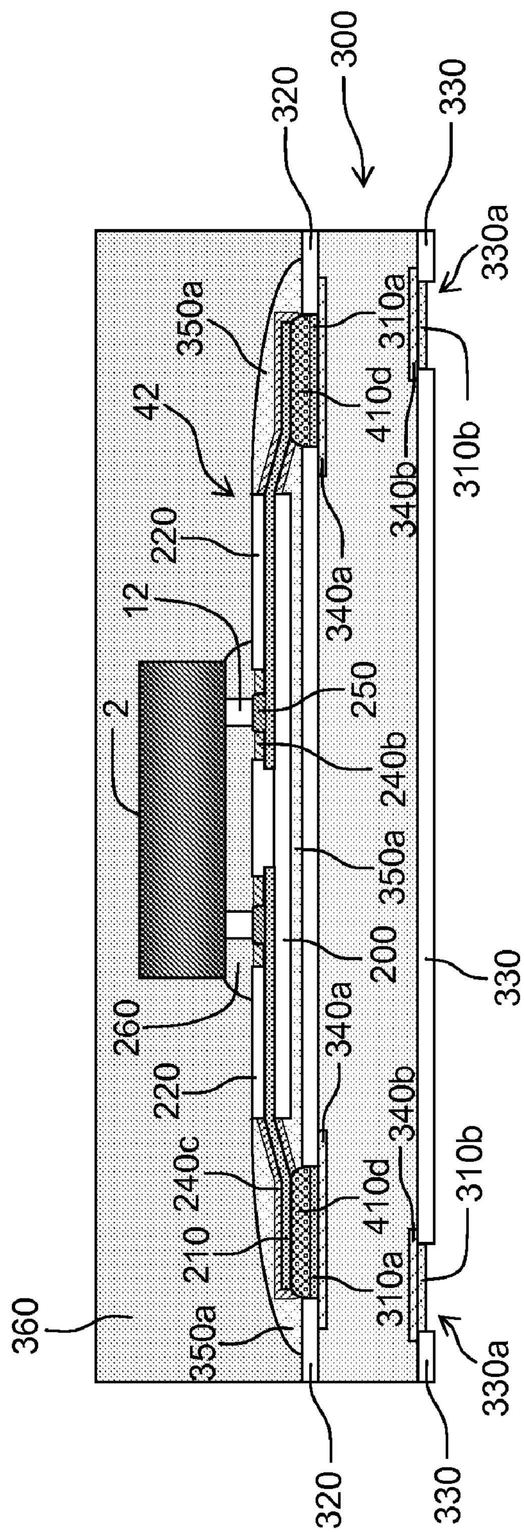

Referring to FIG. 6E, a polymer compound 360 is formed on the semiconductor chip 2, on the flexible circuit film 42 and on a peripheral region of the substrate 300 by molding an epoxy-based polymer with carbon fillers therein on the semiconductor chip 2, on the flexible circuit film 42 and on the peripheral region of the substrate 300 at a temperature of between 130 and 250° C. Alternatively, the polymer compound 360 can be polyimide or polyester. Preferably, the polymer compound 360 has a value of Young's modulus less than 0.5 GPa.

Figure 6F:
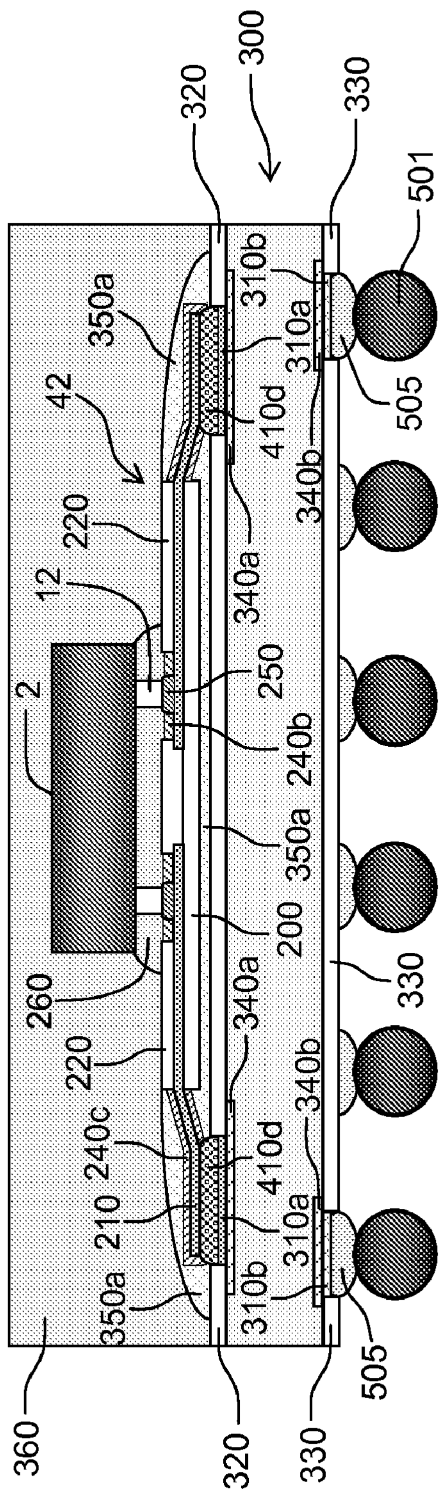
Figure 6G:
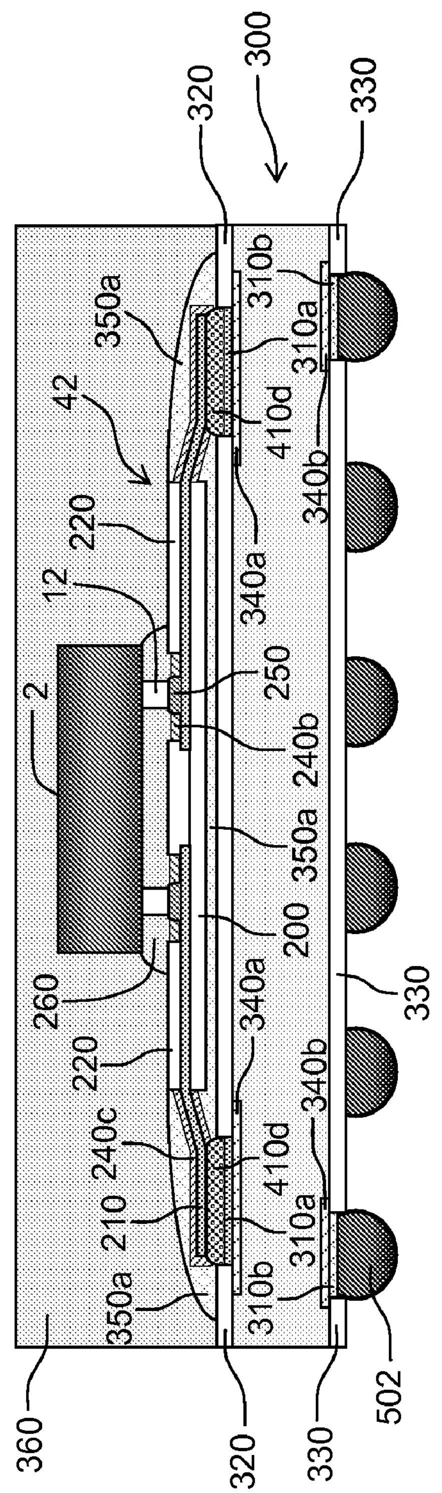

Referring to FIGS. 6F and 6G, solder balls 501 shown in FIG. 6F may be being placed, in a ball-grid-array arrangement, on a flux or solder paste 505 preformed on the metal pads 310*b* of the substrate 300 using a ball placement process to form solder balls 502 shown in FIG. 6G on the substrate 300. The solder balls 502 can be formed by printing the flux or solder paste 505 on the metal pads 310*b*, next placing the solder balls 501, such as pure tin, a tin-silver alloy, a tin-lead alloy or a tin-silver-copper alloy, having a diameter of between 0.25 and 1.2 millimeters on the flux or solder paste 505, next reflowing the solder balls 501 at a peak temperature of between 230 and 270° C., and then cleaning the remaining flux from the substrate 300. The solder balls 502 have a diameter of between 0.2 and 1.2 millimeters, and the solder balls 502 may include pure tin, a tin-silver alloy, a tin-silver-copper alloy or a tin-lead alloy.

For example, during the step of reflowing the solder balls 501, when the metal pads 310*b* have a bottommost metal layer of gold, the gold layer of the metal pads 310*b* is solved in the solder balls 502. Preferably, the metal pads 310*b* have a nickel layer between the gold layer and the copper traces 340*b*. The nickel layer serves as a barrier layer preventing copper in the copper traces 340*b* from being solved in the solder balls 502 after the solder balls 502 are formed on the substrate 300. In the case of gold serving as a bottommost metal layer of the metal pads 310*b*, the solder balls 502, after being joined with the substrate 300, may include a portion, of a tin-silver-gold-copper alloy, a tin-silver-gold alloy, a tin-gold alloy or a tin-lead-gold alloy, on the nickel layer of the metal pads 310*b* and under the copper traces 340*b* of the substrate 300 due to the reaction between gold in the metal pads 310*b* and tin in the solder balls 501 during reflowing the solder balls 501.

After the solder balls 502 are formed on the substrate 300, the substrate 300 and the polymer compound 360 can be optionally cut into multiple units.

Figure 6H:
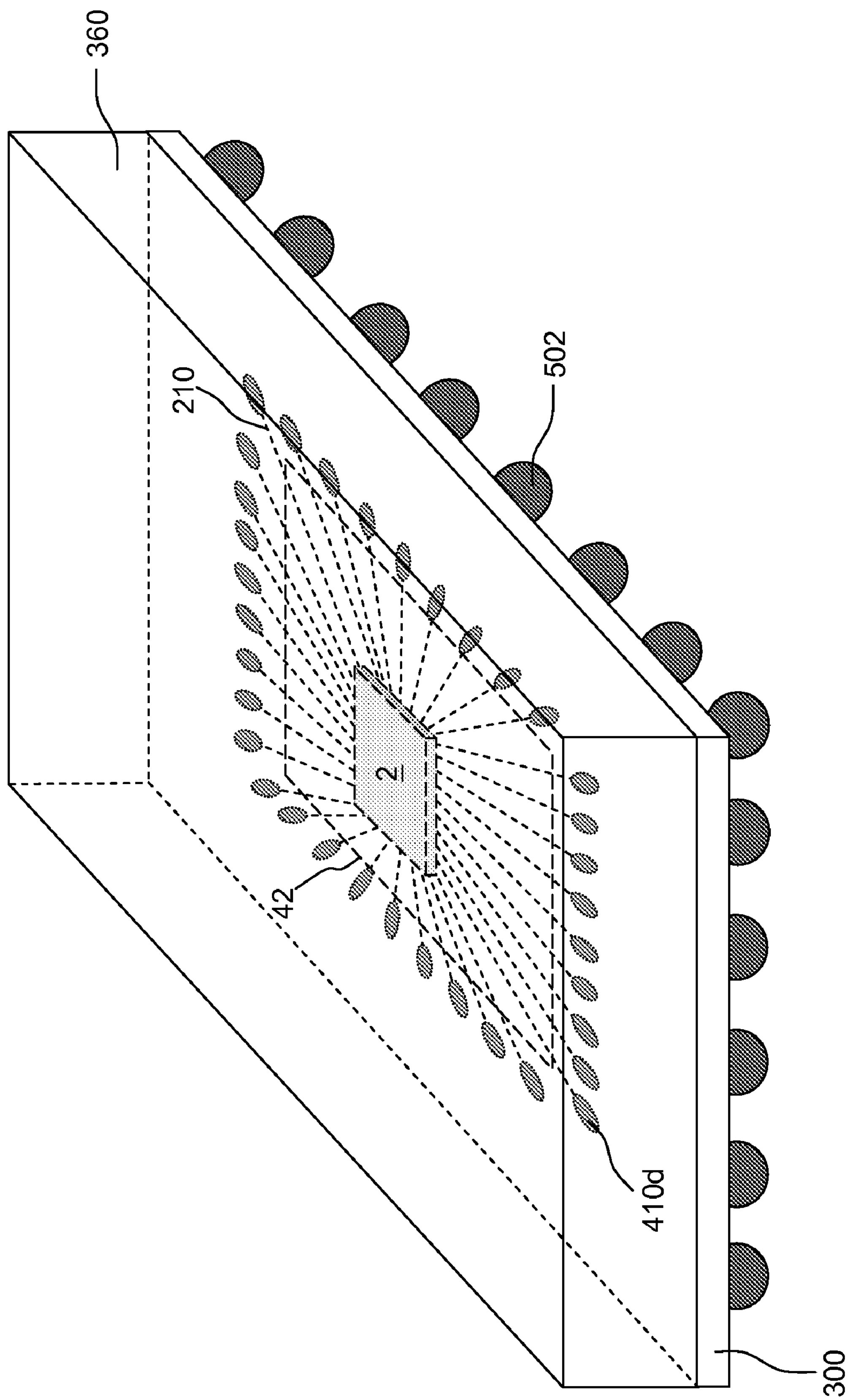
FIGS. 6H and 6I are perspective views showing two chip packages each including a rigid substrate, a flexible circuit film mounted on the rigid substrate and a semiconductor chip joined with the flexible circuit film.

FIG. 6H is a perspective view showing FIG. 6G. The fine-pitched metal bumps 12 of the semiconductor chip 2 can be fanned out through the copper traces 210 of the flexible circuit film 42 by bonding the semiconductor chip 2 with the flexible circuit film 42. The flexible circuit film 42 is also bonded with the substrate 300 to connect the fine-pitched metal bumps 12 of the semiconductor chip 2 with the circuit structure of the substrate 300. Thereby, the semiconductor chip 2 has the fine-pitched metal bumps 12 connected to an external circuit, such as a printed circuit board (PCB) comprising a glass fiber as a core, through the copper traces 210 of the flexible circuit film 42 and the circuit structure of the substrate 300.

Figure 6I:
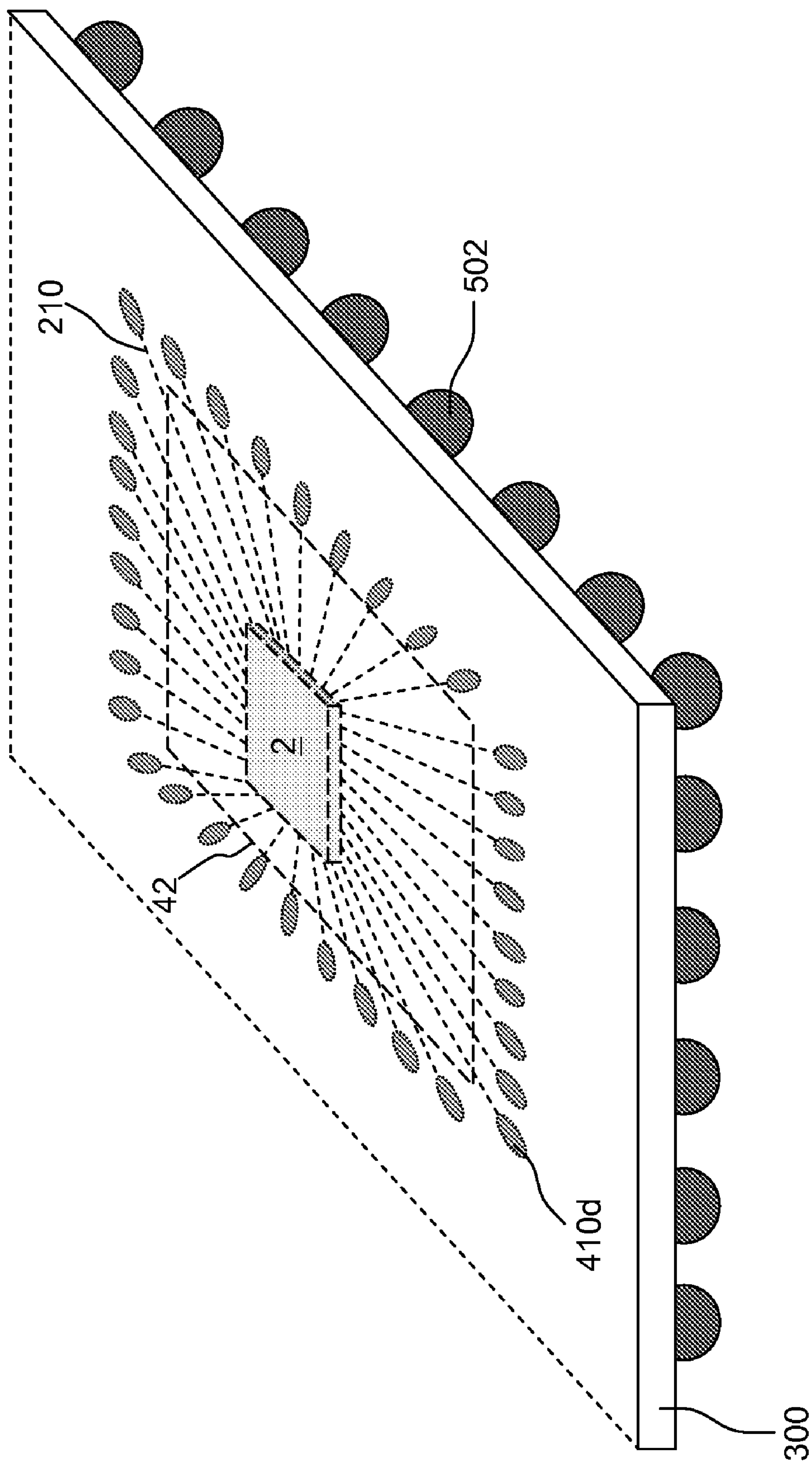
Figure 6J:
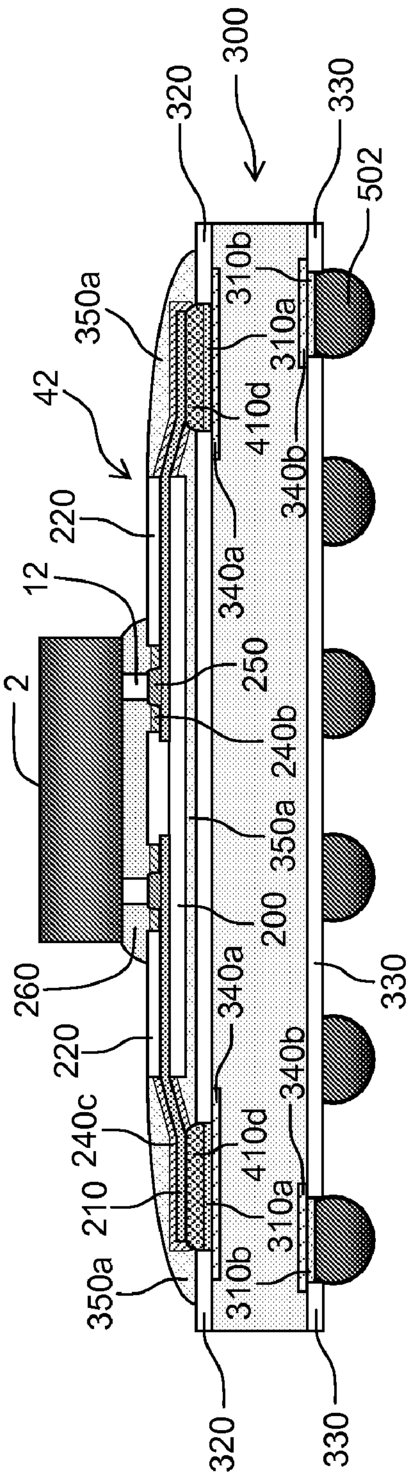
FIGS. 6J-6M are cross-sectional views showing various chip packages each including a rigid substrate, a flexible circuit film mounted on the rigid substrate and a semiconductor chip joined with the flexible circuit film.
Figure 6K:
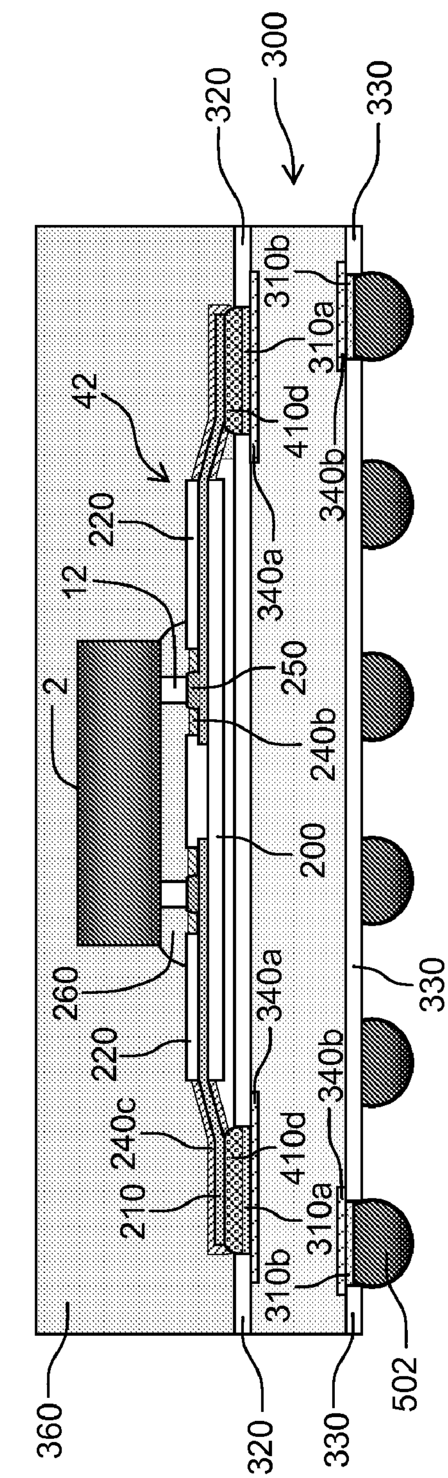
Figure 6L:
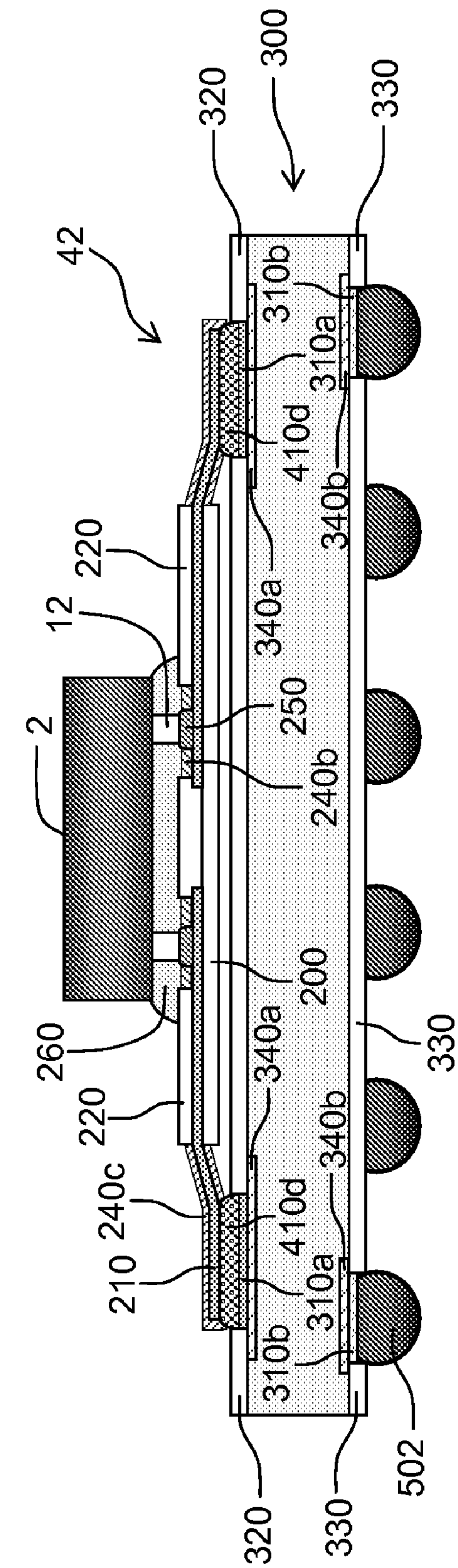

Alternatively, referring to FIGS. 6I and 6J, the step of forming the polymer compound 360, as shown in FIG. 6E, can be omitted, that is, the semiconductor chip 2 and the flexible circuit film 42 are uncovered by any polymer compound. Alternatively, referring to FIG. 6K, the step of forming the polymer layer 350*a*, as shown in FIG. 6D, can be omitted. Alternatively, referring to FIG. 6L, the steps of forming the polymer layer 350*a*, as shown in FIG. 6D, and of forming the polymer compound 360, as shown in FIG. 6E, can be omitted, that is, the semiconductor chip 2 and the flexible circuit film 42 are uncovered by any polymer compound.

Alternatively, the solder balls 502 can be omitted, as shown in FIG. 6E. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer compound 360 and the solder balls 502 can be omitted, as shown in FIG. 6D. The semiconductor chip 2 and the flexible circuit film 42 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 6M:
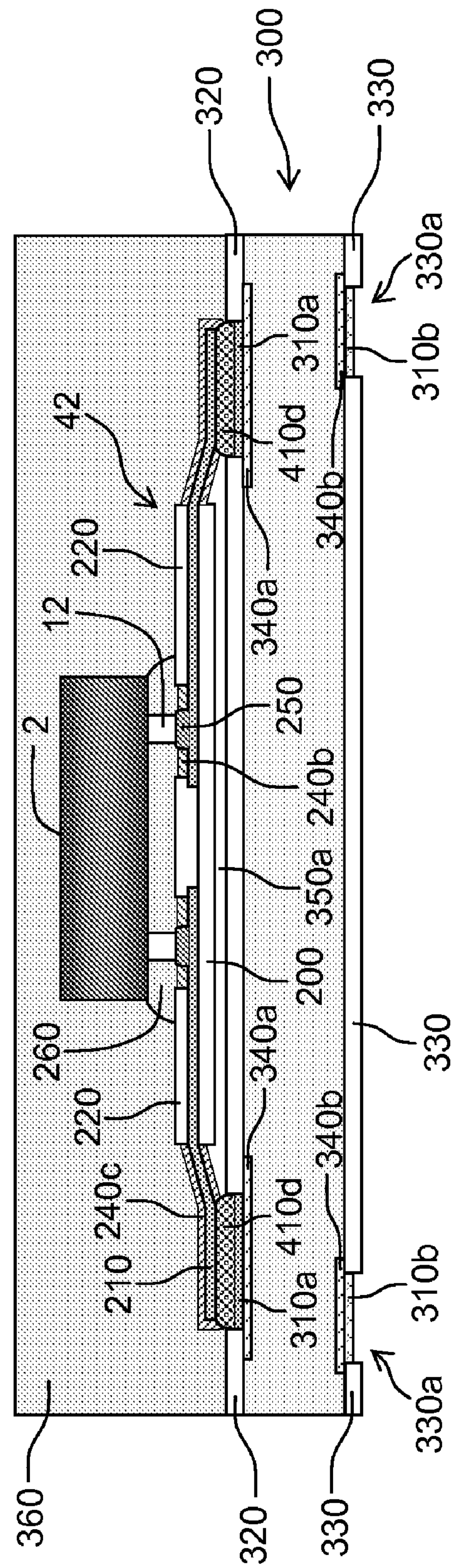

Alternatively, the polymer layer 350*a* and the solder balls 502 can be omitted, as shown in FIG. 6M. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350*a*, the polymer compound 360 and the solder balls 502 can be omitted, as shown in FIG. 6C. The semiconductor chip 2 and the flexible circuit film 42 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 6N:
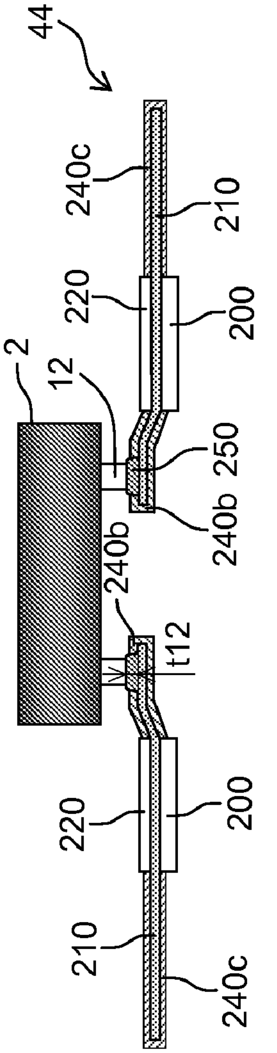
FIGS. 6N-6S are cross-sectional views showing a process for bonding a semiconductor chip with a flexible circuit film using a tape-automated-bonding (TAB) technology and joining the flexible circuit film with a rigid substrate according to another embodiment of the present invention.

FIG. 6N is a schematically cross-sectional figure showing a chip package including the semiconductor chip 2 joined with a flexible circuit substrate 44 using a tape-automated-bonding (TAB) technology. The above-mentioned flexible circuit film 42 can be replaced by the flexible circuit film 44. The flexible circuit film 44 includes the polymer layer 200, the polymer layer 220, the wetting layer 240*b*, the wetting layer 240*c* and the copper traces 210 between the polymer layers 200 and 220, wherein the polymer layers 200 and 220 uncover top and bottom sides of the copper traces 210 at the center portion and the outer portion of the flexible circuit film 44. The wetting layer 240*b* is on the copper traces 210 at the center portion of the flexible circuit film 44, and the wetting layer 240*c* is on the copper traces 210 at the outer portion of the flexible circuit film 44. The specification of the polymer layer 200, the polymer layer 220 and the copper traces 210 shown in FIG. 6N can be referred to as the specification of the polymer layer 200, the polymer layer 220 and the copper traces 210 illustrated in FIG. 3A. The specification of the wetting layer 240*b* shown in FIG. 6N can be referred to as the specification of the wetting layer 240*b* illustrated in FIG. 3S. The specification of the wetting layer 240*c* shown in FIG. 6N can be referred to as the specification of the wetting layer 240*c* illustrated in FIG. 6A. Alternatively, the copper traces 210 can be replaced by gold traces having a thickness of between 3 and 30 μm, of between 5 and 20 micrometers or of between 4 and 10 micrometers. Alternatively, the copper traces 210 can be replaced by silver traces having a thickness of between 3 and 30 μm, of between 5 and 20 micrometers or of between 4 and 10 micrometers.

The metal bumps 12 of the semiconductor chip 2 are bonded with the copper traces 210 at the center portion of the flexible circuit film 44 through the interface bonding layer 250. The specification of the interface bonding layer 250 shown in FIG. 6N can be referred to as the specification of the interface bonding layer 250 formed in the process as illustrated in the first case shown in FIGS. 3R and 3S. The method, of bonding the metal bumps 12 of the semiconductor chip 2 with the copper traces 210 of the flexible circuit film 44, as shown in FIG. 6N can be referred to as the method, of bonding the metal bumps 12 of the semiconductor chip 2 with the copper traces 210 of the flexible circuit film 38, as illustrated in the first and second cases shown in FIG. 3R. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 6N can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 6N can be referred to as the specification of the metal bumps 12, between the semiconductor chip 2 and the copper traces 210, formed in the process as illustrated in the second case shown in FIG. 3B.

Figure 6O:
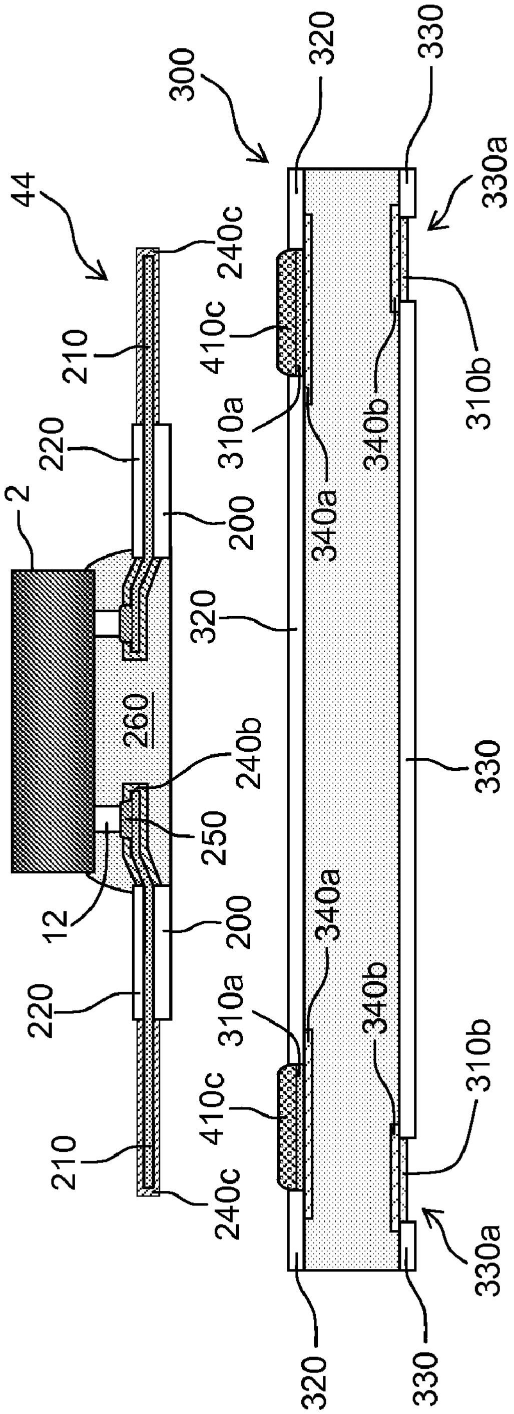

Referring to FIG. 6O, the polymer layer 260 can be formed by dispensing a polymer on the semiconductor chip 2 with the polymer enclosing the metal bumps 12 and the copper traces 210 at the center portion of the flexible circuit film 44, and then curing the polymer at a temperature of between 100 and 250° C. The material of the polymer layer 260 may be expoxy, polyester or polyimide.

The metal joints 410*c*, such as tin-containing joints, are formed on the metal pads 310*a* of the substrate 300 shown in FIG. 3E by screen printing a solder paste containing flux and solder, such as pure tin, a tin-silver alloy, a tin-silver-copper alloy or a tin-lead alloy, on the metal pads 310*a* and then reflowing the solder paste. The metal joints 410*a* may be formed of pure tin, a tin-silver alloy, a tin-silver-copper alloy or a tin-lead alloy. The specification of the substrate 300 shown in FIG. 6O can be referred to as the specification of the substrate 300 illustrated in FIG. 3E.

Figure 6P:
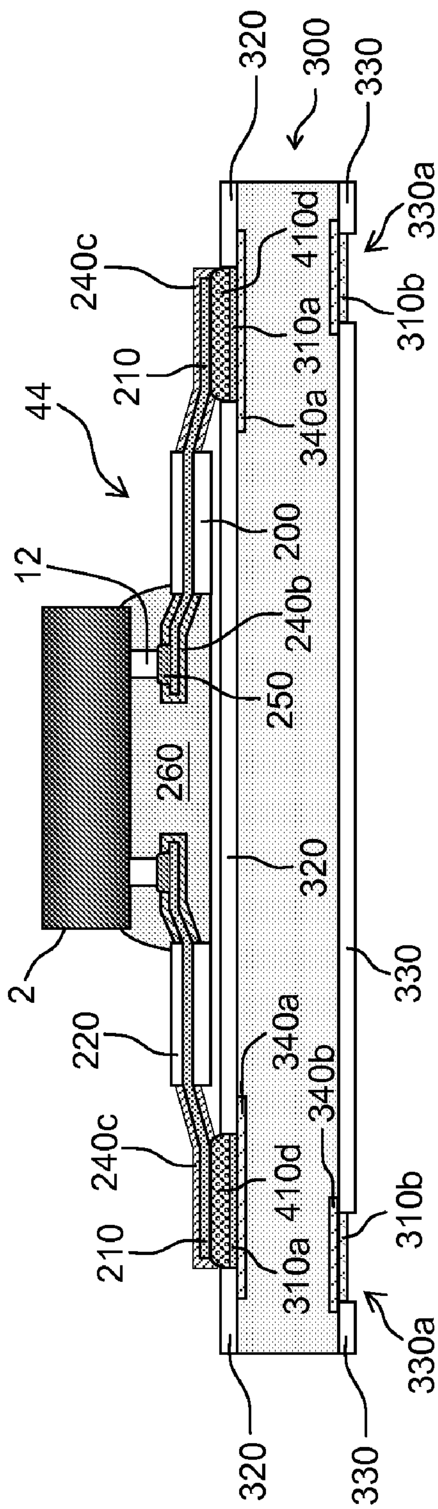

Referring to FIG. 6P, after the polymer layer 260 is formed, the flexible circuit film 44 is bonded with the substrate 300. There is no opening in the polymer layer 200 exposing the copper traces 210 to lead the copper traces 210 to be connected to the substrate 300. The methods of bonding the flexible circuit film 44 with the substrate 300, as shown in FIG. 6P, can be referred to as the methods of bonding the flexible circuit film 42 with the substrate 300, as illustrated in the first and second cases shown in FIGS. 6B and 6C.

Alternatively, the metal joints 410*d* can be replaced by an anisotropic conductive film (ACF). The anisotropic conductive film can be preformed on the metal pads 310*a* of the substrate 300 shown in FIG. 3E, and then the wetting layer 240*c* on the copper traces 210 at the outer portion of the flexible circuit film 44 can be pressed on the anisotropic conductive film, such that metal particles in the anisotropic conductive film connects the wetting layer 240*c* of the flexible circuit film 44 to the metal pads 310*a* of the substrate 300.

Figure 6Q:
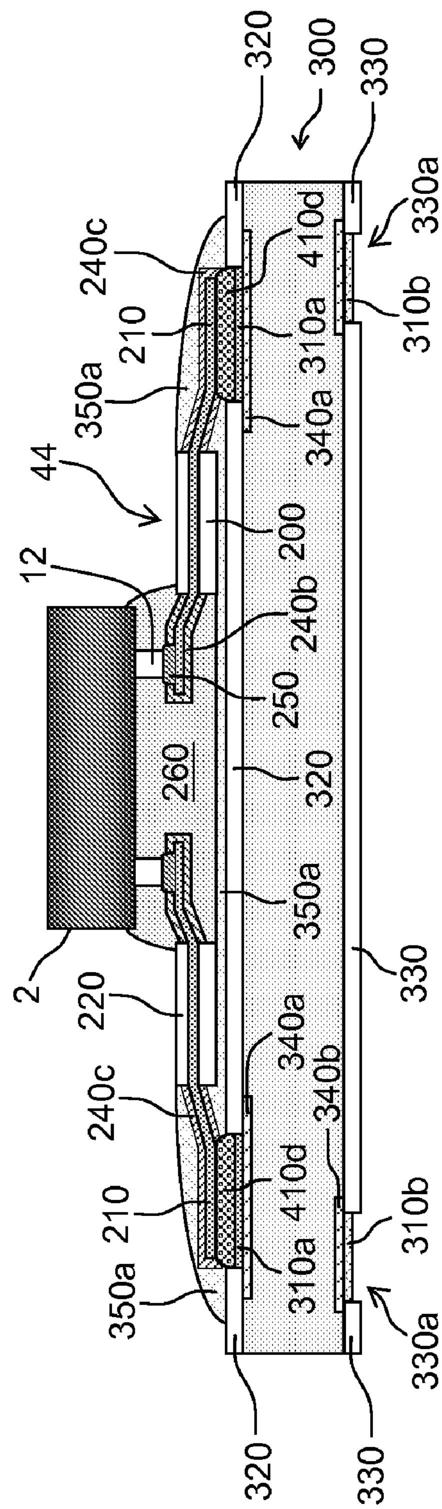

Referring to FIG. 6Q, after the flexible circuit film 44 is bonded with the substrate 300, the polymer layer 350*a* can be optionally filled into the gap between the flexible circuit film 44 and the substrate 300, enclosing the metal joints 410*d* and the wetting layer 240*c*, by dispensing a polymer on the substrate 300 close to the flexible circuit film 44, with the polymer flowing into the gap between the flexible circuit film 44 and the substrate 300, and then curing the flowing polymer at a temperature of between 100 and 250° C. The specification of the polymer layer 350*a* shown in FIG. 6Q can be referred to as the specification of the polymer layer 350*a* illustrated in FIG. 6D.

Figure 6R:
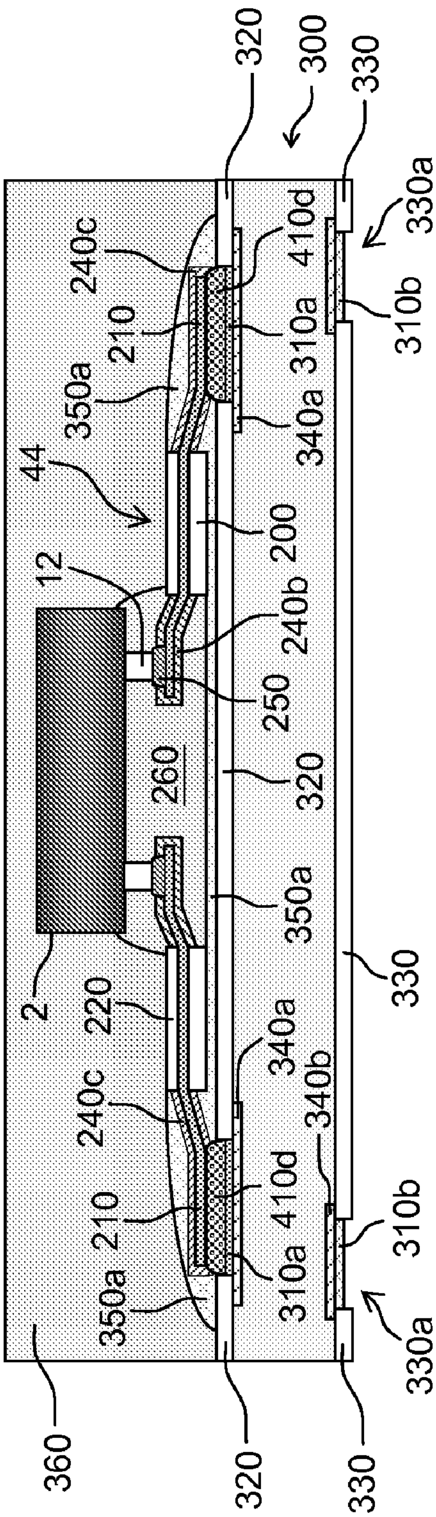

Referring to FIG. 6R, the polymer compound 360 can be optionally formed on the semiconductor chip 2, on the flexible circuit film 44 and on a peripheral region of the substrate 300 by molding an epoxy-based polymer with carbon fillers therein on the semiconductor chip 2, on the flexible circuit film 44 and the peripheral region of the substrate 300 at a temperature of between 130 and 250° C. Alternatively, the polymer compound 360 can be polyimide or polyester. Preferably, the polymer compound 360 has a value of Young's modulus less than 0.5 GPa.

Figure 6S:
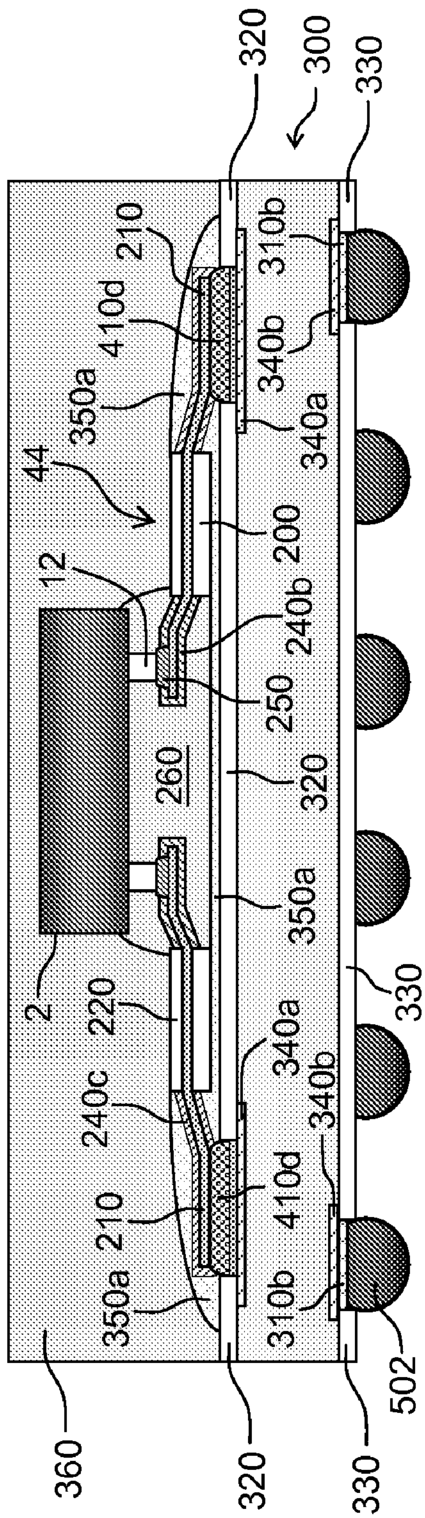

Referring to FIG. 6S, after the polymer compound 360 is formed, the solder balls 502 may be formed, in a ball-grid-array arrangement, on the metal pads 310*b* of the substrate 300 using a ball placement process. The process, of forming the solder balls 502 on the metal pads 310*b* of the substrate 300, as shown in FIG. 6S can be referred to as the process, of forming the solder balls 502 on the metal pads 310*b* of the substrate 300, as illustrated in FIGS. 6F and 6G. The specification of the solder balls 502 shown in FIG. 6S can be referred to as the specification of the solder balls 502 illustrated in FIGS. 6F and 6G.

Thereby, the fine-pitched metal bumps 12 of the semiconductor chip 2 can be fanned out through the copper traces 210 of the flexible circuit film 44 by bonding the semiconductor chip 2 with the flexible circuit film 44. The flexible circuit film 44 is also bonded with the substrate 300 to connect the fine-pitched metal bumps 12 of the semiconductor chip 2 with the circuit structure of the substrate 300. The semiconductor chip 2 has the fine-pitched metal bumps 12 connected to an external circuit, such as a printed circuit board (PCB) comprising a glass fiber as a core, through the copper traces 210 of the flexible circuit film 44 and the circuit structure of the substrate 300.

Alternatively, the step of forming the polymer compound 360, as shown in FIG. 6R, can be omitted, that is, the semiconductor chip 2 and the flexible circuit film 44 are uncovered by any polymer compound. Alternatively, the step of forming the polymer layer 350*a*, as shown in FIG. 6Q, can be omitted. Alternatively, the steps of forming the polymer layer 350*a*, as shown in FIG. 6Q, and of forming the polymer compound 360, as shown in FIG. 6R, can be omitted, that is, the semiconductor chip 2 and the flexible circuit film 44 are uncovered by any polymer compound.

Alternatively, the solder balls 502 can be omitted, as shown in FIG. 6R. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer compound 360 and the solder balls 502 can be omitted, as shown in FIG. 6Q. The semiconductor chip 2 and the flexible circuit film 44 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 6T:
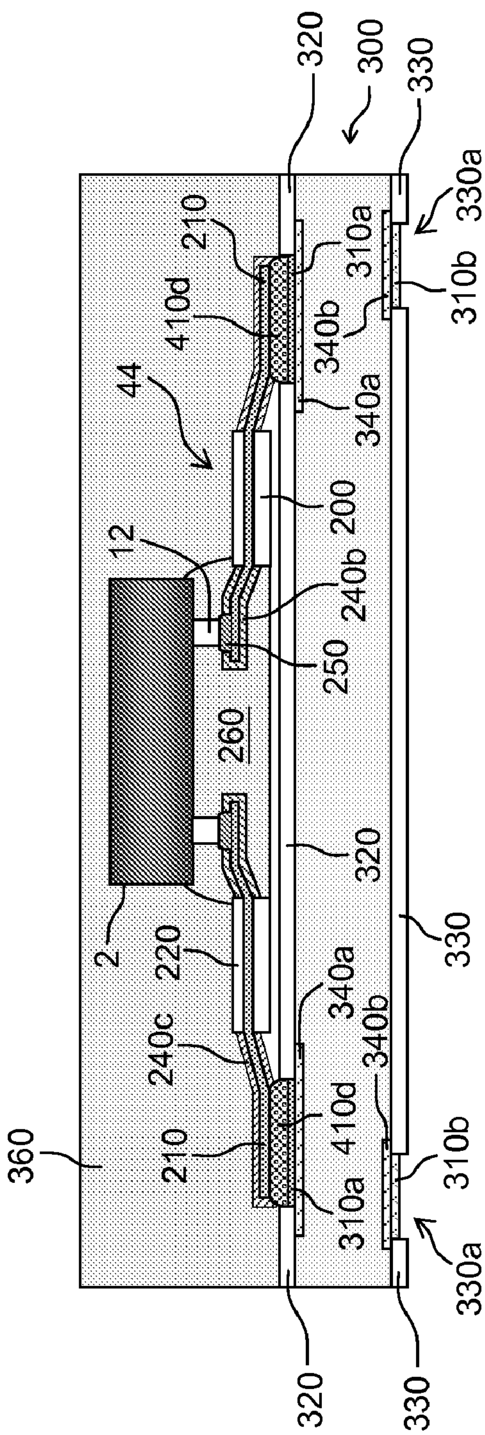
FIG. 6T is a cross-sectional view showing a chip package including a rigid substrate, a flexible circuit film mounted on the rigid substrate and a semiconductor chip joined with the flexible circuit film.

Alternatively, the polymer layer 350*a* and the solder balls 502 can be omitted, as shown in FIG. 6T. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350*a*, the polymer compound 360 and the solder balls 502 can be omitted, as shown in FIG. 6P. The semiconductor chip 2 and the flexible circuit film 44 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Embodiment 4

Figure 7A:
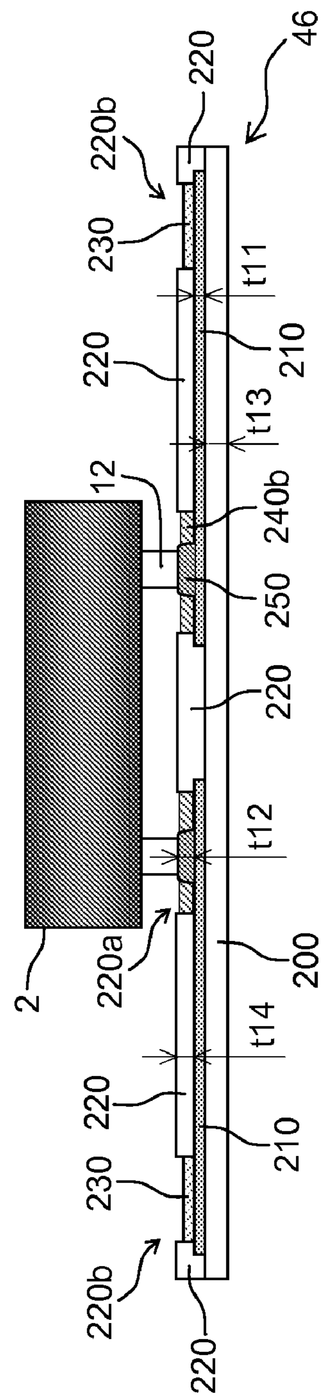
FIGS. 7A-7F are cross-sectional views showing a process for bonding a semiconductor chip with a flexible circuit film using a chip-on-film (COF) technology and connecting the flexible circuit film to a rigid substrate using a wirebinding process according to another embodiment of the present invention.

FIG. 7A is a schematically cross-sectional figure showing a chip-on-film package. A flexible circuit film 46 includes a polymer layer 200, a polymer layer 220, a wirebondable layer 230, a wetting layer 240*b* and copper traces 210 between the polymer layers 200 and 220. The wirebondable layer 230 is on first contact points, exposed by openings 220*b*, of the copper traces 210 in the polymer layer 220, and the wetting layer 240*b* is on second contact points, exposed by openings 220*a*, of the copper traces 210 in the polymer layer 220. The specification of the polymer layer 200, the polymer layer 220 and the copper traces 210 shown in FIG. 7A can be referred to as the specification of the polymer layer 200, the polymer layer 220 and the copper traces 210 illustrated in FIG. 3A. The specification of the wetting layer 240*b* shown in FIG. 7A can be referred to as the specification of the wetting layer 240*b* illustrated in FIGS. 3B and 3C. Alternatively, the copper traces 210 can be replaced by gold traces having a thickness of between 3 and 30 μm, of between 5 and 20 micrometers or of between 4 and 10 micrometers. Alternatively, the copper traces 210 can be replaced by silver traces having a thickness of between 3 and 30 μm, of between 5 and 20 micrometers or of between 4 and 10 micrometers.

The wirebondable layer 230 having a thickness of between 0.05 and 2 micrometers, and preferably of between 0.1 and 1 micrometer, may be gold, copper, aluminum, nickel, silver, palladium or a composite of the above-mentioned materials. For example, the wirebondable layer 230 may be a gold layer having a thickness of between 0.05 and 2 micrometers, and preferably of between 0.05 and 1 micrometer, on the first contact points, exposed by the openings 220*b*, of the copper traces 210 in the polymer layer 220. Alternatively, the wirebondable layer 230 may be a palladium layer having a thickness of between 0.05 and 2 micrometers, and preferably of between 0.05 and 1 micrometer, on the first contact points, exposed by the openings 220*b*, of the copper traces 210 in the polymer layer 220. Alternatively, the wirebondable layer 230 may be a silver layer having a thickness of between 0.05 and 2 micrometers, and preferably of between 0.1 and 1 micrometer, on the first contact points, exposed by the openings 220*b*, of the copper traces 210 in the polymer layer 220. Alternatively, the wirebondable layer 230 may be an aluminum layer having a thickness of between 0.05 and 2 micrometers, and preferably of between 0.1 and 1 micrometer, on the first contact points, exposed by the openings 220*b*, of the copper traces 210 in the polymer layer 220. Alternatively, the wirebondable layer 230 comprises a nickel layer having a thickness of between 0.05 and 1 micrometer on the first contact points, exposed by the openings 220*b*, of the copper traces 210 in the polymer layer 220, and a gold layer having a thickness of between 0.05 and 1 micrometer on the nickel layer.

The metal bumps 12 of the semiconductor chip 2 are bonded with the copper traces 210, exposed by the openings 220*a*, of the flexible circuit film 46 through an interface bonding layer 250. The specification of the interface bonding layer 250 shown in FIG. 7A can be referred to as the specification of the interface bonding layer 250 formed in the process as illustrated in the first case shown in FIGS. 3A and 3B. The methods, of bonding the metal bumps 12 of the semiconductor chip 2 with the copper traces 210 of the flexible circuit film 46, as shown in FIG. 7A can be referred to as the methods, of bonding the metal bumps 12 of the semiconductor chip 2 with the copper traces 210 of the flexible circuit film 36, as illustrated in the first and second cases shown in FIGS. 3B and 3C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 7A can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 7A can be referred to as the specification of the metal bumps 12, between the semiconductor chip 2 and the copper traces 210, formed in the process as illustrated in the second case shown in FIG. 3B.

Figure 7B:
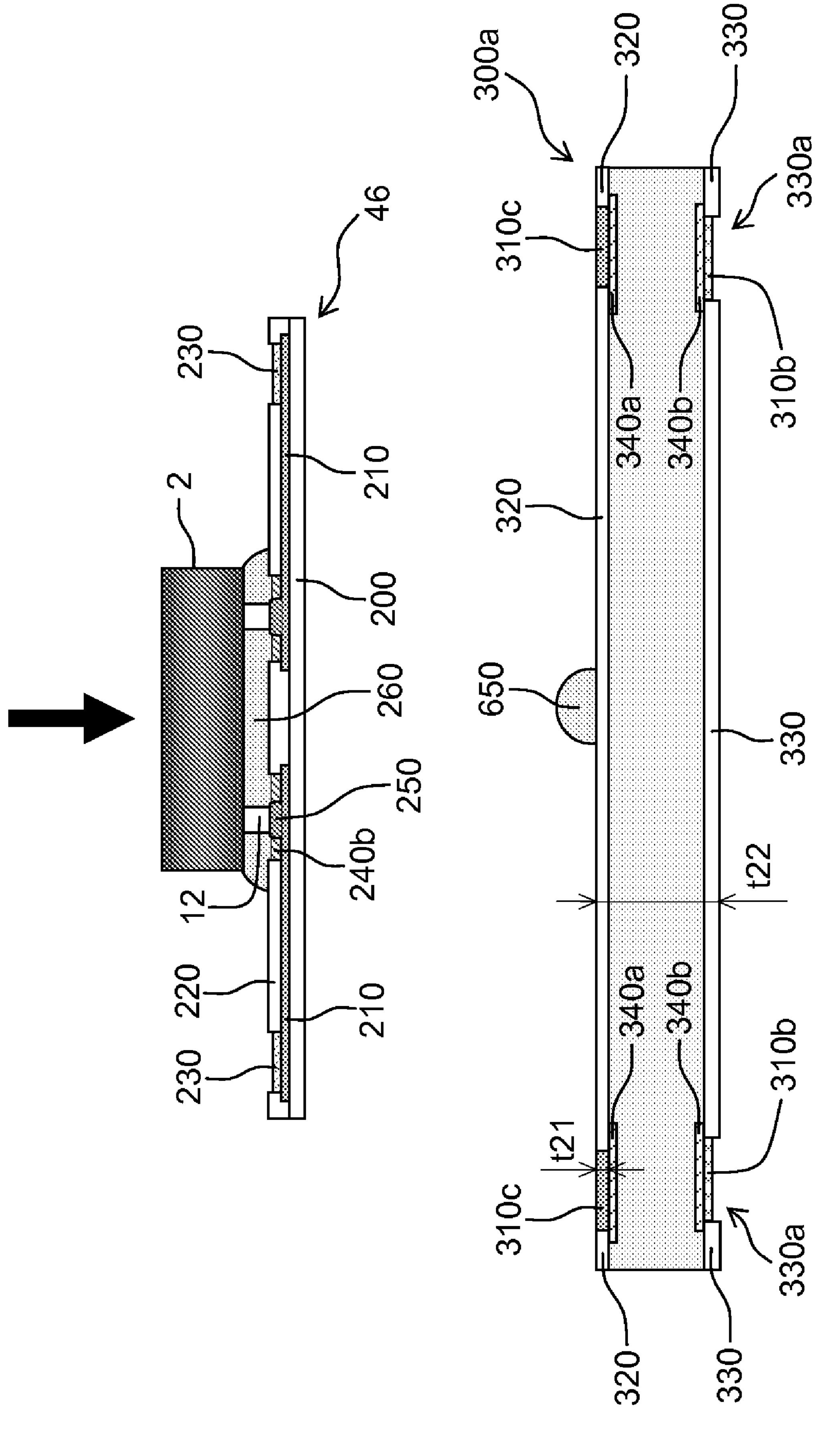

Referring to FIG. 7B, a polymer layer 260 is filled into the gap between the semiconductor chip 2 and the flexible circuit film 46, enclosing the metal bumps 12, by dispensing a polymer on the flexible circuit film 46 close to the semiconductor chip 2, with the polymer flowing into the gap between the semiconductor chip 2 and the flexible circuit film 46, and then curing the flowing polymer at a temperature of between 100 and 250° C. The material of the polymer layer 260 may be expoxy, polyester, polybenzoxazole or polyimide.

A substrate 300*a* comprises a circuit structure in the substrate 300*a*, an insulating layer 320, an insulating layer 330, wirebonding pads 310*c* and metal pads 310*b*. The circuit structure comprises copper traces (including 340*a* and 340*b*) each having a thickness between 5 and 30 micrometers. The wirebonding pads 310*c* are formed on the topmost copper traces 340*a* exposed by openings in the insulating layer 320, and the openings may be filled up with the wirebonding pads 310*c*. The metal pads 310*b* are formed on the bottommost copper traces 340*b* exposed by openings 330*a* in the insulating layer 330. The wirebonding pads 310*c* are connected to the metal pads 310*b* through the copper traces (comprising the copper traces 340*a* and 340*b*) in the substrate 300*a*. The specification of the metal pads 310*b*, the insulating layer 320 and the insulating layer 330 shown in FIG. 7B can be referred to as the specification of the metal pads 310*b*, the insulating layer 320 and the insulating layer 330 illustrated in FIG. 3E.

The material of the wirebonding pads 310*c* may be gold, copper, nickel, aluminum, palladium, silver or a composite of the above-mentioned materials, and the wirebonding pads 310*c* have a thickness t21 of between 0.05 and 2 micrometers, and preferably of between 0.1 and 1 micrometer. For example, the wirebonding pads 310*c* may be formed by electroplating or electroless plating a gold layer with a thickness of between 0.05 and 2 micrometers, and preferably of between 0.05 and 1 micrometer, on the topmost copper traces 340*a* exposed by openings in the insulating layer 320, and the openings in the insulating layer 320 may be filled up with the gold layer. Alternatively, the wirebonding pads 310*c* may be formed by electroplating or electroless plating a palladium layer with a thickness of between 0.05 and 2 micrometers, and preferably of between 0.05 and 1 micrometer, on the topmost copper traces 340*a* exposed by openings in the insulating layer 320, and the openings in the insulating layer 320 may be filled up with the palladium layer. Alternatively, the wirebonding pads 310*c* may be formed by electroplating or electroless plating a silver layer with a thickness of between 0.05 and 2 micrometers, and preferably of between 0.1 and 1 micrometer, on the topmost copper traces 340*a* exposed by openings in the insulating layer 320, and the openings in the insulating layer 320 may be filled up with the silver layer. Alternatively, the wirebonding pads 310*c* may be formed by electroplating or electroless plating an aluminum layer with a thickness of between 0.05 and 2 micrometers, and preferably of between 0.1 and 1 micrometer, on the topmost copper traces 340*a* exposed by openings in the insulating layer 320, and the openings in the insulating layer 320 may be filled up with the aluminum layer. Alternatively, the wirebonding pads 310*c* may be formed by electroless plating a nickel layer with a thickness of between 0.05 and 1 micrometer on the topmost copper traces 340*a* exposed by openings in the insulating layer 320, and electroless plating a gold layer with a thickness of between 0.05 and 1 micrometer on the nickel layer in the openings in the insulating layer 320, and the openings in the insulating layer 320 may be filled up with the nickel layer and the gold layer.

In a case, the substrate 300*a* may comprise a core layer, such as a glass fiber reinforced epoxy with a thickness of between 200 and 2,000 μm, multiple copper circuit layers respectively over and under the core layer, and multiple polymer layers between the neighboring copper circuit layers. The copper circuit layers provide the circuit structure in the substrate 300*a*. The wirebonding pads 310*c* are on the copper traces 340*a* of the topmost copper circuit layer, and the metal pads 310*b* are on the copper traces 340*b* of the bottommost copper circuit layer.

In another case, the substrate 300*a* may comprise multiple copper circuit layers and multiple ceramic layers between the neighboring copper circuit layers. The copper circuit layers provide the circuit structure in the substrate 300*a*. The wirebonding pads 310*c* are on the copper traces 340*a* of the topmost copper circuit layer, and the metal pads 310*b* are on the copper traces 340*b* of the bottommost copper circuit layer.

The substrate 300*a* may be a ball grid array (BGA) substrate with a thickness t22 of between 200 and 2,000 μm. Alternatively, the substrate 300*a* may be a glass fiber reinforced epoxy based substrate with a thickness t22 of between 200 and 2,000 μm. Alternatively, the substrate 300*a* may be a silicon substrate with a thickness t22 of between 200 and 2,000 μm. Alternatively, the substrate 300*a* may be a ceramic substrate with a thickness t22 of between 200 and 2,000 μm.

Alternatively, the substrate 300*a* may be an organic substrate with a thickness t22 of between 200 and 2,000 μm.

Figure 7C:
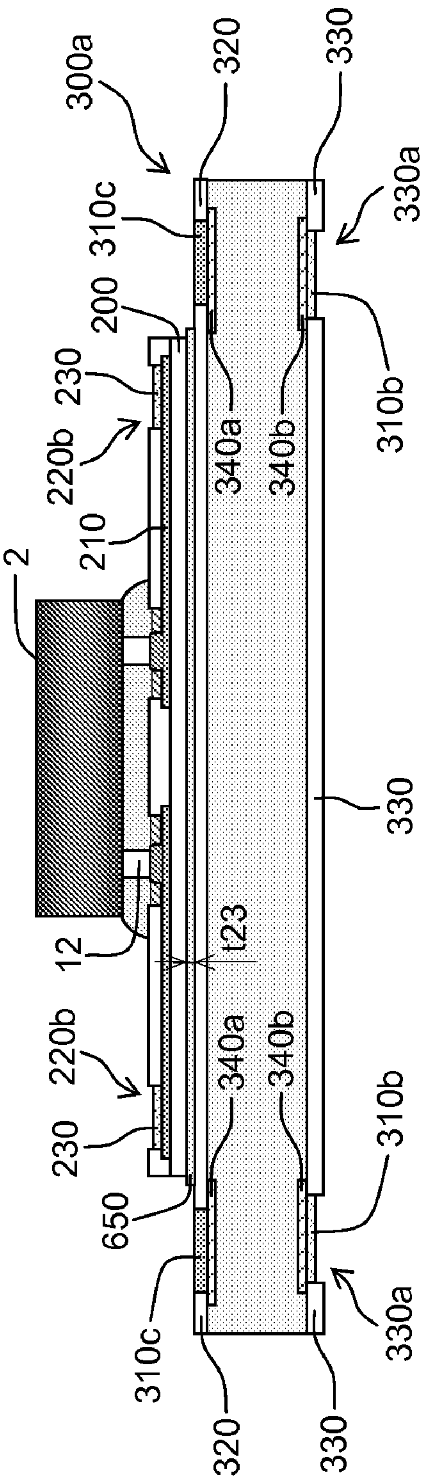

Referring to FIGS. 7B and 7C, a glue material 650 is first formed on the insulating layer 320 of the substrate 300*a* by a dispensing process after the semiconductor chip 2 is bonded with the flexible circuit film 46. Next, the polymer layer 200 of the flexible circuit film 46 adheres onto the glue material 650, and then the glue material 650 is baked at a temperature of between 100 and 200° C. and to a thickness t23 between 5 and 30 micrometers if the glue material 650 is an epoxy. Alternatively, the glue material 650 can be polyimide, silver-filed epoxy or polyester. Thereby, the flexible circuit film 46 can be joined with the substrate 300*a*. In another word, the flexible circuit film 46 boned with the semiconductor chip 2 can be joined with the substrate 300*a* using the glue material 650.

Referring to FIG. 7C, there is no opening in the polymer layer 200 exposing the copper traces 210 to lead the copper traces 210 to be connected to the substrate 300*a*.

Figure 7D:
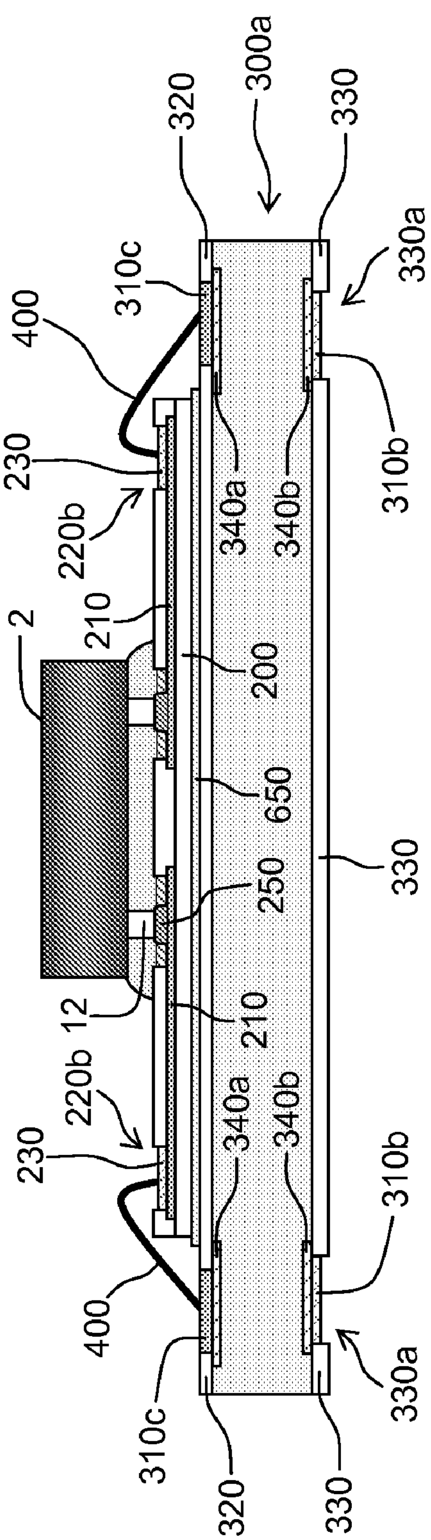

Referring to FIG. 7D, after the flexible circuit film 46 is joined with the substrate 300*a*, wireboning wires 400 having a diameter of between 12 and 40 micrometers are bonded with the wirebondable layer 230 and with the wirebonding pads 310*c* via a wire-bonding process. The wireboning wires 400 may be gold wires with a diameter of between 12 and 40 micrometers. Thereby, the wirebondable layer 230 of the flexible circuit film 46 can be electrically connected to the wirebonding pads 310*c* of the substrate 300*a* through the wireboning wires 400.

Figure 7E:
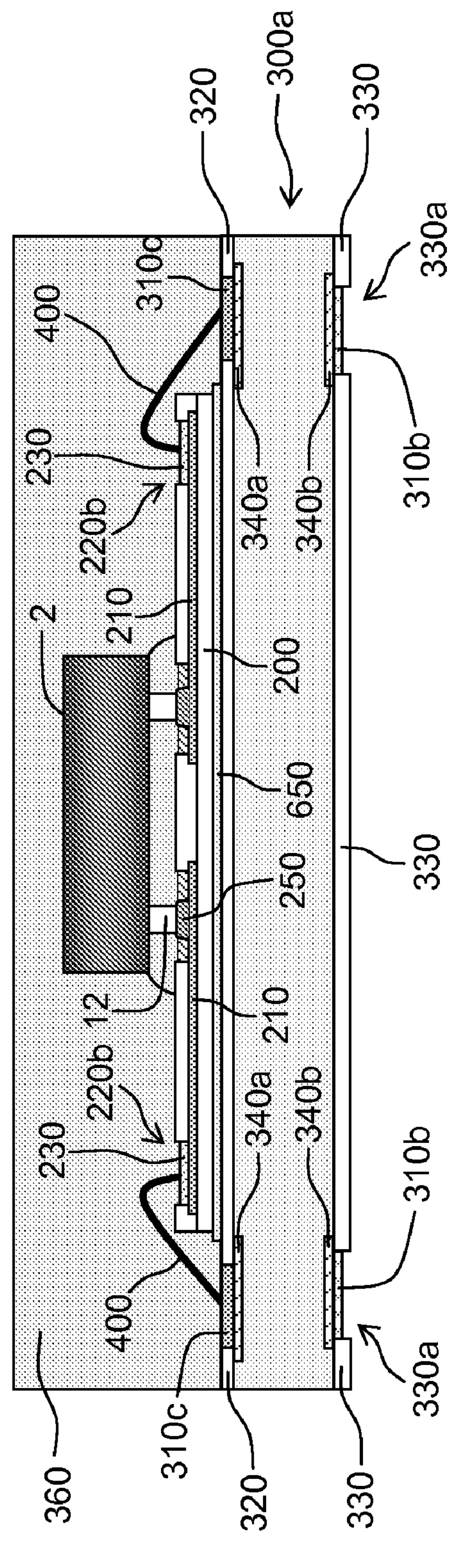

Referring to FIG. 7E, a polymer compound 360 is formed on the semiconductor chip 2, on the flexible circuit film 46 and on a peripheral region of the substrate 300*a* by molding an epoxy-based polymer with carbon fillers therein on the semiconductor chip 2, on the flexible circuit film 46 and on the peripheral region of the substrate 300*a* at a temperature of between 130 and 250° C. The polymer compound 360 encloses the wireboning wires 400, to protect the wireboning wires 400. Alternatively, the polymer compound 360 can be polyimide or polyester. Preferably, the polymer compound 360 has a value of Young's modulus less than 0.5 GPa.

Figure 7F:
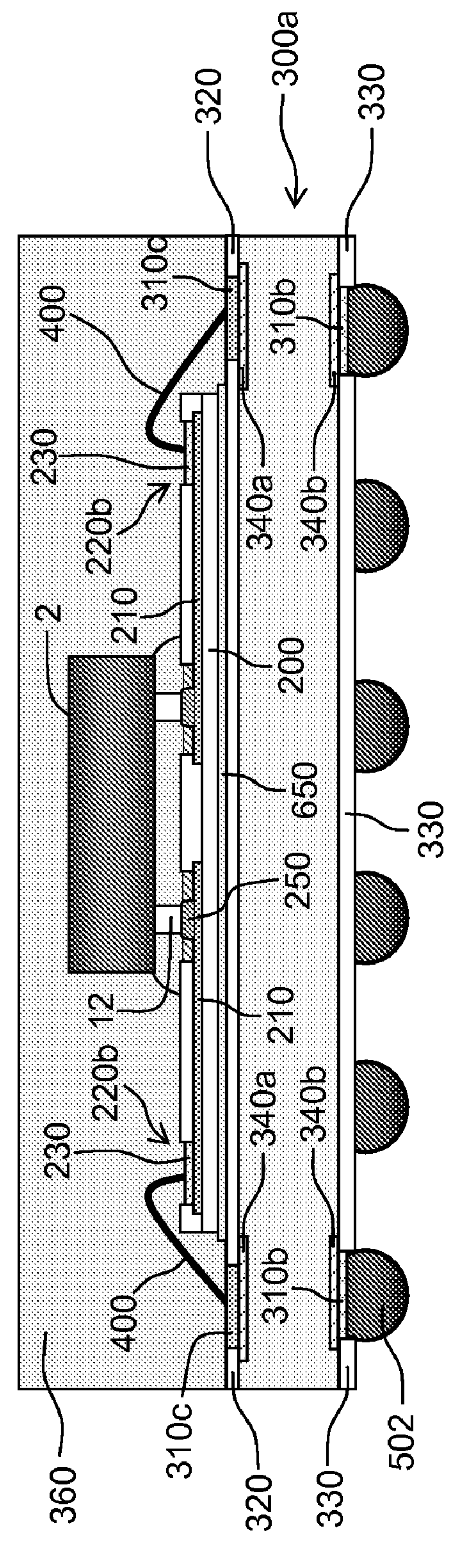

Referring to FIG. 7F, after the polymer compound 360 is formed, the solder balls 502 may be formed, in a ball-grid-array arrangement, on the metal pads 310*b* of the substrate 300*a* using a ball placement process. The process, of forming the solder balls 502 on the metal pads 310*b* of the substrate 300*a*, as shown in FIG. 7F can be referred to as the process, of forming the solder balls 502 on the metal pads 310*b* of the substrate 300, as illustrated in FIGS. 3J and 3K. The specification of the solder balls 502 shown in FIG. 7F can be referred to as the specification of the solder balls 502 illustrated in FIGS. 3J and 3K. After the solder balls 502 are formed on the substrate 300*a*, the substrate 300*a* and the polymer compound 360 can be optionally cut into multiple units.

Figure 7G:
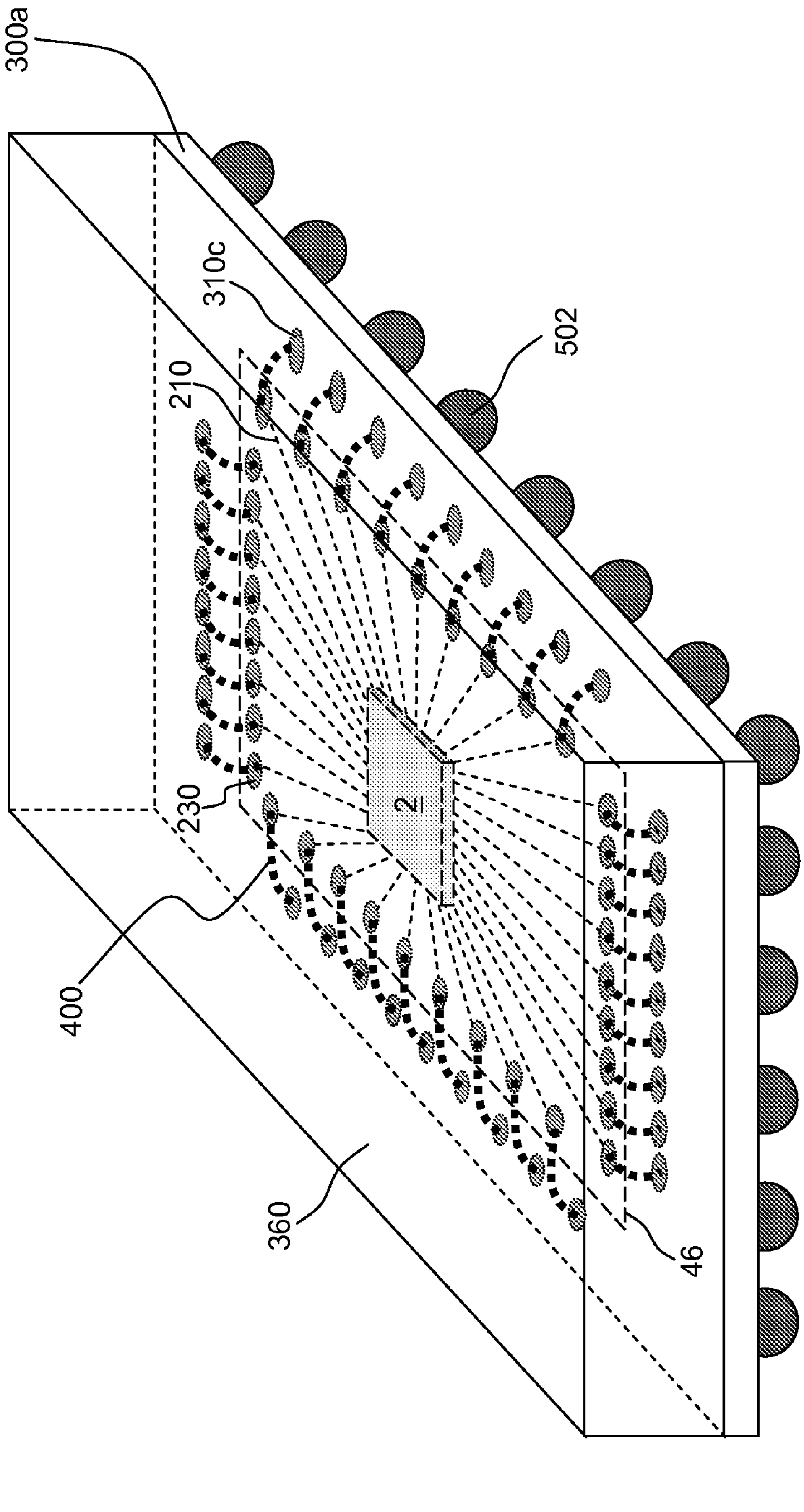
FIG. 7G is perspective view showing a chip package including a rigid substrate, a flexible circuit film mounted on the rigid substrate and a semiconductor chip joined with the flexible circuit film.

FIG. 7G is a perspective view showing FIG. 7F. The fine-pitched metal bumps 12 of the semiconductor chip 2 can be fanned out through the copper traces 210 of the flexible circuit film 46 by bonding the semiconductor chip 2 with the flexible circuit film 46. The flexible circuit film 46 is also joined with the substrate 300*a*, and the wireboning wires 400 connect the flexible circuit film 46 to the substrate 300*a*. Thereby, the semiconductor chip 2 has the fine-pitched metal bumps 12 connected to an external circuit, such as a printed circuit board (PCB) comprising a glass fiber as a core, through the copper traces 210 of the flexible circuit film 46, the wirebonding wires 400 and the circuit structure of the substrate 300*a*.

Alternatively, the solder balls 502 can be omitted, as shown in FIG. 7E. The substrate 300*a* can be optionally sawed into multiple units. After sawing the substrate 300*a*, the metal pads 310*b* of the substrate 300*a* can be joined with a solder, containing pure tin, a tin-silver alloy, a tin-lead alloy or a tin-silver-copper alloy, preformed on an external circuit or can contact with contact points of a socket.

Figures 7H, 7I:
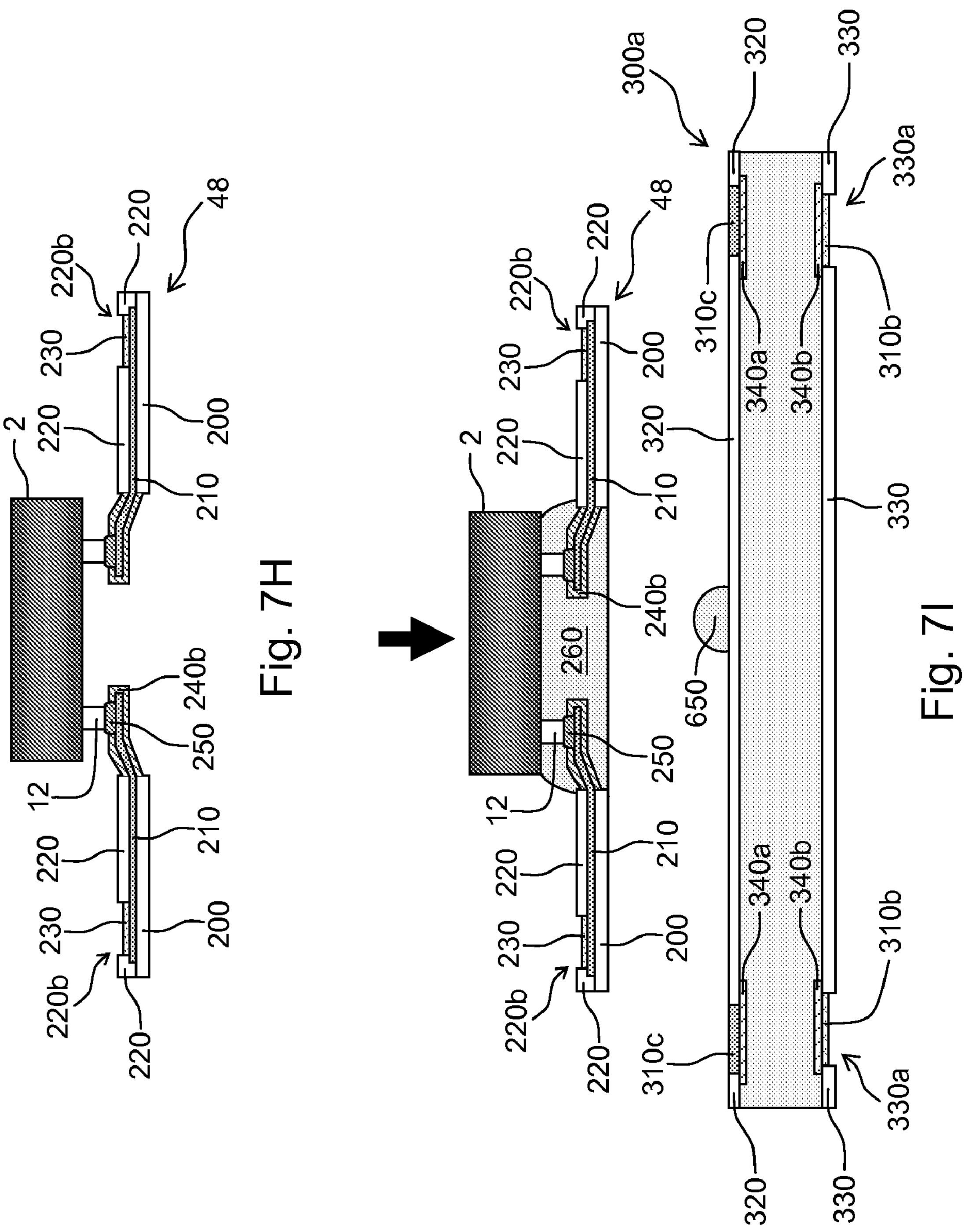
FIGS. 7H-7M are cross-sectional views showing a process for bonding a semiconductor chip with a flexible circuit film using a tape-automated-bonding (TAB) technology and connecting the flexible circuit film to a rigid substrate using a wirebinding process according to another embodiment of the present invention.

FIG. 7H is a schematically cross-sectional figure showing a chip package including the semiconductor chip 2 joined with a flexible circuit substrate 48 using a tape-automated-bonding (TAB) technology. The above-mentioned flexible circuit film 46 can be replaced by the flexible circuit film 48. The flexible circuit film 48 includes the polymer layer 200, the polymer layer 220, the wirebondable layer 230, the wetting layer 240*b* and the copper traces 210 between the polymer layers 200 and 220, wherein the openings 220*b* in the polymer layer 220 expose contact points of the copper traces 210, and the polymer layers 200 and 220 uncover top and bottom sides of the copper traces 210 at the center portion of the flexible circuit film 48. The wirebondable layer 230 is on the contact points, exposed by openings 220*b*, of the copper traces 210 in the polymer layer 220, and the wetting layer 240*b* is on the copper traces 210 at the center portion of the flexible circuit film 48. The specification of the polymer layer 200, the polymer layer 220 and the copper traces 210 shown in FIG. 7H can be referred to as the specification of the polymer layer 200, the polymer layer 220 and the copper traces 210 illustrated in FIG. 3A. The specification of the wirebondable layer 230 shown in FIG. 7H can be referred to as the specification of the wirebondable layer 230 illustrated in FIG. 7A. The specification of the wetting layer 240*b* shown in FIG. 7H can be referred to as the specification of the wetting layer 240*b* illustrated in FIG. 3S. Alternatively, the copper traces 210 can be replaced by gold traces having a thickness of between 3 and 30 μm, of between 5 and 20 micrometers or of between 4 and 10 micrometers. Alternatively, the copper traces 210 can be replaced by silver traces having a thickness of between 3 and 30 μm, of between 5 and 20 micrometers or of between 4 and 10 micrometers.

The metal bumps 12 of the semiconductor chip 2 are bonded with the copper traces 210 at the center portion of the flexible circuit film 48 through the interface bonding layer 250. The specification of the interface bonding layer 250 shown in FIG. 7H can be referred to as the specification of the interface bonding layer 250 formed in the process as illustrated in the first case shown in FIGS. 3R and 3S. The method, of bonding the metal bumps 12 of the semiconductor chip 2 with the copper traces 210 of the flexible circuit film 48, as shown in FIG. 7H can be referred to as the method, of bonding the metal bumps 12 of the semiconductor chip 2 with the copper traces 210 of the flexible circuit film 38, as illustrated in the first and second cases shown in FIGS. 3R and 3S. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 7H can be referred to as the specification of the metal bumps 12, between the semiconductor chip 2 and the interface bonding layer 250, formed in the process as illustrated in the first case shown in FIGS. 3R and 3S. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 7H can be referred to as the specification of the metal bumps 12, between the semiconductor chip 2 and the copper traces 210, formed in the as illustrated in the second case shown in FIG. 3S.

Referring to FIG. 7I, the polymer layer 260 can be formed by dispensing a polymer on the semiconductor chip 2 with the polymer enclosing the metal bumps 12 and the copper traces 210 at the center portion of the flexible circuit film 48, and then curing the polymer at a temperature of between 100 and 250° C. The material of the polymer layer 260 may be expoxy, polyester or polyimide. The specification of the substrate 300*a* shown in FIG. 7I can be referred to as the specification of the substrate 300*a* illustrated in FIG. 7B.

Figure 7J:
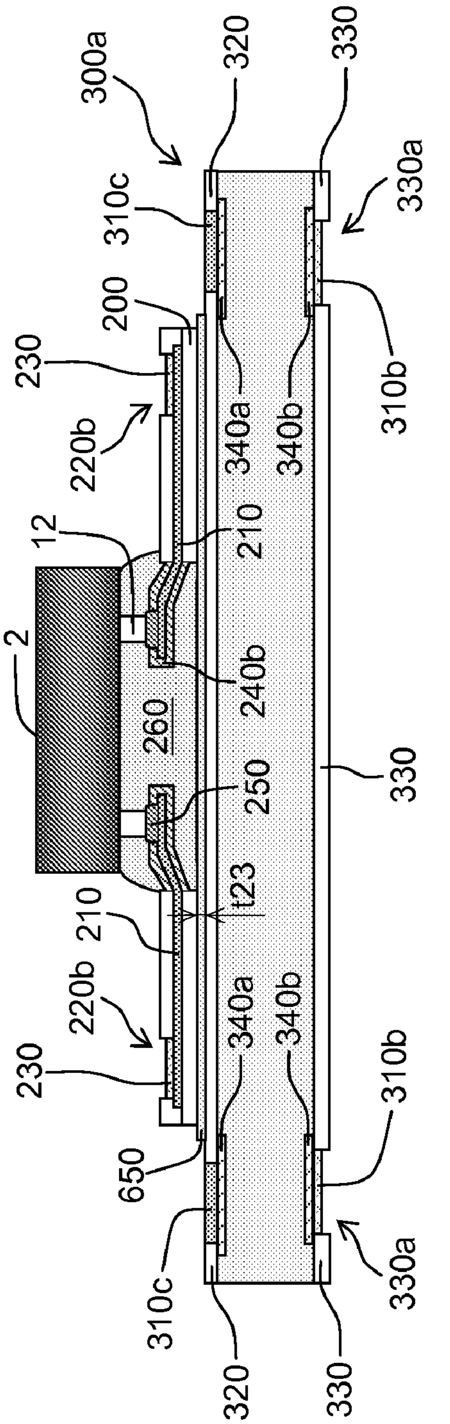

Referring to FIGS. 7I and 7J, the glue material 650 is first formed on the insulating layer 320 of the substrate 300*a* by a dispensing process after the semiconductor chip 2 is bonded with the flexible circuit film 48. Next, the polymer layer 200 of the flexible circuit film 48 adheres onto the glue material 650, and then the glue material 650 is baked at a temperature of between 100 and 200° C. and to a thickness t23 between 5 and 30 micrometers if the glue material 650 is an epoxy. Alternatively, the glue material 650 can be polyimide or polyester. Thereby, the flexible circuit film 48 can be joined with the substrate 300*a*. In another word, the flexible circuit film 48 boned with the semiconductor chip 2 can be joined with the substrate 300*a* using the glue material 650.

Referring to FIG. 7J, there is no opening in the polymer layer 200 exposing the copper traces 210 to lead the copper traces 210 to be connected to the substrate 300*a*.

Figure 7K:
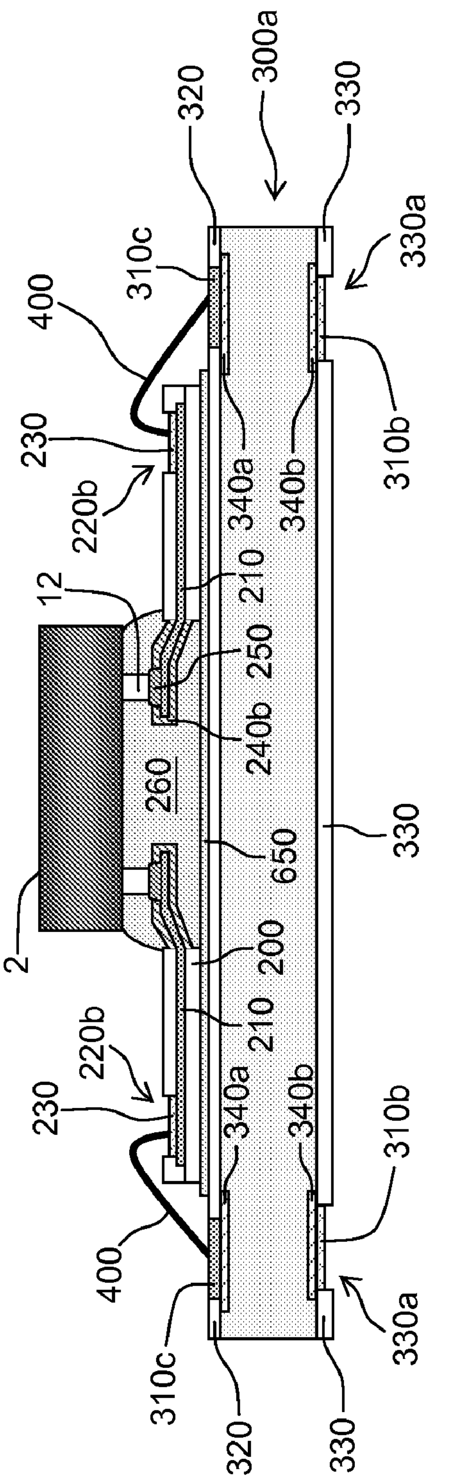

Referring to FIG. 7K, after the flexible circuit film 48 is joined with the substrate 300*a*, the wireboning wires 400 having a diameter of between 12 and 40 micrometers are bonded with the wirebondable layer 230 and with the wirebonding pads 310*c* via a wire-bonding process. The wireboning wires 400 may be gold wires with a diameter of between 12 and 40 micrometers. Thereby, the wirebondable layer 230 of the flexible circuit film 48 can be electrically connected to the wirebonding pads 310*c* of the substrate 300*a* through the wireboning wires 400.

Figure 7L:
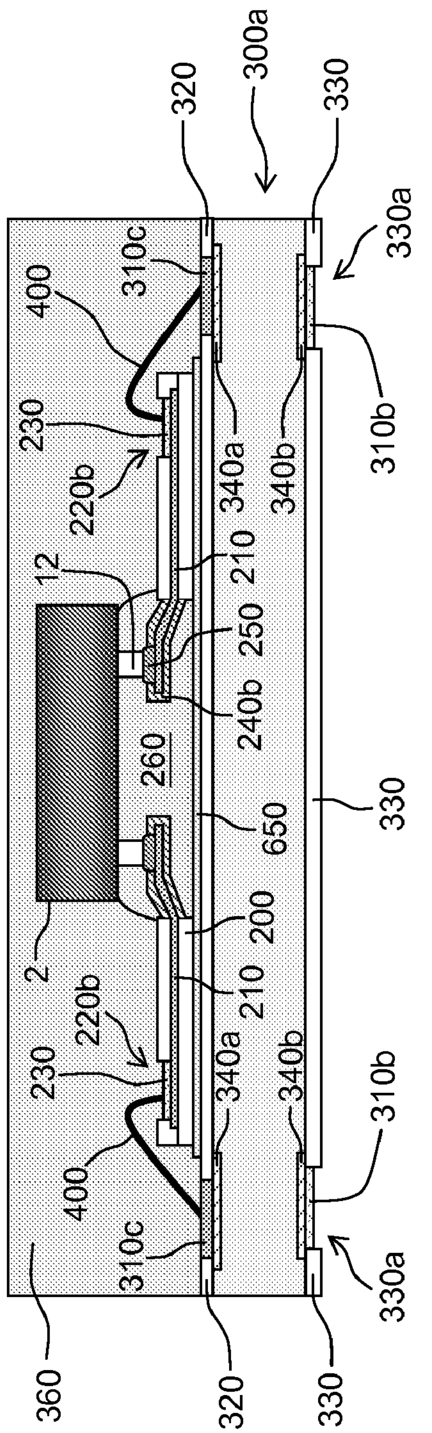

Referring to FIG. 7L, the polymer compound 360 is formed on the semiconductor chip 2, on the flexible circuit film 48 and on a peripheral region of the substrate 300*a* by molding an epoxy-based polymer with carbon fillers therein on the semiconductor chip 2, on the flexible circuit film 48 and on the peripheral region of the substrate 300*a* at a temperature of between 130 and 250° C. The polymer compound 360 encloses the wireboning wires 400, to protect the wireboning wires 400. Alternatively, the polymer compound 360 can be polyimide or polyester. Preferably, the polymer compound 360 has a value of Young's modulus less than 0.5 GPa.

Figure 7M:
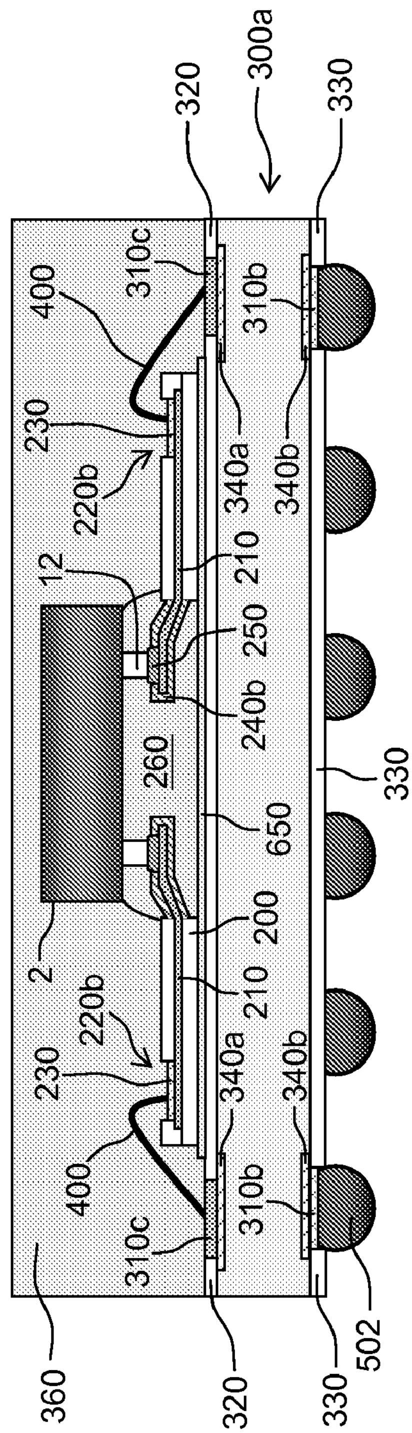

Referring to FIG. 7M, after the polymer compound 360 is formed, the solder balls 502 may be formed, in a ball-grid-array arrangement, on the metal pads 310*b* of the substrate 300*a* using a ball placement process. The process, of forming the solder balls 502 on the metal pads 310*b* of the substrate 300*a*, as shown in FIG. 7M can be referred to as the process, of forming the solder balls 502 on the metal pads 310*b* of the substrate 300, as illustrated in FIGS. 3J and 3K. The specification of the solder balls 502 shown in FIG. 7M can be referred to as the specification of the solder balls 502 illustrated in FIGS. 3J and 3K. After the solder balls 502 are formed on the substrate 300*a*, the substrate 300*a* and the polymer compound 360 can be optionally cut into multiple units.

The fine-pitched metal bumps 12 of the semiconductor chip 2 can be fanned out through the copper traces 210 of the flexible circuit film 48 by bonding the semiconductor chip 2 with the flexible circuit film 48. The flexible circuit film 48 is also joined with the substrate 300*a*, and the wireboning wires 400 connect the flexible circuit film 48 to the substrate 300*a*. Thereby, the semiconductor chip 2 has the fine-pitched metal bumps 12 connected to an external circuit, such as a printed circuit board (PCB) comprising a glass fiber as a core, through the copper traces 210 of the flexible circuit film 48, the wirebonding wires 400 and the circuit structure of the substrate 300*a*.

Alternatively, the solder balls 502 can be omitted, as shown in FIG. 7L. The substrate 300*a* can be optionally sawed into multiple units. After sawing the substrate 300*a*, the metal pads 310*b* of the substrate 300*a* can be joined with a solder, containing pure tin, a tin-silver alloy, a tin-lead alloy or a tin-silver-copper alloy, preformed on an external circuit or can contact with contact points of a socket.

Embodiment 5

Figures 8A, 8B:
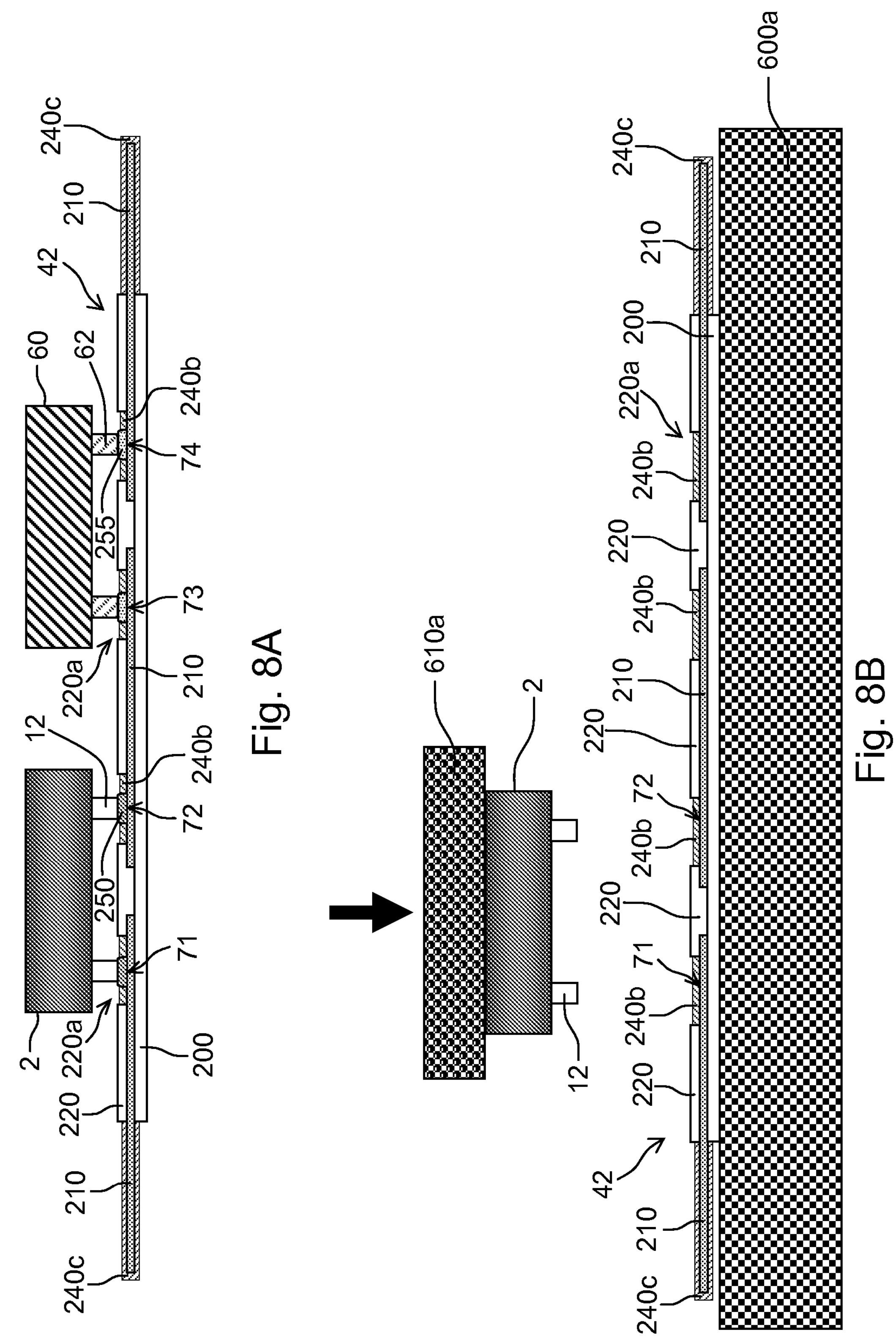
FIGS. 8A-8K are cross-sectional views showing a process for bonding a semiconductor chip with a flexible circuit film using a chip-on-film (COF) technology, bonding an electronic device with the flexible circuit film using a chip-on-film (COF) technology and joining the flexible circuit film with a rigid substrate according to another embodiment of the present invention.

FIG. 8A is a schematically cross-sectional figure showing a chip-on-film package. A flexible circuit film 42 includes a polymer layer 200, a polymer layer 220, a wetting layer 240*b*, a wetting layer 240*c* and copper traces 210 between the polymer layers 200 and 220, wherein the polymer layers 200 and 220 uncover top and bottom sides of the copper traces 210 at the outer portion of the flexible circuit film 42, and openings 220*a* in the polymer layer 220 expose contact points 71, 72, 73 and 74 of the copper traces 210. The wetting layer 240*b* is on the contact points 71, 72, 73 and 74 of the copper traces 210 exposed by the openings 220*a* in the polymer layer 220. The wetting layer 240*c* is on the copper traces 210 at the outer portion of the flexible circuit film 42. The specification of the polymer layer 200, the polymer layer 220 and the copper traces 210 shown in FIG. 8A can be referred to as the specification of the polymer layer 200, the polymer layer 220 and the copper traces 210 illustrated in FIG. 3A. The specification of the wetting layer 240*b* shown in FIG. 8A can be referred to as the specification of the wetting layer 240*b* illustrated in FIGS. 3B and 3C. The specification of the wetting layer 240*c* shown in FIG. 8A can be referred to as the specification of the wetting layer 240*c* illustrated in FIG. 6A. Alternatively, the copper traces 210 can be replaced by gold traces having a thickness of between 3 and 30 μm, of between 5 and 20 micrometers or of between 4 and 10 micrometers. Alternatively, the copper traces 210 can be replaced by silver traces having a thickness of between 3 and 30 μm, of between 5 and 20 micrometers or of between 4 and 10 micrometers.

The metal bumps 12 of the semiconductor chip 2 are bonded with the contact points 71 and 72, exposed by the openings 220*a*, of the copper traces 210 of the flexible circuit film 42 through an interface bonding layer 250, and multiple metal bumps 62 of an electronic device 60 are bonded with the contact points 73 and 74, exposed by the openings 220*a*, of the copper traces 210 of the flexible circuit film 42 through an interface bonding layer 255. The electronic device 60 can be a passive device, such as resistor, capacitor or inductor, or another semiconductor chip. The semiconductor chip 2 is connected to the electronic device 60 through the copper trace 210 at the center portion of the flexible circuit film 42. A method for bonding the metal bumps 12 of the semiconductor chip 2 with the contact points 71 and 72 of the copper traces 210 of the flexible circuit film 42, and for bonding the metal bumps 62 of the electronic device 60 with the contact points 73 and 74 of the copper traces 210 of the flexible circuit film 42 are described as shown in FIG. 8B and FIG. 8C.

Figures 8C, 8D:
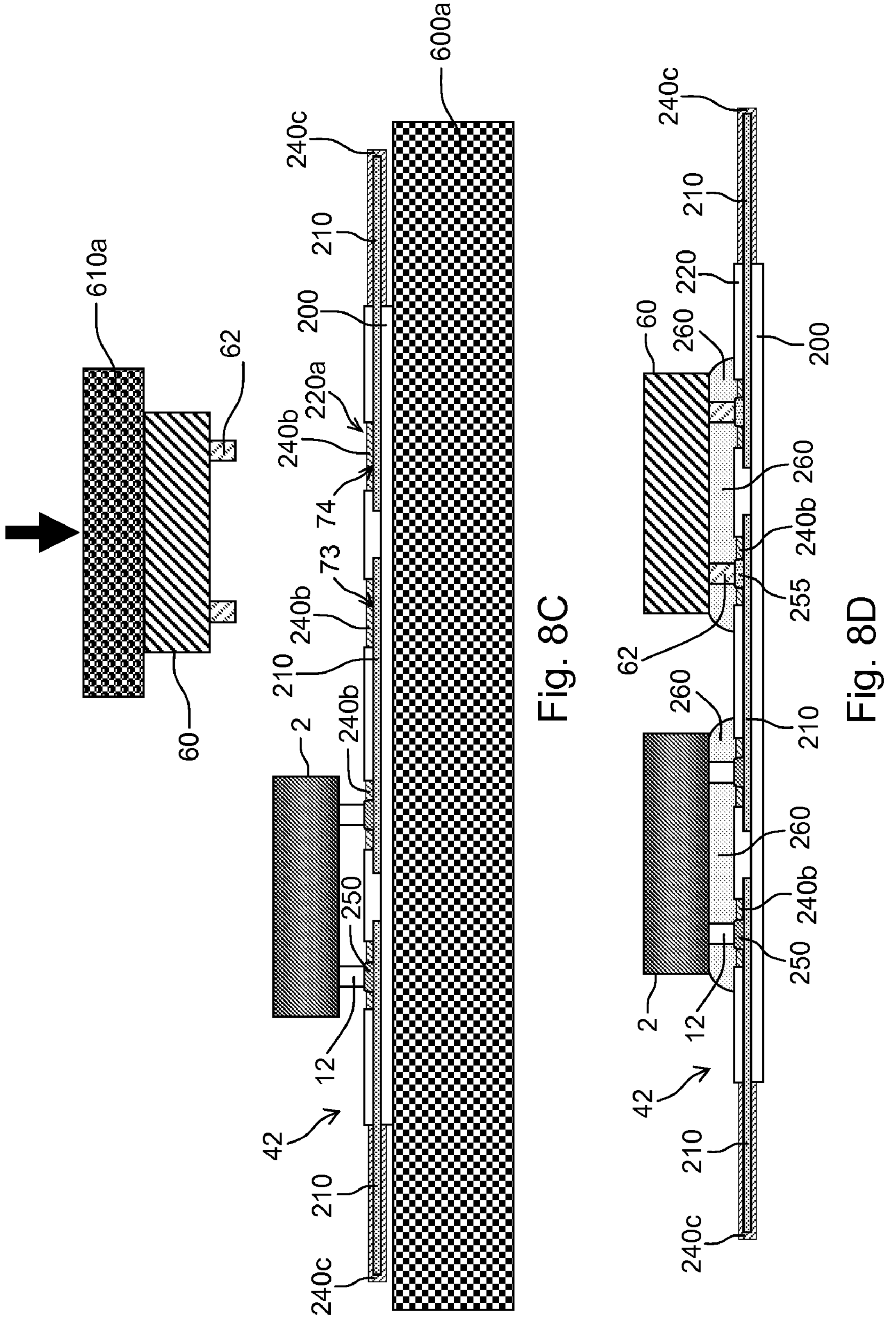

Referring to FIGS. 8B and 8C, the flexible circuit film 42 can be connected to the semiconductor chip 2 and to the electronic device 60. The flexible circuit film 42 has the wetting layer 240*c* to be joined with the substrate 300 shown in FIG. 3E, and the wetting layer 240*b* to be joined with the metal bumps 12 of the semiconductor chip 2 and with the metal bumps 62 of the electronic device 60. The metal bumps 62 of the electronic device 60 having a thickness of between 5 and 200 micrometers, and preferably of between 10 and 50 micrometers, may comprise gold, copper, nickel, silver, tin, palladium or a composite of the above-mentioned materials. A pitch between the neighboring metal bumps 62 is greater than 1 micrometer, greater than 5 micrometers, less than 35 micrometers, less than 30 micrometers, less than 25 micrometers or less than 20 micrometers, such as between 1 and 30 micrometers or between 2 and 20 micrometers. For example, the metal bumps 62 may be gold bumps having a thickness of between 5 and 200 micrometers, and preferably of between 10 and 50 micrometers. Alternatively, the metal bumps 62 may be copper bumps having a thickness of between 5 and 200 micrometers, and preferably of between 10 and 50 micrometers. Alternatively, the metal bumps 62 may be tin-containing bumps having a thickness of between 5 and 200 micrometers, and preferably of between 10 and 50 micrometers, wherein the tin-containing bumps may be made of a lead-free solder, such as a tin-silver alloy or a tin-silver-copper alloy, of an eutectic solder, such as a tin-lead alloy, or of a high-lead solder containing more than 90 weight percent of lead. Alternatively, the metal bumps 62 may comprise a copper layer having a thickness of between 0.5 and 45 micrometers, and preferably of between 5 and 35 micrometers, a nickel layer having a thickness of between 0.5 and 5 micrometers, and preferably of between 1 and 3 micrometers, on the copper layer, and a gold layer having a thickness of between 0.5 and 5 micrometers, and preferably of between 1 and 3 micrometers, on the nickel layer.

In a first case, referring to FIGS. 8B and 8C, the metal bumps 12 and 62 have the above-mentioned gold layer, at the tips of the metal bumps 12 and 62, capable of being used to be joined with the wetting layer 240*b* of pure tin or an above-mentioned tin alloy using flip-chip bonding, which method is described as below. First, the flexible circuit film 42 is placed on a stage 600*a* kept at a temperature of between 150 and 450° C., and preferably of between 250 and 400° C., and the semiconductor chip 2 is held by vacuum adsorption on a tool head 610*a* kept at a temperature of between 250 and 500° C., of between 350 and 450° C. or of between 100 and 500° C. Next, the semiconductor chip 2 is thermally pressed on the wetting layer 240*b* of the flexible circuit film 42 at a force of between 20 and 150N, and preferably of between 50 and 90N, for a time of between 0.1 and 10 seconds, and preferably of between 0.5 and 3 seconds, by the tool head 610*a* kept at a temperature of between 250 and 500° C., of between 350 and 450° C. or of between 100 and 500° C., optionally applying ultrasonic waves to the metal bumps 12 and to the wetting layer 240*b* of the flexible circuit film 42, to join the metal bumps 12 with the wetting layer 240*b*. In the step of joining the metal bumps 12 with the wetting layer 240*b*, the interface bonding layer 250, such as a metal alloy, may be formed between the metal bumps 12 and the contact points 71 and 72 of the copper traces 210. The interface bonding layer 250 between the metal bumps 12 and the contact points 71 and 72 of the copper traces 210 has a thickness of between 0.2 and 10 micrometers or of between 0.4 and 5 micrometers. When the wetting layer 240*b* before bonded with the gold layer of the metal bumps 12 is pure tin, the interface bonding layer 250 is a tin-gold alloy having a thickness of between 0.2 and 10 micrometers or of between 0.4 and 5 micrometers, wherein an atomic ratio of tin to gold in the tin-gold alloy is between 0.2 and 0.3. When the wetting layer 240*b* before bonded with the gold layer of the metal bumps 12 is a tin-silver-copper alloy, the interface bonding layer 250 is a tin-silver-gold-copper alloy having a thickness of between 0.2 and 10 micrometers or of between 0.4 and 5 micrometers. When the wetting layer 240*b* before bonded with the gold layer of the metal bumps 12 is a tin-silver alloy, the interface bonding layer 250 is a tin-silver-gold alloy having a thickness of between 0.2 and 10 micrometers or of between 0.4 and 5 micrometers. Next, the tool head 610*a* is removed from the semiconductor chip 2. Next, the electronic device 60 is held by vacuum adsorption on the tool head 610*a* kept at a temperature of between 250 and 500° C., of between 350 and 450° C. or of between 100 and 500° C. Next, the electronic device 60 is thermally pressed on the wetting layer 240*b* of the flexible circuit film 42 at a force of between 20 and 150N, and preferably of between 50 and 90N, for a time of between 0.1 and 10 seconds, and preferably of between 0.5 and 3 seconds, by the tool head 610*a* kept at a temperature of between 250 and 500° C., of between 350 and 450° C. or of between 100 and 500° C., optionally applying ultrasonic waves to the metal bumps 62 and to the wetting layer 240*b* of the flexible circuit film 42, to join the metal bumps 62 with the wetting layer 240*b*. Referring to FIGS. 8A and 8C, in the step of joining the metal bumps 62 with the wetting layer 240*b*, the interface bonding layer 255, such as a metal alloy, may be formed between the metal bumps 62 and the contact points 73 and 74 of the copper traces 210. The interface bonding layer 255 between the metal bumps 62 and the contact points 73 and 74 of the copper traces 210 has a thickness of between 0.2 and 10 micrometers or of between 0.4 and 5 micrometers. When the wetting layer 240*b* before bonded with the gold layer of the metal bumps 62 is pure tin, the interface bonding layer 255 is a tin-gold alloy having a thickness of between 0.2 and 10 micrometers or of between 0.4 and 5 micrometers, wherein an atomic ratio of tin to gold in the tin-gold alloy is between 0.2 and 0.3. When the wetting layer 240*b* before bonded with the gold layer of the metal bumps 62 is a tin-silver-copper alloy, the interface bonding layer 255 is a tin-silver-gold-copper alloy having a thickness of between 0.2 and 10 micrometers or of between 0.4 and 5 micrometers. When the wetting layer 240*b* before bonded with the gold layer of the metal bumps 62 is a tin-silver alloy, the interface bonding layer 255 is a tin-silver-gold alloy having a thickness of between 0.2 and 10 micrometers or of between 0.4 and 5 micrometers. Next, the tool head 610*a* is removed from the electronic device 60. Next, the flexible circuit film 42 bonded with the semiconductor chip 2 and with the electronic device 60 is removed from the stage 600*a*.

The specification of the metal bumps 12 between the semiconductor chip 2 and the interface bonding layer 250 shown in FIGS. 8A and 8C can be referred to as the specification of the metal bumps 12, between the semiconductor chip 2 and the interface bonding layer 250, formed in the process as illustrated in the first case shown in FIGS. 3A and 3B.

The metal bumps 62 bonded with the contact points 73 and 74 of the copper traces 210 of the flexible circuit film 42 have a thickness of between 5 and 200 micrometers, and preferably of between 10 and 50 micrometers. For example, the metal bumps 62 between the electronic device 60 and the interface bonding layer 255 may include a gold layer having a thickness of between 5 and 200 micrometers, and preferably of between 10 and 50 micrometers, between the electronic device 60 and the interface bonding layer 255. Alternatively, the metal bumps 62 between the electronic device 60 and the interface bonding layer 255 may include a copper layer having a thickness of between 5 and 200 micrometers, and preferably of between 10 and 50 micrometers, between the electronic device 60 and the interface bonding layer 255. Alternatively, the metal bumps 62 between the electronic device 60 and the interface bonding layer 255 may include a copper layer having a thickness of between 0.5 and 45 micrometers, and preferably of between 5 and 35 micrometers, between the electronic device 60 and the interface bonding layer 255, a nickel layer having a thickness of between 0.5 and 5 micrometers, and preferably of between 1 and 3 micrometers, on the copper layer and between the copper layer and the interface bonding layer 255, and a gold layer having a thickness of between 0.5 and 5 micrometers, and preferably of between 1 and 3 micrometers, on the nickel layer and between the nickel layer and the interface bonding layer 255. Alternatively, the metal bumps 62 between the electronic device 60 and the interface bonding layer 255 may include a copper layer having a thickness of between 0.5 and 45 micrometers, and preferably of between 5 and 35 micrometers, between the electronic device 60 and the interface bonding layer 255, and a nickel layer having a thickness of between 0.5 and 5 micrometers, and preferably of between 1 and 3 micrometers, on the copper layer and between the copper layer and the interface bonding layer 255. Alternatively, the metal bumps 62 between the electronic device 60 and the interface bonding layer 255 may include a copper layer having a thickness of between 0.5 and 45 micrometers, and preferably of between 5 and 35 micrometers, between the electronic device 60 and the interface bonding layer 255, and a gold layer having a thickness of between 0.5 and 5 micrometers, and preferably of between 1 and 3 micrometers, on the copper layer and between the copper layer and the interface bonding layer 255.

In a second case, referring to FIGS. 8B and 8C, the metal bumps 12 and 62 have the above-mentioned gold layer, at the tips of the metal bumps 12 and 62, capable of being used to be joined with a gold layer of the wetting layer 240*b* using flip-chip bonding, which method is described as below. First, the flexible circuit film 42 is placed on the stage 600*a* kept at a temperature of between 150 and 450° C., and preferably of between 250 and 400° C., and the semiconductor chip 2 is held by vacuum adsorption on the tool head 610*a* kept at a temperature of between 250 and 500° C., of between 350 and 450° C. or of between 100 and 500° C. Next, the semiconductor chip 2 is thermally pressed on the wetting layer 240*b* of the flexible circuit film 42 at a force of between 20 and 150N, and preferably of between 70 and 120N, for a time of between 0.1 and 10 seconds, and preferably of between 0.5 and 3 seconds, by the tool head 610*a* kept at a temperature of between 250 and 500° C., of between 350 and 450° C. or of between 100 and 500° C., optionally applying ultrasonic waves to the metal bumps 12 and to the wetting layer 240*b* of the flexible circuit film 42, to join the above-mentioned gold layer of the metal bumps 12 with the gold layer of the wetting layer 240*b*. Next, the tool head 610*a* is removed from the semiconductor chip 2. Next, the electronic device 60 is held by vacuum adsorption on the tool head 610*a* kept at a temperature of between 250 and 500° C., of between 350 and 450° C. or of between 100 and 500° C. Next, the electronic device 60 is thermally pressed on the wetting layer 240*b* of the flexible circuit film 42 at a force of between 20 and 150N, and preferably of between 70 and 120N, for a time of between 0.1 and 10 seconds, and preferably of between 0.5 and 3 seconds, by the tool head 610*a* kept at a temperature of between 250 and 500° C., of between 350 and 450° C. or of between 100 and 500° C., optionally applying ultrasonic waves to the metal bumps 62 and to the wetting layer 240*b* of the flexible circuit film 42, to join the above-mentioned gold layer of the metal bumps 62 with the gold layer of the wetting layer 240*b*. Next, the tool head 610*a* is removed from the electronic device 60. Next, the flexible circuit film 42 bonded with the semiconductor chip 2 and with the electronic device 60 is removed from the stage 600*a*.

Thereby, the pads 18 of the semiconductor chip 2 can be connected to the contact points 71 and 72 of the copper traces 210 of the flexible circuit film 42 through gold joints formed by joining the above-mentioned gold layer of the metal bumps 12 with the gold layer of the wetting layer 240*b*. The specification of the metal bumps 12, between the semiconductor chip 2 and the copper traces 210, formed in the process as illustrated in the second case shown in FIGS. 8B and 8C can be referred to as the specification of the metal bumps 12, between the semiconductor chip 2 and the copper traces 210, formed in the process as illustrated in the second case shown in FIG. 3B.

The electronic device 60 can be connected to the contact points 73 and 74 of the copper traces 210 of the flexible circuit film 42 through gold joints formed by joining the above-mentioned gold layer of the metal bumps 62 with the gold layer of the wetting layer 240*b*. For example, the metal bumps 62 between the electronic device 60 and the contact points 73 and 74 of the copper traces 210 may include a gold joint having a thickness of between 5 and 200 micrometers, and preferably of between 10 and 50 micrometers, between the electronic device 60 and the contact points 73 and 74 of the copper traces 210. Alternatively, the metal bumps 62 between the electronic device 60 and the contact points 73 and 74 of the copper traces 210 may include a copper layer having a thickness of between 0.5 and 45 micrometers, and preferably of between 5 and 35 micrometers, between the electronic device 60 and the contact points 73 and 74 of the copper traces 210, a nickel layer having a thickness of between 0.5 and 5 micrometers, and preferably of between 1 and 3 micrometers, on the copper layer and between the copper layer and the contact points 73 and 74 of the copper traces 210, and a gold joint having a thickness of between 0.5 and 5 micrometers, and preferably of between 1 and 3 micrometers, on the nickel layer and between the nickel layer and the contact points 73 and 74 of the copper traces 210. Alternatively, the metal bumps 62 between between the electronic device 60 and the contact points 73 and 74 of the copper traces 210 may include a copper layer having a thickness of between 0.5 and 45 micrometers, and preferably of between 5 and 35 μm, between the electronic device 60 and the contact points 73 and 74 of the copper traces 210, and a gold joint having a thickness of between 0.5 and 5 micrometers, and preferably of between 1 and 3 micrometers, on the copper layer and between the copper layer and the contact points 73 and 74 of the copper traces 210.

Referring to FIG. 8D, a polymer layer 260 is filled into the gap between the semiconductor chip 2 and the flexible circuit film 42 and into the gap between the electronic device 60 and the flexible circuit film 42, enclosing the metal bumps 12 and 62, by dispensing a polymer on the flexible circuit film 42 close to the semiconductor chip 2 and close to the electronic device 60, with the polymer flowing into the gap between the semiconductor chip 2 and the flexible circuit film 42 and into the gap between the electronic device 60 and the flexible circuit film 42, and then curing the flowing polymer at a temperature of between 100 and 250° C. The material of the polymer layer 260 may be expoxy, polyester, polybenzoxazole or polyimide.

Figure 8E:
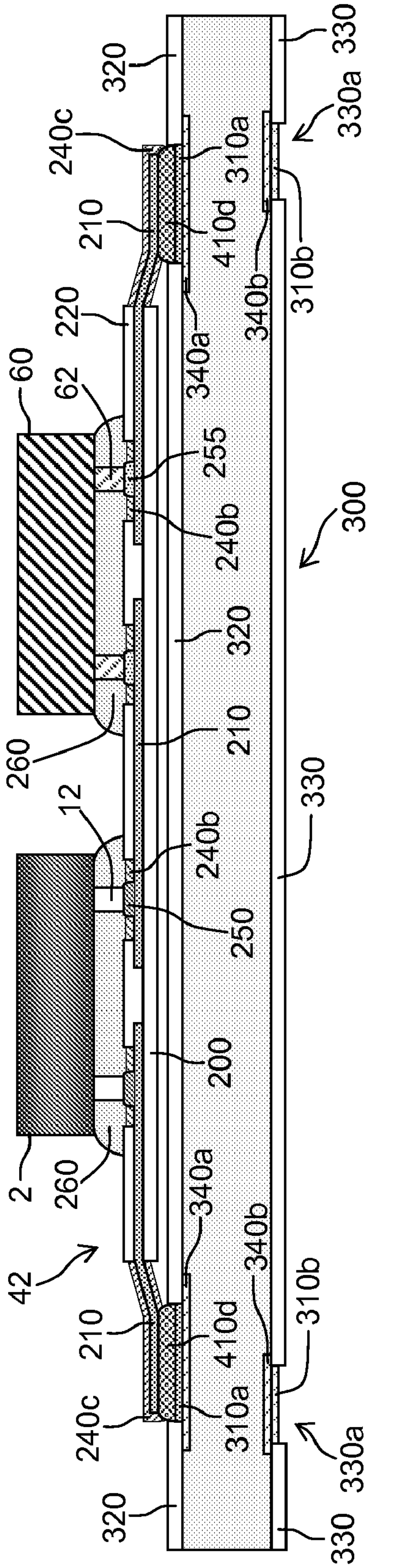

Referring to FIG. 8E, the flexible circuit film 42 is joined with the substrate 300 shown in FIG. 6B by joining the wetting layer 240*c* of the flexible circuit film 42 with the metal joints 410*c*, shown in FIG. 6B, screen printed on the metal pads 310*a* of the substrate 300 in advance, wherein the metal joints 410*c* may be pure tin, a tin-silver alloy, a tin-silver-copper alloy or a tin-lead alloy. There is no opening in the polymer layer 200 exposing the copper traces 210 to lead the copper traces 210 to be connected to the substrate 300. The methods of bonding the flexible circuit film 42 with the substrate 300, as shown in FIG. 8E, can be referred to as the methods of bonding the flexible circuit film 42 with the substrate 300, as illustrated in the first and second cases shown in FIGS. 6B and 6C.

Alternatively, the metal joints 410*d* can be replaced by an anisotropic conductive film (ACF). The anisotropic conductive film can be preformed on the metal pads 310*a* of the substrate 300 shown in FIG. 3E, and then the wetting layer 240*c* on the copper traces 210 at the outer portion of the flexible circuit film 42 can be pressed on the anisotropic conductive film, such that metal particles in the anisotropic conductive film connects the wetting layer 240*c* of the flexible circuit film 42 to the metal pads 310*a* of the substrate 300.

Figure 8F:
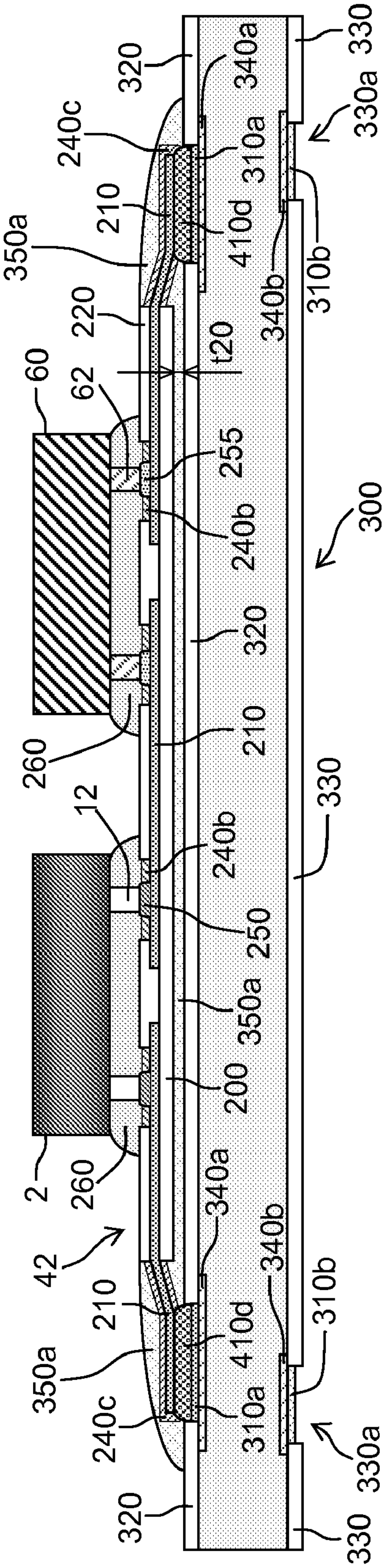

Referring to FIG. 8F, after the flexible circuit film 42 is bonded with the substrate 300, a polymer layer 350*a* can be filled into the gap between the flexible circuit film 42 and the substrate 300, enclosing the metal joints 410*d* and the wetting layer 240*c*, by dispensing a polymer on the substrate 300 close to the flexible circuit film 42, with the polymer flowing into the gap between the flexible circuit film 42 and the substrate 300, and then curing the flowing polymer at a temperature of between 100 and 250° C. The material of the polymer layer 350*a* may be expoxy, polyester or polyimide, and the polymer layer 350*a* between the flexible circuit film 42 and the substrate 300 has a thickness t20 of between 1 and 30 micrometers.

Figure 8G:
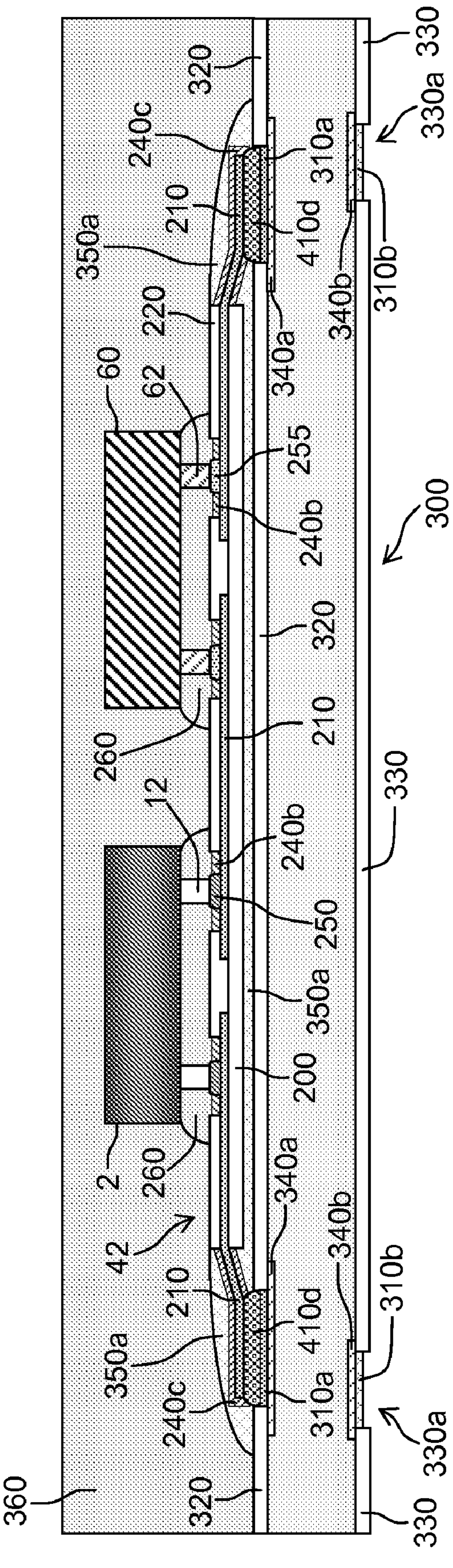

Referring to FIG. 8G, a polymer compound 360 is formed on the semiconductor chip 2, on the electronic device 60, on the flexible circuit film 42 and on a peripheral region of the substrate 300 by molding an epoxy-based polymer with carbon fillers therein on the semiconductor chip 2, on the electronic device 60, on the flexible circuit film 42 and on the peripheral region of the substrate 300 at a temperature of between 130 and 250° C. Alternatively, the polymer compound 360 can be polyimide or polyester. Preferably, the polymer compound 360 has a value of Young's modulus less than 0.5 GPa.

Figure 8H:
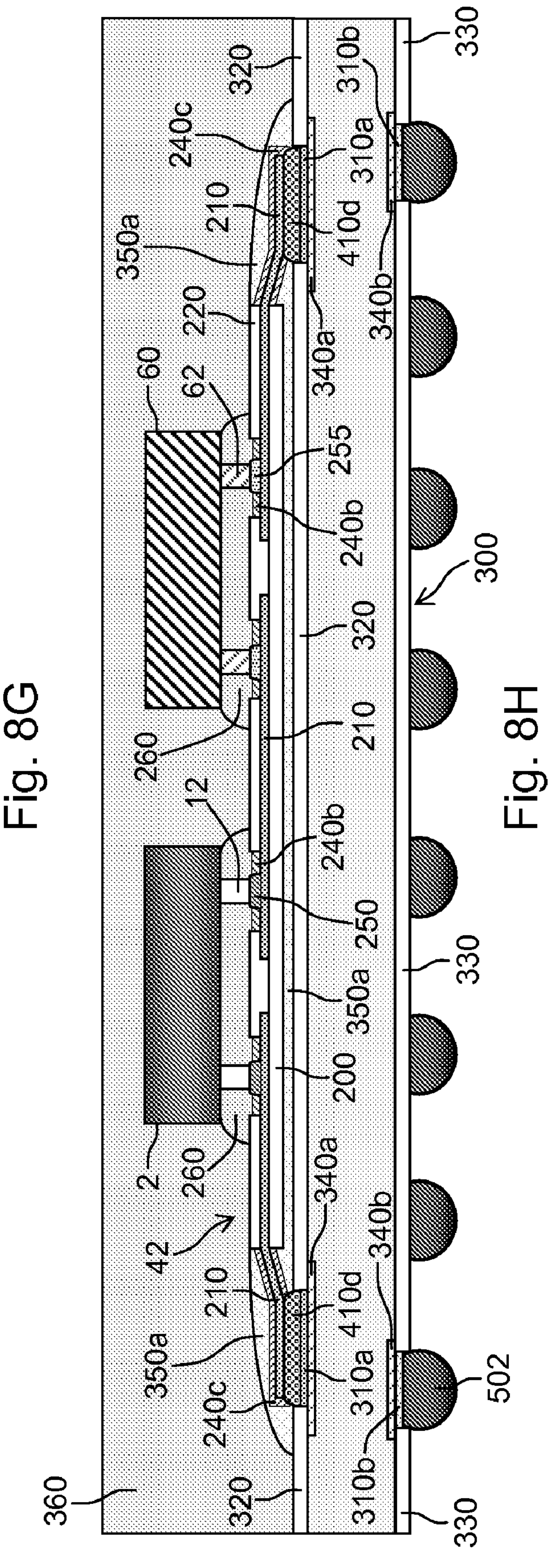

Referring to FIG. 8H, after the polymer compound 360 is formed, solder balls 502 may be formed, in a ball-grid-array arrangement, on the metal pads 310*b* of the substrate 300 using a ball placement process. The process, of forming the solder balls 502 on the metal pads 310*b* of the substrate 300, as shown in FIG. 8H can be referred to as the process, of forming the solder balls 502 on the metal pads 310*b* of the substrate 300, as illustrated in FIGS. 6F and 6G. The specification of the solder balls 502 shown in FIG. 8H can be referred to as the specification of the solder balls 502 illustrated in FIGS. 6F and 6G. After the solder balls 502 are formed on the substrate 300, the substrate 300 and the polymer compound 360 can be optionally cut into multiple units.

Figure 8I:
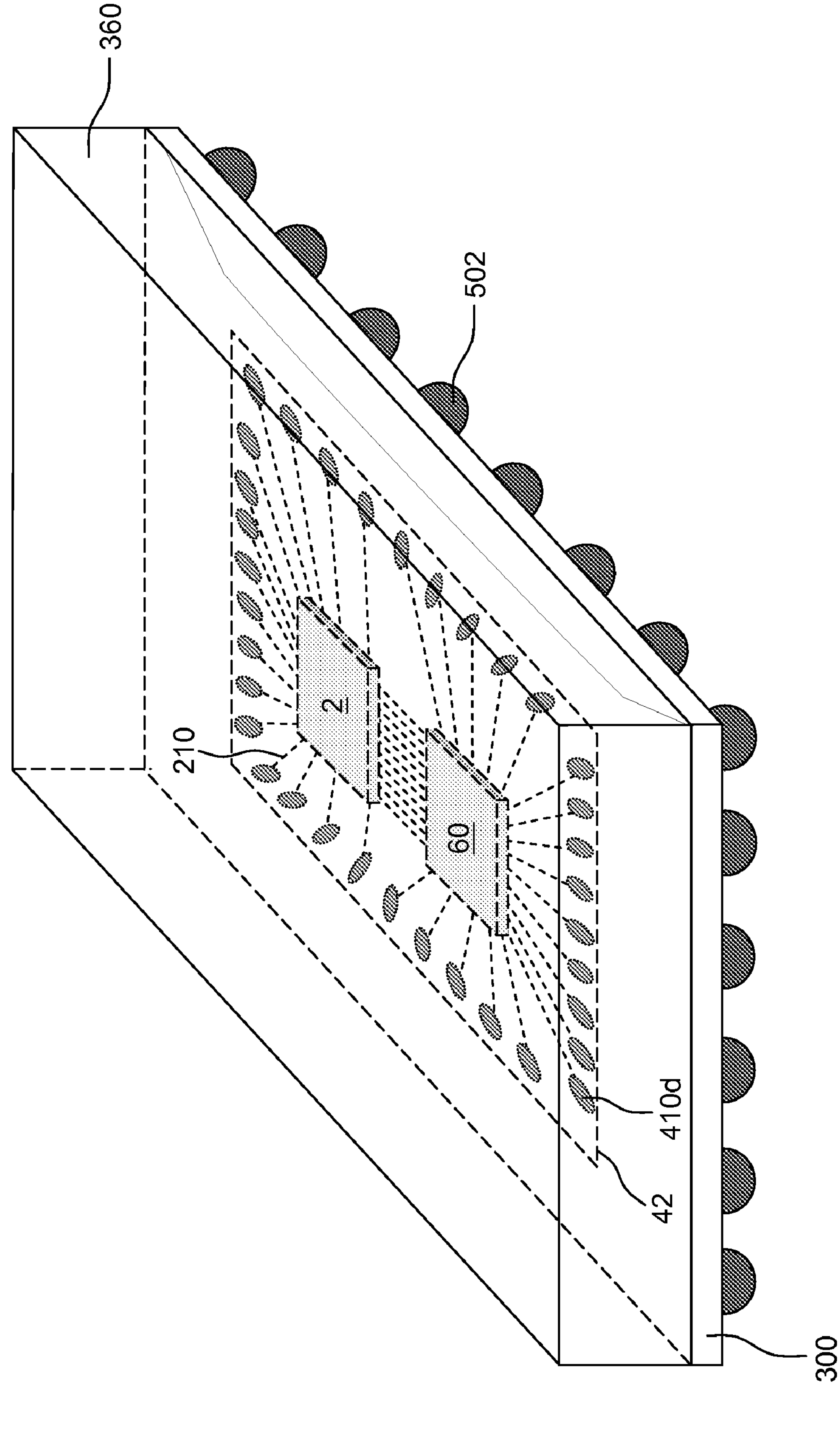

FIG. 8I is a perspective view showing FIG. 8H. The fine-pitched metal bumps 12 of the semiconductor chip 2 can be fanned out through the copper traces 210 of the flexible circuit film 42 by bonding the semiconductor chip 2 with the flexible circuit film 42. The electronic device 60 is also can be fanned out through the copper traces 210 of the flexible circuit film 42 by bonding the electronic device 60 with the flexible circuit film 42, and the electronic device 60 is connected to the semiconductor chip 2 through the copper traces 210 of the flexible circuit film 42. The flexible circuit film 42 is bonded with the substrate 300 to connect the fine-pitched metal bumps 12 of the semiconductor chip 2 with the circuit structure of the substrate 300, and to connect the electronic device 60 with the circuit structure of the substrate 300. Thereby, the semiconductor chip 2 has the fine-pitched metal bumps 12 connected to an external circuit, such as a printed circuit board (PCB) comprising a glass fiber as a core, through the copper traces 210 of the flexible circuit film 42 and the circuit structure of the substrate 300, and to the electronic device 60 through the copper traces 210 of the flexible circuit film 42.

Figure 8J:
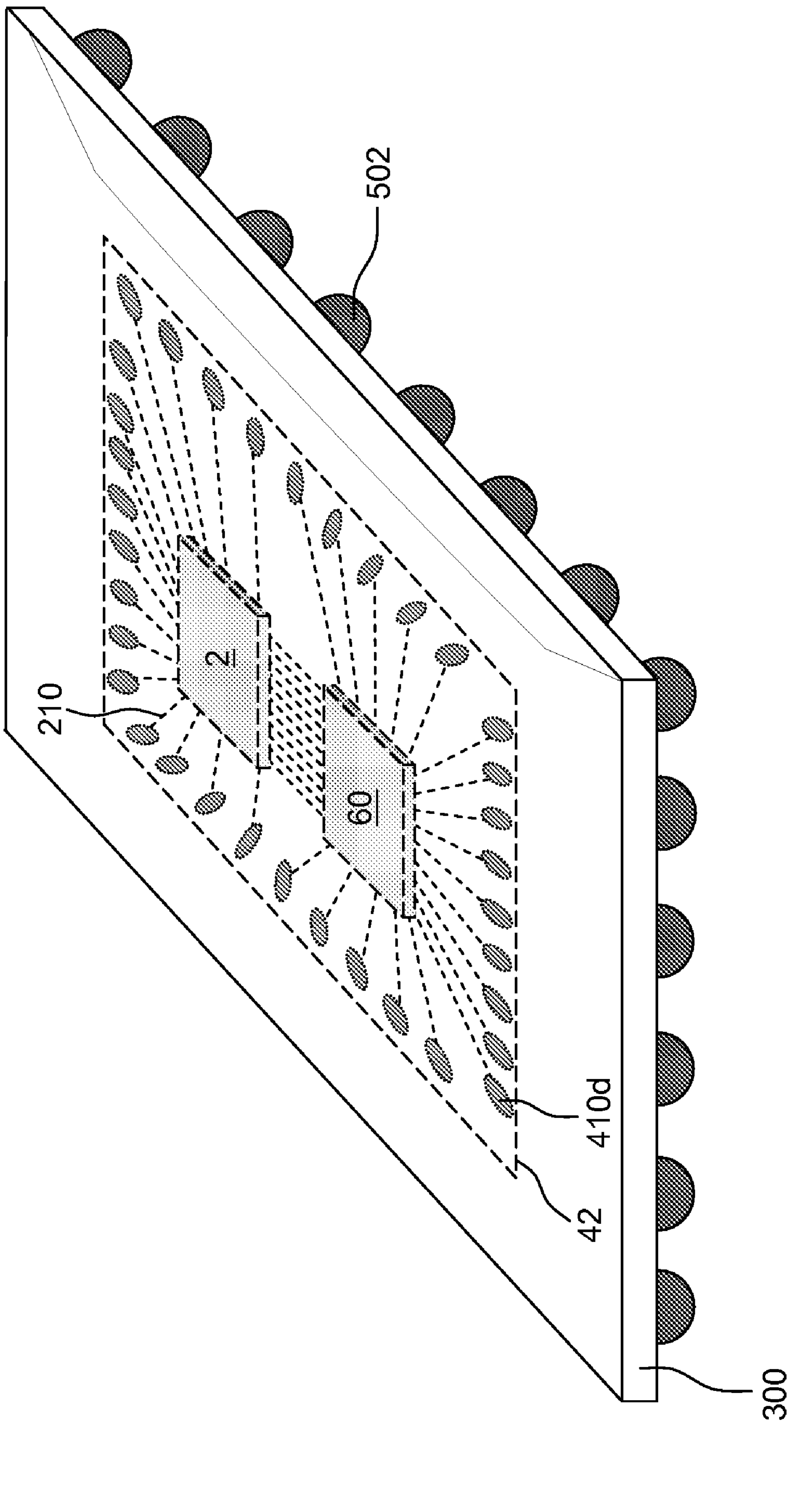
Figure 8K:
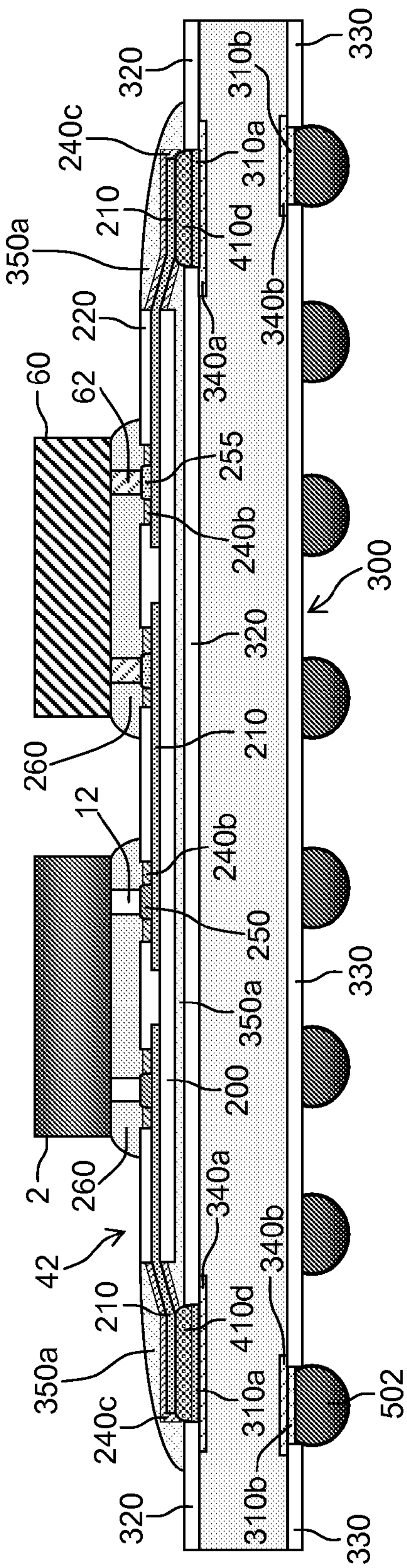
Figure 8L:
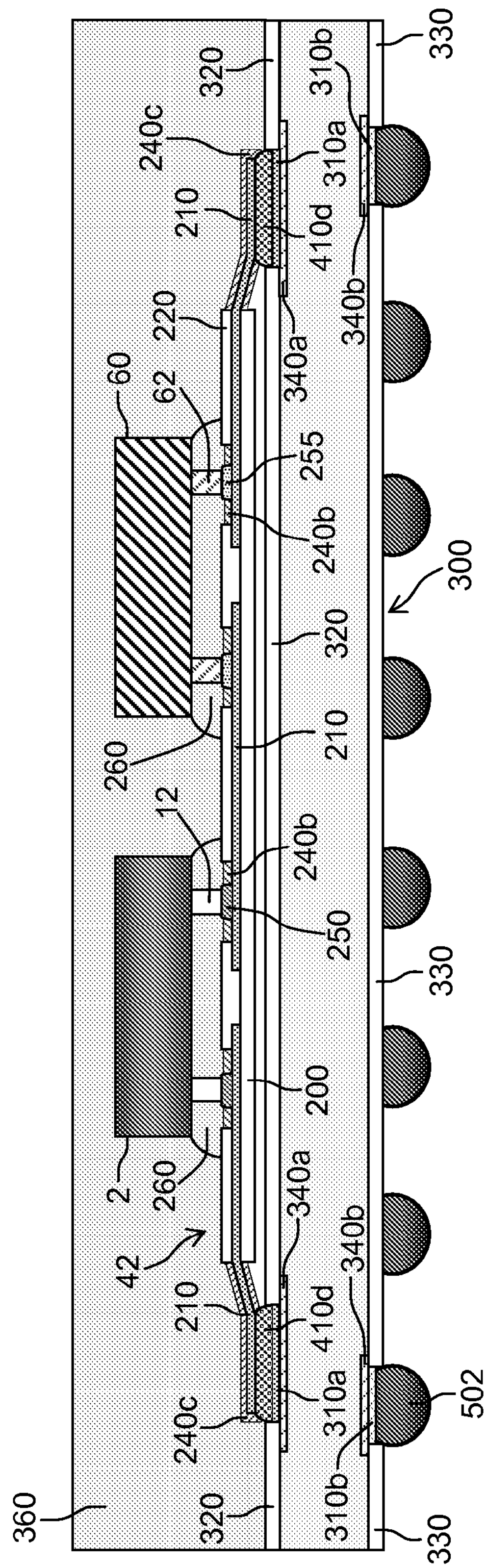
Figure 8M:
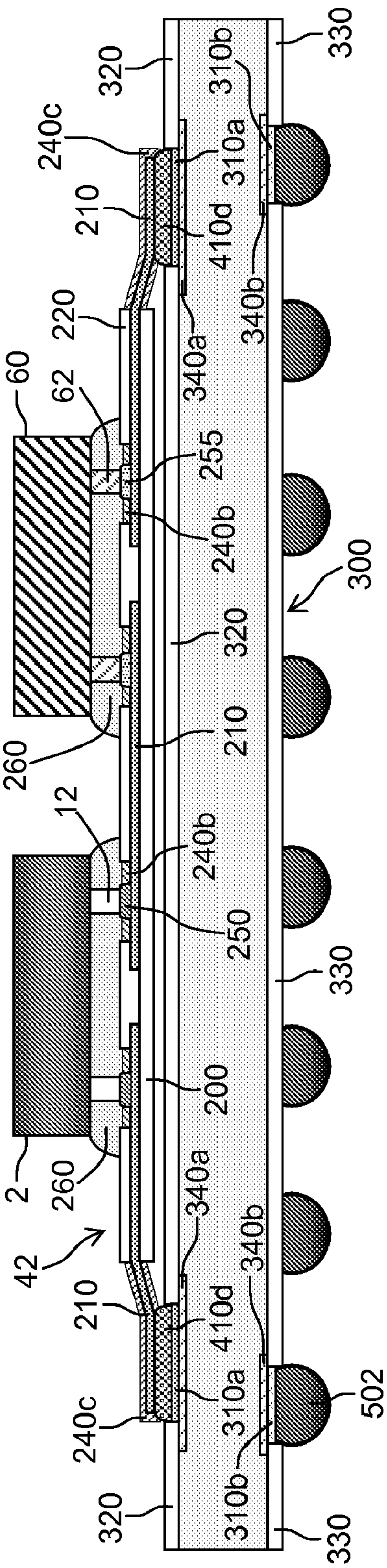

Alternatively, referring to FIGS. 8J and 8K, the step of forming the polymer compound 360, as shown in FIG. 8G, can be omitted, that is, the semiconductor chip 2, the electronic device 60 and the flexible circuit film 42 are uncovered by any polymer compound. Alternatively, referring to FIG. 8L, the step of forming the polymer layer 350*a*, as shown in FIG. 8F, can be omitted. Alternatively, referring to FIG. 8M, the steps of forming the polymer layer 350*a*, as shown in FIG. 8F, and of forming the polymer compound 360, as shown in FIG. 8G, can be omitted, that is, the semiconductor chip 2, the electronic device 60 and the flexible circuit film 42 are uncovered by any polymer compound.

Alternatively, the solder balls 502 can be omitted, as shown in FIG. 8G. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer compound 360 and the solder balls 502 can be omitted, as shown in FIG. 8F. The semiconductor chip 2, the electronic device 60 and the flexible circuit film 42 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 8N:
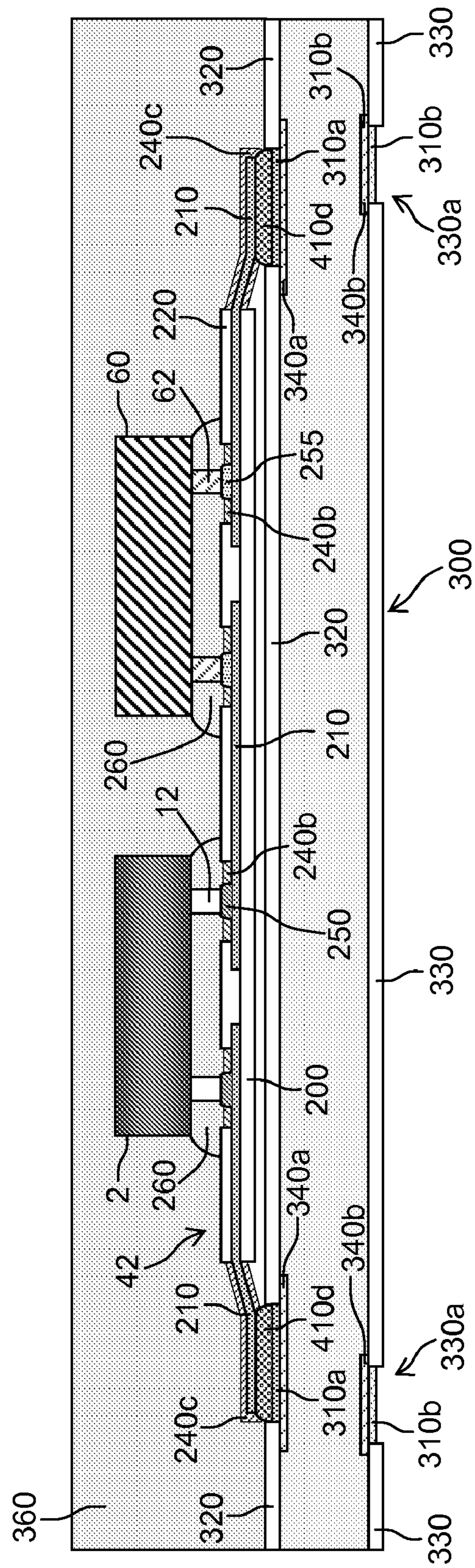

Alternatively, the polymer layer 350*a* and the solder balls 502 can be omitted, as shown in FIG. 8N. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350*a*, the polymer compound 360 and the solder balls 502 can be omitted, as shown in FIG. 8E. The semiconductor chip 2, the electronic device 60 and the flexible circuit film 42 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 8O:
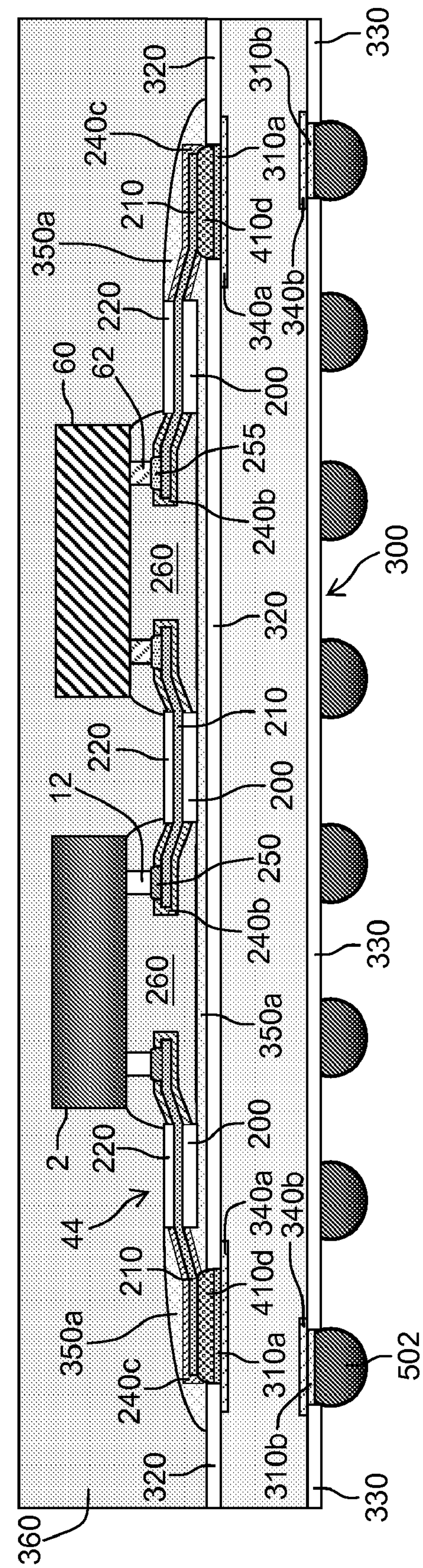

Referring to FIG. 8O, the above-mentioned flexible circuit film 42 shown in FIG. 8H can be replaced by a flexible circuit film 44, that is, the semiconductor chip 2 and the electronic device 60 are bonded with the copper traces 210 at the center portion of the flexible circuit film 44, followed by forming the polymer layer 260 on the semiconductor chip 2 and on the electronic device 60, enclosing the metal bumps 12, the metal bumps 62 and the wetting layer 240*b*, followed by performing the above-mentioned steps as shown in FIGS. 8E-8H. The flexible circuit film 44 includes the polymer layer 200, the polymer layer 220, the wetting layer 240*b*, the wetting layer 240*c* and the copper traces 210 between the polymer layers 200 and 220, wherein the polymer layers 200 and 220 uncover top and bottom sides of the copper traces 210 at the center portion and the outer portion of the flexible circuit film 44. The wetting layer 240*b* is on the copper traces 210 at the center portion of the flexible circuit film 44, and the wetting layer 240*c* is on the copper traces 210 at the outer portion of the flexible circuit film 44. There is no opening in the polymer layer 200 exposing the copper traces 210 to lead the copper traces 210 to be connected to the substrate 300. The metal bumps 12 of the semiconductor chip 2 are bonded with the copper traces 210 at the center portion of the flexible circuit film 44 through the interface bonding layer 250, and the metal bumps 62 of the electronic device 60 are bonded with the copper traces 210 at the center portion of the flexible circuit film 44 through the interface bonding layer 255.

The specification of the interface bonding layer 250 shown in FIG. 8O can be referred to as the specification of the interface bonding layer 250 between the metal bumps 12 and the copper traces 210 formed in the process as illustrated in the first case shown in FIGS. 3A and 3B. The specification of the interface bonding layer 255 shown in FIG. 8O can be referred to as the specification of the interface bonding layer 255 formed in the process as illustrated in the first case shown in FIGS. 8A, 8B and 8C. The methods, of bonding the metal bumps 12 of the semiconductor chip 2 and the metal bumps 62 of the electronic device 60 with the copper traces 210 of the flexible circuit film 44, as shown in FIG. 8O can be referred to as the methods, of bonding the metal bumps 12 of the semiconductor chip 2 and the metal bumps 62 of the electronic device 60 with the copper traces 210 of the flexible circuit film 42, as illustrated in the first and second cases shown in FIGS. 8B and 8C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 8O can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 8O can be referred to as the specification of the metal bumps 12, between the semiconductor chip 2 and the copper traces 210, formed in the process as illustrated in the second case shown in FIG. 3B. When the step of bonding a gold layer of the metal bumps 62 with the wetting layer 240*b* of a tin-containing layer is performed, the specification of the metal bumps 62 between the electronic device 60 and the interface bonding layer 255 shown in FIG. 8O can be referred to as the specification of the metal bumps 62, between the electronic device 60 and the interface bonding layer 255, formed in the process as illustrated in the first case shown in FIGS. 8A, 8B and 8C. Alternatively, when the step of bonding a gold layer of the metal bumps 62 with the wetting layer 240*b* of a gold layer is performed, the specification of the metal bumps 62 between the electronic device 60 and the copper traces 210 shown in FIG. 8O can be referred to as the specification of the metal bumps 62, between the electronic device 60 and the copper traces 210, formed in the process as illustrated in the second case shown in FIGS. 8B and 8C.

Alternatively, the metal joints 410*d* shown in FIG. 8O can be replaced by an anisotropic conductive film (ACF). The anisotropic conductive film can be preformed on the metal pads 310*a* of the substrate 300 shown in FIG. 3E, and then the wetting layer 240*c* on the copper traces 210 at the outer portion of the flexible circuit film 44 can be pressed on the anisotropic conductive film, such that metal particles in the anisotropic conductive film connects the wetting layer 240*c* of the flexible circuit film 44 to the metal pads 310*a* of the substrate 300.

Alternatively, the polymer compound 360 shown in FIG. 8O can be omitted, that is, the semiconductor chip 2, the electronic device 60 and the flexible circuit film 44 are uncovered by any polymer compound. Alternatively, the polymer layer 350*a* shown in FIG. 8O can be omitted. Alternatively, the polymer layer 350*a* and the polymer compound 360 shown in FIG. 8O can be omitted, that is, the semiconductor chip 2, the electronic device 60 and the flexible circuit film 44 are uncovered by any polymer compound.

Alternatively, the solder balls 502 shown in FIG. 8O can be omitted. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer compound 360 and the solder balls 502 shown in FIG. 8O can be omitted. The semiconductor chip 2, the electronic device 60 and the flexible circuit film 44 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350*a* and the solder balls 502 shown in FIG. 8O can be omitted. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350*a*, the polymer compound 360 and the solder balls 502 shown in FIG. 8O can be omitted. The semiconductor chip 2, the electronic device 60 and the flexible circuit film 44 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 8P:
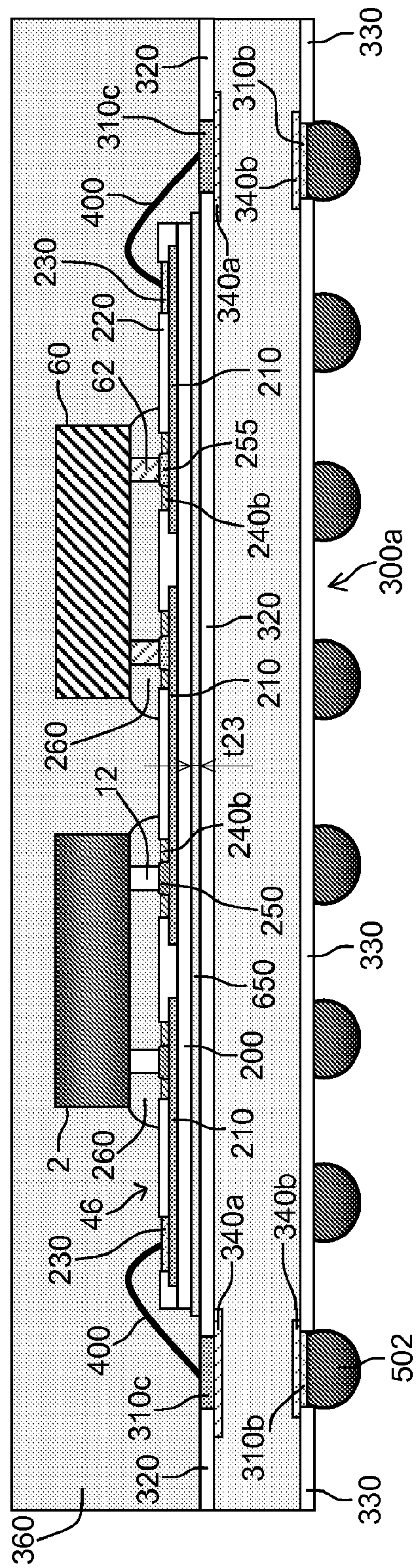
Figure 8Q:
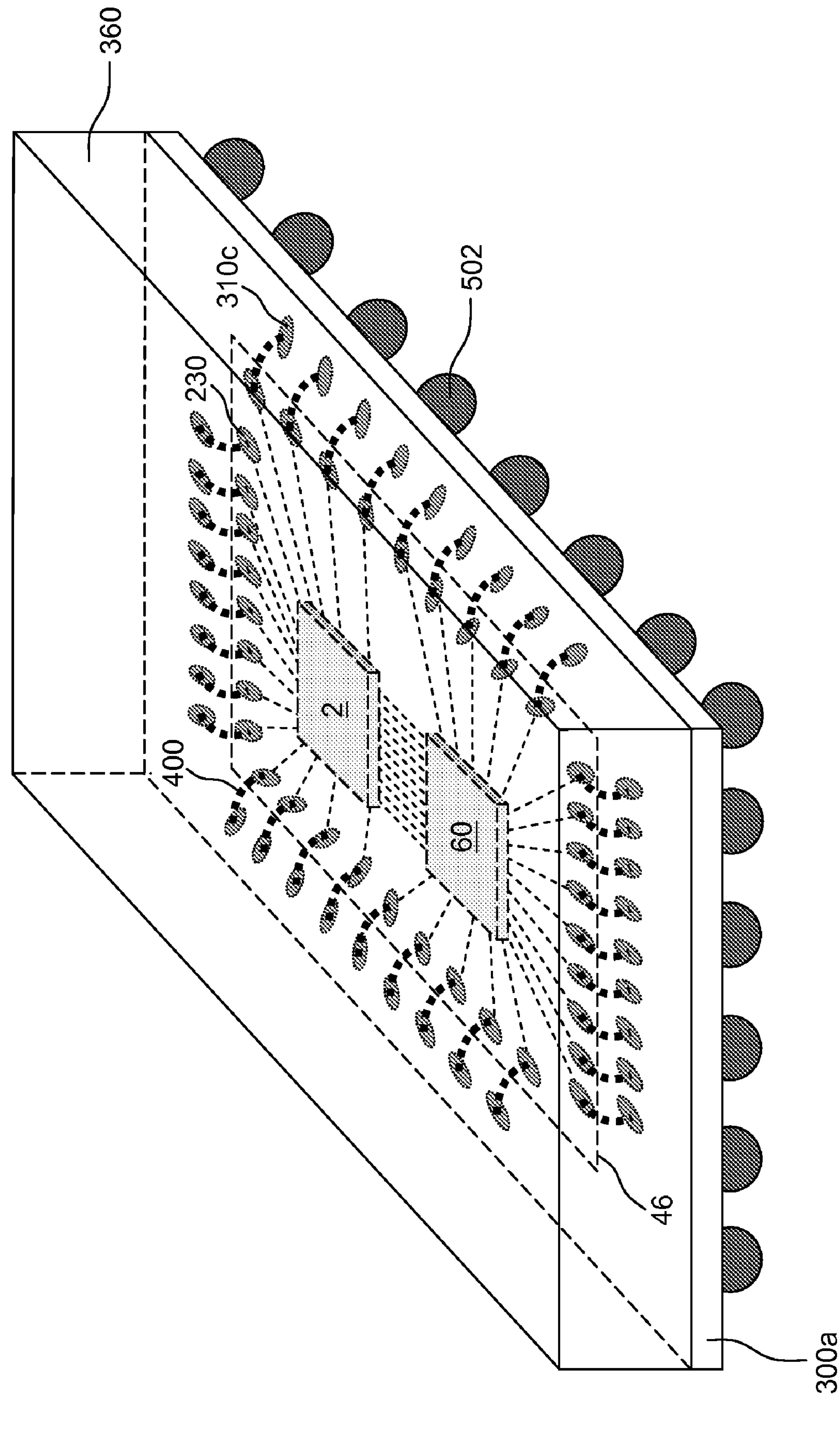

Referring to FIGS. 8P and 8Q, the above-mentioned flexible circuit film 42 shown in FIG. 8H can be replaced by a flexible circuit film 46, and the substrate 300 shown in FIG. 8H can be replaced by the substrate 300*a* shown in FIG. 7B, that is, the semiconductor chip 2 and the electronic device 60 are bonded with the copper traces 210 at the center portion of the flexible circuit film 46, followed by performing the above-mentioned step as shown in FIG. 8D, followed by joining the flexible circuit film 46, bonded with the semiconductor chip 2 and with the electronic device 60, with the substrate 300*a* using a glue material 650, followed by bonding wireboning wires 400, such as gold wires, having a diameter of between 12 and 40 micrometers with a wirebondable layer 230 of the flexible circuit film 46 and with the wirebonding pads 310*c* of the substrate 300*a* via a wire-bonding process, followed by performing the above-mentioned steps as shown in FIGS. 8G-8H.

The flexible circuit film 46 includes the polymer layer 200, the polymer layer 220, the wirebondable layer 230, the wetting layer 240*b* and the copper traces 210 between the polymer layers 200 and 220. The wetting layer 240*b* is on the copper traces 210 at the center portion of the flexible circuit film 46, and the wirebondable layer 230 is on the copper traces 210 at the outer portion of the flexible circuit film 46. The wirebondable layer 230 having a thickness of between 0.05 and 2 micrometers, and preferably of between 0.1 and 1 micrometer, may be gold, copper, aluminum, nickel, silver, palladium or a composite of the above-mentioned materials. For example, the wirebondable layer 230 may be a gold layer having a thickness of between 0.05 and 2 micrometers, and preferably of between 0.05 and 1 micrometer, on the copper traces 210 at the outer portion of the flexible circuit film 46. Alternatively, the wirebondable layer 230 may be a palladium layer having a thickness of between 0.05 and 2 micrometers, and preferably of between 0.05 and 1 micrometer, on the copper traces 210 at the outer portion of the flexible circuit film 46. Alternatively, the wirebondable layer 230 may be a silver layer having a thickness of between 0.05 and 2 micrometers, and preferably of between 0.1 and 1 micrometer, on the copper traces 210 at the outer portion of the flexible circuit film 46. Alternatively, the wirebondable layer 230 may be an aluminum layer having a thickness of between 0.05 and 2 micrometers, and preferably of between 0.1 and 1 micrometer, on the copper traces 210 at the outer portion of the flexible circuit film 46. Alternatively, the wirebondable layer 230 comprises a nickel layer having a thickness of between 0.05 and 1 micrometer on the copper traces 210 at the outer portion of the flexible circuit film 46, and a gold layer having a thickness of between 0.05 and 1 micrometer on the nickel layer. There is no opening in the polymer layer 200 exposing the copper traces 210 to lead the copper traces 210 to be connected to the substrate 300*a*. The metal bumps 12 of the semiconductor chip 2 are bonded with the copper traces 210 at the center portion of the flexible circuit film 46 through the interface bonding layer 250, and the metal bumps 62 of the electronic device 60 are bonded with the copper traces 210 at the center portion of the flexible circuit film 46 through the interface bonding layer 255.

The specification of the substrate 300*a* shown in FIG. 8P can be referred to as the specification of the substrate 300*a* illustrated in FIG. 7B. The specification of the interface bonding layer 250 shown in FIG. 8P can be referred to as the specification of the interface bonding layer 250 between the metal bumps 12 and the copper traces 210 formed in the process as illustrated in the first case shown in FIGS. 3A and 3B. The specification of the interface bonding layer 255 shown in FIG. 8P can be referred to as the specification of the interface bonding layer 255 formed in the process as illustrated in the first case shown in FIGS. 8A, 8B and 8C. The specification of the glue material 650 shown in FIG. 8P can be referred to as the specification of the glue material 650 illustrated in FIGS. 7B and 7C. The process, of forming the glue material 650, as shown in FIG. 8P can be referred to as the process, of forming the s glue material 650, as illustrated in FIGS. 7B and 7C. The methods, of bonding the metal bumps 12 of the semiconductor chip 2 and the metal bumps 62 of the electronic device 60 with the copper traces 210 of the flexible circuit film 46, as shown in FIG. 8P can be referred to as the methods, of bonding the metal bumps 12 of the semiconductor chip 2 and the metal bumps 62 of the electronic device 60 with the copper traces 210 of the flexible circuit film 42, as illustrated in the first and second cases shown in FIGS. 8B and 8C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 8P can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 8P can be referred to as the specification of the metal bumps 12, between the semiconductor chip 2 and the copper traces 210, formed in the process as illustrated in the second case shown in FIG. 3B. When the step of bonding a gold layer of the metal bumps 62 with the wetting layer 240*b* of a tin-containing layer is performed, the specification of the metal bumps 62 between the electronic device 60 and the interface bonding layer 255 shown in FIG. 8P can be referred to as the specification of the metal bumps 62, between the electronic device 60 and the interface bonding layer 255, formed in the process as illustrated in the first case shown in FIGS. 8A, 8B and 8C. Alternatively, when the step of bonding a gold layer of the metal bumps 62 with the wetting layer 240*b* of a gold layer is performed, the specification of the metal bumps 62 between the electronic device 60 and the copper traces 210 shown in FIG. 8P can be referred to as the specification of the metal bumps 62, between the electronic device 60 and the copper traces 210, formed in the process as illustrated in the second case shown in FIGS. 8B and 8C.

Alternatively, the solder balls 502 shown in FIGS. 8P and 8Q can be omitted. The substrate 300*a* can be optionally sawed into multiple units. After sawing the substrate 300*a*, the metal pads 310*b* of the substrate 300*a* can be joined with a solder, containing pure tin, a tin-silver alloy, a tin-lead alloy or a tin-silver-copper alloy, preformed on an external circuit or can contact with contact points of a socket.

Figure 8R:
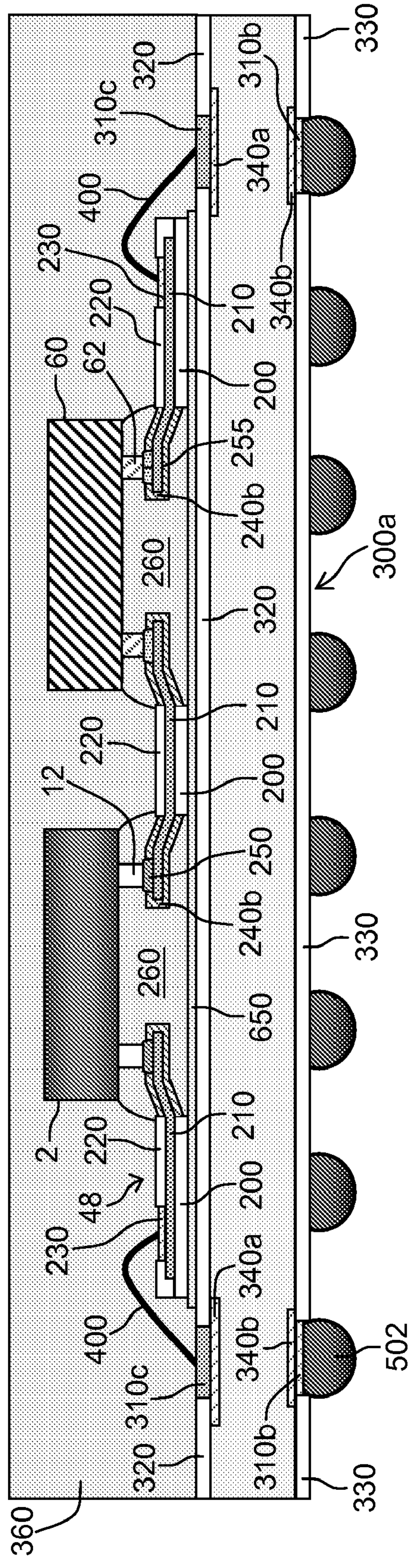

Referring to FIG. 8R, the above-mentioned flexible circuit film 42 shown in FIG. 8H can be replaced by a flexible circuit film 48, and the substrate 300 shown in FIG. 8H can be replaced by the substrate 300*a* shown in FIG. 7B, that is, the semiconductor chip 2 and the electronic device 60 are bonded with the copper traces 210 at the center portion of the flexible circuit film 48, followed by forming the polymer layer 260 on the semiconductor chip 2 and on the electronic device 60, enclosing the metal bumps 12, the metal bumps 62 and the wetting layer 240*b*, followed by joining the flexible circuit film 48, bonded with the semiconductor chip 2 and with the electronic device 60, with the substrate 300*a* using the glue material 650, followed by bonding the wireboning wires 400, such as gold wires, having a diameter of between 12 and 40 micrometers with the wirebondable layer 230 of the flexible circuit film 48 and with the wirebonding pads 310*c* of the substrate 300*a* via a wire-bonding process, followed by performing the above-mentioned steps as shown in FIGS. 8G-8H.

The flexible circuit film 48 includes the polymer layer 200, the polymer layer 220, the wirebondable layer 230, the wetting layer 240*b* and the copper traces 210 between the polymer layers 200 and 220, wherein the polymer layers 200 and 220 uncover top and bottom sides of the copper traces 210 at the center portion of the flexible circuit film 48. The wetting layer 240*b* is on the copper traces 210 at the center portion of the flexible circuit film 48, and the wirebondable layer 230 is on the copper traces 210 at the outer portion of the flexible circuit film 48. There is no opening in the polymer layer 200 exposing the copper traces 210 to lead the copper traces 210 to be connected to the substrate 300*a*. The metal bumps 12 of the semiconductor chip 2 are bonded with the copper traces 210 at the center portion of the flexible circuit film 48 through the interface bonding layer 250, and the metal bumps 62 of the electronic device 60 are bonded with the copper traces 210 at the center portion of the flexible circuit film 48 through the interface bonding layer 255.

The specification of the substrate 300*a* shown in FIG. 8R can be referred to as the specification of the substrate 300*a* illustrated in FIG. 7B. The specification of the wirebondable layer 230 shown in FIG. 8R can be referred to as the specification of the wirebondable layer 230 illustrated in FIGS. 8P and 8Q. The specification of the interface bonding layer 250 shown in FIG. 8R can be referred to as the specification of the interface bonding layer 250 between the metal bumps 12 and the copper traces 210 formed in the process as illustrated in the first case shown in FIGS. 3A and 3B. The specification of the interface bonding layer 255 shown in FIG. 8R can be referred to as the specification of the interface bonding layer 255 formed in the process as illustrated in the first case shown in FIGS. 8A, 8B and 8C. The specification of the glue material 650 shown in FIG. 8R can be referred to as the specification of the glue material 650 illustrated in FIGS. 7B and 7C. The process, of forming the glue material 650, as shown in FIG. 8R can be referred to as the process, of forming the glue material 650, as illustrated in FIGS. 7B and 7C. The methods, of bonding the metal bumps 12 of the semiconductor chip 2 and the metal bumps 62 of the electronic device 60 with the copper traces 210 of the flexible circuit film 48, as shown in FIG. 8R can be referred to as the methods, of bonding the metal bumps 12 of the semiconductor chip 2 and the metal bumps 62 of the electronic device 60 with the copper traces 210 of the flexible circuit film 42, as illustrated in the first and second cases shown in FIGS. 8B and 8C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 8R can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 8R can be referred to as the specification of the metal bumps 12, between the semiconductor chip 2 and the copper traces 210, formed in the process as illustrated in the second case shown in FIG. 3B. When the step of bonding a gold layer of the metal bumps 62 with the wetting layer 240*b* of a tin-containing layer is performed, the specification of the metal bumps 62 between the electronic device 60 and the interface bonding layer 255 shown in FIG. 8R can be referred to as the specification of the metal bumps 62, between the electronic device 60 and the interface bonding layer 255, formed in the process as illustrated in the first case shown in FIGS. 8A, 8B and 8C. Alternatively, when the step of bonding a gold layer of the metal bumps 62 with the wetting layer 240*b* of a gold layer is performed, the specification of the metal bumps 62 between the electronic device 60 and the copper traces 210 shown in FIG. 8R can be referred to as the specification of the metal bumps 62, between the electronic device 60 and the copper traces 210, formed in the process as illustrated in the second case shown in FIGS. 8B and 8C.

Alternatively, the solder balls 502 shown in FIG. 8R can be omitted. The substrate 300*a* can be optionally sawed into multiple units. After sawing the substrate 300*a*, the metal pads 310*b* of the substrate 300*a* can be joined with a solder, containing pure tin, a tin-silver alloy, a tin-lead alloy or a tin-silver-copper alloy, preformed on an external circuit or can contact with contact points of a socket.

Figure 8S:
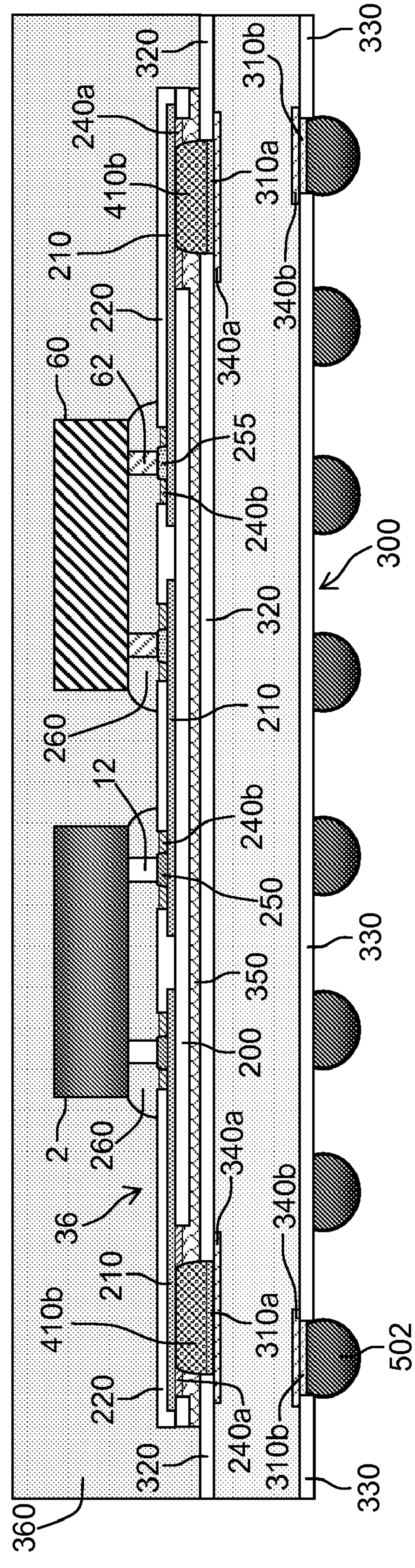

Referring to FIG. 8S, the above-mentioned flexible circuit film 42 shown in FIG. 8H can be replaced by a flexible circuit film 36, that is, the semiconductor chip 2 and the electronic device 60 are bonded with the copper traces 210 at the center portion of the flexible circuit film 36, followed by performing the above-mentioned step as shown in FIG. 8D, followed by joining the copper traces 210 with tin-containing joints preformed on the metal pads 310*a* of the substrate 300 to provide metal joints 410*b*, such as tin-containing joints, between the copper traces 210 of the flexible circuit film 36 and the topmost copper traces 340*a* of the substrate 300, followed by filling a polymer layer 350 into the gap between the flexible circuit film 36 and the substrate 300, enclosing the metal joints 410*b*, followed by performing the above-mentioned steps as shown in FIGS. 8G-8H.

The flexible circuit film 36 includes the polymer layer 200, the polymer layer 220, the wetting layer 240*a*, the wetting layer 240*b* and the copper traces 210 between the polymer layers 200 and 220. The wetting layer 240*b* is on the copper traces 210 at the center portion of the flexible circuit film 36, and the wetting layer 240*a* is on the copper traces 210 at the outer portion of the flexible circuit film 36. The wetting layer 240*a* having a thickness of between 0.05 and 5 micrometers, and preferably of between 0.1 and 1 micrometer, may be gold, copper, nickel, silver, tin or a composite of the above-mentioned materials. For example, the wetting layer 240*a* may be a tin-containing layer, such as pure tin, a tin-silver alloy, a tin-silver-copper alloy or a tin-lead alloy, having a thickness of between 0.05 and 5 micrometers, and preferably of between 0.1 and 1 micrometer, directly on the the copper traces 210 at the outer portion of the flexible circuit film 36. Alternatively, the wetting layer 240*a* may be a gold layer having a thickness of between 0.05 and 5 micrometers, and preferably of between 0.1 and 1 micrometer, directly on the copper traces 210 at the outer portion of the flexible circuit film 36; optionally, a nickel layer having a thickness between 0.05 and 1 micrometer may be between the copper traces 210 and the gold layer. The metal bumps 12 of the semiconductor chip 2 are bonded with the copper traces 210 at the center portion of the flexible circuit film 36 through the interface bonding layer 250, and the metal bumps 62 of the electronic device 60 are bonded with the copper traces 210 at the center portion of the flexible circuit film 36 through the interface bonding layer 255.

The specification of the interface bonding layer 250 shown in FIG. 8S can be referred to as the specification of the interface bonding layer 250 between the metal bumps 12 and the copper traces 210 formed in the process as illustrated in the first case shown in FIGS. 3A and 3B. The specification of the interface bonding layer 255 shown in FIG. 8S can be referred to as the specification of the interface bonding layer 255 formed in the process as illustrated in the first case shown in FIGS. 8A, 8B and 8C. The specification of the metal joints 410*b* shown in FIG. 8S can be referred to as the specification of the the metal joints 410*b* formed in the process as illustrated in the first and second cases shown in FIGS. 3F and 3G. The specification of the polymer layer 350 shown in FIG. 8S can be referred to as the specification of the polymer layer 350 illustrated in FIG. 3H. The process, of forming the polymer layer 350, as shown in FIG. 8S can be referred to as the process, of forming the polymer layer 350, as illustrated in FIG. 3H. The methods, of joining the flexible circuit film 36 with the tin-containing joints preformed on the metal pads 310*a* of the substrate 300, as shown in FIG. 8S can be referred to as the methods, of joining the flexible circuit film 36 with the tin-containing joints 410*a* preformed on the metal pads 310*a* of the substrate 300, as illustrated in the first and second cases shown in FIGS. 3F and 3G. The methods, of bonding the metal bumps 12 of the semiconductor chip 2 and the metal bumps 62 of the electronic device 60 with the copper traces 210 of the flexible circuit film 36, as shown in FIG. 8S can be referred to as the methods, of bonding the metal bumps 12 of the semiconductor chip 2 and the metal bumps 62 of the electronic device 60 with the copper traces 210 of the flexible circuit film 42, as illustrated in the first and second cases shown in FIGS. 8B and 8C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 8S can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 8S can be referred to as the specification of the metal bumps 12, between the semiconductor chip 2 and the copper traces 210, formed in the process as illustrated in the second case shown in FIG. 3B. When the step of bonding a gold layer of the metal bumps 62 with the wetting layer 240*b* of a tin-containing layer is performed, the specification of the metal bumps 62 between the electronic device 60 and the interface bonding layer 255 shown in FIG. 8S can be referred to as the specification of the metal bumps 62, between the electronic device 60 and the interface bonding layer 255, formed in the process as illustrated in the first case shown in FIGS. 8A, 8B and 8C. Alternatively, when the step of bonding a gold layer of the metal bumps 62 with the wetting layer 240*b* of a gold layer is performed, the specification of the metal bumps 62 between the electronic device 60 and the copper traces 210 shown in FIG. 8S can be referred to as the specification of the metal bumps 62, between the electronic device 60 and the copper traces 210, formed in the process as illustrated in the second case shown in FIGS. 8B and 8C.

Alternatively, the polymer compound 360 shown in FIG. 8S can be omitted, that is, the semiconductor chip 2, the electronic device 60 and the flexible circuit film 36 are uncovered by any polymer compound. Alternatively, the polymer layer 350 shown in FIG. 8S can be omitted. Alternatively, the polymer layer 350 and the polymer compound 360 shown in FIG. 8S can be omitted, that is, the semiconductor chip 2, the electronic device 60 and the flexible circuit film 36 are uncovered by any polymer compound.

Alternatively, the solder balls 502 shown in FIG. 8S can be omitted. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer compound 360 and the solder balls 502 shown in FIG. 8S can be omitted. The semiconductor chip 2, the electronic device 60 and the flexible circuit film 36 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350 and the solder balls 502 shown in FIG. 8S can be omitted. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350, the polymer compound 360 and the solder balls 502 shown in FIG. 8S can be omitted. The semiconductor chip 2, the electronic device 60 and the flexible circuit film 36 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Figure 8T:
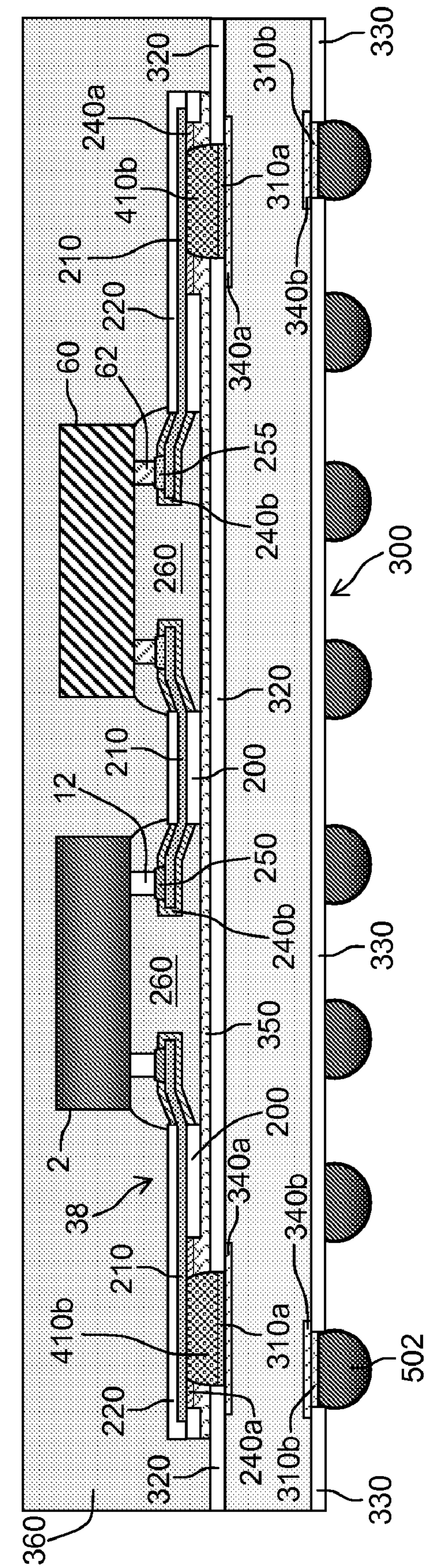

Referring to FIG. 8T, the above-mentioned flexible circuit film 42 shown in FIG. 8H can be replaced by a flexible circuit film 38, that is, the semiconductor chip 2 and the electronic device 60 are bonded with the copper traces 210 at the center portion of the flexible circuit film 38, followed by forming the polymer layer 260 on the semiconductor chip 2 and on the electronic device 60, enclosing the metal bumps 12, the metal bumps 62 and the wetting layer 240*b*, followed by joining the copper traces 210 with tin-containing joints preformed on the metal pads 310*a* of the substrate 300 to provide the metal joints 410*b*, such as tin-containing joints, between the copper traces 210 of the flexible circuit film 38 and the topmost copper traces 340*a* of the substrate 300, followed by filling the polymer layer 350 into the gap between the flexible circuit film 38 and the substrate 300, enclosing the metal joints 410*b*, followed by performing the above-mentioned steps as shown in FIGS. 8G-8H.

The flexible circuit film 38 includes the polymer layer 200, the polymer layer 220, the wetting layer 240*a*, the wetting layer 240*b* and the copper traces 210 between the polymer layers 200 and 220. The wetting layer 240*b* is on the copper traces 210 at the center portion of the flexible circuit film 38, and the wetting layer 240*a* is on the copper traces 210 at the outer portion of the flexible circuit film 38. The metal bumps 12 of the semiconductor chip 2 are bonded with the copper traces 210 at the center portion of the flexible circuit film 38 through the interface bonding layer 250, and the metal bumps 62 of the electronic device 60 are bonded with the copper traces 210 at the center portion of the flexible circuit film 38 through the interface bonding layer 255. The specification of the wetting layer 240*a* shown in FIG. 8T can be referred to as the specification of the wetting layer 240*a* illustrated in FIG. 8S.

The specification of the interface bonding layer 250 shown in FIG. 8T can be referred to as the specification of the interface bonding layer 250 between the metal bumps 12 and the copper traces 210 formed in the process as illustrated in the first case shown in FIGS. 3A and 3B. The specification of the interface bonding layer 255 shown in FIG. 8T can be referred to as the specification of the interface bonding layer 255 formed in the process as illustrated in the first case shown in FIGS. 8A, 8B and 8C. The specification of the metal joints 410*b* shown in FIG. 8T can be referred to as the specification of the the metal joints 410*b* formed in the process as illustrated in the first and second cases shown in FIGS. 3F and 3G. The specification of the polymer layer 350 shown in FIG. 8T can be referred to as the specification of the polymer layer 350 illustrated in FIG. 3H. The process, of forming the polymer layer 350, as shown in FIG. 8T can be referred to as the process, of forming the polymer layer 350, as illustrated in FIG. 3H. The methods, of joining the flexible circuit film 38 with the tin-containing joints preformed on the metal pads 310*a* of the substrate 300, as shown in FIG. 8S can be referred to as the methods, of joining the flexible circuit film 38 with the tin-containing joints 410*a* preformed on the metal pads 310*a* of the substrate 300, as illustrated in the first and second cases shown in FIGS. 3F and 3G. The methods, of bonding the metal bumps 12 of the semiconductor chip 2 and the metal bumps 62 of the electronic device 60 with the copper traces 210 of the flexible circuit film 38, as shown in FIG. 8T can be referred to as the methods, of bonding the metal bumps 12 of the semiconductor chip 2 and the metal bumps 62 of the electronic device 60 with the copper traces 210 of the flexible circuit film 42, as illustrated in the first and second cases shown in FIGS. 8B and 8C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 8T can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 8T can be referred to as the specification of the metal bumps 12, between the semiconductor chip 2 and the copper traces 210, formed in the process as illustrated in the second case shown in FIG. 3B. When the step of bonding a gold layer of the metal bumps 62 with the wetting layer 240*b* of a tin-containing layer is performed, the specification of the metal bumps 62 between the electronic device 60 and the interface bonding layer 255 shown in FIG. 8T can be referred to as the specification of the metal bumps 62, between the electronic device 60 and the interface bonding layer 255, formed in the process as illustrated in the first case shown in FIGS. 8A, 8B and 8C. Alternatively, when the step of bonding a gold layer of the metal bumps 62 with the wetting layer 240*b* of a gold layer is performed, the specification of the metal bumps 62 between the electronic device 60 and the copper traces 210 shown in FIG. 8T can be referred to as the specification of the metal bumps 62, between the electronic device 60 and the copper traces 210, formed in the process as illustrated in the second case shown in FIGS. 8B and 8C.

Alternatively, the polymer compound 360 shown in FIG. 8T can be omitted, that is, the semiconductor chip 2, the electronic device 60 and the flexible circuit film 38 are uncovered by any polymer compound. Alternatively, the polymer layer 350 shown in FIG. 8T can be omitted. Alternatively, the polymer layer 350 and the polymer compound 360 shown in FIG. 8T can be omitted, that is, the semiconductor chip 2, the electronic device 60 and the flexible circuit film 38 are uncovered by any polymer compound.

Alternatively, the solder balls 502 shown in FIG. 8T can be omitted. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer compound 360 and the solder balls 502 shown in FIG. 8T can be omitted. The semiconductor chip 2, the electronic device 60 and the flexible circuit film 38 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350 and the solder balls 502 shown in FIG. 8T can be omitted. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Alternatively, the polymer layer 350, the polymer compound 360 and the solder balls 502 shown in FIG. 8T can be omitted. The semiconductor chip 2, the electronic device 60 and the flexible circuit film 38 are uncovered by any polymer compound. The substrate 300 can be optionally sawed into multiple units. After sawing the substrate 300, the metal pads 310*b* of the substrate 300 can be joined with a solder, containing pure tin, a tin-silver alloy, a tin-lead alloy or a tin-silver-copper alloy, preformed on an external circuit or can contact with contact points of a socket.

Embodiment 6

Figure 9A:
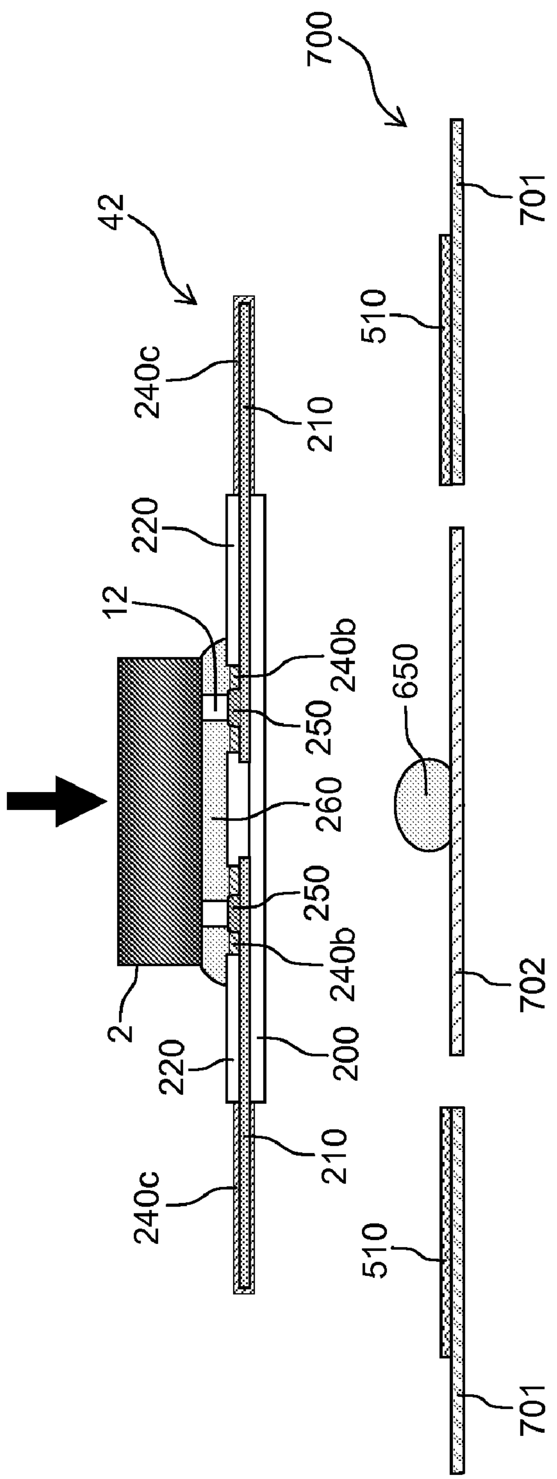
FIGS. 9A-9F are cross-sectional views showing a process for bonding a semiconductor chip with a flexible circuit film using a chip-on-film (COF) technology and joining the flexible circuit film with a lead frame according to another embodiment of the present invention.

Referring to FIG. 9A, a lead frame 700 comprises multiple leads 701 and a die pad 702 surrounded by the leads 701. Both the leads 701 and the die pad 702 are made of copper or a copper alloy. A wetting layer 510 is formed on the leads 701, and the wetting layer 510 may be a gold layer or a tin-containing layer, such as pure tin, a tin-silver alloy, a tin-silver-copper alloy or a tin-lead alloy.

The methods, of bonding the metal bumps 12 of the semiconductor chip 2 with the copper traces 210 of the flexible circuit film 42, as shown in FIG. 9A can be referred to as the methods, of bonding the metal bumps 12 of the semiconductor chip 2 with the copper traces 210 of the flexible circuit film 36, as illustrated in the first and second cases shown in FIGS. 3B and 3C. When the step of bonding a gold layer of the metal bumps 12 with the wetting layer 240*b* of a tin-containing layer is performed, the specification of the metal bumps 12 between the semiconductor chip 2 and the interface bonding layer 250 shown in FIG. 9A can be referred to as the specification of the metal bumps 12, between the semiconductor chip 2 and the interface bonding layer 250, formed in the process as illustrated in the first case shown in FIGS. 3A and 3B. Alternatively, when the step of bonding a gold layer of the metal bumps 12 with the wetting layer 240*b* of a gold layer is performed, the specification of the metal bumps 12 between the semiconductor chip 2 and the copper traces 210 shown in FIG. 9A can be referred to as the specification of the metal bumps 12, between the semiconductor chip 2 and the copper traces 210, formed in the process as illustrated in the second case shown in FIG. 3B.

Figure 9B:
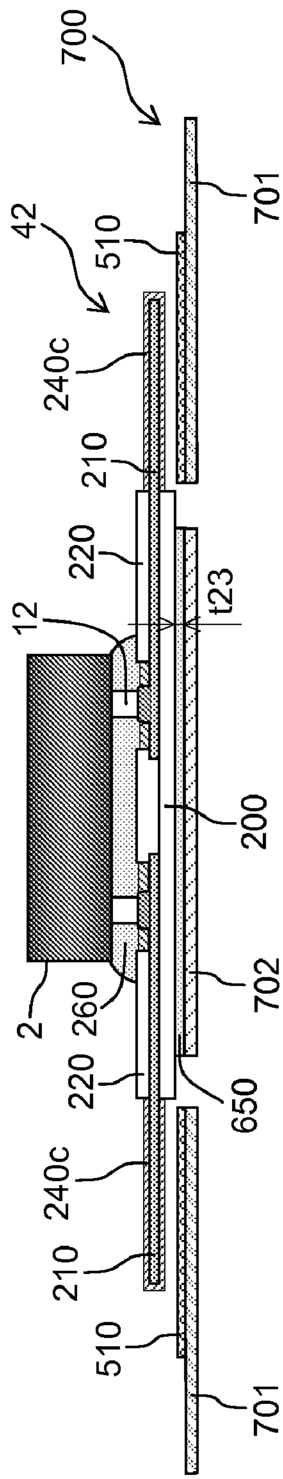

Referring to FIGS. 9A and 9B, a glue material 650 is first formed on the die pad 702 of the lead frame 700 by a dispensing process after the semiconductor chip 2 is bonded with the above-mentioned flexible circuit film 42 shown in FIG. 6B. Next, the polymer layer 200 of the flexible circuit film 42 adheres onto the glue material 650, and then the glue material 650 is baked at a temperature of between 100 and 200° C. and to a thickness t23 between 5 and 30 micrometers if the glue material 650 is an epoxy. Alternatively, the glue material 650 can be polyimide or polyester. Thereby, the flexible circuit film 42 can be joined with the die pad 702. In another word, the flexible circuit film 42 boned with the semiconductor chip 2 can be joined with the die pad 702 using the glue material 650.

Figure 9C:
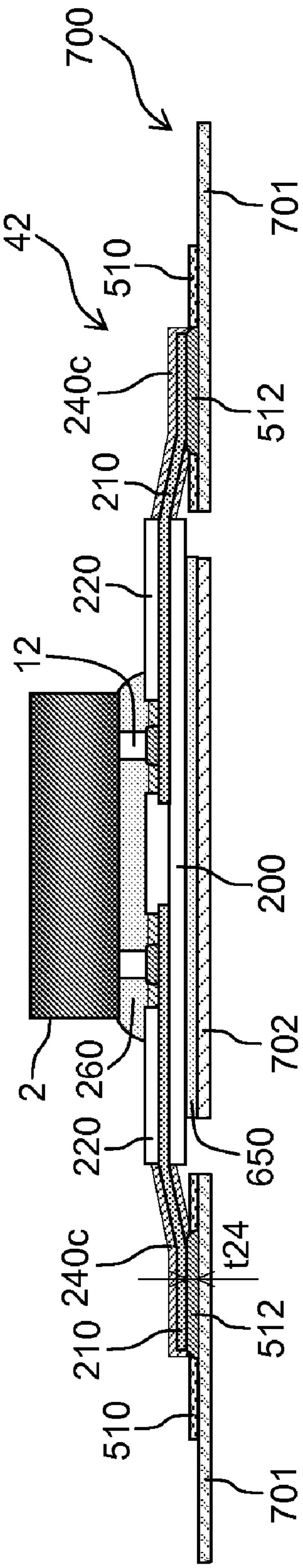

Referring to FIG. 9C, after the flexible circuit film 42 is joined with the die pad 702, the copper traces 210 at the outer portion of the flexible circuit film 42 are bonded with the leads 701 of the lead frame 700. Four methods of bonding the copper traces 210 at the outer portion of the flexible circuit film 42 with the leads 701 of the lead frame 700 are described as follow.

In a first case, referring to FIGS. 9B and 9C, when the wetting layer 510 is a gold layer, the wetting layer 510 can be used to be joined with the wetting layer 240*c* of pure tin or an above-mentioned tin alloy using a heat press process, which method is described as below. First, the lead frame 700 joined with the flexible circuit film 42 using the glue material 650 is placed on a stage kept at a temperature of between 150 and 350° C., and preferably of between 200 and 300° C. Next, the wetting layer 240*c* of the flexible circuit film 42 is thermally pressed on the wetting layer 510 on the leads 701 of the lead frame 700 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*c* with the wetting layer 510. In the step of joining the wetting layer 240*c* with the wetting layer 510, metal joints 512 can be formed between the leads 701 of the lead frame 700 and the copper traces 210 at the outer portion of the flexible circuit film 42. The metal joints 512 can be tin-containing joints having a thickness t24 of between 0.1 and 10 micrometers, and preferably of between 0.2 and 2 micrometers, wherein the tin-containing joints may include a tin-gold alloy, a tin-silver-gold alloy, a tin-silver-gold-copper alloy or a tin-lead-gold alloy due to the reaction between tin in the wetting layer 240*c* and gold in the wetting layer 510. Next, the tool head is removed from the flexible circuit film 42. Next, the lead frame 700 bonded with the flexible circuit film 42 is removed from the stage.

In a second case, referring to FIGS. 9B and 9C, when the wetting layer 510 is a tin-containing layer, the wetting layer 510 can be used to be joined with a gold layer of the wetting layer 240*c* using a heat press process, which method is described as below. First, the lead frame 700 joined with the flexible circuit film 42 using the glue material 650 is placed on a stage kept at a temperature of between 150 and 350° C., and preferably of between 200 and 300° C. Next, the wetting layer 240*c* of the flexible circuit film 42 is thermally pressed on the wetting layer 510 on the leads 701 of the lead frame 700 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*c* with the wetting layer 510. In the step of joining the wetting layer 240*c* with the wetting layer 510, the metal joints 512 can be formed between the leads 701 of the lead frame 700 and the copper traces 210 at the outer portion of the flexible circuit film 42. The metal joints 512 can be tin-containing joints having a thickness t24 of between 0.1 and 10 micrometers, and preferably of between 0.2 and 2 micrometers, wherein the tin-containing joints may include a tin-gold alloy, a tin-silver-gold alloy, a tin-silver-gold-copper alloy or a tin-lead-gold alloy due to the reaction between gold in the wetting layer 240*c* and tin in the wetting layer 510. Next, the tool head is removed from the flexible circuit film 42. Next, the lead frame 700 bonded with the flexible circuit film 42 is removed from the stage.

In a third case, referring to FIGS. 9B and 9C, when the wetting layer 510 is a tin-containing layer, the wetting layer 510 can be used to be joined with the wetting layer 240*c* of pure tin or an above-mentioned tin alloy using a heat press process, which method is described as below. First, the lead frame 700 joined with the flexible circuit film 42 using the glue material 650 is placed on a stage kept at a temperature of between 150 and 350° C., and preferably of between 200 and 300° C. Next, the wetting layer 240*c* of the flexible circuit film 42 is thermally pressed on the wetting layer 510 on the leads 701 of the lead frame 700 at a force of between 20 and 150N, and preferably of between 50 and 90N, for a time of between 0.1 and 10 seconds, and preferably of between 0.5 and 3 seconds, by a tool head kept at a temperature of between 250 and 500° C., and preferably of between 350 and 450° C., to join the wetting layer 240*c* with the wetting layer 510. Next, the tool head is removed from the flexible circuit film 42. Next, the lead frame 700 bonded with the flexible circuit film 42 is removed from the stage. Thereby, the leads 701 of the lead frame 700 can be connected to the copper traces 210 of the flexible circuit film 42 through tin-containing joints formed by joining the tin-containing layer of the wetting layer 240*b* with the tin-containing layer of the wetting layer 510, wherein the tin-containing joints may include pure tin, a tin-silver alloy, a tin-silver-copper alloy or a tin-lead alloy.

In a fourth case, referring to FIGS. 9B and 9C, when the wetting layer 510 is a gold layer, the metal joints 510 can be used to be joined with a gold layer of the wetting layer 240*c* using a heat press process, which method is described as below. First, the lead frame 700 joined with the flexible circuit film 42 using the glue material 650 is placed on a stage kept at a temperature of between 150 and 350° C., and preferably of between 200 and 300° C. Next, the wetting layer 240*c* of the flexible circuit film 42 is thermally pressed on the wetting layer 510 on the leads 701 of the lead frame 700 at a force of between 20 and 150N, and preferably of between 70 and 120N, for a time of between 0.1 and 10 seconds, and preferably of between 0.5 and 3 seconds, by a tool head kept at a temperature of between 250 and 500° C., and preferably of between 350 and 450° C., to join the wetting layer 240*c* with the wetting layer 510. Next, the tool head is removed from the flexible circuit film 42. Next, the lead frame 700 bonded with the flexible circuit film 42 is removed from the stage. Thereby, the leads 701 of the lead frame 700 can be connected to the copper traces 210 of the flexible circuit film 42 through gold joints formed by joining the gold layer of the wetting layer 240*b* with the gold layer of the wetting layer 510.

Figure 9D:
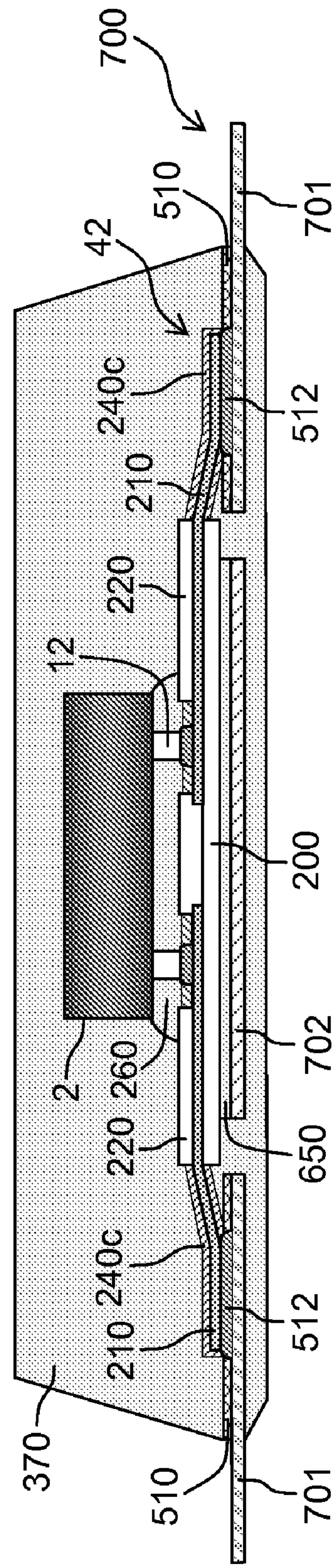

Referring to FIG. 9D, after the step shown in FIG. 9C, a polymer compound 370 is formed using a molding process, enclosing the die pad 702, an inner portion of the leads 701 close to the die pad 702, the semiconductor chip 2 and the flexible circuit film 42. For example, the polymer compound 370 can be formed by molding an epoxy-based polymer with carbon fillers therein enclosing the die pad 702, the inner portion of the leads 701, the semiconductor chip 2 and the flexible circuit film 42 at a temperature of between 130 and 250° C. Alternatively, the polymer compound 370 can be polyimide or polyester. Preferably, the polymer compound 370 has a value of Young's modulus less than 0.5 GPa.

Figure 9E:
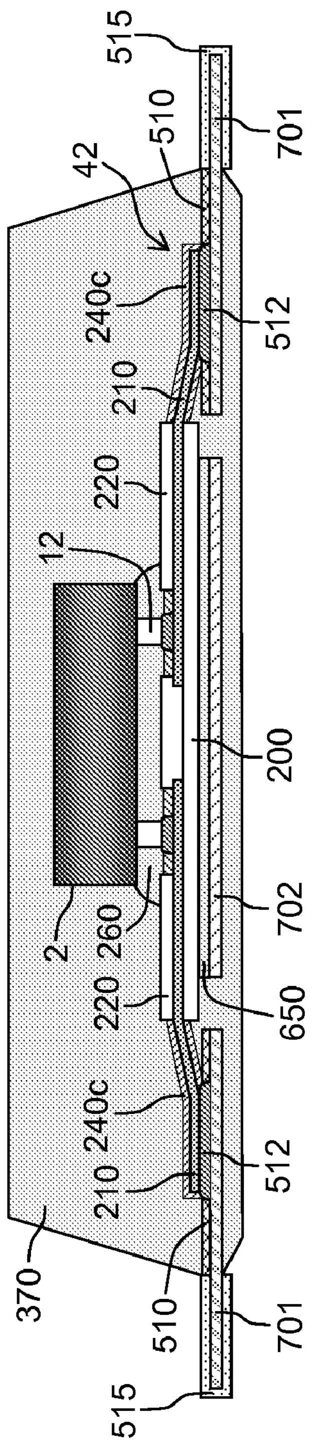

Referring to FIG. 9E, after the polymer compound 370 is formed, a wetting layer 515, such as gold, pure tin, a tin-silver alloy, a tin-silver-copper alloy or a tin-lead alloy, can be electroplated or electroless plated on an outer portion of the leads 701 unenclosed by the polymer compound 370.

Figure 9F:
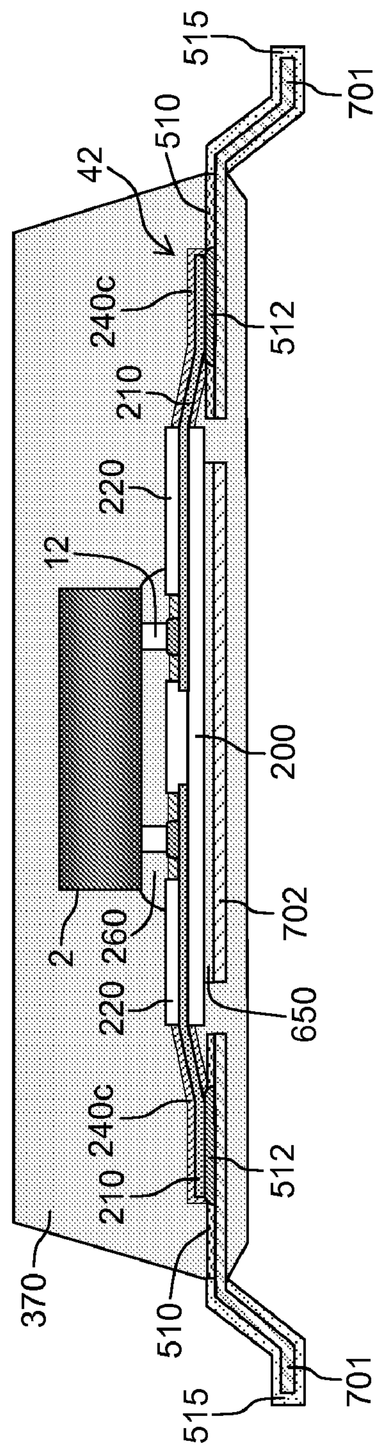

Referring to FIG. 9F, after the wetting layer 515 is formed, the steps of dejunking the residual of the polymer compound 370, trimming dam bars and cutting and punching the leads 701 can be performed, such that the leads 701 have a predetermined shape and multiple chip packages are singularized.

Figure 9G:
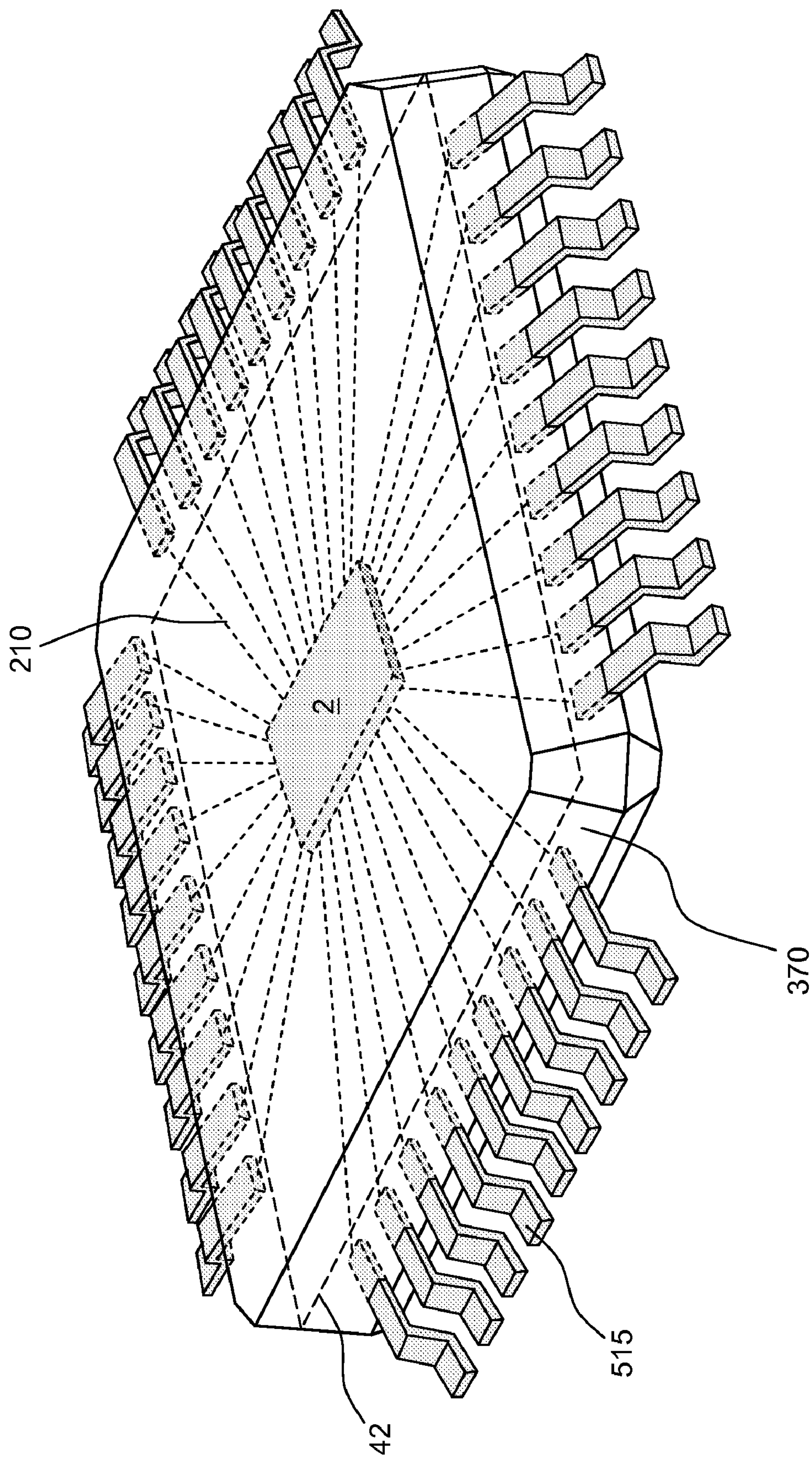
FIGS. 9G and 9J are perspective views showing two chip packages each including a lead frame, a flexible circuit film mounted on the lead frame and a semiconductor chip joined with the flexible circuit film.

FIG. 9G is a perspective view showing FIG. 9F. The fine-pitched metal bumps 12 of the semiconductor chip 2 can be fanned out through the copper traces 210 of the flexible circuit film 42 by bonding the semiconductor chip 2 with the flexible circuit film 42. The flexible circuit film 42 is also joined with the lead frame 700, and the flexible circuit film 42 can be connected to the lead frame 700. Thereby, the semiconductor chip 2 has the fine-pitched metal bumps 12 connected to an external circuit, such as a printed circuit board (PCB) comprising a glass fiber as a core, through the copper traces 210 of the flexible circuit film 42 and through the leads 701 of the lead frame 700. Alternatively, the glue material 650 shown in FIGS. 9A-9F can be omitted.

Figure 9H:
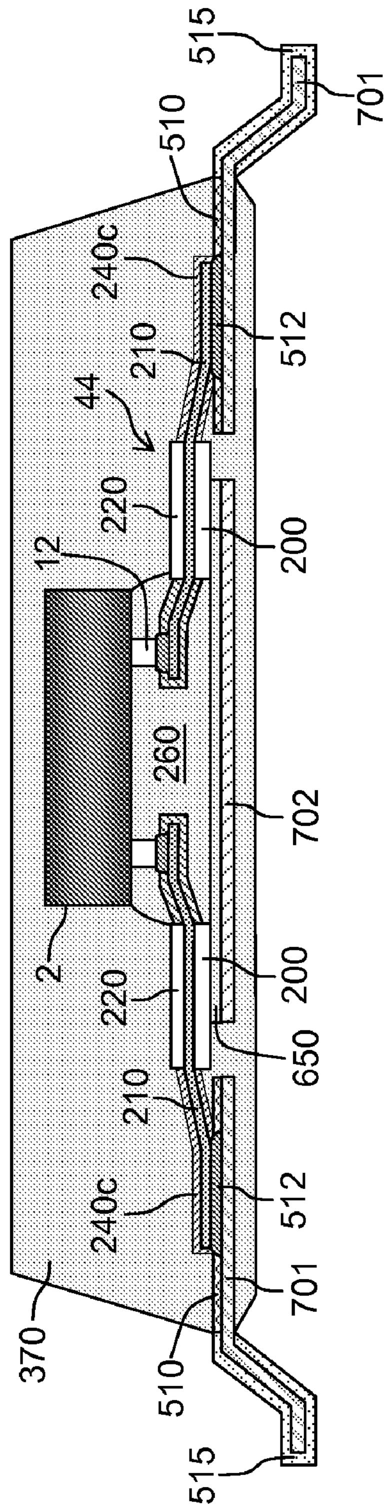
FIGS. 9H-9I and 9K-9M are cross-sectional views showing various chip packages each including a lead frame, a flexible circuit film mounted on the lead frame and a semiconductor chip joined with the flexible circuit film.

Referring to FIG. 9H, the above-mentioned flexible circuit film 42, bonded with the semiconductor chip 2, shown in FIGS. 9A-9G can be replaced by the above-mentioned flexible circuit film 44, bonded with the semiconductor chip 2, shown in FIG. 6O, that is, the flexible circuit film 44 bonded with the semiconductor chip 2 is joined with the lead frame 700 using the glue material 650, followed by performing the above-mentioned steps as shown in FIGS. 9C-9F. The method, of joining the flexible circuit film 44 bonded with the semiconductor chip 2 with the lead frame 700 using the glue material 650, as shown in FIG. 9H can be referred to as the method, of joining the flexible circuit film 42 bonded with the semiconductor chip 2 with the lead frame 700 using the glue material 650, as illustrated in FIGS. 9A and 9B.

Figure 9I:
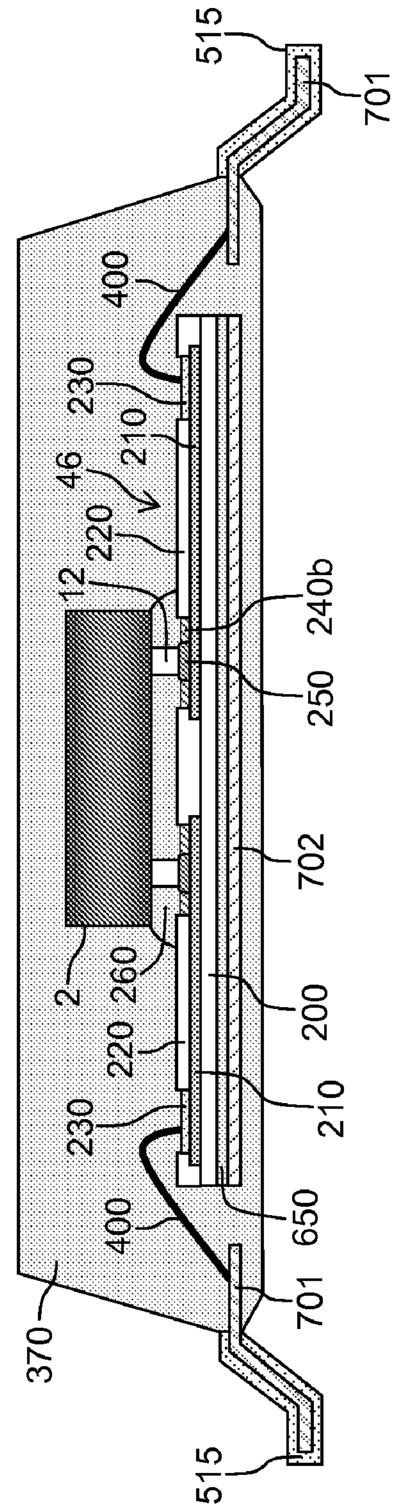
Figure 9J:
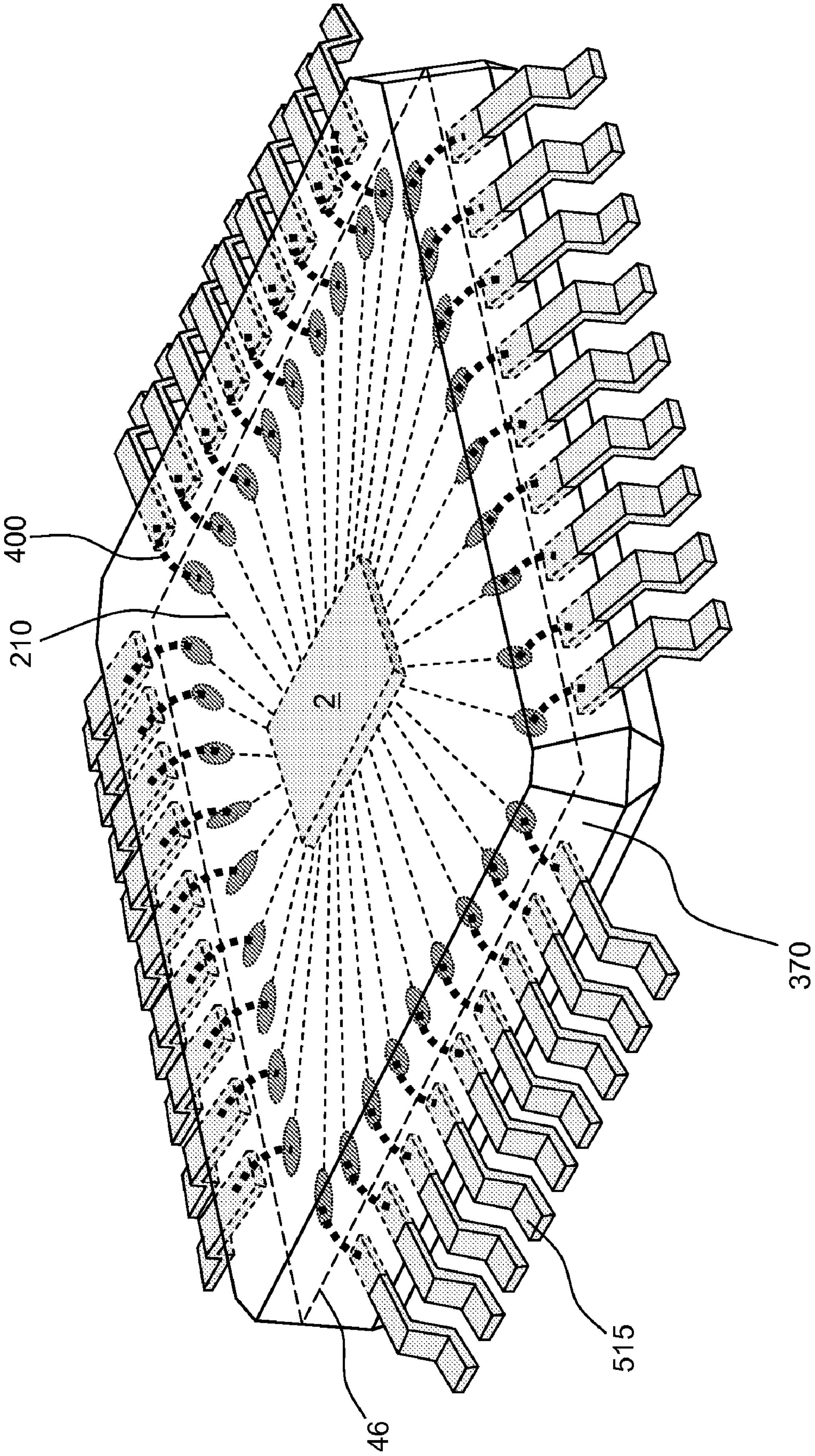

Referring to FIGS. 9I and 9J, the above-mentioned flexible circuit film 42, bonded with the semiconductor chip 2, shown in FIGS. 9A-9G can be replaced by the above-mentioned flexible circuit film 46, bonded with the semiconductor chip 2, shown in FIG. 7B, that is, the flexible circuit film 46 bonded with the semiconductor chip 2 is joined with the lead frame 700 using the glue material 650, followed by bonding wireboning wires 400, such as gold wires, having a diameter of between 12 and 40 micrometers with the wirebondable layer 230 and with the leads 701 via a wire-bonding process, followed by performing the above-mentioned steps as shown in FIGS. 9D-9F. Thereby, the wirebondable layer 230 of the flexible circuit film 46 can be electrically connected to the leads 701 of the lead frame 700 through the wireboning wires 400.

Figure 9K:
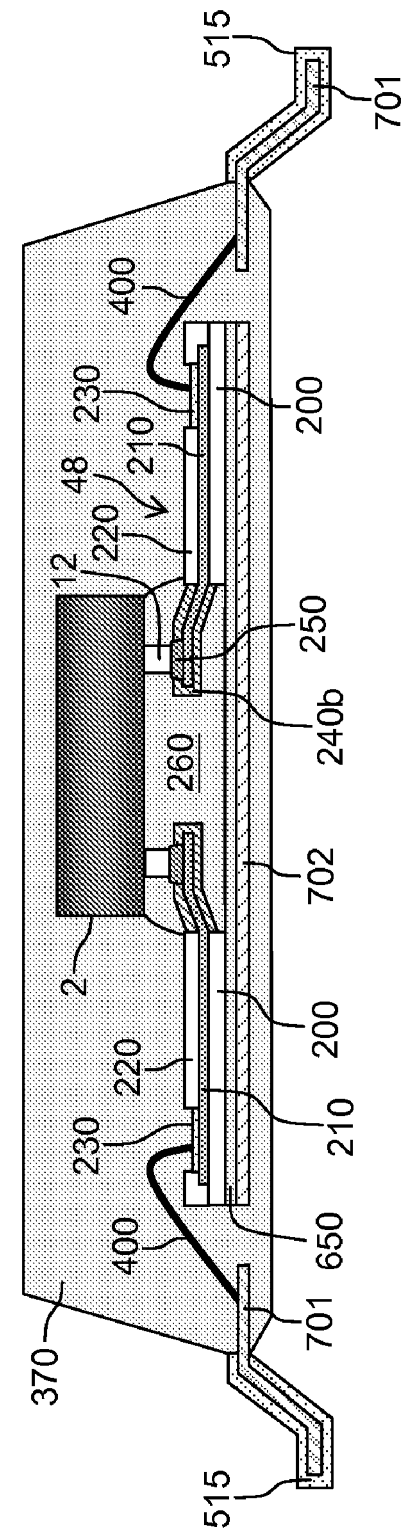

Referring to FIG. 9K, the above-mentioned flexible circuit film 42, bonded with the semiconductor chip 2, shown in FIGS. 9A-9G can be replaced by the above-mentioned flexible circuit film 48, bonded with the semiconductor chip 2, shown in FIG. 7I, that is, the flexible circuit film 48 bonded with the semiconductor chip 2 is joined with the lead frame 700 using the glue material 650, followed by bonding the wireboning wires 400, such as gold wires, having a diameter of between 12 and 40 micrometers with the wirebondable layer 230 and with the leads 701 via a wire-bonding process, followed by performing the above-mentioned steps as shown in FIGS. 9D-9F. Thereby, the wirebondable layer 230 of the flexible circuit film 48 can be electrically connected to the leads 701 of the lead frame 700 through the wireboning wires 400.

Figure 9L:
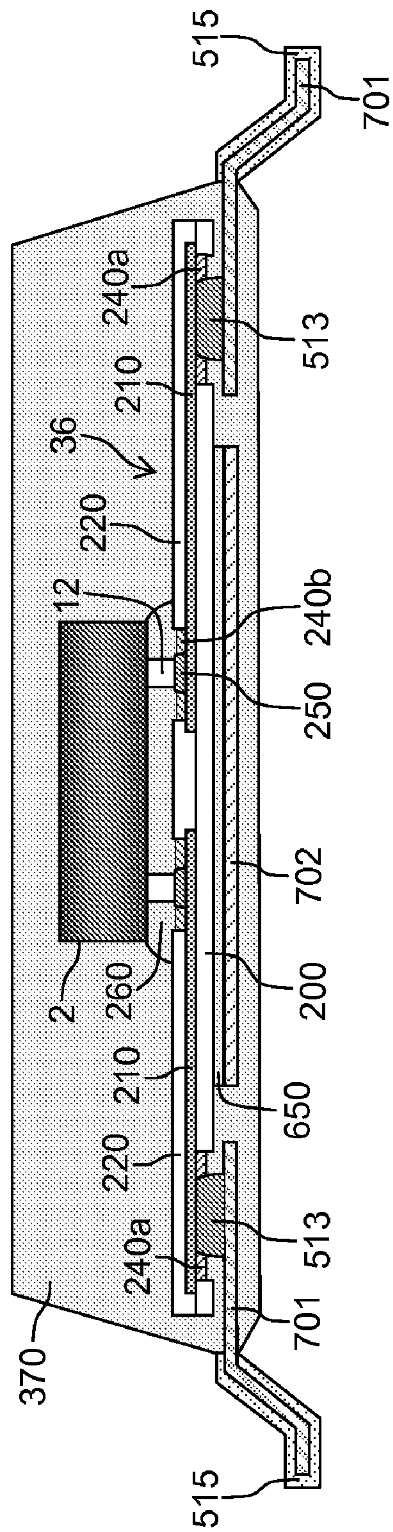

Referring to FIG. 9L, the above-mentioned flexible circuit film 42, bonded with the semiconductor chip 2, shown in FIGS. 9A-9G can be replaced by the above-mentioned flexible circuit film 36, bonded with the semiconductor chip 2, shown in FIG. 3D, that is, the flexible circuit film 36 bonded with the semiconductor chip 2 is joined with the lead frame 700 using the glue material 650, followed by joining the copper traces 210 with tin-containing solder preformed on the leads 701 to provide metal joints 513, such as tin-containing joints, between the copper traces 210 and the leads 701, followed by performing the above-mentioned steps as shown in FIGS. 9D-9F.

Figure 9M:
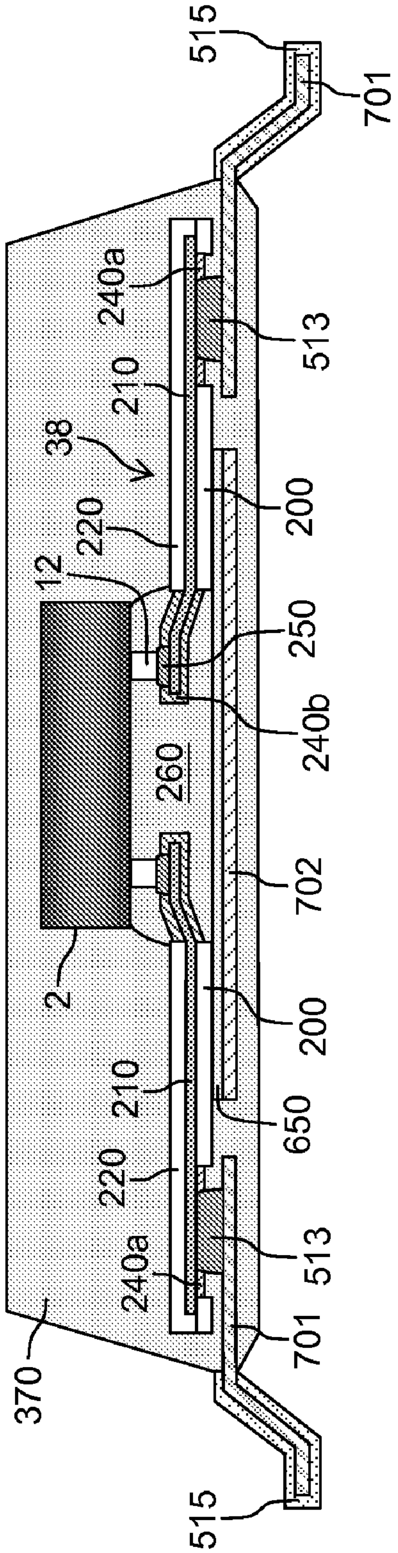

Referring to FIG. 9M, the above-mentioned flexible circuit film 42, bonded with the semiconductor chip 2, shown in FIGS. 9A-9G can be replaced by the above-mentioned flexible circuit film 38, bonded with the semiconductor chip 2, shown in FIG. 3T, that is, the flexible circuit film 38 bonded with the semiconductor chip 2 is joined with the lead frame 700 using the glue material 650, followed by joining the copper traces 210 with a tin-containing solder preformed on the leads 701 to provide the metal joints 513, such as tin-containing joints, between the copper traces 210 and the leads 701, followed by performing the above-mentioned steps as shown in FIGS. 9D-9F.

Figure 10A:
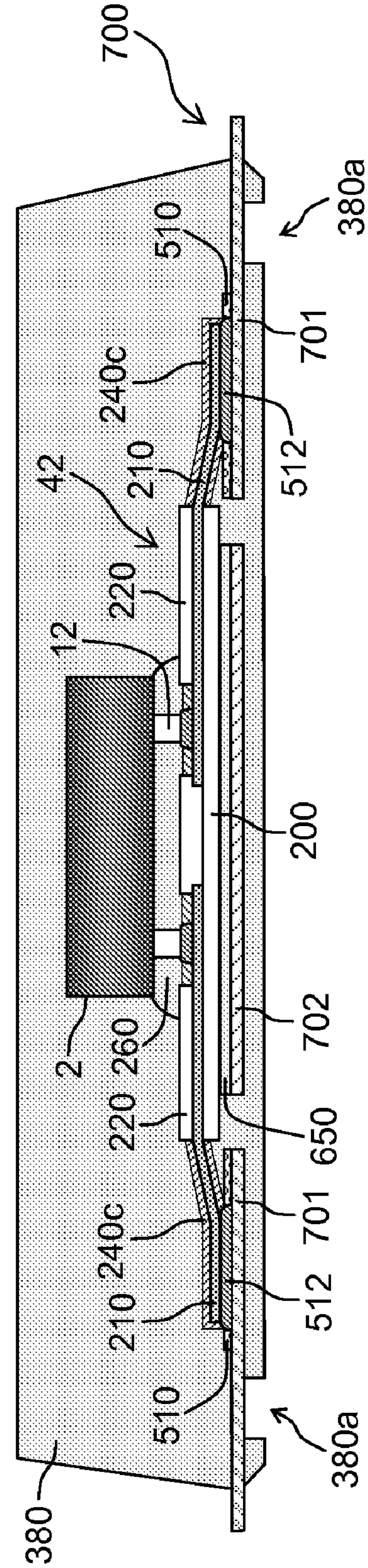
FIGS. 10A-10B are cross-sectional views showing a process for bonding a semiconductor chip with a flexible circuit film using a chip-on-film (COF) technology and joining the flexible circuit film with a lead frame according to another embodiment of the present invention.

Referring to FIG. 10A, after the step shown in FIG. 9C, a polymer compound 380 is formed using a molding process, enclosing the die pad 702, an inner portion of the leads 701 close to the die pad 702, an outer portion of the leads 701, the semiconductor chip 2 and the flexible circuit film 42, and openings 380*a* in the polymer compound 380 expose the bottom surface of the outer portion of the leads 701. For example, the polymer compound 380 can be formed by molding an epoxy-based polymer with carbon fillers therein enclosing the die pad 702, the inner portion of the leads 701, the outer portion of the leads 701, the semiconductor chip 2 and the flexible circuit film 42 at a temperature of between 130 and 250° C., and the openings 380*a* in the polymer compound 380 expose the bottom surface of the outer portion of the leads 701. Alternatively, the polymer compound 380 can be polyimide or polyester. Preferably, the polymer compound 380 has a value of Young's modulus less than 0.5 GPa.

Figure 10B:
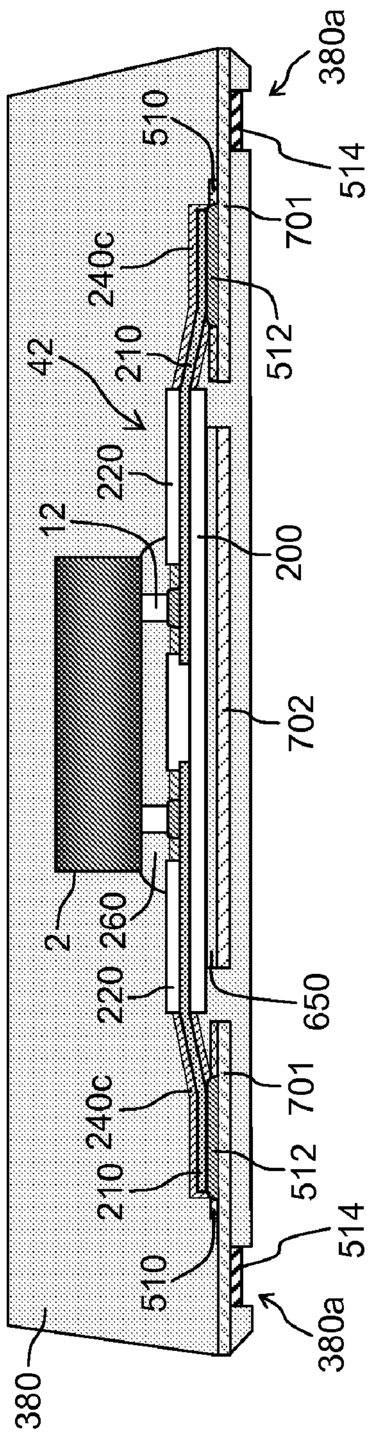

Referring to FIG. 10B, after the polymer compound 380 is formed, a wetting layer 514 can be electroplated or electroless plated on the bottom surface of the outer portion of the leads 701 exposed by the openings 380*a* in the polymer compound 380. The wetting layer 514 has a thickness of between 0.1 and 3 micrometers, and may be gold, copper, silver, nickel, tin, aluminum, palladium or a composite of the above-mentioned materials. For example, the wetting layer 514 can be formed by electroless plating a nickel layer having a thickness of between 0.05 and 1 μm on the bottom surface of the outer portion of the leads 701 exposed by the openings 380*a* in the polymer compound 380, and electroless plating a gold layer having a thickness of between 0.05 and 2 micrometers, and preferably of between 0.05 and 0.3 micrometers, on the nickel layer in the openings 380*a*. Alternatively, the wetting layer 514 can be formed by electroplating a nickel layer having a thickness of between 0.05 and 1 μm on the bottom surface of the outer portion of the leads 701 exposed by the openings 380*a* in the polymer compound 380, and electroplating a gold layer having a thickness of between 0.05 and 2 micrometers, and preferably of between 0.05 and 0.3 micrometers, on the nickel layer in the openings 380*a*. Alternatively, the wetting layer 514 can be formed by electroless plating a gold layer having a thickness of between 0.05 and 2 micrometers, and preferably of between 0.05 and 0.3 micrometers, on the bottom surface of the outer portion of the leads 701 exposed by the openings 380*a* in the polymer compound 380. Alternatively, the wetting layer 514 can be formed by electroplating a gold layer having a thickness of between 0.05 and 2 micrometers, and preferably of between 0.05 and 0.3 micrometers, on the bottom surface of the outer portion of the leads 701 exposed by the openings 380*a* in the polymer compound 380. Alternatively, the wetting layer 514 can be formed by electroless plating a tin-containing layer, such as pure tin, a tin-silver alloy, a tin-lead alloy or a tin-silvercopper alloy, having a thickness of between 0.05 and 2 micrometers, and preferably of between 0.05 and 0.3 micrometers, on the bottom surface of the outer portion of the leads 701 exposed by the openings 380*a* in the polymer compound 380. Alternatively, the wetting layer 514 can be formed by electroplating a tin-containing layer, such as pure tin, a tin-silver alloy, a tin-lead alloy or a tin-silver-copper alloy, having a thickness of between 0.05 and 2 micrometers, and preferably of between 0.05 and 0.3 micrometers, on the bottom surface of the outer portion of the leads 701 exposed by the openings 380*a* in the polymer compound 380. Alternatively, the wetting layer 514 can be formed by electroless plating an aluminum layer having a thickness of between 0.05 and 2 micrometers, and preferably of between 0.05 and 0.3 micrometers, on the bottom surface of the outer portion of the leads 701 exposed by the openings 380*a* in the polymer compound 380. Alternatively, the wetting layer 514 can be formed by electroplating an aluminum layer having a thickness of between 0.05 and 2 micrometers, and preferably of between 0.05 and 0.3 micrometers, on the bottom surface of the outer portion of the leads 701 exposed by the openings 380*a* in the polymer compound 380.

Next, the steps of dejunking the residual of the polymer compound 380, trimming dam bars and cutting and punching the leads 701 can be performed, such that multiple chip packages are singularized. After singularizing the chip packages, the wetting layer 514 can be joined with a solder, containing pure tin, a tin-silver alloy, a tin-lead alloy or a tin-silver-copper alloy, preformed on an external circuit or can contact with contact points of a socket.

Figure 10C:
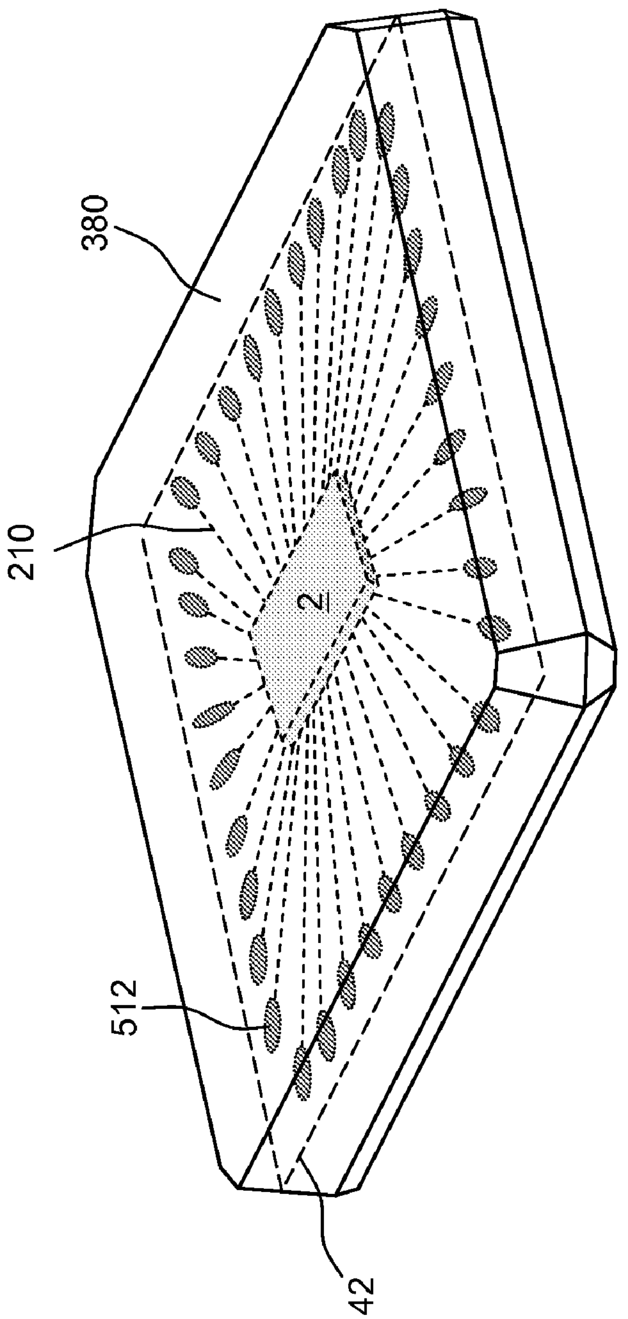
FIG. 10C is a perspective view showing a chip package including a lead frame, a flexible circuit film mounted on the lead frame and a semiconductor chip joined with the flexible circuit film.

FIG. 10C is a perspective view showing FIG. 10B. The fine-pitched metal bumps 12 of the semiconductor chip 2 can be fanned out through the copper traces 210 of the flexible circuit film 42 by bonding the semiconductor chip 2 with the flexible circuit film 42. The flexible circuit film 42 is also joined with the lead frame 700, and the flexible circuit film 42 can be connected to the lead frame 700. Thereby, the semiconductor chip 2 has the fine-pitched metal bumps 12 connected to an external circuit, such as a printed circuit board (PCB) comprising a glass fiber as a core, through the copper traces 210 of the flexible circuit film 42 and through the leads 701 of the lead frame 700.

Figure 10D:
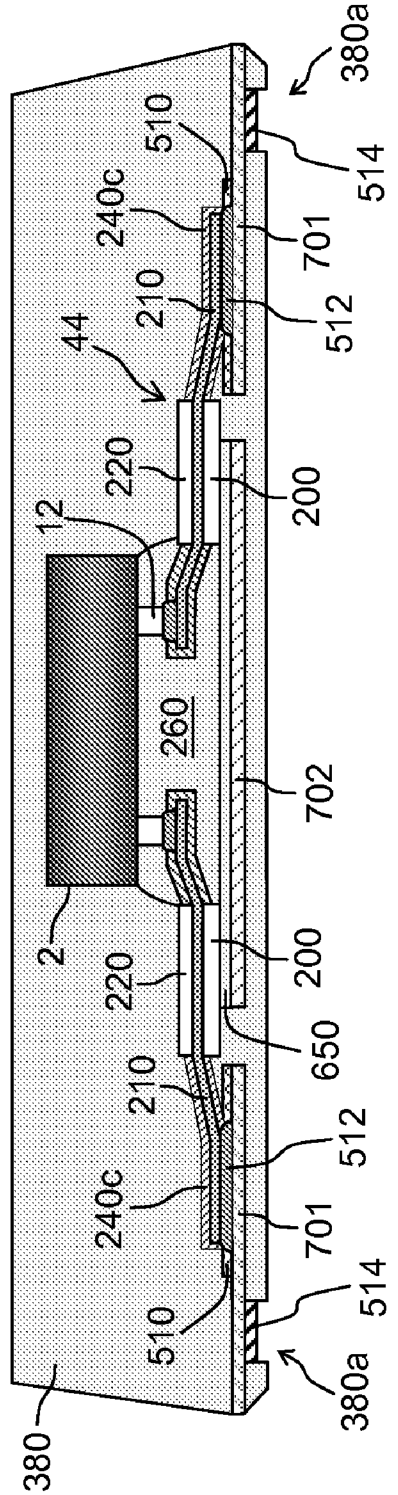
FIGS. 10D-10H are cross-sectional views showing various chip packages each including a lead frame, a flexible circuit film mounted on the lead frame and a semiconductor chip joined with the flexible circuit film.

Referring to FIG. 10D, the above-mentioned flexible circuit film 42, bonded with the semiconductor chip 2, shown in FIGS. 10A-10B can be replaced by the above-mentioned flexible circuit film 44, bonded with the semiconductor chip 2, shown in FIG. 6O, that is, the flexible circuit film 44 bonded with the semiconductor chip 2 is joined with the lead frame 700 using the glue material 650, followed by performing the above-mentioned steps as shown in FIG. 9C, followed by performing the above-mentioned steps as shown in FIG. 10A-10B. The methods, of joining the flexible circuit film 44 bonded with the semiconductor chip 2 with the lead frame 700 using the glue material 650, as shown in FIG. 10D can be referred to as the methods, of joining the flexible circuit film 42 bonded with the semiconductor chip 2 with the lead frame 700 using the glue material 650, as illustrated in the first, second, third and fourth cases shown in FIGS. 9A and 9B.

Figure 10E:
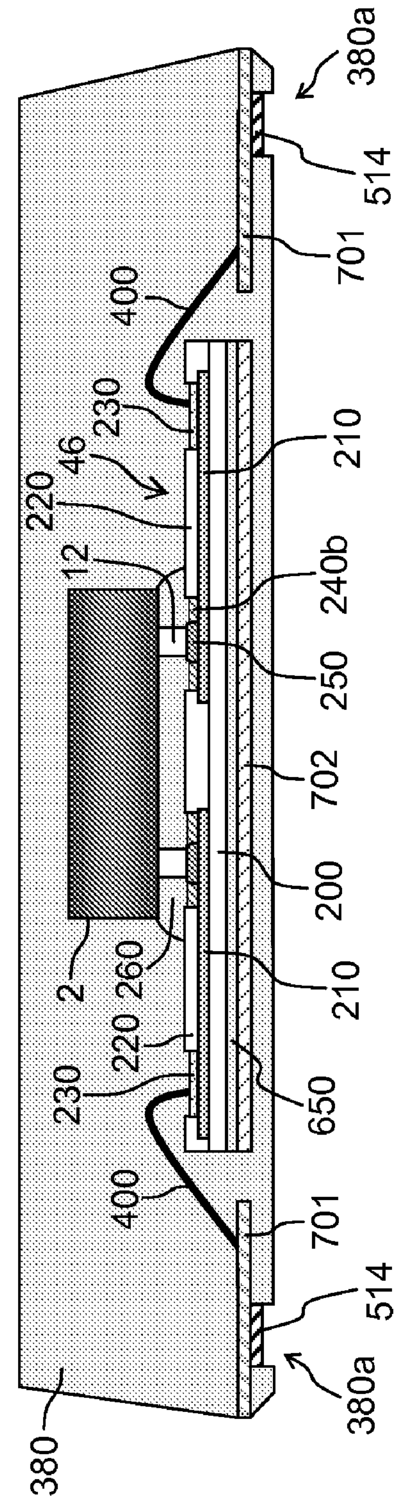

Referring to FIG. 10E, the above-mentioned flexible circuit film 42, bonded with the semiconductor chip 2, shown in FIGS. 10A-10B can be replaced by the above-mentioned flexible circuit film 46, bonded with the semiconductor chip 2, shown in FIG. 7B, that is, the flexible circuit film 46 bonded with the semiconductor chip 2 is joined with the lead frame 700 using the glue material 650, followed by bonding the wireboning wires 400, such as gold wires, having a diameter of between 12 and 40 micrometers with the wirebondable layer 230 and with the inner portion of the leads 701 via a wire-bonding process, followed by performing the above-mentioned steps as shown in FIG. 10A-10B. Thereby, the wirebondable layer 230 of the flexible circuit film 46 can be electrically connected to the leads 701 of the lead frame 700 through the wireboning wires 400.

Figure 10F:
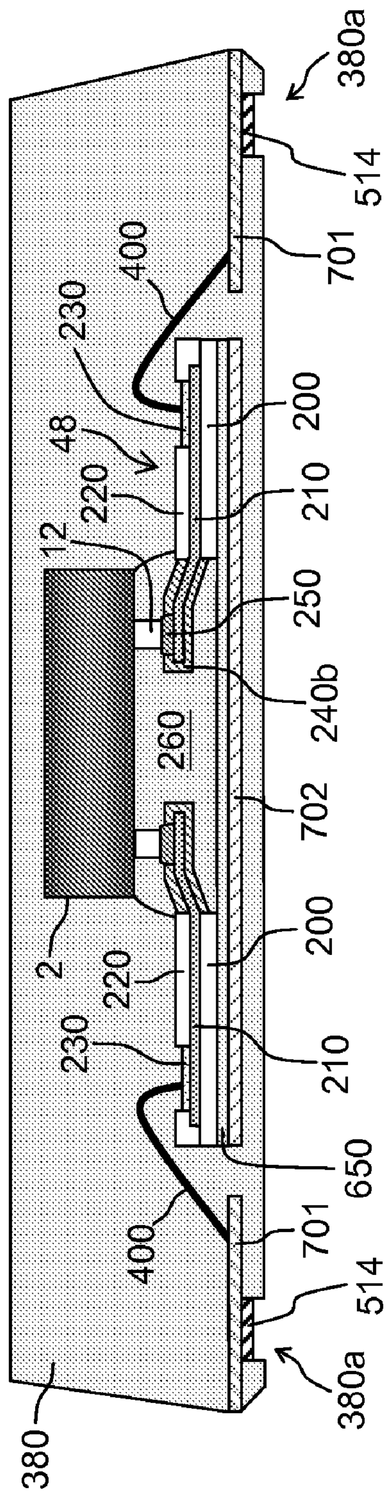

Referring to FIG. 10F, the above-mentioned flexible circuit film 42, bonded with the semiconductor chip 2, shown in FIGS. 10A-10B can be replaced by the above-mentioned flexible circuit film 48, bonded with the semiconductor chip 2, shown in FIG. 7I, that is, the flexible circuit film 48 bonded with the semiconductor chip 2 is joined with the lead frame 700 using the glue material 650, followed by bonding the wireboning wires 400, such as gold wires, having a diameter of between 12 and 40 micrometers with the wirebondable layer 230 and with the inner portion of the leads 701 via a wire-bonding process, followed by performing the above-mentioned steps as shown in FIG. 10A-10B. Thereby, the wirebondable layer 230 of the flexible circuit film 48 can be electrically connected to the leads 701 of the lead frame 700 through the wireboning wires 400.

Figure 10G:
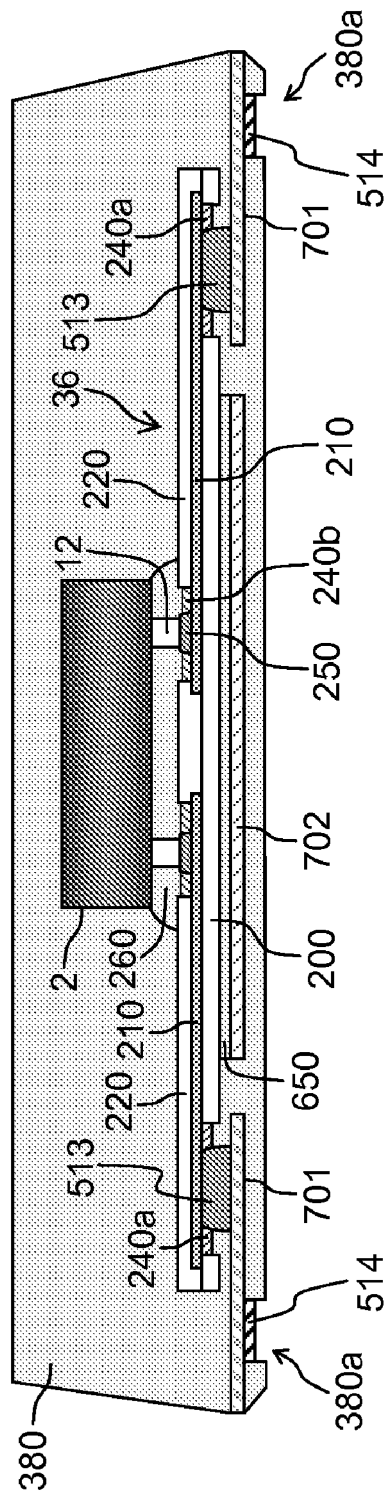

Referring to FIG. 10G, the above-mentioned flexible circuit film 42, bonded with the semiconductor chip 2, shown in FIGS. 10A-10B can be replaced by the above-mentioned flexible circuit film 36, bonded with the semiconductor chip 2, shown in FIG. 3D, that is, the flexible circuit film 36 bonded with the semiconductor chip 2 is joined with the lead frame 700 using the glue material 650, followed by joining the copper traces 210 with a tin-containing solder preformed on the leads 701 to provide the metal joints 513, such as tin-containing joints, between the copper traces 210 and the leads 701, followed by performing the above-mentioned steps as shown in FIGS. 10A-10B.

Figure 10H:
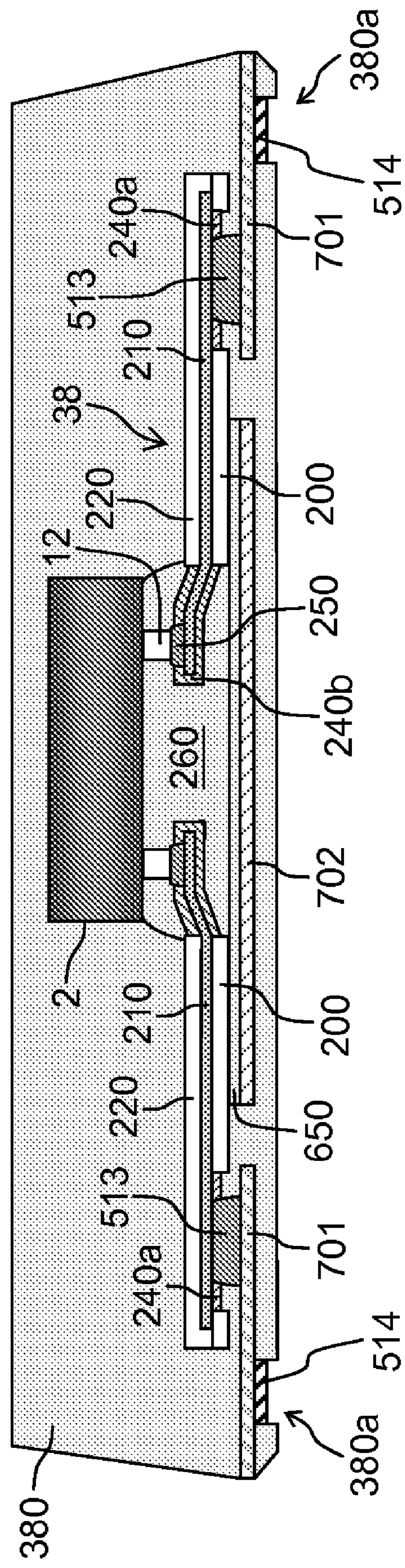

Referring to FIG. 10H, the above-mentioned flexible circuit film 42, bonded with the semiconductor chip 2, shown in FIGS. 10A-10B can be replaced by the above-mentioned flexible circuit film 38, bonded with the semiconductor chip 2, shown in FIG. 3T, that is, the flexible circuit film 38 bonded with the semiconductor chip 2 is joined with the lead frame 700 using the glue material 650, followed by joining the copper traces 210 with a tin-containing solder preformed on the leads 701 to provide the metal joints 513, such as tin-containing joints, between the copper traces 210 and the leads 701, followed by performing the above-mentioned steps as shown in FIGS. 10A-10B.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A chip package comprising:

a substrate comprising multiple insulating layers and multiple metal circuit layers between said multiple insulating layers;

a flexible film over a top surface of said substrate, wherein said flexible film comprises a first polymer layer over said top surface of said substrate, a first metal trace on a top surface of said first polymer layer, a second metal trace on said top surface of said first polymer layer, and a second polymer layer on said first and second metal traces and on said top surface of said first polymer layer;

a first tin-containing joint at said top surface of said substrate and between said first metal trace and a first metal pad of said substrate, wherein said first metal trace is connected to said first metal pad through said first tin-containing joint;

a second tin-containing joint at said top surface of said substrate and between said second metal trace and a second metal pad of said substrate, wherein said second metal trace is connected to said second metal pad through said second tin-containing joint;

a semiconductor chip vertically over said top surface of said substrate;

a first metal bump between said semiconductor chip and said first metal trace, wherein said semiconductor chip is connected to said first metal trace through said first metal bump; and a second metal bump between said semiconductor chip and said second metal trace, wherein said semiconductor chip is connected to said second metal trace through said second metal bump, wherein a pitch between said first and second metal bumps is less than 35 micrometers.

2. The chip package of claim 1 further comprising a third polymer layer on a top surface of said second polymer layer, on said semiconductor chip, and over said top surface of said substrate.

3. The chip package of claim 1, wherein said substrate further comprises a third metal pad at a bottom surface of said substrate, wherein said third metal pad is connected to said first metal pad through said multiple metal circuit layers, and a fourth metal pad at said bottom surface of said substrate, wherein said fourth metal pad is connected to said second metal pad through said multiple metal circuit layers.

4. The chip package of claim 3 further comprising a third tin-containing joint on said third metal pad, and a fourth tin-containing joint on said fourth metal pad.

5. The chip package of claim 1, wherein said first polymer layer has a thickness between 10 and 100 micrometers.

6. The chip package of claim 1, wherein said first metal trace comprises a copper layer having a thickness between 3 and 30 micrometers.

7. The chip package of claim 1, wherein said second polymer layer has a thickness between 5 and 30 micrometers.

8. The chip package of claim 1, wherein said first metal bump comprises a gold layer having a thickness between 5 and 50 micrometers.

9. The chip package of claim 1, wherein said first metal bump comprises a copper layer having a thickness between 0.5 and 45 micrometers.

10. The chip package of claim 1, wherein said first metal bump comprises a nickel layer having a thickness between 0.5 and 5 micrometers.

11. The chip package of claim 1, wherein said first metal bump comprises a copper layer having a thickness between 0.5 and 45 micrometers between said semiconductor chip and said first metal trace, a nickel layer having a thickness between 0.5 and 5 micrometers between said copper layer and said first metal trace, and a gold layer having a thickness between 0.1 and 4.5 micrometers between said nickel layer and said first metal trace.

12. The chip package of claim 1, wherein said first metal bump comprises a copper layer having a thickness between 0.5 and 45 micrometers between said semiconductor chip and said first metal trace, and a gold layer having a thickness between 0.1 and 4.5 micrometers between said copper layer and said first metal trace.

13. The chip package of claim 1, wherein said multiple insulating layers comprise multiple ceramic layers.

14. The chip package of claim 1, wherein said multiple insulating layers comprise multiple organic layers.

15. A chip package comprising:

a substrate comprising multiple insulating layers and multiple metal circuit layers between said multiple insulating layers;

a flexible film over a top surface of said substrate, wherein said flexible film comprises a first polymer layer over said top surface of said substrate, a first metal trace on a top surface of said first polymer layer, a second metal trace on said top surface of said first polymer layer, and a second polymer layer on said first and second metal traces and on said top surface of said first polymer layer;

an anisotropic conductive film (ACF) at said top surface of said substrate, between said first metal trace and a first metal pad of said substrate, and between said second metal trace and a second metal pad of said substrate, wherein said first metal trace is connected to said first metal pad through multiple first metal particles in said anisotropic conductive film, and said second metal trace is connected to said second metal pad through multiple second metal particles in said anisotropic conductive film;

a semiconductor chip vertically over said top surface of said substrate;

a first metal bump between said semiconductor chip and said first metal trace, wherein said semiconductor chip is connected to said first metal trace through said first metal bump; and a second metal bump between said semiconductor chip and said second metal trace, wherein said semiconductor chip is connected to said second metal trace through said second metal bump, wherein a pitch between said first and second metal bumps is less than 35 micrometers.

16. The chip package of claim 15, wherein said substrate comprises a third metal pad at a bottom surface of said substrate, wherein said third metal pad is connected to said first metal pad through said multiple metal circuit layers, and a fourth metal pad at said bottom surface of said substrate, wherein said fourth metal pad is connected to said second metal pad through said multiple metal circuit layers.

17. The chip package of claim 16 further comprising a first tin-containing joint on said third metal pad, and a second tin-containing joint on said fourth metal pad.

18. The chip package of claim 15, wherein said first metal bump comprises a gold layer having a thickness between 5 and 50 micrometers.

19. The chip package of claim 15, wherein said first metal bump comprises a copper layer having a thickness between 0.5 and 45 micrometers.

20. The chip package of claim 15, wherein said first metal bump comprises a nickel layer having a thickness between 0.5 and 5 micrometers.

21. A chip package comprising:

a flexible substrate comprising a first polymer layer, a first metal trace on a top surface of said first polymer layer, a second metal trace on said top surface of said first polymer layer and a second polymer layer on a top surface of said first metal trace, a top surface of said second metal trace and said top surface of said first polymer layer;

a first tin-containing joint at a bottom surface of said first metal trace;

a second tin-containing joint at a bottom surface of said second metal trace;

a semiconductor chip over said flexible substrate;

a first metal bump between said semiconductor chip and said first metal trace, wherein said semiconductor chip is connected to said first tin-containing joint through, in sequence, said first metal bump and said first metal trace;

a second metal bump between said semiconductor chip and said second metal trace, wherein said semiconductor chip is connected to said second tin-containing joint through, in sequence, said second metal bump and said second metal trace, wherein a pitch between said first and second metal bumps is less than 35 micrometers; and a molding compound on a top surface of said second polymer layer, wherein said molding compound covers a sidewall of said semiconductor chip.

22. The chip package of claim 21, wherein said first metal bump comprises a gold layer having a thickness between 5 and 50 micrometers.

23. The chip package of claim 21, wherein said first metal bump comprises a copper layer having a thickness between 0.5 and 45 micrometers.

24. The chip package of claim 21, wherein said molding compound comprises an epoxy-based polymer.

25. The chip package of claim 24, wherein said molding compound further comprises multiple carbon fillers in said epoxy-based polymer.

26. The chip package of claim 21, wherein said molding compound has a value of Young's modulus less than 0.5 GPa.

27. The chip package of claim 21, wherein said first metal trace comprises a copper layer having a thickness between 3 and 30 micrometers.

* * * * *